US012371612B2

(12) United States Patent
Yi et al.

(10) Patent No.: US 12,371,612 B2
(45) Date of Patent: Jul. 29, 2025

(54) ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

(71) Applicant: Samsung Electronics Co., Ltd., Suwon-si (KR)

(72) Inventors: Jeoungin Yi, Seoul (KR); Byungjoon Kang, Seoul (KR); Sangdong Kim, Seongnam-si (KR); Hyungjun Kim, Suwon-si (KR); Yong Joo Lee, Suwon-si (KR); Byoungki Choi, Hwaseong-si (KR); Youngki Hong, Anyang-si (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 854 days.

(21) Appl. No.: 17/229,659

(22) Filed: Apr. 13, 2021

(65) Prior Publication Data

US 2022/0102654 A1 Mar. 31, 2022

(30) Foreign Application Priority Data

Apr. 14, 2020 (KR) ........................ 10-2020-0045374
Apr. 12, 2021 (KR) ........................ 10-2021-0046891

(51) Int. Cl.
*H01L 51/50* (2006.01)
*C07F 15/00* (2006.01)
(Continued)

(52) U.S. Cl.
CPC ....... *H10K 85/346* (2023.02); *C07F 15/0086* (2013.01); *C09K 11/06* (2013.01);
(Continued)

(58) Field of Classification Search
None
See application file for complete search history.

(56) References Cited

U.S. PATENT DOCUMENTS

2007/0032000 A1* 2/2007 Yeh ...................... G09G 3/3648 438/149
2016/0240800 A1 8/2016 Ma et al.
(Continued)

FOREIGN PATENT DOCUMENTS

CN 107068888 A 8/2017
EP 3508491 A1 7/2019
(Continued)

OTHER PUBLICATIONS

English Abstract of CN 107068888.
(Continued)

*Primary Examiner* — Gregory D Clark
(74) *Attorney, Agent, or Firm* — CANTOR COLBURN LLP

(57) ABSTRACT

Provided are an organometallic compound, an organic light-emitting device including the organometallic compound,
(Continued)

and an electronic apparatus including the organic light-emitting device, in which the organometallic compound may be represented by Formula 1-1:

Formula 1-1

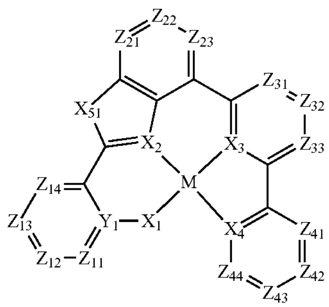

wherein Formula 1-1 may be understood by referring to the description of Formula 1-1 provided herein.

20 Claims, 1 Drawing Sheet

(51) Int. Cl.

| | |
|---|---|
| ***C09K 11/06*** | (2006.01) |
| ***H10K 85/30*** | (2023.01) |
| *H10K 50/11* | (2023.01) |
| *H10K 50/15* | (2023.01) |
| *H10K 50/16* | (2023.01) |
| *H10K 50/17* | (2023.01) |
| *H10K 50/18* | (2023.01) |

(52) U.S. Cl.
CPC .. *C07B 2200/05* (2013.01); *C09K 2211/1044* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02)

(56) References Cited

U.S. PATENT DOCUMENTS

| | | | | |
|---|---|---|---|---|
| 2018/0114928 | A1* | 4/2018 | Lee | C09K 11/06 |
| 2019/0140192 | A1 | 5/2019 | Cho et al. | |
| 2020/0111977 | A1 | 4/2020 | Choi et al. | |
| 2020/0115406 | A1 | 4/2020 | Yi et al. | |
| 2021/0159431 | A1 | 5/2021 | Lee et al. | |
| 2023/0287024 | A1 | 9/2023 | Lee et al. | |

FOREIGN PATENT DOCUMENTS

| | | | |
|---|---|---|---|
| JP | 2012079901 | A | 4/2012 |
| KR | 1020180005128 | A | 1/2018 |
| KR | 1020190052545 | A | 5/2019 |
| KR | 20190083984 | A | 7/2019 |
| KR | 1020200026093 | A | 3/2020 |
| KR | 1020200040198 | A | 4/2020 |

OTHER PUBLICATIONS

English Abstract of JP 2012-079901.

Extended European Search Report dated Sep. 10, 2021 issued in EP Patent Application No. 21167798.4.

Yafei Luo, Exploring the Photodeactivation Pathways of Pt[O^N^C^N^] Complexes: A Theoretical Perspective, Chemphyschem Jan. 4, 2016;17(1):69-77.

English Translation of Office Action dated Oct. 10, 2024, issued in corresponding KR Patent Application No. 10-2021-0046891, 11 pp.

Office Action dated Oct. 10, 2024, issued in corresponding KR Patent Application No. 10-2021-0046891, 8 pp.

* cited by examiner

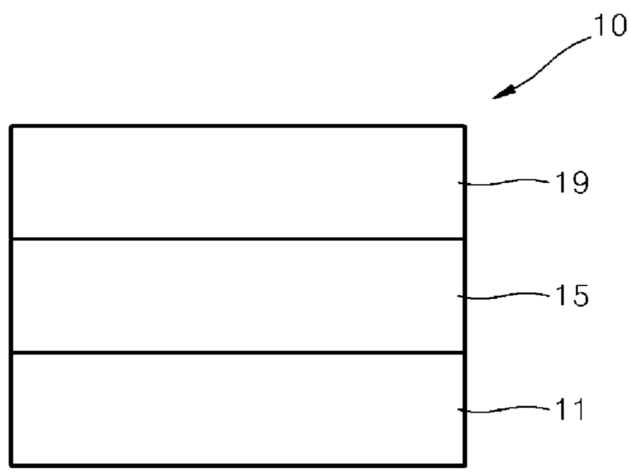
10
19
15
11

ORGANOMETALLIC COMPOUND, ORGANIC LIGHT-EMITTING DEVICE INCLUDING ORGANOMETALLIC COMPOUND, AND ELECTRONIC APPARATUS INCLUDING ORGANIC LIGHT-EMITTING DEVICE

CROSS-REFERENCE TO RELATED APPLICATION

This application claims priority under 35 U.S.C. § 119 to Korean Patent Application Nos. 10-2020-0045374, filed on Apr. 14, 2020, and 10-2021-0046891, filed on Apr. 12, 2021, in the Korean Intellectual Property Office, the contents of which are incorporated by reference herein in their entirety.

BACKGROUND

1. Field

The present disclosure relates to an organometallic compound, an organic light-emitting device including the organometallic compound, and an electronic apparatus including the organic light-emitting device.

2. Description of the Related Art

Organic light-emitting devices (OLEDs) are self-emissive devices which produce full-color images. In addition, OLEDs have wide viewing angles and exhibit excellent driving voltage and response speed characteristics.

OLEDs include an anode, a cathode, and an organic layer between the anode and the cathode and including an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. The excitons may transit from an excited state to a ground state, thus generating light.

SUMMARY

Provided are an organometallic compound, an organic light-emitting device including the organometallic compound, and an electronic apparatus including the organic light-emitting device.

Additional aspects will be set forth in part in the description which follows and, in part, will be apparent from the description, or may be learned by practice of the presented embodiments of the disclosure.

According to an aspect of an embodiment, an organometallic compound represented by Formula 1-1 is provided.

Formula 1-1

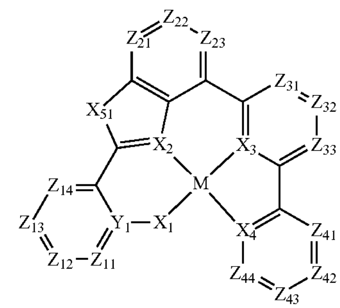

In Formula 1-1,

M is a transition metal, $X_1$ is O, S, or N(R'''), a bond between $X_1$ and M is a covalent bond, $X_2$ to $X_4$ and $Y_1$ are each independently C or N, one bond of a bond between $X_2$ and M, a bond between $X_3$ and M, and a bond between $X_4$ and M is a covalent bond, while the remaining bonds are each be a coordinate bond, $X_{51}$ is O, S, N-[$(L_7)_{b7}$-$(R_7)_{c7}$], C($R_7$)($R_8$), Si($R_7$)($R_8$), Ge($R_7$)($R_8$), or C(=O), $Z_{11}$ is N or C-[$(L_{11})_{b11}$-$(T_{11})_{c11}$], $Z_{12}$ is N or C-[$(L_{12})_{b12}$-$(T_{12})_{c12}$], $Z_{13}$ is N or C-[$(L_{13})_{b13}$-$(T_{13})_{c13}$], and $Z_{14}$ is N or C-[$(L_{14})_{b14}$-$(T_{14})_{c14}$], $Z_{21}$ is N or C-[$(L_{21})_{b21}$-$(T_{21})_{c21}$], $Z_{22}$ is N or C-[$(L_{22})_{b22}$-$(T_{22})_{c22}$], and $Z_{23}$ is N or C-[$(L_{23})_{b23}$-$(T_{23})_{c23}$], $Z_{31}$ is N or C-[$(L_{31})_{b31}$-$(T_{31})_{c31}$], $Z_{32}$ is N or C-[$(L_{32})_{b32}$-$(T_{32})_{c32}$], and $Z_{33}$ is N or C-[$(L_{33})_{b33}$-$(T_{33})_{c33}$], $Z_{41}$ is N or C-[$(L_{41})_{b41}$-$(T_{41})_{c41}$], $Z_{42}$ is N or C-[$(L_{42})_{b42}$-$(T_{42})_{c42}$], $Z_{43}$ is N or C-[$(L_{43})_{b43}$-$(T_{43})_{c43}$], and $Z_{44}$ is N or C-[$(L_{44})_{b44}$-$(T_{44})_{c44}$], $L_7$, $L_{11}$ to $L_{14}$, $L_{21}$ to $L_{23}$, $L_{31}$ to $L_{33}$ and $L_{41}$ to $L_{44}$ are each independently a single bond, a $C_1$-$C_{10}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b7, b11 to b14, b21 to b23, b31 to b33 and b41 to b44 are each independently 1, 2, 3, 4, or 5, R''', $R_7$, $R_8$, $T_{11}$ to $T_{14}$, $T_{21}$ to $T_{23}$, $T_{31}$ to $T_{33}$ and $T_{41}$ to $T_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q_9)$, or —$P(Q_8)(Q_9)$, c7, c11 to c14, c21 to c23, c31 to c33 and c41 to c44 are each independently 1, 2, 3, 4, or 5, wherein, the organometallic compound represented by Formula 1-1 satisfies:

1) one of Condition 11, Condition 12 and Condition 13,
2) Condition 11 and Condition 13, or
3) Condition 12 and Condition 13, $Z_{42}$ in Formula 1-1 is C-[$(L_{42})_{b42}$-$(T_{42})_{c42}$], Condition 11

$T_{42}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c42 is 1, $Z_{42}$ in Formula 1-1 is C-[$(L_{42})_{b42}$-$(T_{42})_{c42}$], Condition 12

$T_{42}$ is a group represented by Formula 41, and c42 is 1,

*—$C(Q_{41})(Q_{42})(Q_{43})$ Formula 41 wherein in Formula 41, $Q_{41}$ to $Q_{43}$ are each independently deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, at least one of $Q_{41}$ to $Q_{43}$ are each independently a substituted or unsubstituted $C_2$-$C_{60}$ alkyl group, a substituted or unsubstituted $C_3$-$C_{10}$ cycloalkyl group, or a substituted or unsubstituted $C_6$-$C_{60}$ aryl group, and

* indicates a binding site to an adjacent atom, $X_{51}$ in Formula 1-1 is N-[$(L_7)_{b7}$-$(R_7)_{c7}$], Condition 13

$L_7$ is a benzene group, or a naphthalene group, each unsubstituted or substituted with at least one $R_{10a}$, $R_7$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c7 is 1, each of i) at least two of $T_{11}$ to $T_{14}$, ii) at least two of $T_{21}$ to $T_{23}$, iii) at least two of $T_{31}$ to $T_{33}$, iv) at least two of $T_{41}$ to $T_{44}$ and v) at least two of $T_{11}$ to $T_{14}$, $T_{21}$ to $T_{23}$, $T_{31}$ to $T_{33}$, and $T_{41}$ to $T_{44}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ may be understood by referring to the description of $T_{11}$ provided herein, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$Ge(Q_{13})(Q_{14})(Q_{15})$, —$B(Q_{16})(Q_{17})$, —$P(=O)(Q_{18})(Q_{19})$, —$P(Q_{18})(Q_{19})$, or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$Ge(Q_{23})(Q_{24})(Q_{25})$, —$B(Q_{26})(Q_{27})$, —$P(=O)(Q_{28})(Q_{29})$, —$P(Q_{28})(Q_{29})$, or any combination thereof, —$N(Q_{31})(Q_{32})$, —$Si(Q_{33})(Q_{34})(Q_{35})$, —$Ge(Q_{33})(Q_{34})(Q_{35})$, —$B(Q_{36})(Q_{37})$, —$P(=O)(Q_{38})(Q_{39})$, or —$P(Q_{38})(Q_{39})$, or any combination thereof, wherein $Q_1$ to $Q_9$, $Q_{11}$ to $Q_{19}$, $Q_{21}$ to $Q_{29}$, and $Q_{31}$ to $Q_{39}$ are independently hydrogen, deuterium, —F, —Cl, —Br, —I, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group unsubstituted or substituted with deuterium, a $C_1$-$C_{60}$ alkyl group, a $C_6$-$C_{60}$ aryl group, or any combination thereof, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group unsubstituted or substituted with deuterium, a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

According to an aspect of another embodiment, an organic light-emitting device may include a first electrode, a second electrode, and an organic layer between the first electrode and the second electrode, the organic layer including an emission layer and at least one of the organometallic compound.

The organometallic compound may be included in the emission layer of the organic layer, and the organometallic compound included in the emission layer may serve as a dopant.

According to an aspect of another embodiment, an electronic apparatus may include the organic light-emitting device.

BRIEF DESCRIPTION OF THE DRAWING

The above and other aspects, features, and advantages of certain embodiments of the disclosure will be more apparent from the following description taken in conjunction with the accompanying drawings, in which The FIGURE is a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity, and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded Thus, the regions illustrated in the figures are schematic in nature and their shapes are not intended to illustrate the precise shape of a region and are not intended to limit the scope of the present claims.

An organometallic compound may be represented by Formula 1-1:

Formula 1-1

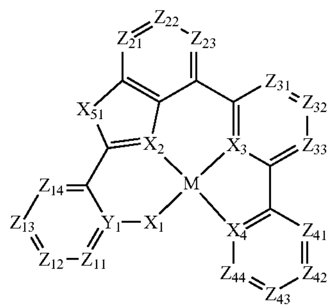

wherein Formula 1-1 may be understood by referring to the description.

In an embodiment, the organometallic compound may have ΔST in a range of about 0.1 eV to about 0.2 eV.

In an embodiment, the organometallic compound may have a horizontal orientation ratio of about 85% or greater.

ΔST indicates an energy gap (an absolute value) between a singlet ($S_1$) energy level and a triplet ($T_1$) energy level of the organometallic compound represented by Formula 1-1. The singlet ($S_1$) energy level and the triplet ($T_1$) energy level of the organometallic compound may be calculated using a density functional theory (DFT). A method of measuring the singlet ($S_1$) energy level and the triplet ($T_1$) energy level of the organometallic compound may be understood with reference to Evaluation Example 1.

In an embodiment, the organometallic compound may have ΔST in a range of about 0.13 eV to about 0.2 eV, about 0.15 eV to about 0.2 eV or about 0.176 eV to about 0.2 eV.

In one or more embodiments, the organometallic compound may have ΔST in a range of about 0.10 eV to about 0.17 eV, about 0.12 eV to about 0.17 eV, or about 0.125 eV to about 0.16 eV.

In one or more embodiments, the organometallic compound may have a horizontal orientation ratio in a range of about 85% to about 95% or about 87% to about 95%.

In one or more embodiments, the organometallic compound may have a horizontal orientation ratio in a range of about 85% to about 100%, about 87% to about 97%, or about 88% to about 95%.

The horizontal orientation ratio of the organometallic compound, as used herein, may be a horizontal orientation ratio of a transition dipole moment of the organometallic compound. The term "horizontal orientation ratio of a transition dipole moment", as used herein, refers to, in a film including the organometallic compound, a ratio of the organometallic compound having a transition dipole moment which is horizontal with respect to the film, relative to the total organometallic compound included in the film. A horizontal orientation ratio may be measured by preparing a film including a predetermined matrix compound (e.g., mCP) and the organometallic compound and measuring a horizontal orientation ratio of the film. For example, a method of measuring a horizontal orientation ratio of the organometallic compound may be understood by referring to Evaluation Example 2.

Since the organometallic compound has a high horizontal orientation ratio of a transition dipole moment as such, namely, a greatly oriented transition dipole moment (i.e., a large optical orientation in a horizontal direction), when the film includes the organometallic compound, it may be possible for the organometallic compound to emit a large electric field in a vertical direction with respect to the film. Since light emitted by this mechanism may pass to the outside with high efficiency (i.e., efficiency of light emitted from the organometallic compound passing to the outside in a device (e.g., an organic light-emitting device) including a film (e.g., an emission layer described herein) including the organometallic compound), an electronic device, e.g., an organic light-emitting device, employing the organometallic compound, may have excellent luminous efficiency.

In one or more embodiments, the organometallic compound may have a sublimation temperature in a range of about 200° C. to about 350° C., about 200° C. to about 340° C., or about 200° C. to about 300° C. The organometallic compound may have a molecular weight of 1,200 or less or 1100 or less. As the organometallic compound has a sublimation temperature and/or a molecular weight as described above, when forming a thin film including the organometallic compound, decomposition of the organometallic compound may be substantially prevented, thus forming a thin film showing excellent performance.

wherein, in Formula 1-1, M may be a transition metal.

For example, M may be cobalt (Co), copper (Cu), zinc (Zn), gallium (Ga), zirconium (Zr), ruthenium (Ru), rhodium (Rh), palladium (Pd), silver (Ag), rhenium (Re), platinum (Pt), or gold (Au).

In an embodiment, M may be Pt, Pd, or Au.

In Formula 1-1, $X_1$ may be O, S, or N(R'''), and a bond between $X_1$ and M may be a covalent bond. R''' may be understood by referring to the description of R''' provided herein.

In some embodiments, $X_1$ may be O or S.

In an embodiment, $X_1$ may be O.

In Formula 1-1, $X_2$ to $X_4$ and $Y_1$ may each independently be C or N.

For example, $X_2$ and $X_4$ may each be N, and $Y_1$ and $X_3$ may each be C.

In Formula 1-1, one bond of a bond between $X_2$ and M, a bond between $X_3$ and M, and a bond between $X_4$ and M may be a covalent bond, while the remaining bonds may each be a coordinate bond. The organometallic compound represented by Formula 1-1 may be electrically neutral.

In some embodiments, a bond between $X_2$ and M and a bond between $X_4$ and M may each be a coordinate bond, and a bond between $X_3$ and M may be a covalent bond.

$X_{51}$ in Formula 1-1 may be O, S, N-[$(L_7)_{b7}$-$(R_7)_{c7}$], $C(R_7)(R_8)$, $Si(R_7)(R_8)$, $Ge(R_7)(R_8)$, or C(=O). Each of $R_7$, b7, $R_8$ and b8 may be understood by referring to the description provided herein. $R_7$ and $R_8$ may optionally be bound to each other via a first linking group to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

In an embodiment, $X_{51}$ in Formula 1-1 may be O, S, or N-$[(L_7)_{b7}$-$(R_7)_{c7}]$.

In an embodiment, $X_{51}$ in Formula 1-1 may be N-$[(L_7)_{b7}$-$(R_7)_{c7}]$.

In Formula 1-1, $Z_{11}$ may be N or C-$[(L_{11})_{b11}$-$(T_{11})_{c11}]$, $Z_{12}$ may be N or C-$[(L_{12})_{b12}$-$(T_{12})_{c12}]$, $Z_{13}$ may be N or C-$[(L_{13})_{b13}$-$(T_{13})_{c13}]$, and $Z_{14}$ may be N or C-$[(L_{14})_{b14}$-$(T_{14})_{c14}]$, $Z_{21}$ may be N or C-$[(L_{21})_{b21}$-$(T_{21})_{c21}]$, $Z_{22}$ may be N or C-$[(L_{22})_{b22}$-$(T_{22})_{c22}]$, and $Z_{23}$ may be N or C-$[(L_{23})_{b23}$-$(T_{23})_{c23}]$, $Z_{31}$ may be N or C-$[(L_{31})_{b31}$-$(T_{31})_{c31}]$, $Z_{32}$ may be N or C-$[(L_{32})_{b32}$-$(T_{32})_{c32}]$, and $Z_{33}$ may be N or C-$[(L_{33})_{b33}$-$(T_{33})_{c33}]$, and $Z_{41}$ may be N or C-$[(L_{41})_{b41}$-$(T_{41})_{c41}]$, $Z_{42}$ may be N or C-$[(L_{42})_{b42}$-$(T_{42})_{c42}]$, $Z_{43}$ may be N or C-$[(L_{43})_{b43}$-$(T_{43})_{c43}]$, and $Z_{44}$ may be N or C-$[(L_{44})_{b44}$-$(T_{44})_{c44}]$.

In an embodiment, none of $Z_{11}$ to $Z_{14}$, none of $Z_{21}$ to $Z_{23}$, none of $Z_{31}$ to $Z_{33}$ and none of $Z_{41}$ to $Z_{44}$ may be N.

In Formula 1-1, $L_7$, $L_{11}$ to $L_{14}$, $L_{21}$ to $L_{23}$, $L_{31}$ to $L_{33}$ and $L_{41}$ to $L_{44}$ may each independently be a single bond, a $C_1$-$C_{10}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$.

For example, in Formula 1-1, $L_7$, $L_{11}$ to $L_{14}$, $L_{21}$ to $L_{23}$, $L_{31}$ to $L_{33}$ and $L_{41}$ to $L_{44}$ may each independently be:

a single bond; or a methylene group, an ethylene group, a cyclopentane group, a cyclohexane group, a cycloheptane group, a cyclopentene group, a cyclohexene group, a cycloheptene group, an adamantane group, norbornane group, a norbornene group, a bicyclo[1.1.1]pentane group, a bicyclo[2.1.1]hexane group, a bicyclo[2.2.2]octane group, a benzene group, a naphthalene group, an anthracene group, a phenanthrene group, a triphenylene group, a pyrene group, a chrysene group, a cyclopentadiene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$.

In some embodiments, in Formula 1-1, $L_7$, $L_{11}$ to $L_{14}$, $L_{21}$ to $L_{23}$, $L_{31}$ to $L_{33}$ and $L_{41}$ to $L_{44}$ may each independently be:

a single bond; or a methylene group, a cyclopentane group, a cyclohexane group, a cycloheptane group, a cyclopentene group, a cyclohexene group, a cycloheptene group, an adamantane group, a norbornane group, a norbornene group, a bicyclo[1.1.1]pentane group, a bicyclo[2.1.1]hexane group, a bicyclo[2.2.2]octane group, a benzene group, or a naphthalene group, each unsubstituted or substituted with at least one $R_{10a}$.

In Formula 1-1, b7, b11 to b14, b21 to b23, b31 to b33 and b41 to b44 may respectively indicate the number of $L_7$, $L_{11}$ to $L_{14}$, $L_{21}$ to $L_{23}$, $L_{31}$ to $L_{33}$ and $L_{41}$ to $L_{44}$, and b7, b11 to b14, b21 to b23, b31 to b33 and b41 to b44 may each independently be 1, 2, 3, 4, or 5. For example, in Formula 1-1, b7, b11 to b14, b21 to b23, b31 to b33 and b41 to b44 may each independently be 1, 2, or 3.

In Formula 1-1, R''', $R_7$, $R_8$, $T_{11}$ to $T_{14}$, $T_{21}$ to $T_{23}$, $T_{31}$ to $T_{33}$ and $T_{41}$ to $T_{44}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$Ge(Q_3)(Q_4)(Q_5)$, —$B(Q_6)(Q_7)$, —$P(=O)(Q_8)(Q)$, or —$P(Q_8)(Q)$. $Q_1$ to $Q_9$ may respectively be understood by referring to the descriptions of $Q_1$ to $Q_3$ provided herein.

For example, in Formula 1-1, R''', $R_7$, $R_8$, $T_{11}$ to $T_{14}$, $T_{21}$ to $T_{23}$, $T_{31}$ to $T_{33}$ and $T_{41}$ to $T_{44}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_2$-$C_{10}$ alkyl group or a $C_2$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a pyridinyl group, a pyrimidinyl group, or any combination thereof; or a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group or an azadibenzothiophenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.2]octyl group, a ($C_1$-$C_{20}$ alkyl)cyclopentyl group, a ($C_1$-$C_{20}$ alkyl)cyclohexyl group, a ($C_1$-$C_{20}$ alkyl)cycloheptyl group, a ($C_1$-$C_{20}$ alkyl)cyclooctyl group, a ($C_1$-$C_{20}$ alkyl)adamantanyl group, a ($C_1$-$C_{20}$ alkyl)norbornanyl group, a ($C_1$-$C_{20}$ alkyl)norbornenyl group, a ($C_1$-$C_{20}$ alkyl)cyclopentenyl group, a ($C_1$-$C_{20}$ alkyl)cyclohexenyl group, a ($C_1$-$C_{20}$ alkyl)cycloheptenyl group, a ($C_1$-$C_{20}$ alkyl)bicyclo[1.1.1]pentyl group, a ($C_1$-$C_{20}$ alkyl)bicyclo[2.1.1]hexyl group, a ($C_1$-$C_{20}$ alkyl)bicyclo[2.2.2]octyl group, a phenyl group, a ($C_1$-$C_{20}$ alkyl)phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, a benzoisothiazolyl group, a benzoxazolyl group, a benzoisoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, an azacarbazolyl group, an azadibenzofuranyl group, an azadibenzothiophenyl group, or any combination thereof; or $—N(Q_1)(Q_2)$, $—Si(Q_3)(Q_4)(Q_5)$, $—Ge(Q_3)(Q_4)(Q_5)$, $—B(Q_6)(Q_7)$, $—P(=O)(Q_8)(Q_9)$, or $—P(Q_8)(Q_8)$, wherein $Q_1$ to $Q_9$ may each independently be:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$;

an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, a phenyl group, a biphenyl group, or a naphthyl group, each unsubstituted or substituted with deuterium, a $C_1$-$C_{10}$ alkyl group, a phenyl group, or any combination thereof.

In some embodiments, in Formula 1-1, R''', $R_7$, $R_8$, $T_{11}$ to $T_{14}$, $T_{21}$ to $T_{23}$, $T_{31}$ to $T_{33}$ and $T_{41}$ to $T_{44}$ may each independently be:

hydrogen, deuterium, —F, or a cyano group; or a $C_1$-$C_{20}$ alkyl group, a $C_3$-$C_{10}$ cycloalkyl group, a phenyl group, a biphenyl group or a naphtyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a ($C_1$-$C_{20}$ alkyl)$C_3$-$C_{10}$ cycloalkyl group, a deuterated $C_3$-$C_{10}$ cycloalkyl group, a fluorinated $C_3$-$C_{10}$ cycloalkyl group, or any combination thereof.

In Formula 1-1, c7, c11 to c14, c21 to c23, c31 to c33 and c41 to c44 may respectively indicate the number of $R_7$, $T_{11}$ to $T_{14}$, $T_{21}$ to $T_{23}$, $T_{31}$ to $T_{33}$ and $T_{41}$ to $T_{44}$, and c7, c11 to c14, c21 to c23, c31 to c33 and c41 to c44 may each independently be 1, 2, 3, 4, or 5. For example, c7, c11 to c14, c21 to c23, c31 to c33 and c41 to c44 may each independently be 1 or 2.

The organometallic compound represented by Formula 1-1 may satisfy:

1) one of Condition 11, Condition 12 and Condition 13,
2) Condition 11 and Condition 13, or
3) Condition 12 and Condition 13.

$Z_{42}$ in Formula 1-1 is C-[$(L_{42})_{b42}$-$(T_{42})_{c42}$], Condition 11

$T_{42}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c42 is 1.

$Z_{42}$ in Formula 1-1 is C-[$(L_{42})_{b42}$-$(T_{42})_{c42}$], Condition 12

$T_{42}$ is a group represented by Formula 41, and c42 is 1:

$$*—C(Q_{41})(Q_{42})(Q_{43}) \quad \text{Formula 41}$$

wherein in Formula 41, $Q_{41}$ to $Q_{43}$ are each independently deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, at least one of $Q_{41}$ to $Q_{43}$ are each independently a substituted or unsubstituted $C_2$-$C_{60}$ alkyl group, a substituted or unsubstituted $C_3$-$C_{10}$ cycloalkyl group, or a substituted or unsubstituted $C_6$-$C_{60}$ aryl group, and

* indicates a binding site to an adjacent atom.

$X_{51}$ in Formula 1-1 is N-[$(L_7)_{b7}$-$(R_7)_{c7}$], Condition 13

$L_7$ is a benzene group, or a naphthalene group, each unsubstituted or substituted with at least one $R_{10a}$, $R_7$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c7 is 1.

In some embodiments, the organometallic compound represented by Formula 1-1 may satisfy Condition 11 or Condition 12.

In some embodiments, the organometallic compound represented by Formula 1-1 may satisfy Condition 11 and $L_{42}$ may be a benzene group, or a naphthalene group, each unsubstituted or substituted with at least one $R_{10a}$.

In some embodiments, the organometallic compound represented by Formula 1-1 may satisfy Condition 12 and $L_{42}$ may be a benzene group, or a naphthalene group, each unsubstituted or substituted with at least one $R_{10a}$.

In some embodiments, the organometallic compound represented by Formula 1-1 may satisfy Condition 11 or Condition 13, and $T_{42}$ and $R_7$ may each independently be a $C_3$-$C_{10}$ cycloalkyl group unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a ($C_1$-$C_{20}$ alkyl) phenyl group, a deuterated phenyl group, or a fluorinated phenyl group.

In some embodiments, the organometallic compound represented by Formula 1-1 may satisfy Condition 12, and $Q_{41}$ to $Q_{43}$ in Formula 41 may each independently be: deuterium; or a $C_1$-$C_{20}$ alkyl group, a $C_3$-$C_{10}$ cycloalkyl group, a phenyl group, a biphenyl group or a naphtyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a ($C_1$-$C_{20}$ alkyl) $C_3$-$C_{10}$ cycloalkyl group, a deuterated $C_3$-$C_{10}$ cycloalkyl group, a fluorinated $C_3$-$C_{10}$ cycloalkyl group, or any combination thereof.

In some embodiments, the organometallic compound represented by Formula 1-1 may satisfy Condition 12 and at least one of $Q_{41}$ to $Q_{43}$ in Formula 41 may each independently be a $C_2$-$C_{20}$ alkyl group, a $C_3$-$C_{10}$ cycloalkyl group, a phenyl group, a biphenyl group or a naphtyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a ($C_1$-$C_{20}$ alkyl) $C_3$-$C_{10}$ cycloalkyl group, a deuterated $C_3$-$C_{10}$ cycloalkyl group, or a fluorinated $C_3$-$C_{10}$ cycloalkyl group.

Each of i) at least two of $T_{11}$ to $T_{14}$, ii) at least two of $T_{21}$ to $T_{23}$, iii) at least two of $T_{31}$ to $T_{33}$, iv) at least two of $T_{41}$ to $T_{44}$ and v) at least two of $T_{11}$ to $T_{14}$, $T_{21}$ to $T_{23}$, $T_{31}$ to $T_{33}$, and $T_{41}$ to $T_{44}$ may optionally be bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$.

$R_{10a}$ may be understood by referring to the description of $T_{11}$ provided herein, and a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—Ge(Q_{13})(Q_{14})(Q_{15})$, $—B(Q_{16})(Q_{17})$, $—P({=}O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_0$ aryl group, a $C_6$-$C_0$ aryloxy group, a $C_6$-$C_{60}$ arylthio group, a $C_1$-$C_0$ heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(=O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(=O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_0$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

In an embodiment, in Formula 1-1, $X_{51}$ may be N-[$(L_7)_{b7}$-$(R_7)_{c7}$], and the group represented by *-[$(L_7)_{b7}$-$(R_7)_{c7}$] may be a group represented by Formula N51:

Formula N51

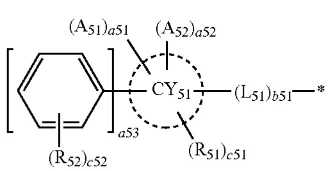

wherein, in Formula N51, ring $CY_{51}$ may be a $C_5$-$C_{30}$ carbocyclic group or a $C_1$-$C_{30}$ heterocyclic group. For example, ring $CY_{51}$ may be a benzene group or a naphthalene group.

In Formula N51, $L_{51}$, b51, $R_{51}$, and c51 may respectively be understood by referring to the descriptions of $L_7$, b7, $R_7$, and c7 provided herein, and $R_{52}$ and c52 may respectively be understood by referring to the descriptions of $R_7$ and c7 provided herein.

In Formula N51, $A_{51}$ may be a $C_1$-$C_{60}$ alkyl group unsubstituted or substituted with a $C_3$-$C_{10}$ cycloalkyl group. For example, $A_{51}$ may be a $C_1$-$C_{20}$ alkyl group unsubstituted or substituted with a $C_3$-$C_{10}$ cycloalkyl group or a $C_4$-$C_{20}$ alkyl group unsubstituted or substituted with a $C_3$-$C_{10}$ cycloalkyl group.

In Formula N51, $A_{52}$ may be a deuterated $C_1$-$C_{60}$ alkyl group unsubstituted or substituted with a $C_3$-$C_{10}$ cycloalkyl group. For example, $A_{52}$ may be a deuterated $C_1$-$C_{20}$ alkyl group unsubstituted or substituted with a $C_3$-$C_{10}$ cycloalkyl group.

When $X_{51}$ in Formula 1-1 is N-[$(L_7)_{b7}$-$(R_7)_{c7}$] and the group represented by *-[$(L_7)_{b7}$-$(R_7)_{c7}$] is a group represented by Formula N51, an angle between a plane including a transition dipole moment of the organometallic compound and a plane including four atoms of a tetradentate ligand bound to a metal (M) in Formula 1-1 may be 10° or less. In addition, a horizontal orientation ratio of a transition dipole moment of the organometallic compound represented by Formula 1-1 may be in a range of about 80% to about 100%.

For example, an angle between a plane including a transition dipole moment of the organometallic compound and a plane including four atoms of a tetradentate ligand bound to a metal (or platinum) in Formula 1-1 may be in a range of about 0° to about 10°, about 0° to about 9°, about 0° to about 8°, about 0° to about 7°, about 0° to about 6°, about 0° to about 5°, about 0° to about 4°, about 0° to about 3°, about 0° to about 2°, or about 0° to about 1°. As an angle between a plane including a transition dipole moment of the organometallic compound represented by Formula 1-1 and a plane including four atoms bound to a metal in Formula 1-1 is within any of these ranges, the organometallic compound may have excellent planar properties, and a thin film formed using the organometallic compound may have excellent electrical characteristics.

In an embodiment, $A_{51}$ may be a linear or branched $C_4$-$C_{10}$ alkyl group, and $A_{52}$ may be a hydrogen-free deuterated $C_1$-$C_{10}$ alkyl group.

In one or more embodiments, $A_{51}$ may be an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group.

In one or more embodiments, $A_{52}$ may be a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group, each substituted with at least one deuterium (or a hydrogen-free methyl group, a hydrogen-free ethyl group, a hydrogen-free n-propyl group, a hydrogen-free iso-propyl group, a hydrogen-free n-butyl group, a hydrogen-free sec-butyl group, a hydrogen-free isobutyl group, a hydrogen-free tert-butyl group, a hydrogen-free n-pentyl group, a hydrogen-free tert-pentyl group, a hydrogen-free neopentyl group, a hydrogen-free isopentyl group, a hydrogen-free sec-pentyl group, a hydrogen-free 3-pentyl group, or a hydrogen-free sec-isopentyl group, each substituted with at least one deuterium).

In one or more embodiments, in Formulae 1-1 and N51, R''', $R_7$, $R_8$, $T_{11}$ to $T_{14}$, $T_{21}$ to $T_{23}$, $T_{31}$ to $T_{33}$, $T_{41}$ to $T_{44}$, $R_{51}$, and $R_{52}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-39, a group represented by one of Formulae 9-1 to 9-39 in which at least one hydrogen is substituted with deuterium, a group represented by one of Formulae 9-201 to 9-237, a group represented by one of 9-201 to 9-237 in which at least one hydrogen is substituted with deuterium, a group represented by one of Formulae 10-1 to 10-129, a group represented by one of Formulae 10-1 to 10-129 in which at least one hydrogen is substituted with deuterium, a group represented by one of Formulae 10-201 to 10-350, a group represented by one of Formulae 10-201 to 10-350 in which at least one hydrogen is substituted with deuterium, —Si($Q_3$)($Q_4$)($Q_5$), or —Ge($Q_3$)($Q_4$)($Q_5$), wherein $Q_3$ to $Q_5$ may respectively be understood by referring to the descriptions of $Q_3$ to $Q_5$ provided herein.

In one or more embodiments, in Formula N51, $A_{51}$ may be a group represented by one of Formulae 9-4 to 9-39.

In one or more embodiments, in Formula N51, $A_{52}$ may be a group represented by one of Formulae 9-1 to 9-39 in which at least one hydrogen is substituted with deuterium.

In one or more embodiments, in Formula N51, a group represented by

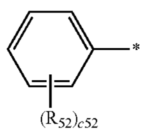

may be a group represented by one of Formulae 10-12 to 10-129:

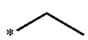
9-1

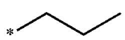
9-2

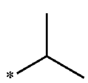
9-3

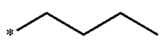
9-4

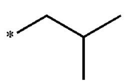
9-5

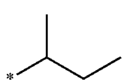
9-6

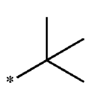
9-7

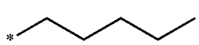
9-8

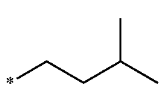
9-9

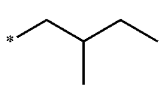
9-10

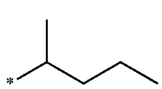
9-11

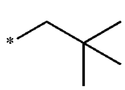
9-12

-continued

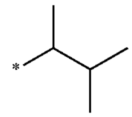
9-13

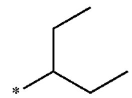
9-14

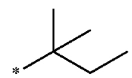
9-15

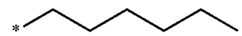
9-16

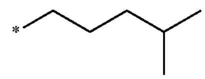
9-17

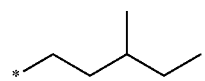
9-18

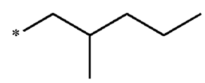
9-19

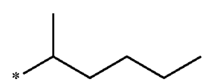
9-20

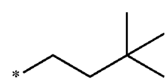
9-21

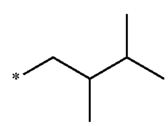
9-22

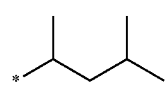
9-23

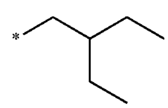
9-24

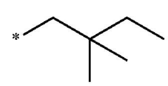
9-25

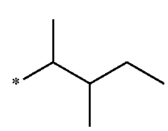
9-26

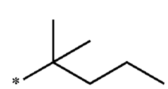
9-27

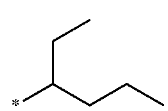
9-28

-continued
9-29
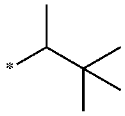
9-30
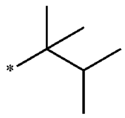
9-31
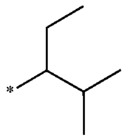
9-32
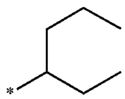
9-33
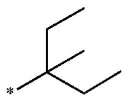
9-34
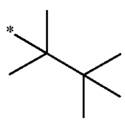
9-35
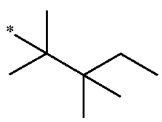
9-36
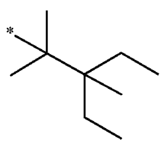
9-37
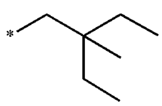
9-38
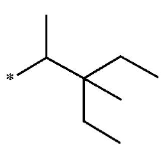
9-39
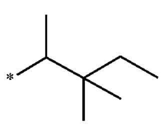
9-201
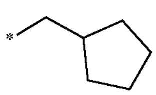
9-202
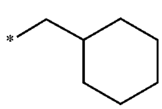
-continued
9-203
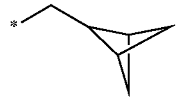
9-204
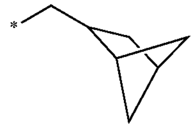
9-205
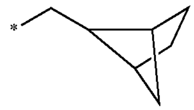
9-206
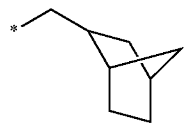
9-207
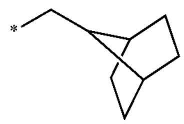
9-208
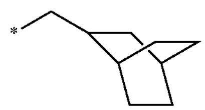
9-209
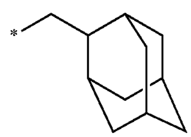
9-210
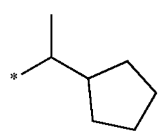
9-211
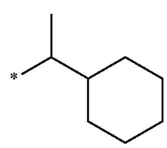
9-212
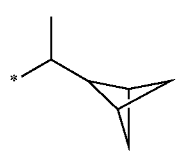
9-213
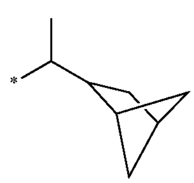

-continued
9-214
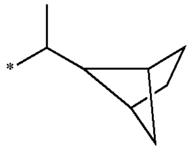
9-215
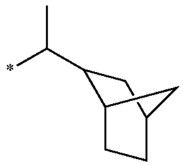
9-216
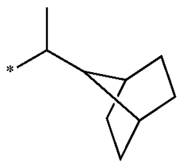
9-217
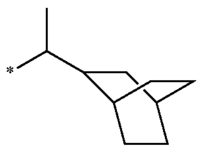
9-218
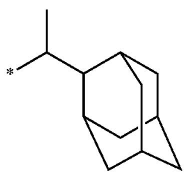
9-219
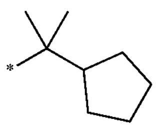
9-220
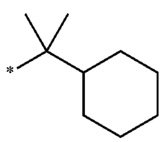
9-221
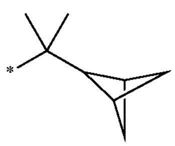
9-222
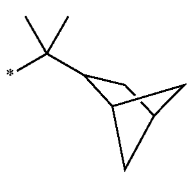
9-223
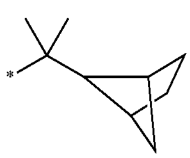
-continued
9-224
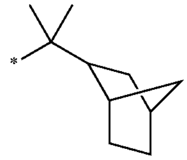
9-225
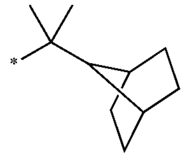
9-226
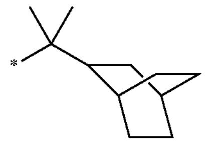
9-227
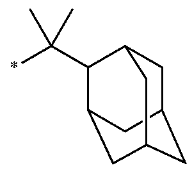
9-228
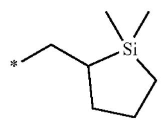
9-229
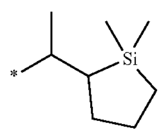
9-230
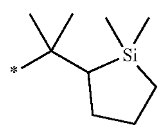
9-231
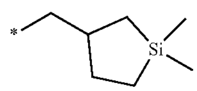
9-232
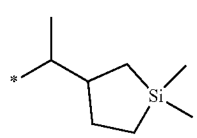
9-233
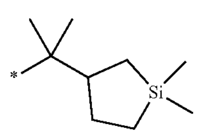
9-234
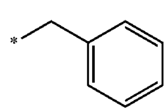

-continued
9-235
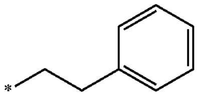
9-236
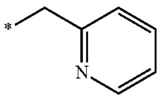
9-237
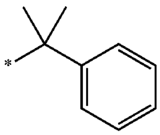
10-1
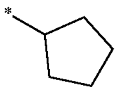
10-2
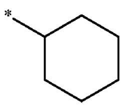
10-3
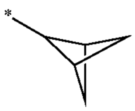
10-4
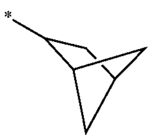
10-5
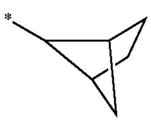
10-6
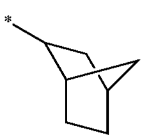
10-7
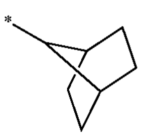
10-8
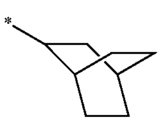
10-9
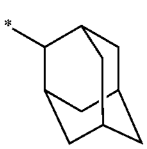
-continued
10-10
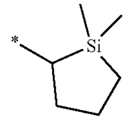
10-11
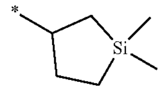
10-12
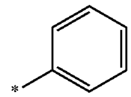
10-13
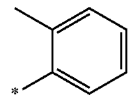
10-14
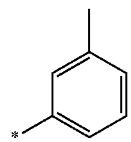
10-15
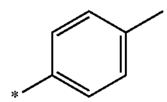
10-16
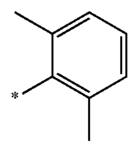
10-17
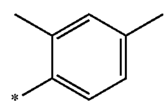
10-18
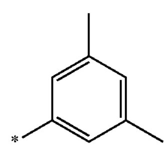
10-19
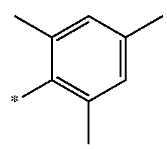
10-20
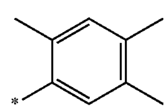
10-21
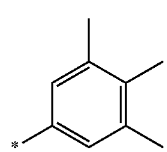

-continued
10-22
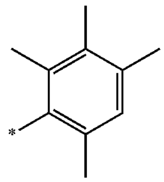
10-23
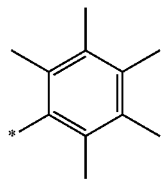
10-24
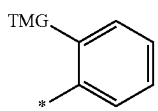
10-25
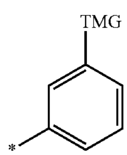
10-26
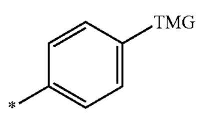
10-27
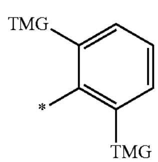
10-28
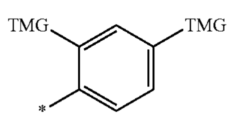
10-29
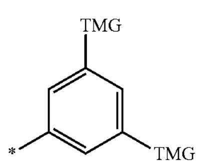
10-30
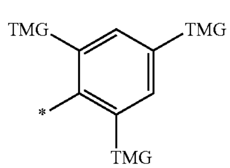
10-31
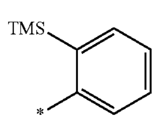
-continued
10-32
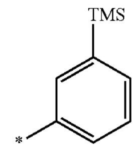
10-33
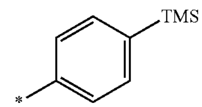
10-34
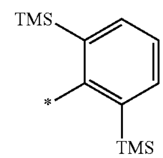
10-35
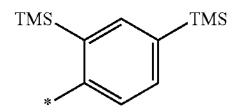
10-36
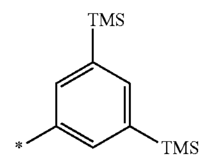
10-37
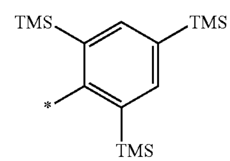
10-38
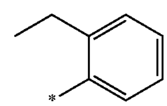
10-39
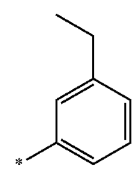
10-40
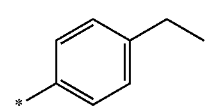
10-41
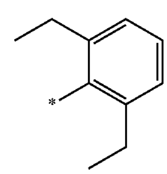
10-42
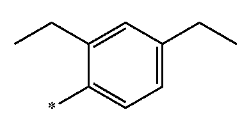

-continued
10-43
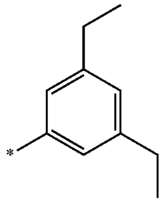
10-44
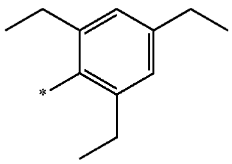
10-45
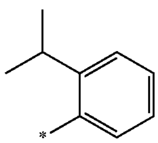
10-46
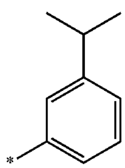
10-47
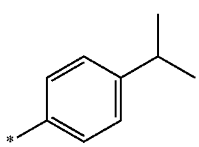
10-48
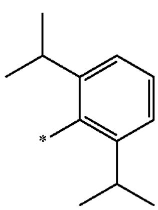
10-49
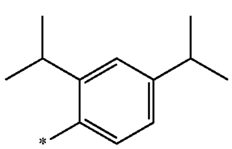
10-50
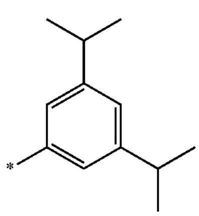
10-51
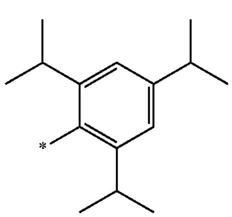
-continued
10-52
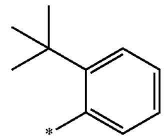
10-53
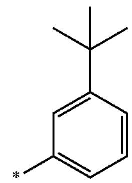
10-54
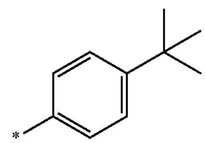
10-55
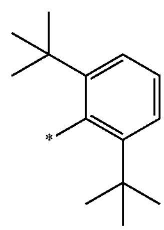
10-56
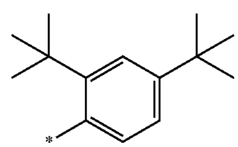
10-57
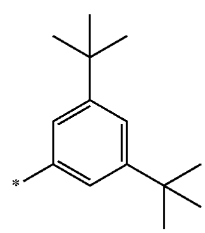
10-58
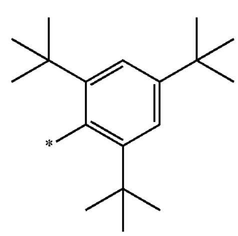
10-59
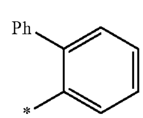
10-60
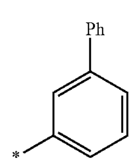

-continued
10-61
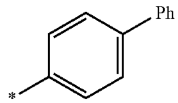
10-62
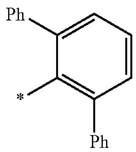
10-63
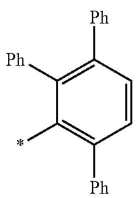
10-64
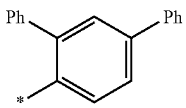
10-65
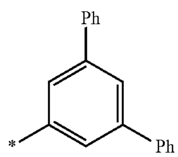
10-66
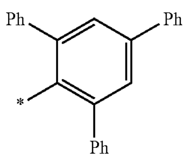
10-67
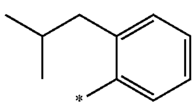
10-68
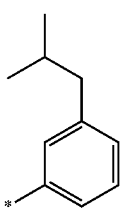
10-69
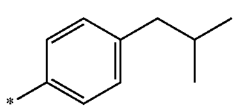
10-70
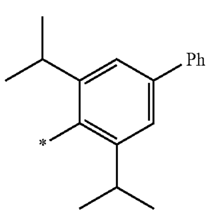
-continued
10-71
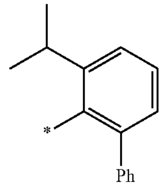
10-72
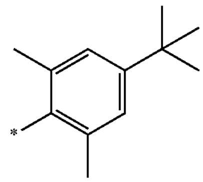
10-73
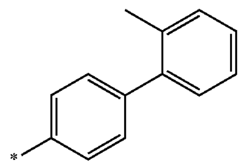
10-74
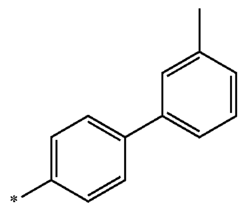
10-75
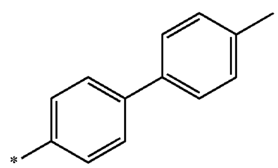
10-76
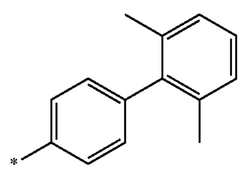
10-77
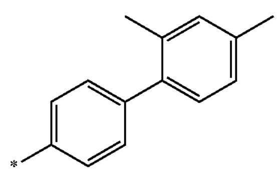
10-78
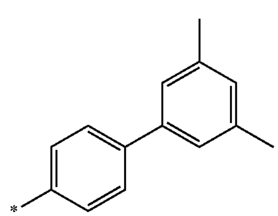

-continued
10-79
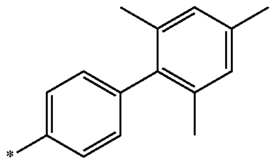
10-80
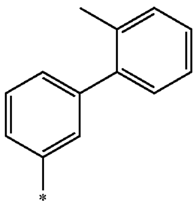
10-81
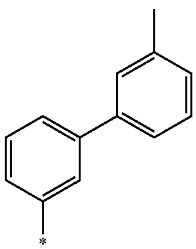
10-82
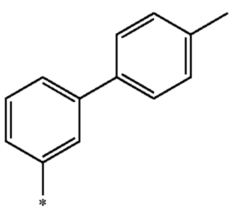
10-83
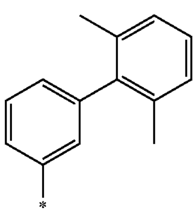
10-84
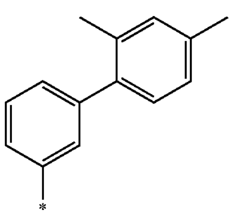
10-85
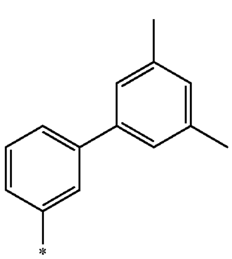
-continued
10-86
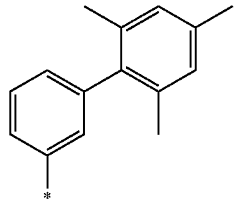
10-87
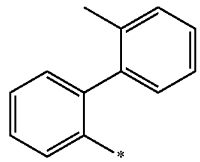
10-88
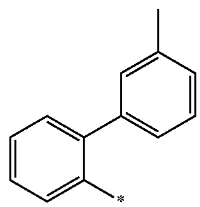
10-89
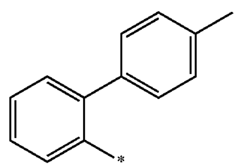
10-90
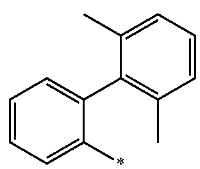
10-91
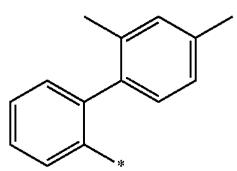
10-92
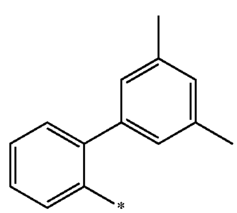
10-93
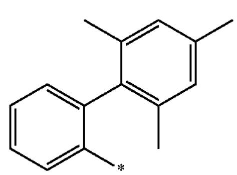

-continued
10-94
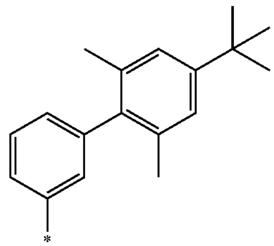
10-95
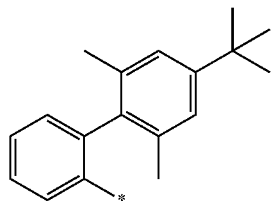
10-96
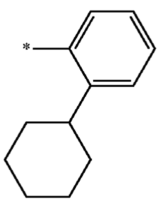
10-97
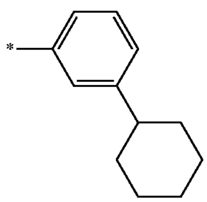
10-98
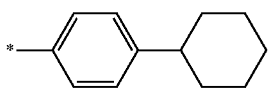
10-99
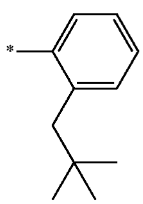
10-100
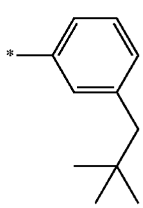
10-101
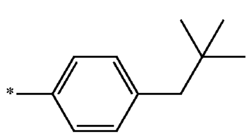
-continued
10-102
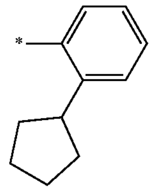
10-103
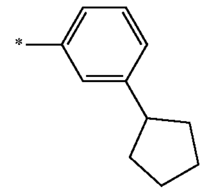
10-104
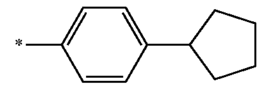
10-105
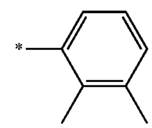
10-106
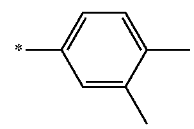
10-107
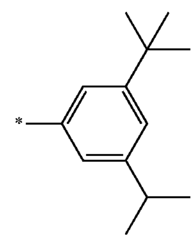
10-108
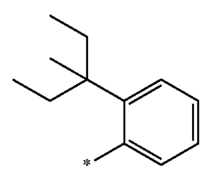
10-109
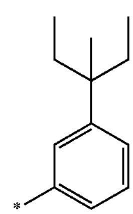
10-110
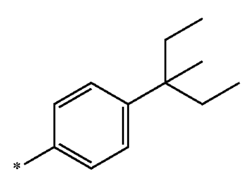

-continued
10-111
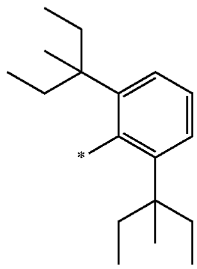
10-112
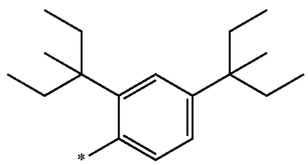
10-113
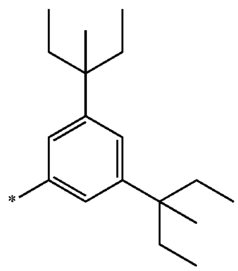
10-114
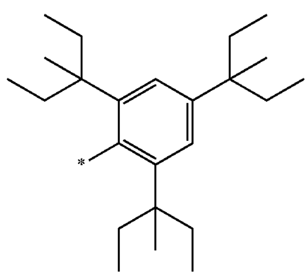
10-115
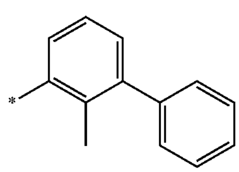
10-116
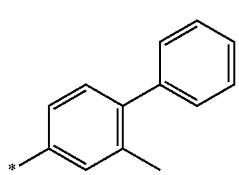
10-117
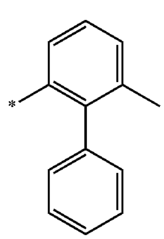
-continued
10-118
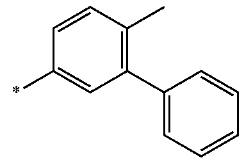
10-119
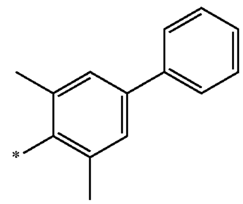
10-120
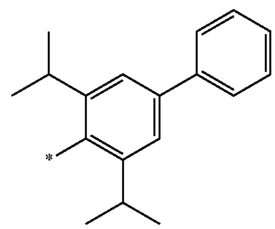
10-121
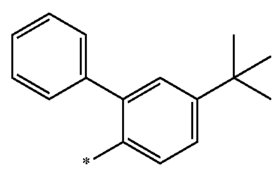
10-122
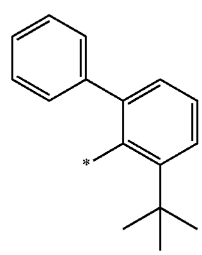
10-123
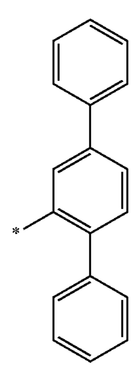

-continued
10-124
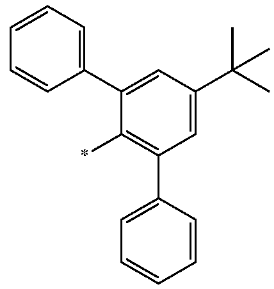
10-125
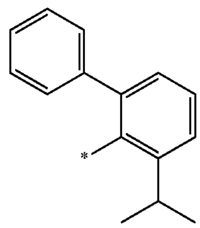
10-126
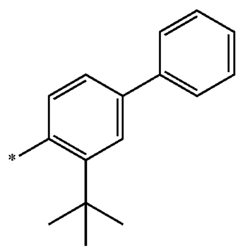
10-127
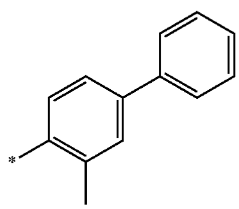
10-128
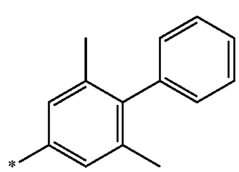
10-129
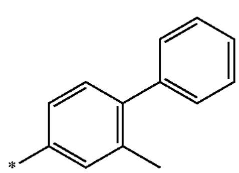
10-201
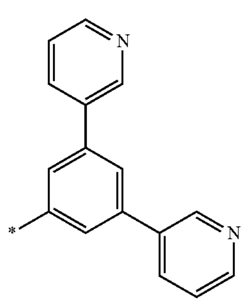
-continued
10-202
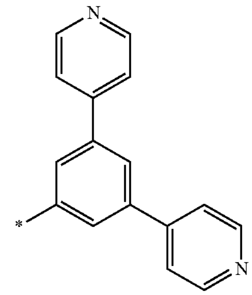
10-203
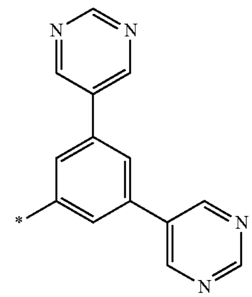
10-204
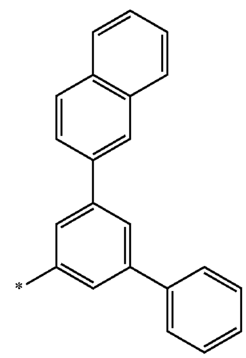
10-205
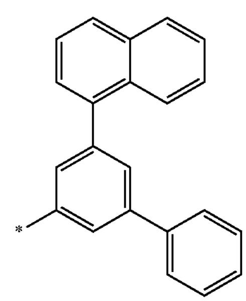
10-206
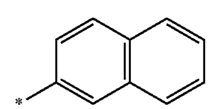
10-207
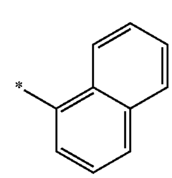
10-208
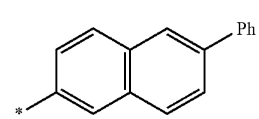

-continued
10-209
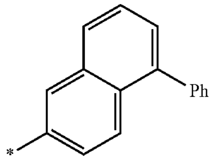
10-210
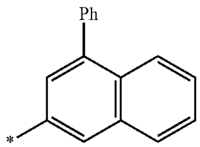
10-211
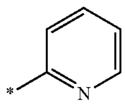
10-212
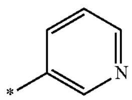
10-213
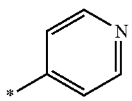
10-214
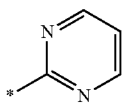
10-215
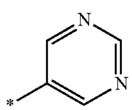
10-216
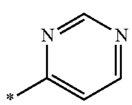
10-217
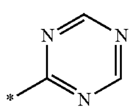
10-218
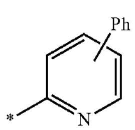
10-219
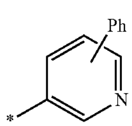
10-220
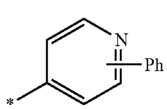
-continued
10-221
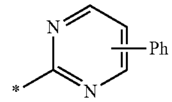
10-222
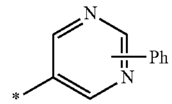
10-223
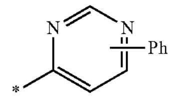
10-224
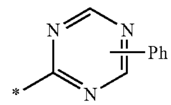
10-225
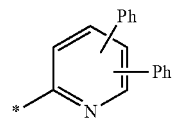
10-226
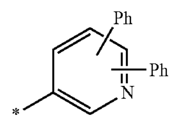
10-227
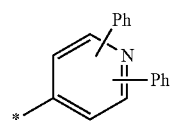
10-228
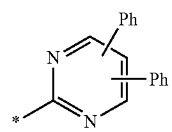
10-229
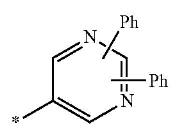
10-230
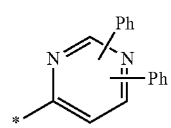
10-231
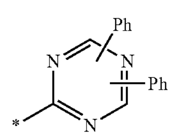
10-232
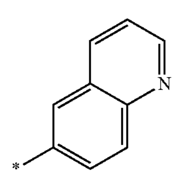

-continued
10-233
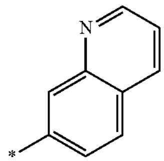
10-234
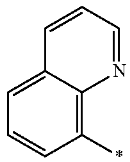
10-235
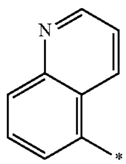
10-236
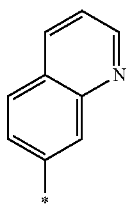
10-237
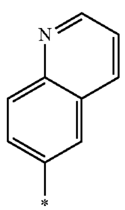
10-238
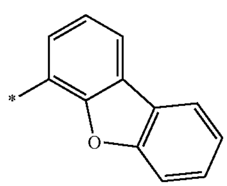
10-239
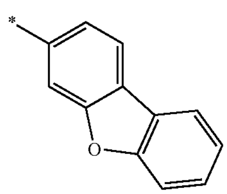
10-240
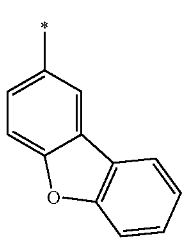
-continued
10-241
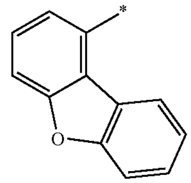
10-242
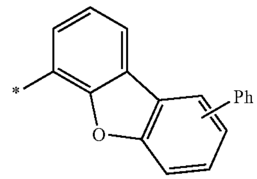
10-243
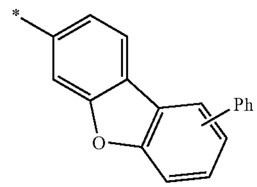
10-244
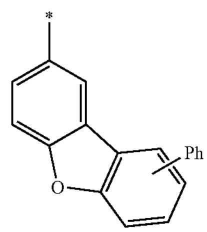
10-245
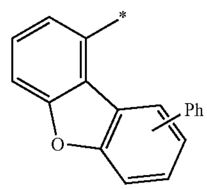
10-246
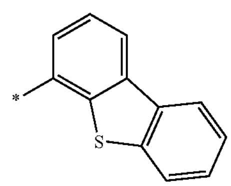
10-247
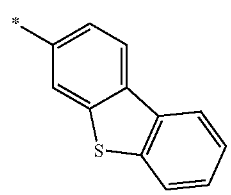
10-248
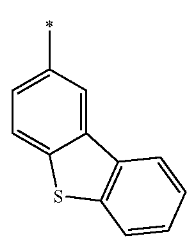

-continued
10-249
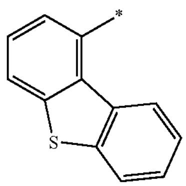
10-250
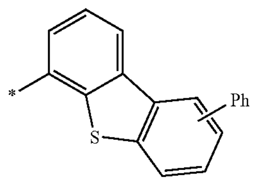
10-251
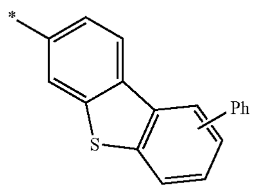
10-252
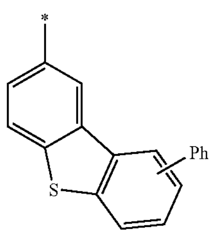
10-253
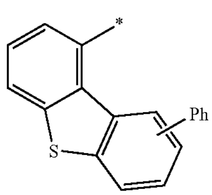
10-254
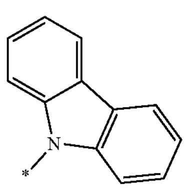
10-255
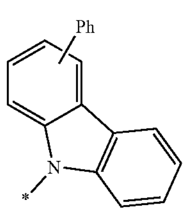
10-256
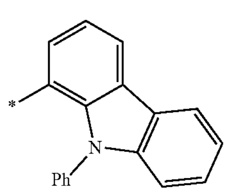
-continued
10-257
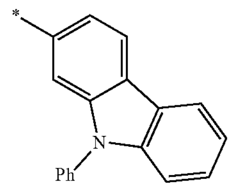
10-258
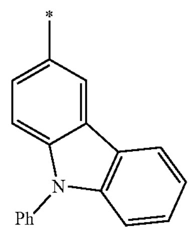
10-259
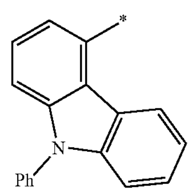
10-260
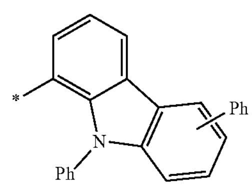
10-261
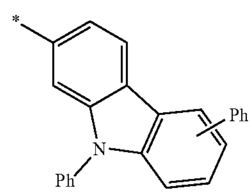
10-262
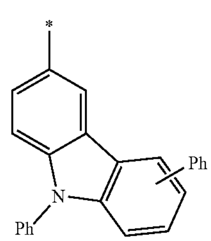
10-263
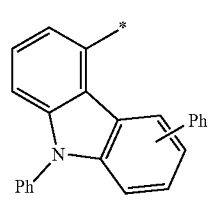

-continued
10-264
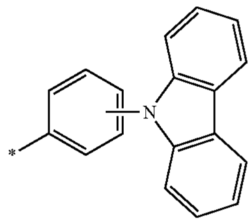
10-265
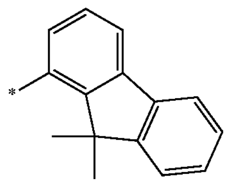
10-266
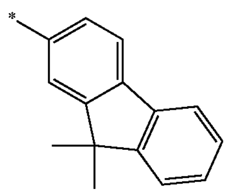
10-267
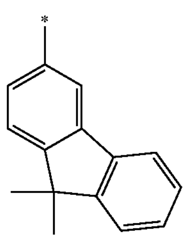
10-268
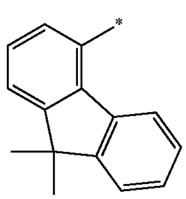
10-269
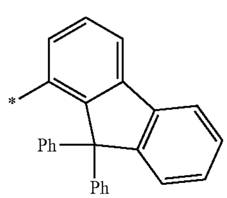
10-270
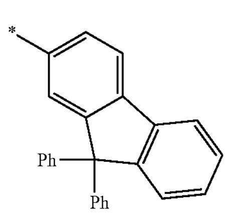
-continued
10-271
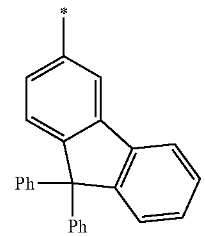
10-272
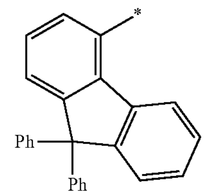
10-273
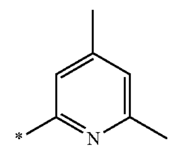
10-274
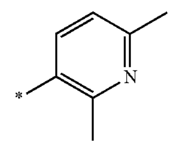
10-275
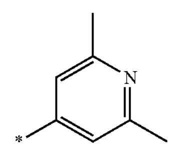
10-276
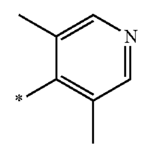
10-277
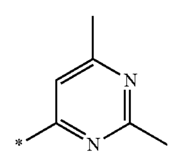
10-278
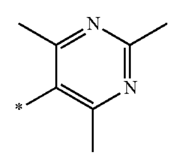
10-279
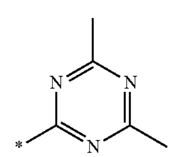

-continued
10-280
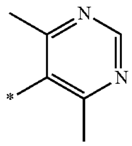
10-281
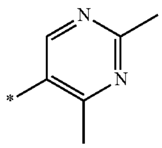
10-282
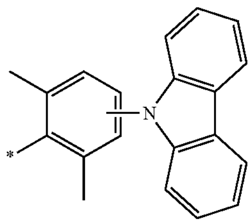
10-283
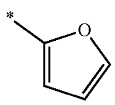
10-284
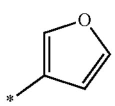
10-285
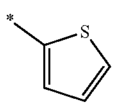
10-286
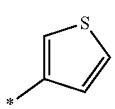
10-287
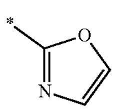
10-288
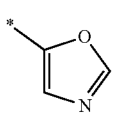
10-289
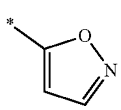
10-290
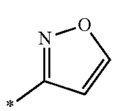
10-291
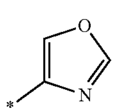
-continued
10-292
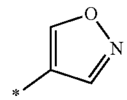
10-293
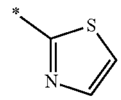
10-294
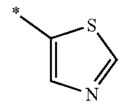
10-295
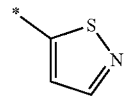
10-296
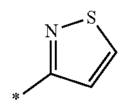
10-297
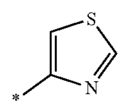
10-298
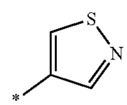
10-299
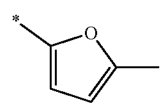
10-300
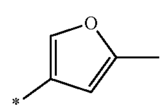
10-301
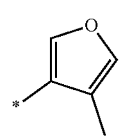
10-302
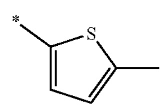
10-303
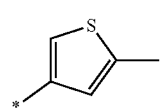
10-304
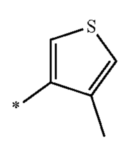

10-305
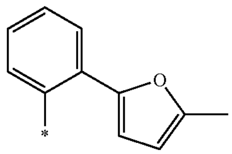
10-306
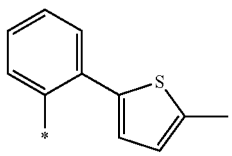
10-307
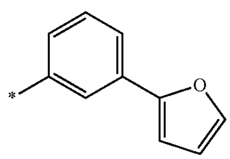
10-308
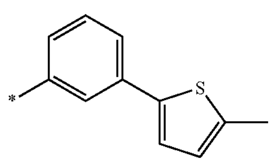
10-309
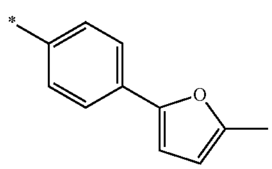
10-310
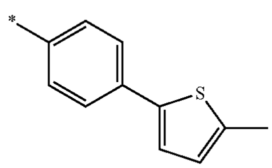
10-311
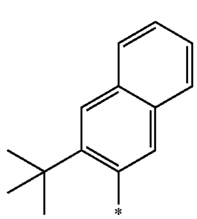
10-312
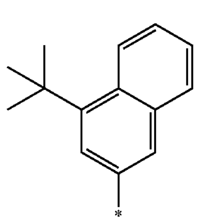
10-313
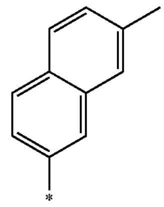
10-314
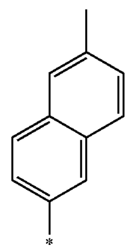
10-315
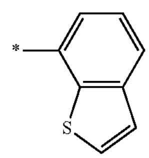
10-316
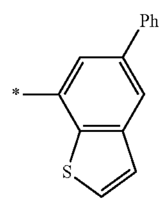
10-317
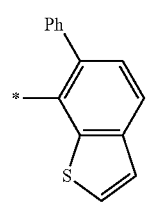
10-318
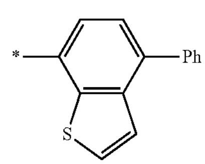
10-319
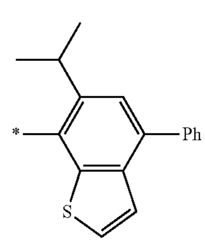

-continued
10-320
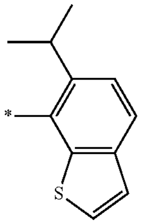
10-321
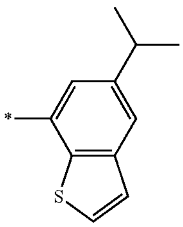
10-322
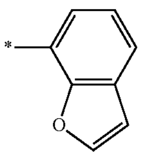
10-323
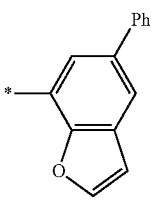
10-324
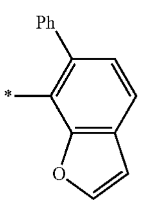
10-325
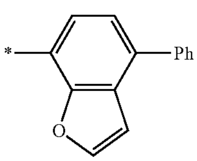
10-326
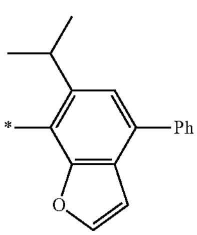
-continued
10-327
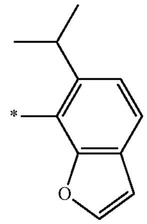
10-328
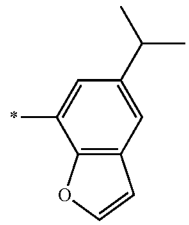
10-329
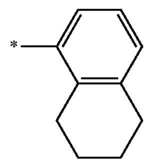
10-330
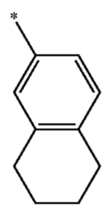
10-331
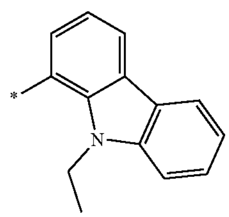
10-332
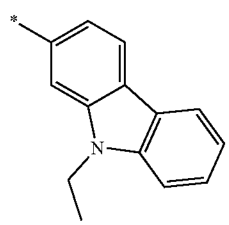
10-333
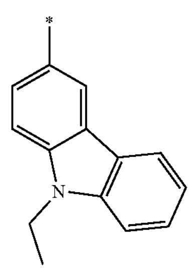

-continued 10-334

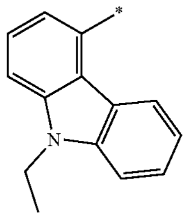

10-335

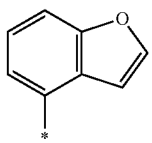

10-336

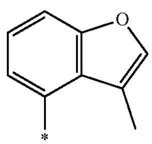

10-337

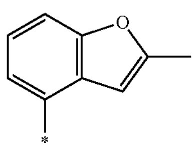

10-338

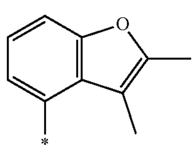

10-339

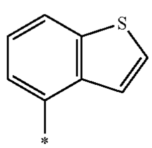

10-340

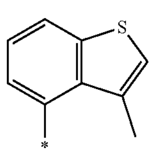

10-341

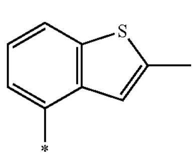

10-342

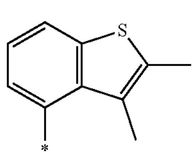

-continued 10-343

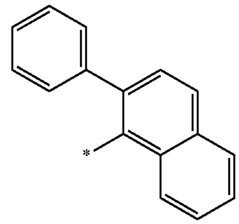

10-344

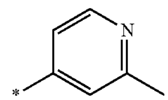

10-345

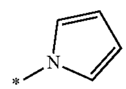

10-346

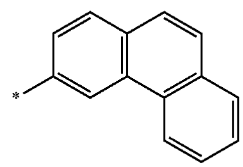

10-347

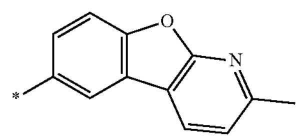

10-348

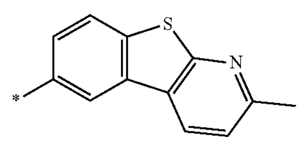

10-349

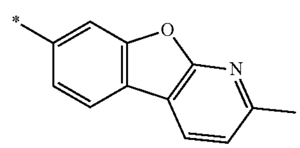

10-350

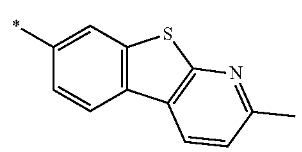

In Formulae 9-1 to 9-39, 9-201 to 9-237, 10-1 to 10-129, and 10-201 to 10-350, * indicates a binding site to an adjacent atom, “Ph” represents a phenyl group, “TMS” represents a trimethylsilyl group, and “TMG” represents a trimethylgermyl group.

The “group represented by one of Formulae 9-1 to 9-39 in which at least one hydrogen is substituted with deuterium” and the “group represented by one of Formulae 9-201 to 9-237 in which at least one hydrogen is substituted with deuterium” may each be, for example, a group represented by one of Formulae 9-501 to 9-514 and 9-601 to 9-636:

-continued
9-501
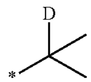
9-502
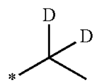
9-503
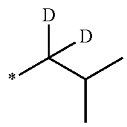
9-504
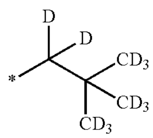
9-505
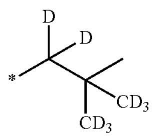
9-506
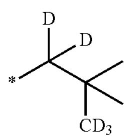
9-507
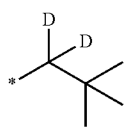
9-508
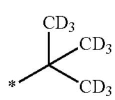
9-509
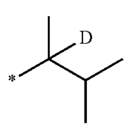
9-510
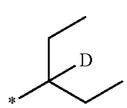
9-511
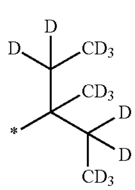
9-512
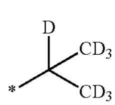
9-513
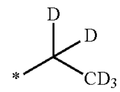
9-514
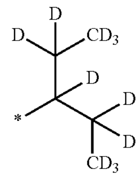
9-601
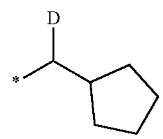
9-602
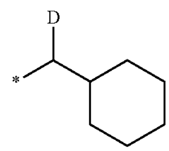
9-603
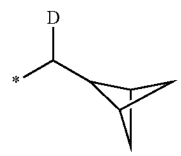
9-604
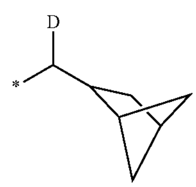
9-605
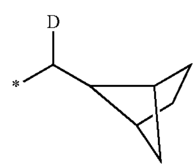
9-606
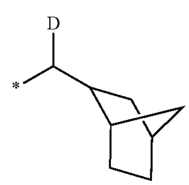
9-607
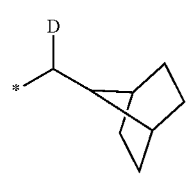
9-608
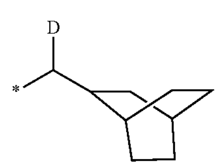

-continued
9-609
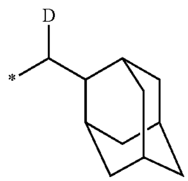
9-610
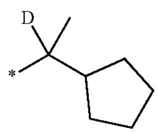
9-611
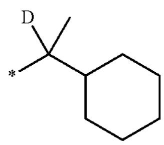
9-612
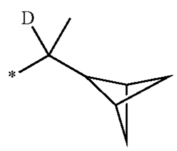
9-613
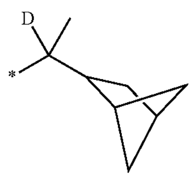
9-614
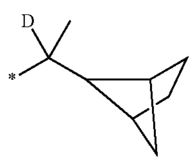
9-615
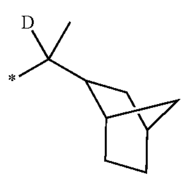
9-616
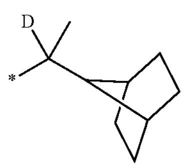
9-617
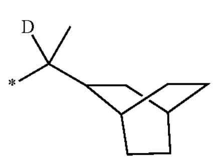
-continued
9-618
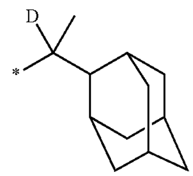
9-619
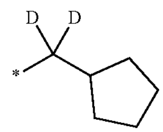
9-620
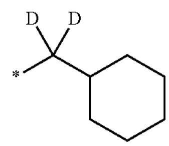
9-621
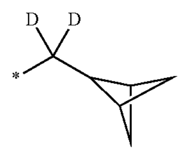
9-622
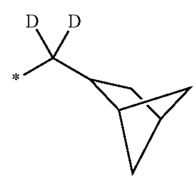
9-623
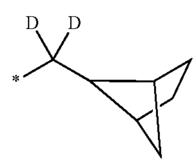
9-624
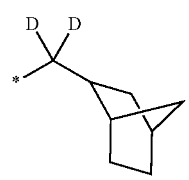
9-625
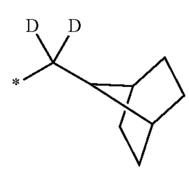
9-626
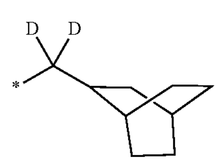

-continued
9-627
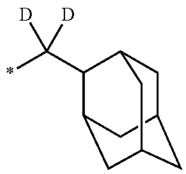
9-628
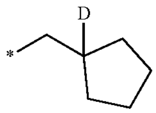
9-629
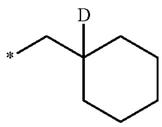
9-630
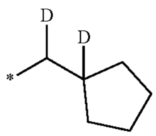
9-631
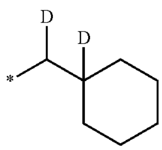
9-632
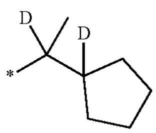
9-633
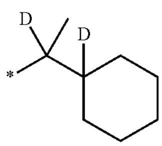
9-634
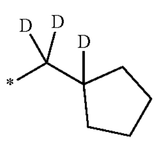
9-635
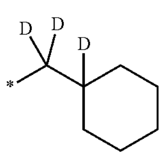
9-636
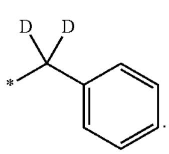
The "group represented by one of Formulae 10-1 to 10-129 in which at least one hydrogen is substituted with deuterium" and the "group represented by one of Formulae 10-201 to 10-350 in which at least one hydrogen is substituted with deuterium" may each be, for example, a group represented by one of Formulae 10-501 to 553:
10-501
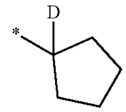
10-502
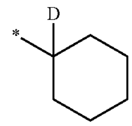
10-503
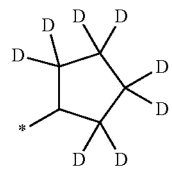
10-504
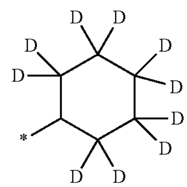
10-505
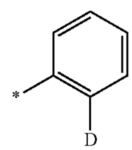
10-506
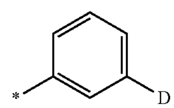
10-507
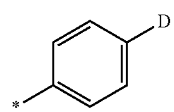
10-508
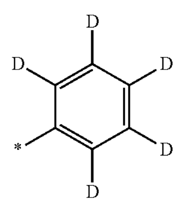
10-509
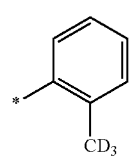
10-510
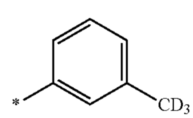
10-511
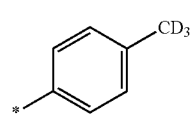

-continued
10-512
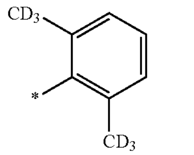
10-513
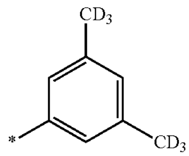
10-514
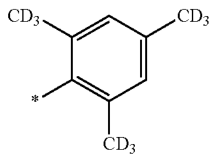
10-515
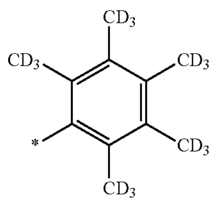
10-516
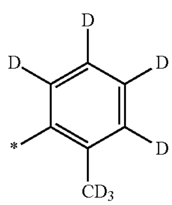
10-517
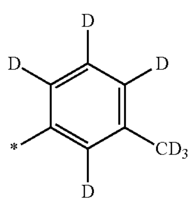
10-518
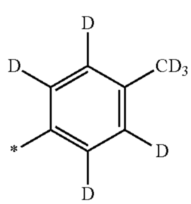
10-519
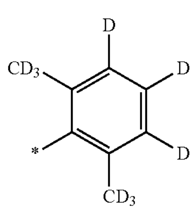
-continued
10-520
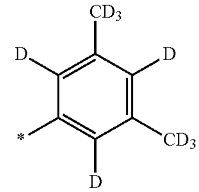
10-521
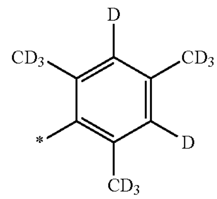
10-522
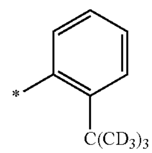
10-523
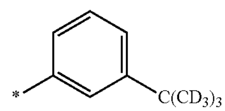
10-524
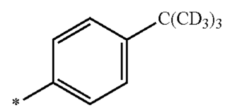
10-525
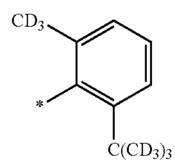
10-526
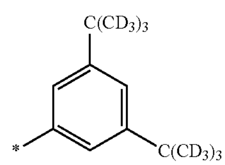
10-527
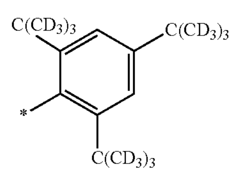
10-528
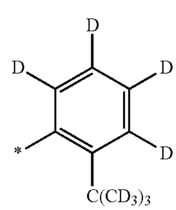

-continued
10-529
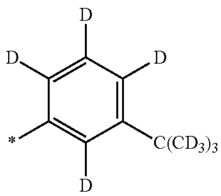
10-530
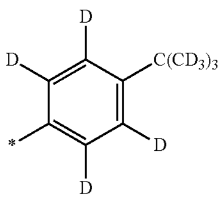
10-531
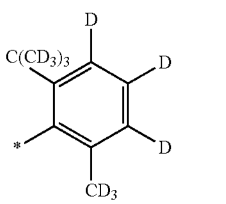
10-532
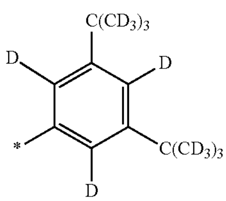
10-533
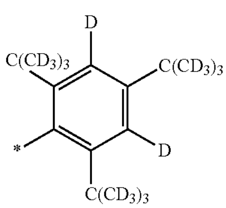
10-534
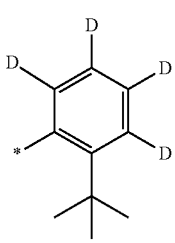
10-535
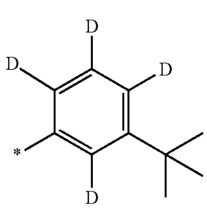
-continued
10-536
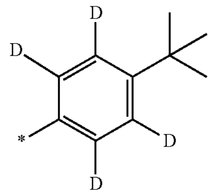
10-537
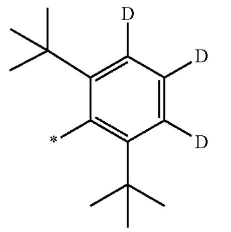
10-538
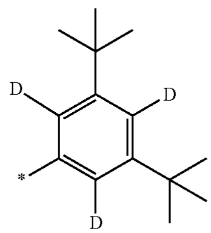
10-540
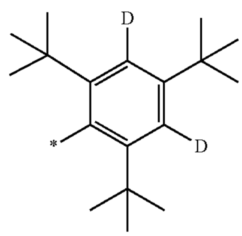
10-541
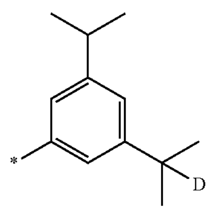
10-542
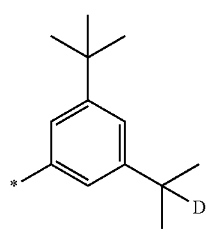
10-543
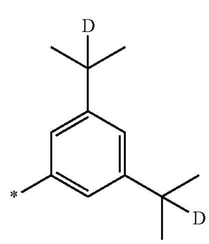

-continued

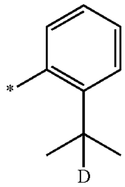

10-544

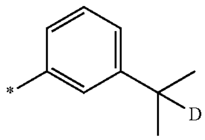

10-545

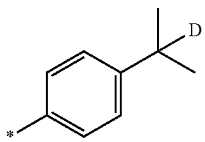

10-546

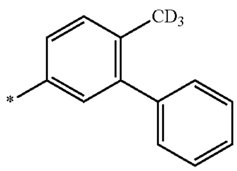

10-547

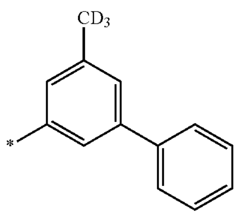

10-548

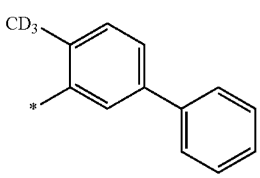

10-549

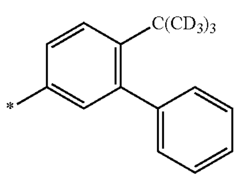

10-550

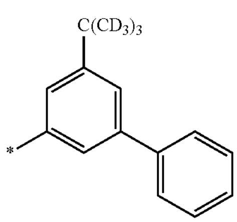

10-551

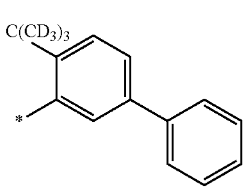

10-552

-continued 10-553

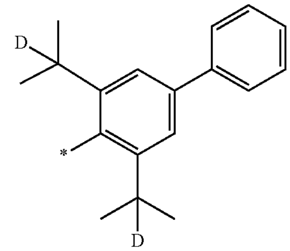

In some embodiments, in Formula N51, $A_{52}$ may be a group represented by one of Formulae 9-1 to 9-39 in which all hydrogens are substituted with deuterium atoms.

In one or more embodiments, in Formula 1-1, $X_{51}$ may be N-$[(L_7)_{b7}$-$(R_7)_{c7}]$, and a group represented by *-$[(L_7)_{b7}$-$(R_7)_{c7}]$ may be a phenyl group substituted with both 1) at least one $C_4$-$C_{10}$ alkyl group and 2) at least one phenyl group.

In one or more embodiments, in Formula 1-1, $X_{51}$ may be N-$[(L_7)_{b7}$-$(R_7)_{c7}]$, and a group represented by *-$[(L_7)_{b7}$-$(R_7)_{c7}]$ may be a phenyl group substituted with both 1) at least one tert-butyl group and 2) at least one phenyl group.

In Formula N51, a51 and a52 may respectively indicate the number of $A_{51}$(s) and $A_{52}$(s), and a51 and a52 may each independently be an integer from 0 to 10. When a51 is 2 or greater, at least two $A_{51}$(s) may be identical to or different from each other. When a52 is 2 or greater, at least two $A_2$(s) may be identical to or different from each other.

For example, in Formula N51, a51 and a52 may each independently be 0, 1, 2, 3, 4, 5, or 6.

In Formula N51, a sum of a51 and a52 may be 1 or greater. That is, in Formula N51, ring $CY_{51}$ is substituted with the group represented by $A_{51}$, the group represented by $A_{52}$, or any combination thereof. While not wishing to be bound by theory, ring $CY_{51}$ is substituted with at least one electron donating group, and thus, an electronic device, e.g., an organic light-emitting device, including the organometallic compound represented by Formula 1-1 including the group represented by Formula N51 may have improved luminescence efficiency and lifespan.

In some embodiments, a sum of a51 and a52 may be 1, 2, or 3. In an embodiment, a sum of a51 and a52 may be 1.

In Formula N51, a53 indicates the number of a group represented by

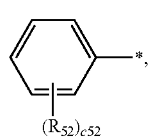

and a53 may be an integer from 1 to 10. That is, a53 in Formula N51 may not be 0, and thus ring $CY_{51}$ in Formula N51 is substituted with at least one group represented by

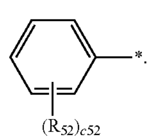

While not wishing to be bound by theory, due to resonance effects of the group represented by

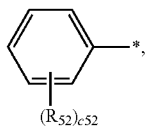

an electronic device, e.g., an organic light-emitting device, including the organometallic compound represented by Formula 1-1 including the group represented by Formula N51, may have improved luminescence efficiency and lifespan. While not wishing to be bound by theory, because a benzimidazole group in Formula 1-1 including the group represented by Formula N51 may be protected from electrons or heat by the group represented by

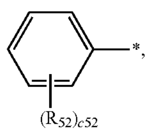

an electronic device, e.g., an organic light-emitting device, including the organometallic compound represented by Formula 1-1 may have improved luminescence efficiency and lifespan.

In an embodiment, in Formula N51, a51 and a52 may each independently be 0, 1, or 2 (e.g., 0 or 1), and a sum of a51 and a52 may be 1 or 2 (e.g., 1), and a53 may be 1 or 2 (e.g., 1).

In Formula N51, * indicates a binding site to an adjacent atom.

In one or more embodiments, in Formula N51, the group represented by

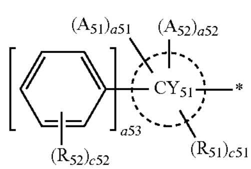

may be a group represented by one of Formulae 51-1 to 51-20:

51-1

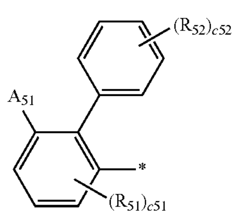

51-2

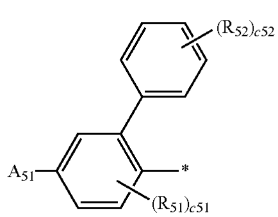

-continued 51-3

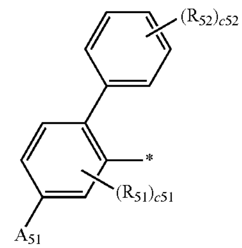

51-4

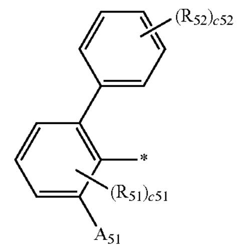

51-5

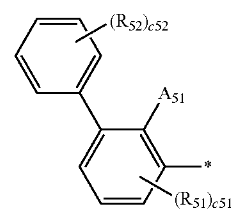

51-6

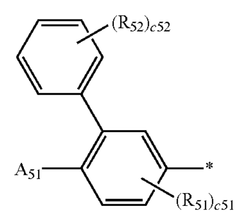

51-7

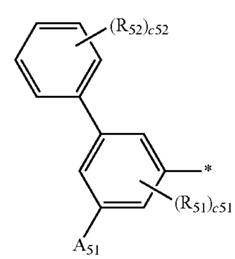

51-8

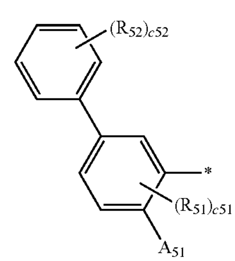

51-9

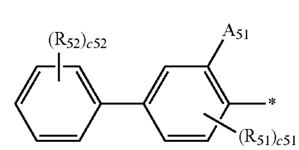

-continued 51-10

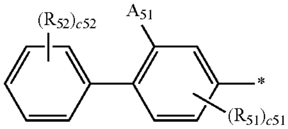

51-11

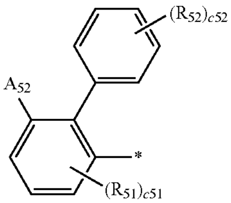

51-12

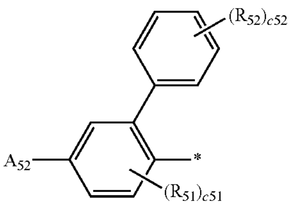

51-13

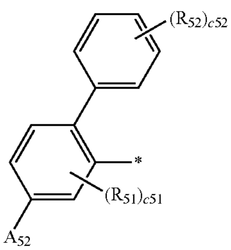

51-14

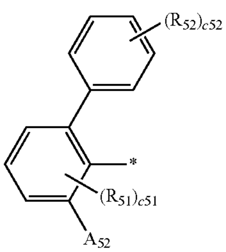

51-15

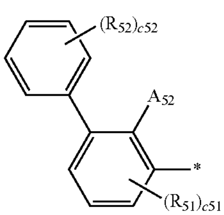

51-16

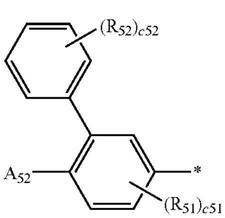

-continued 51-17

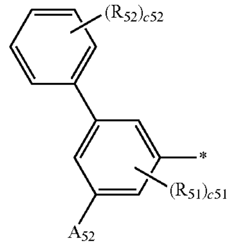

51-18

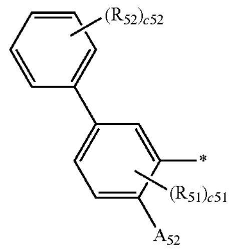

51-19

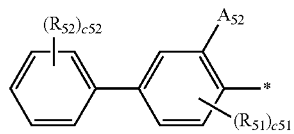

51-20

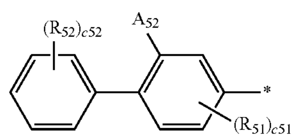

wherein, in Formulae 51-1 to 51-20, $R_{51}$, $R_{52}$, c51, c52, $A_{51}$, and $A_{52}$ may respectively be understood by referring to the descriptions of $R_{51}$, $R_{52}$, c51, c52, $A_{51}$, and $A_{52}$ provided herein, and * indicates a binding site to $L_{51}$.

In one or more embodiments, in Formula 1-1, each of $Z_{12}$ and $Z_{14}$ may be C(H).

In one or more embodiments, in Formula 1-1, each of $Z_{11}$ may be C-[$(L_{11})_{b11}$-$(T_{11})_{c11}$] and $T_{11}$ may not be hydrogen.

In one or more embodiments, in Formula 1-1, each of $Z_{13}$ may be C-[$(L_{13})_{b13}$-$(T_{13})_{c13}$] and $T_{13}$ may not be hydrogen.

In one or more embodiments, in Formula 1-1, each of $Z_{21}$ to $Z_{22}$ may be C(H).

In one or more embodiments, in Formula 1-1, each of $Z_{31}$ and $Z_{33}$ may be C(H).

In one or more embodiments, in Formula 1-1, $Z_{32}$ may be C-[$(L_{32})_{b32}$-$(T_{32})_{c32}$], $L_{32}$ may be a single bond, and $T_{32}$ may be a substituted or unsubstituted $C_1$-$C_0$ alkyl group or a substituted or unsubstituted $C_6$-$C_0$ aryl group.

In one or more embodiments, in Formula 1-1, each of $Z_{41}$, $Z_{43}$ and $Z_{44}$ may be C(H).

In one or more embodiments, in Formula 1-1, each of $Z_{42}$ may be C-[$(L_{42})_{b42}$-$(T_{42})_{c42}$] and $T_{42}$ may not be hydrogen.

In one or more embodiments, in Formula 1-1, $Z_{11}$ may be C-[$(L_{11})_{b11}$-$(T_{11})_{c11}$], $Z_{12}$ may be C-[$(L_{12})_{b12}$-$(T_{12})_{c12}$], $Z_{13}$ may be C-[$(L_{13})_{b13}$-$(T_{13})_{c13}$], $Z_{14}$ may be C-[$(L_{14})_{b14}$-$(T_{14})_{c14}$], $Z_{31}$ may be C-[$(L_{31})_{b31}$-$(T_{31})_{c31}$], $Z_{32}$ may be C-[$(L_{32})_{b32}$-$(T_{32})_{c32}$], $Z_{33}$ may be C-[$(L_{33})_{b33}$-$(T_{33})_{c33}$], at least one of $T_{11}$ to $T_{14}$, at least one of $T_{31}$ to $T_{33}$, or any combination thereof may each independently be:

a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group, each unsubstituted or substituted with at least one deuterium, —F, a cyano group, or any combination thereof; or a phenyl group, or naphtyl group, each unsubstituted or substituted with at least one deuterium, —F, a cyano group, a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, or a sec-isopentyl group, or any combination thereof.

In one or more embodiments, in Formula 1-1, a group represented by

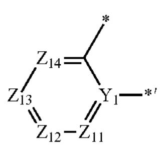

may be represented by one of Formulae A1-1 to A1-9:

A1-1

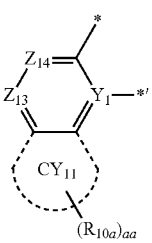

A1-2

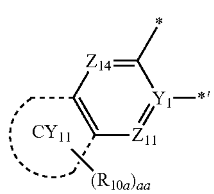

A1-3

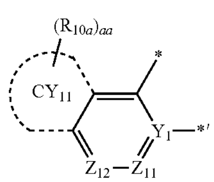

A1-4

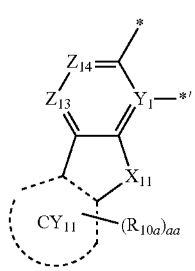

-continued

A1-5

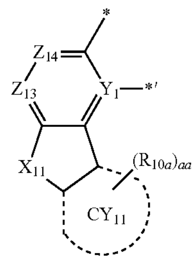

A1-6

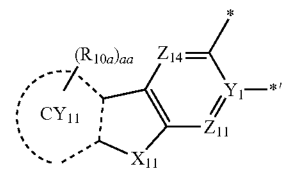

A1-7

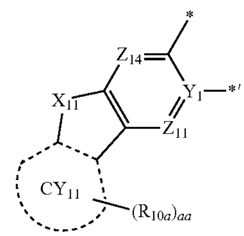

A1-8

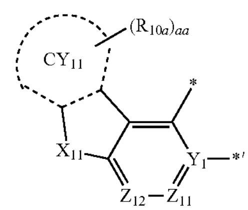

A1-9

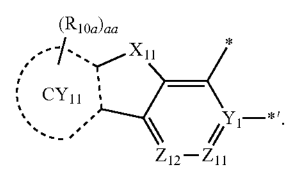

wherein, in Formulae A1-1 to A1-9, $Y_1$, $Z_{11}$ to $Z_{14}$ and $R_{10a}$ may respectively be understood by referring to the descriptions of $Y_1$, $Z_{11}$ to $Z_{14}$ and $R_{10a}$ provided herein, ring $CY_{11}$ may be a $C_5$-$C_{30}$ carbocyclic group or a $C_1$-$C_{30}$ heterocyclic group (for example, a cyclohexane group, a norbornane group, a benzene group, or a naphthalene group), $X_{11}$ may be O, S, $N(R_{11})$, $C(R_{11})(R_{12})$, or $Si(R_{11})(R_{12})$, $R_{11}$ and $R_{12}$ may each be understood by referring to the description of $T_{11}$ provided herein, aa may be an integer from 0 to 6,

*' indicates a binding site to $X_1$ in Formula 1-1, and

* indicates a binding site to an adjacent atom.

In one or more embodiments, in Formula 1-1, a group represented by

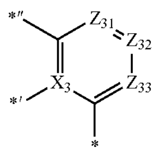

may be represented by one of Formulae A3-1 to A3-6:

A3-1

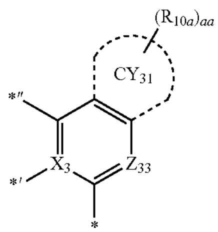

A3-2

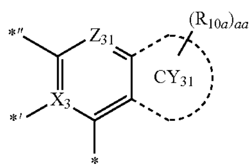

A3-3

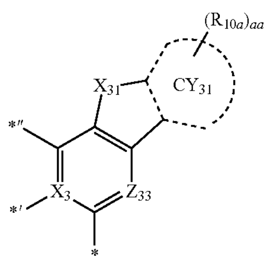

A3-4

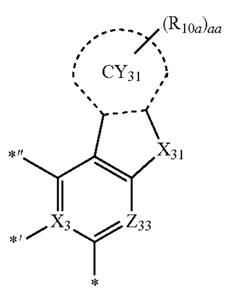

A3-5

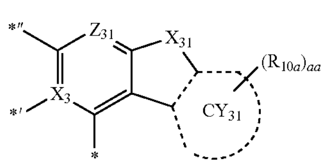

A3-6

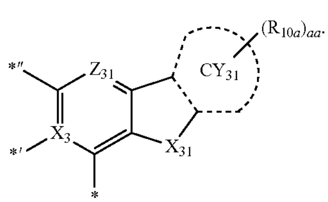

wherein, in Formulae A3-1 to A3-1, $X_3$, $Z_{31}$ to $Z_{33}$ and $R_{10a}$ may respectively be understood by referring to the descriptions of $X_3$, $Z_{31}$ to $Z_{33}$ and $R_{10a}$ provided herein, ring $CY_{31}$ may be a $C_5$-$C_{30}$ carbocyclic group or a $C_1$-$C_{30}$ heterocyclic group (for example, a cyclohexane group, a norbornane group, a benzene group, or a naphthalene group), $X_{31}$ may be O, S, $N(R_{31})$, $C(R_{31})(R_{32})$, or $Si(R_{31})(R_{32})$, $R_{31}$ and $R_{32}$ may each be understood by referring to the description of $T_{31}$ provided herein, aa may be an integer from 0 to 6, each of *" and * indicates a binding site to an adjacent atom,

*' indicates a binding site to M in Formula 1-1.

In one or more embodiments, in Formula 1-1, a group represented by

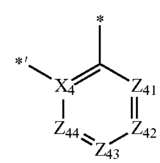

may be represented by one of Formulae A4-1 to A4-9:

A4-1

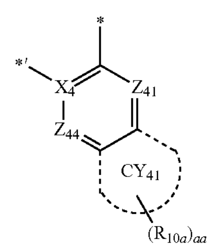

A4-2

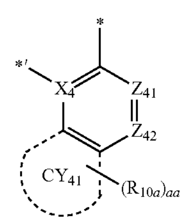

A4-3

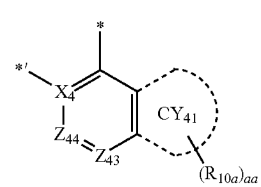

A4-4

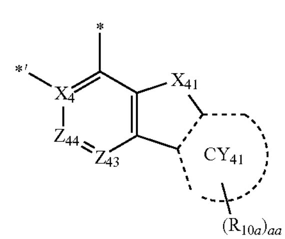

-continued

A4-5

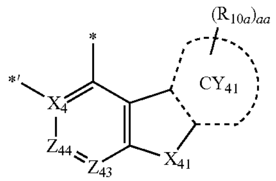

A4-6

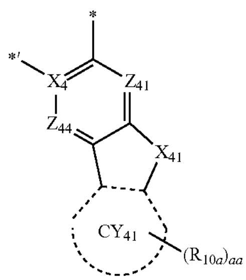

A4-7

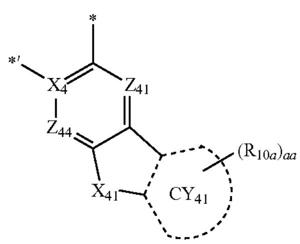

-continued

A4-8

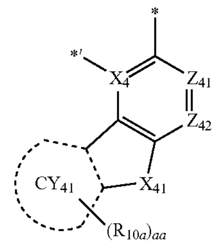

A4-9

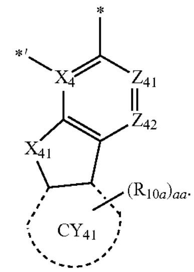

wherein, in Formulae A4-1 to A4-9, $X_4$, $Z_{41}$ to $Z_{44}$ and $R_{10a}$ may respectively be understood by referring to the descriptions of $X_4$, $Z_{41}$ to $Z_{44}$ and $R_{10a}$ provided herein, ring $CY_{41}$ may be a $C_5$-$C_{30}$ carbocyclic group or a $C_1$-$C_{30}$ heterocyclic group (for example, a cyclohexane group, a norbornane group, a benzene group, or a naphthalene group), $X_{41}$ may be O, S, $N(R_{41})$, $C(R_{41})(R_{42})$, or $Si(R_{41})(R_{42})$, $R_{41}$ and $R_{42}$ may each be understood by referring to the description of $T_{41}$ provided herein, aa may be an integer from 0 to 6,

*' indicates a binding site to M in Formula 1-1, and

* indicates a binding site to an adjacent atom in Formula 1-1.

In one or more embodiments, the organometallic compound represented by Formula 1-1 may include at least one deuterium.

The organometallic compound represented by Formula 1-1 may be one of the Compounds 1 to 420:

1

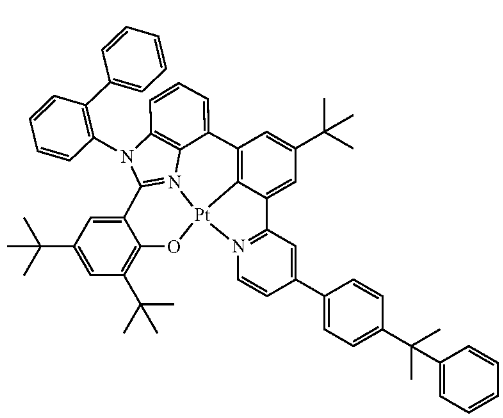

2

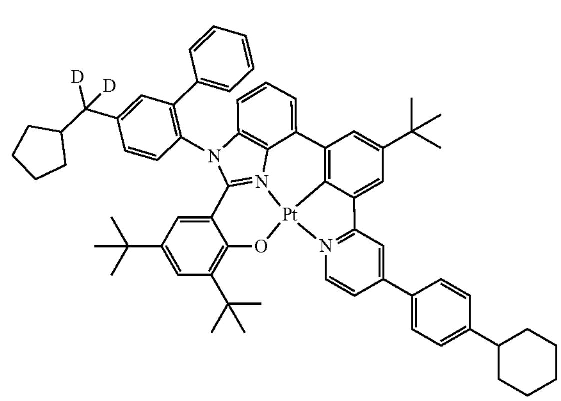

-continued
3
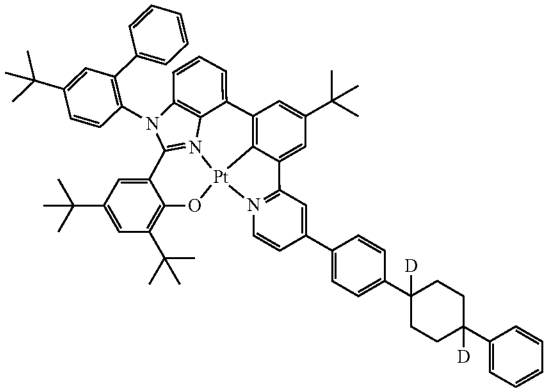
4
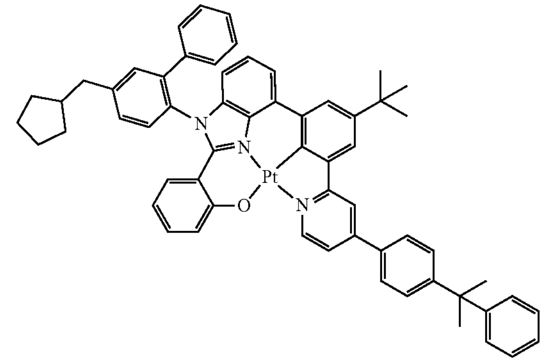
5
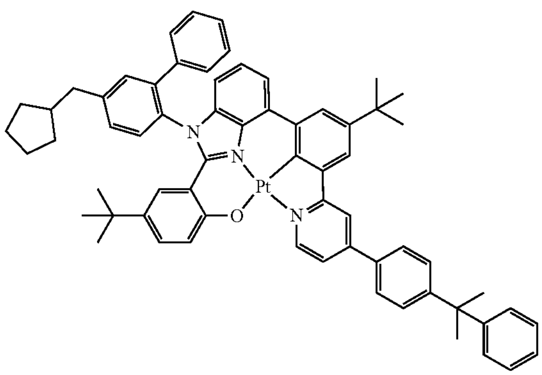
6
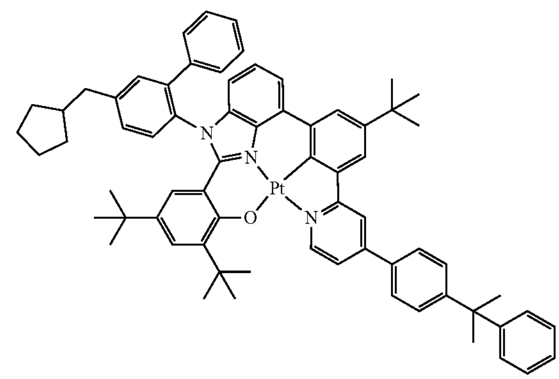
7
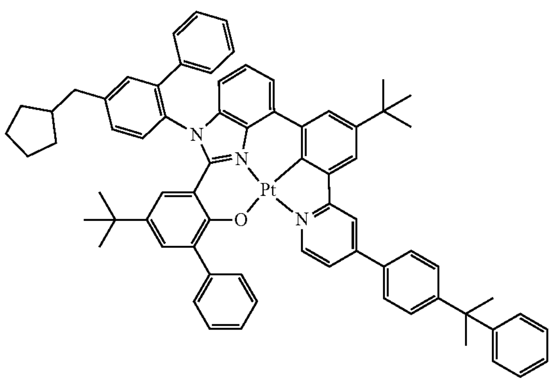
8
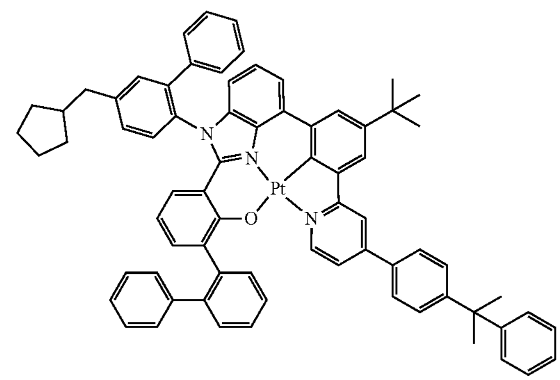
9
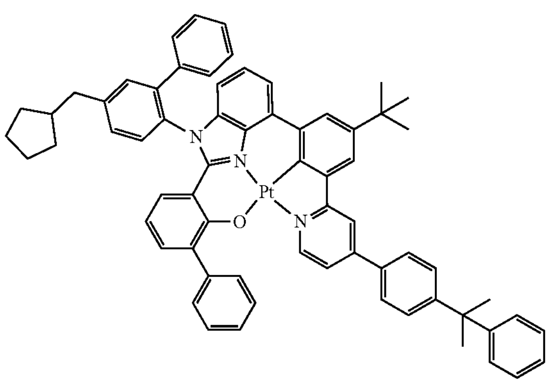
10
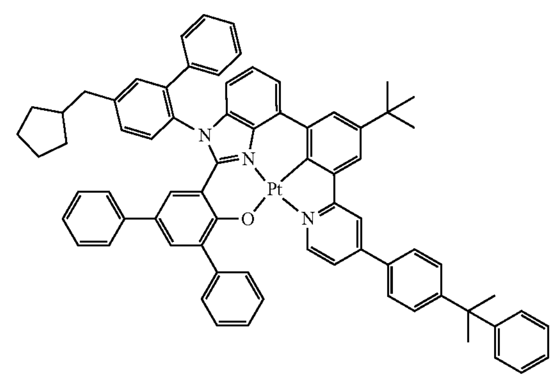

-continued
11
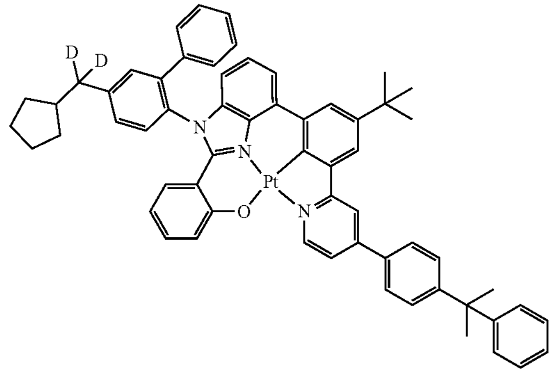
12
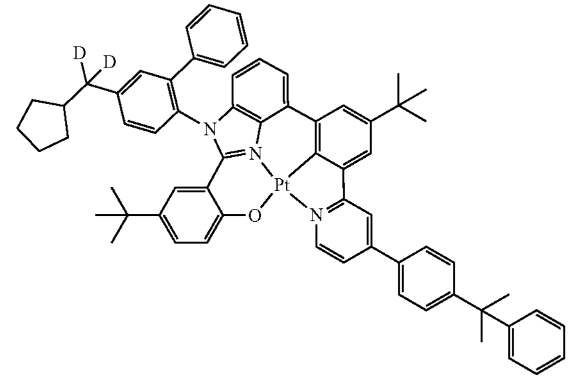
13
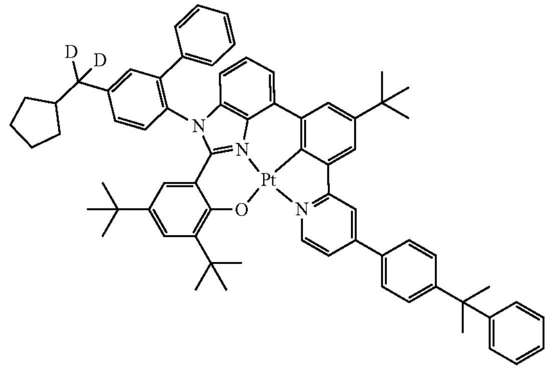
14
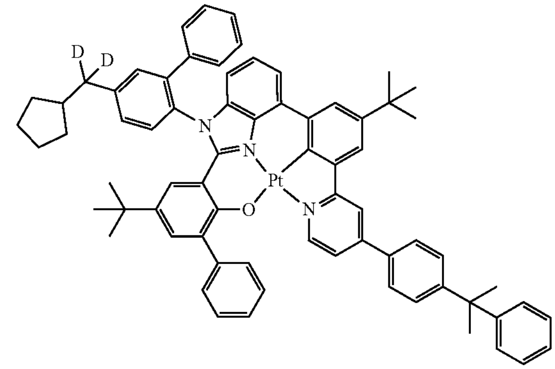
15
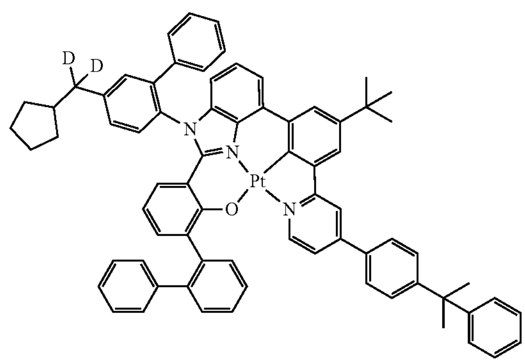
16
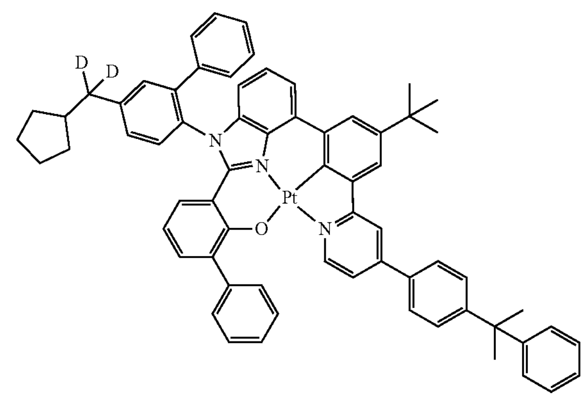
17
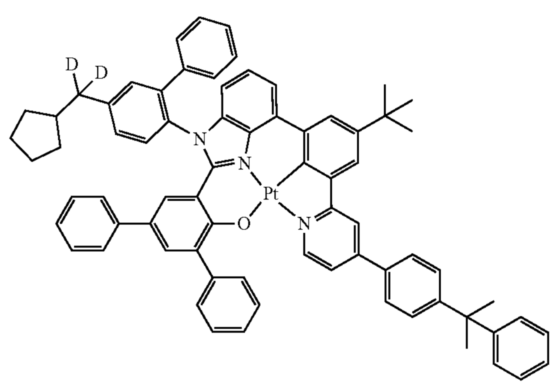
18
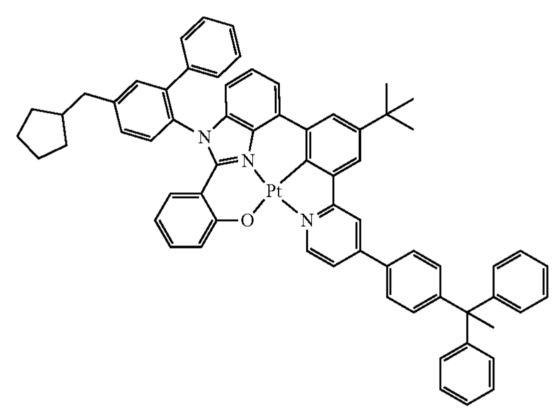

-continued
19
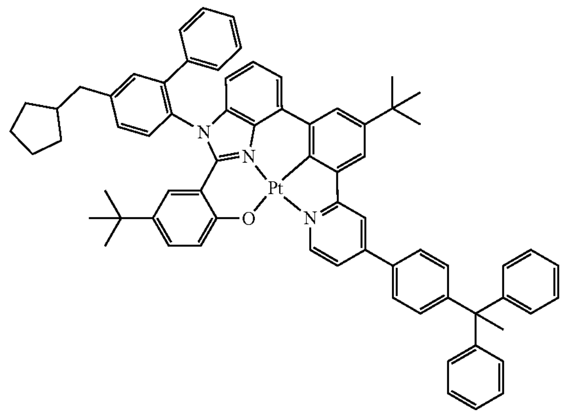
20
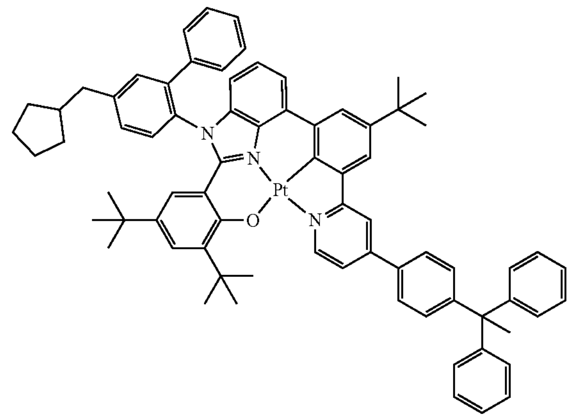
21
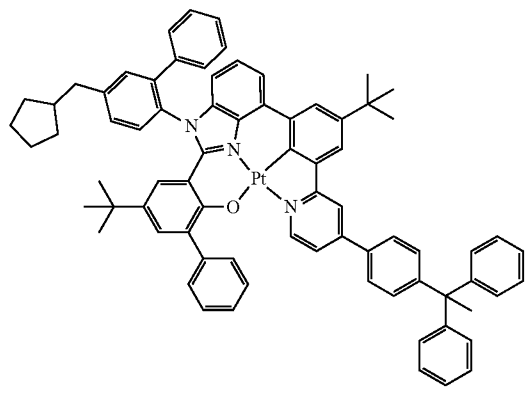
22
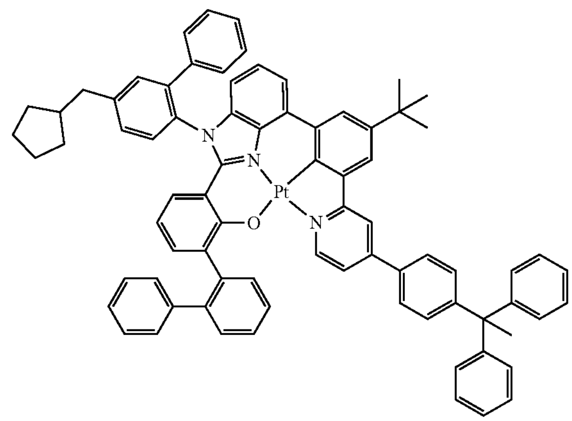
23
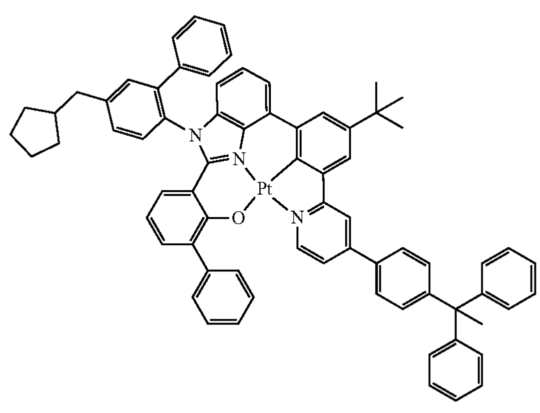
24
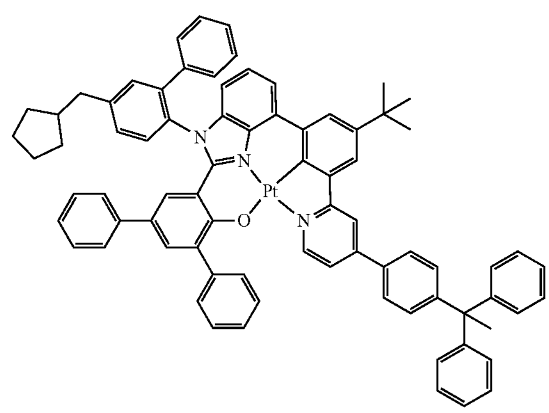

-continued
25
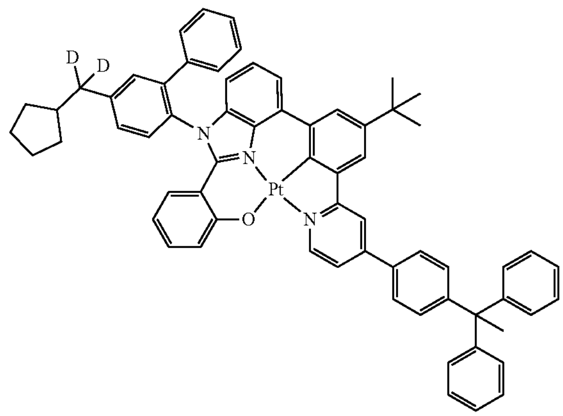
26
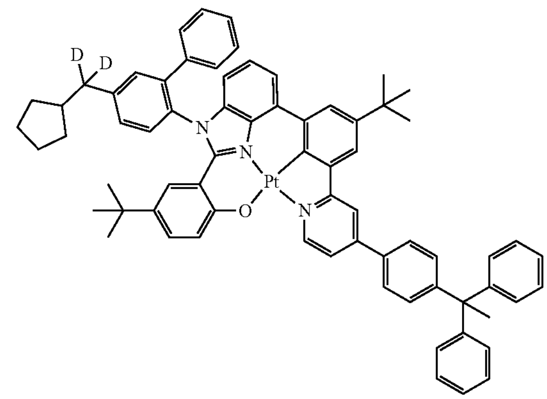
27
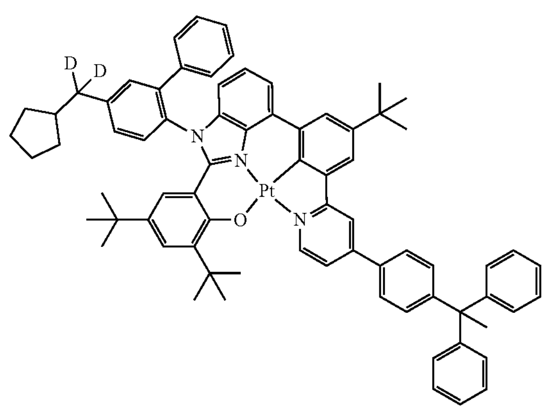
28
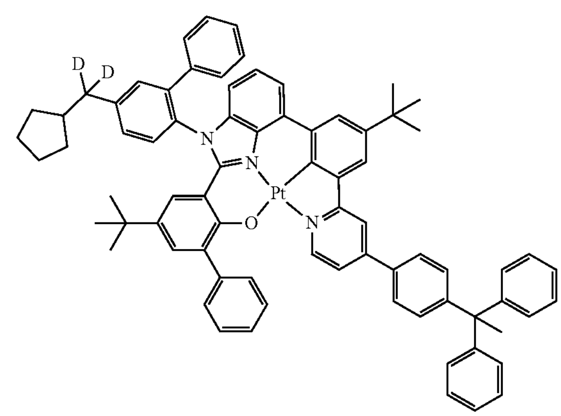
29
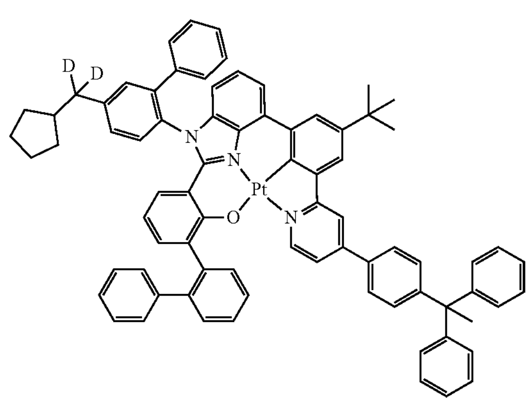
30
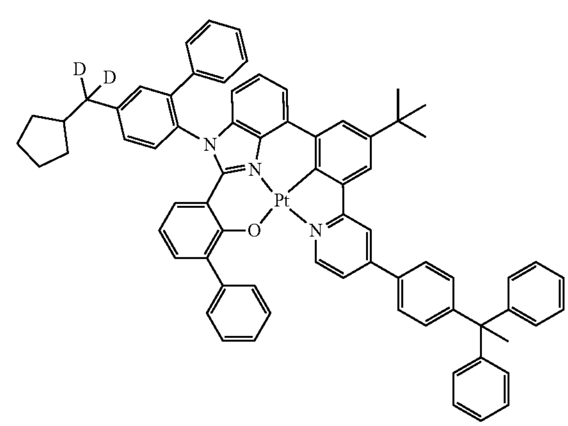

-continued
31
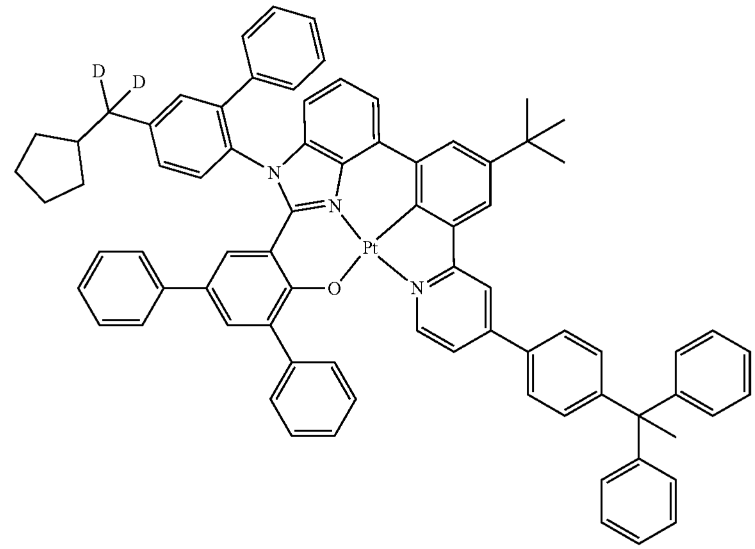
32
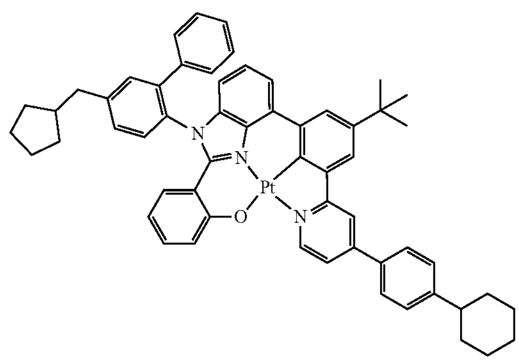
33
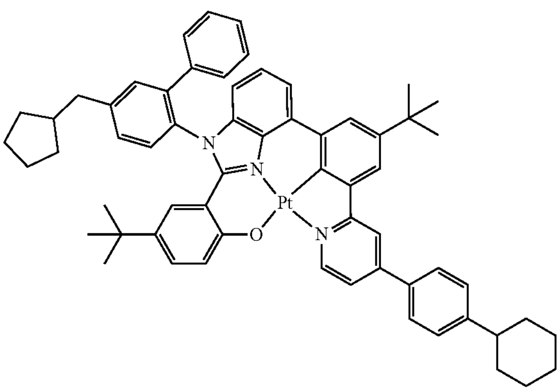
34
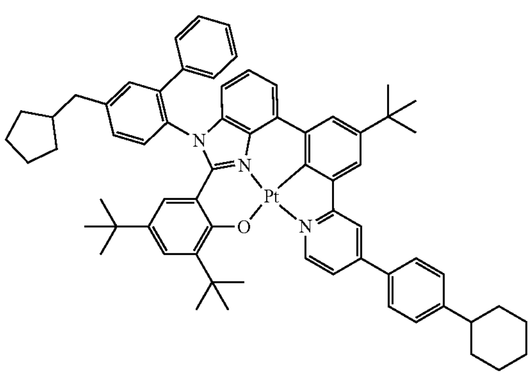
35
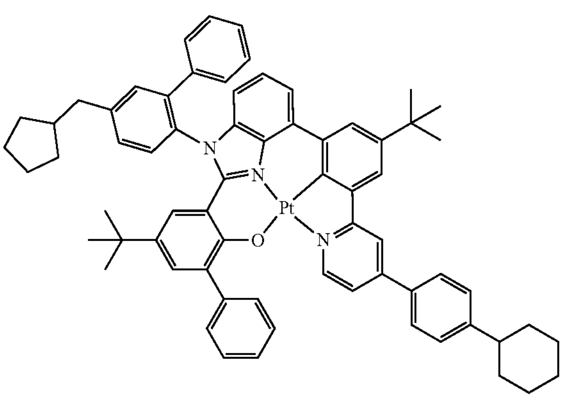

-continued
36
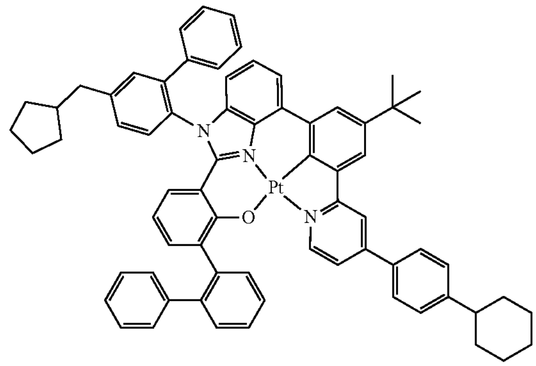
37
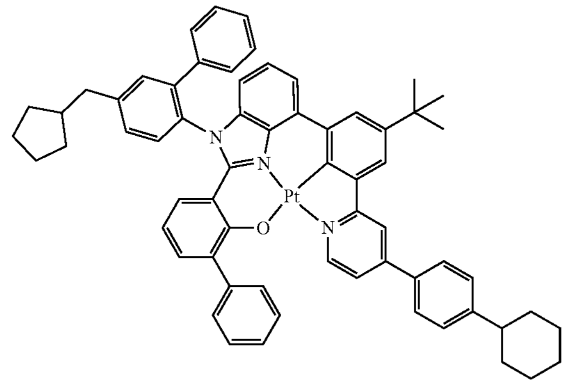
38
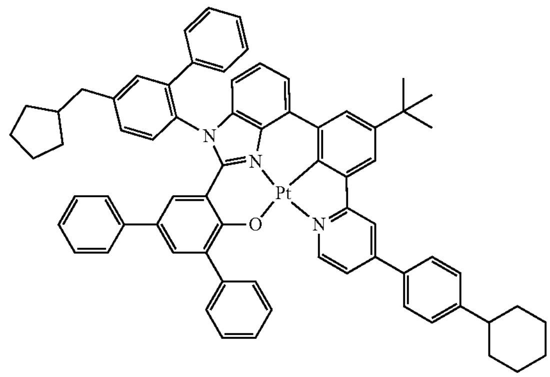
39
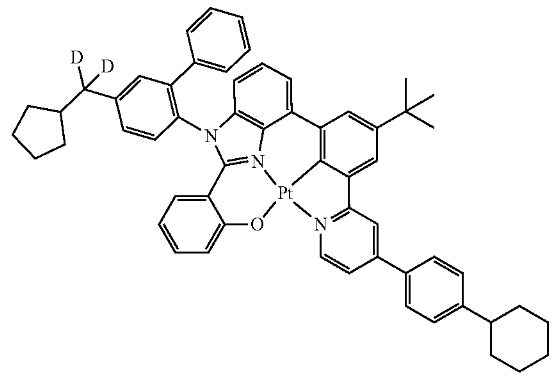
40
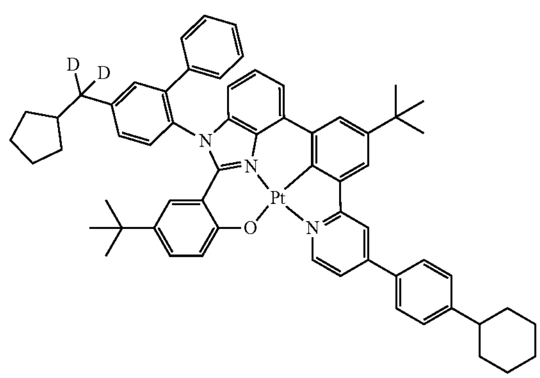
41
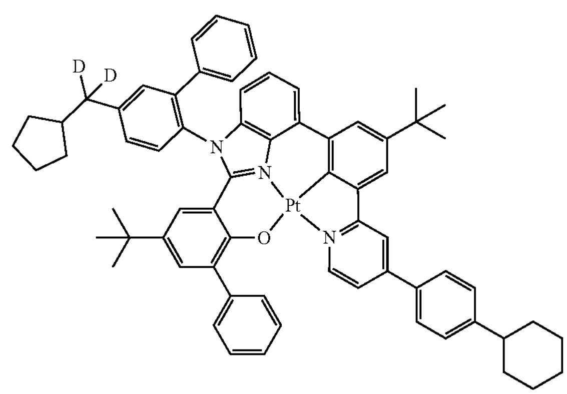
42
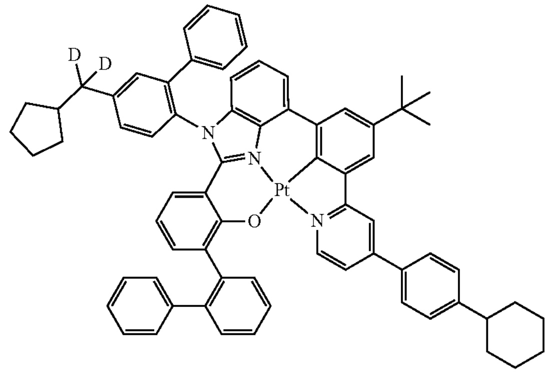
43
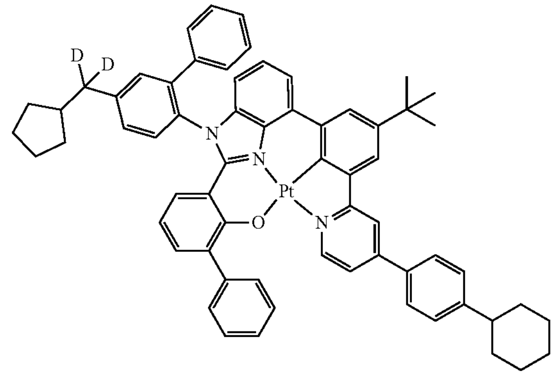

-continued
44
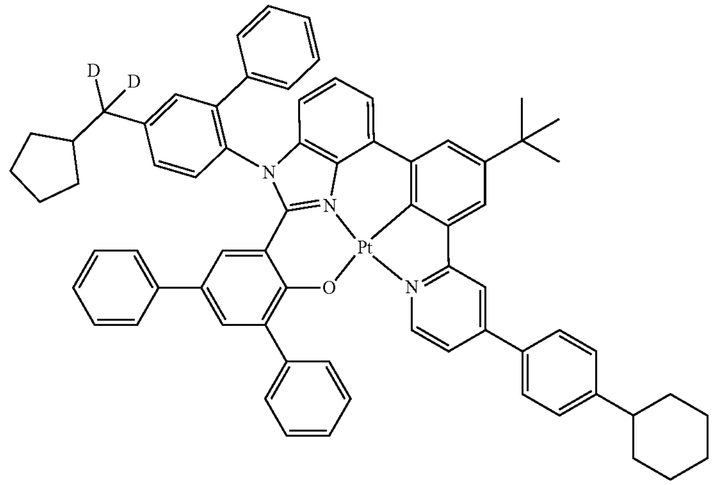
45
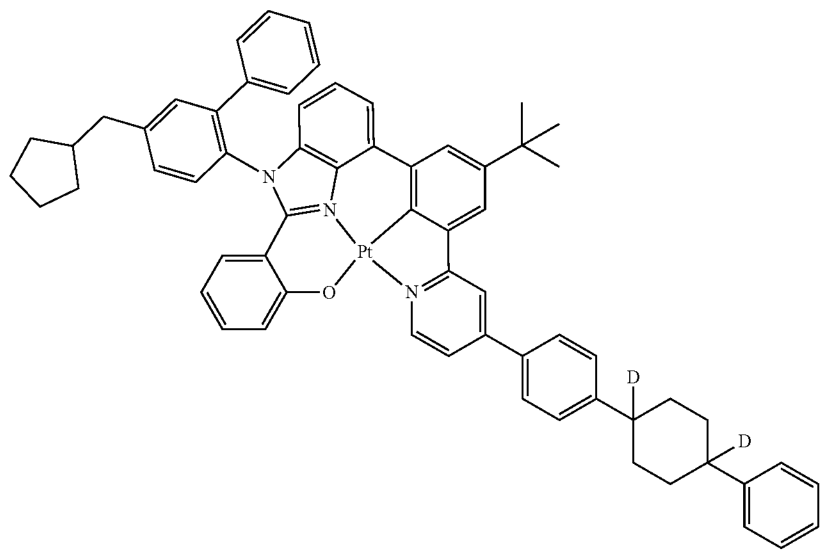
46
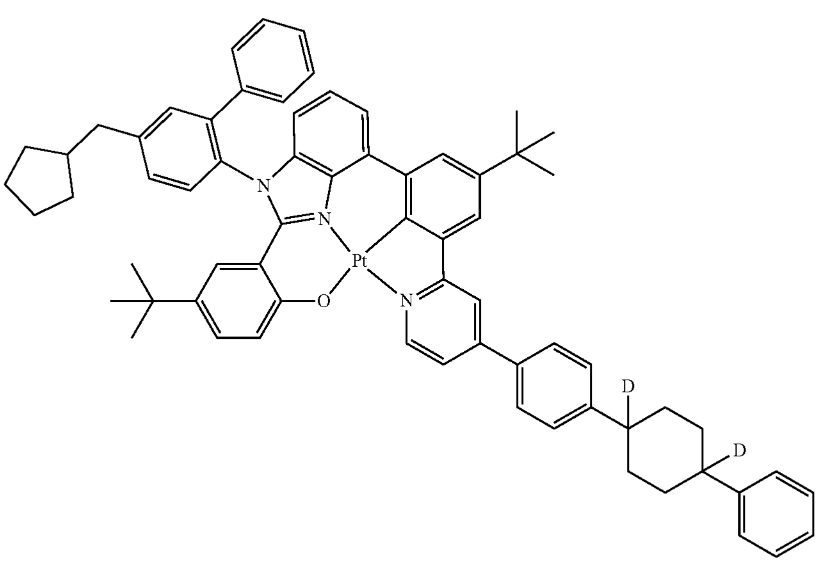

-continued
47
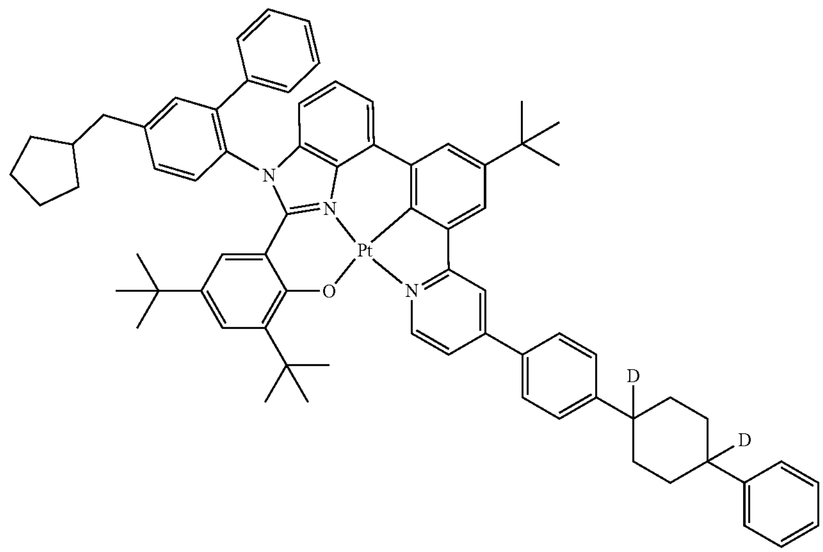
48
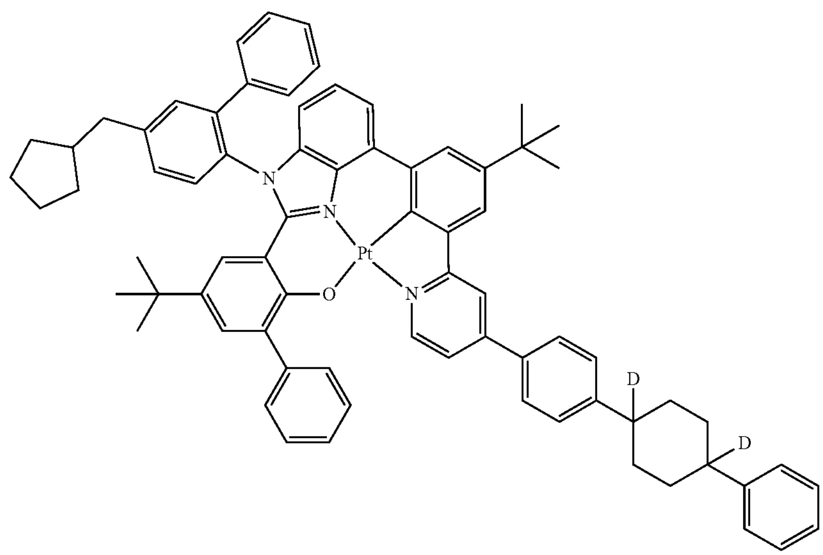
49
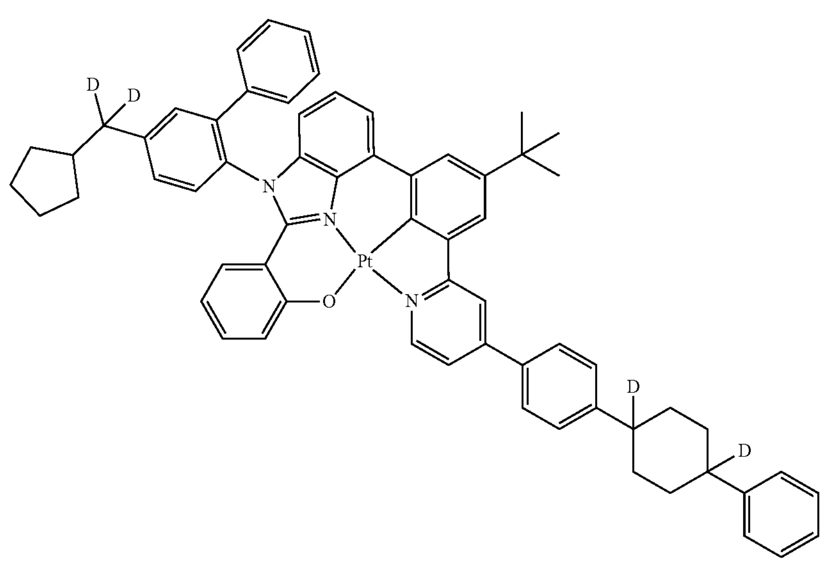

-continued
50
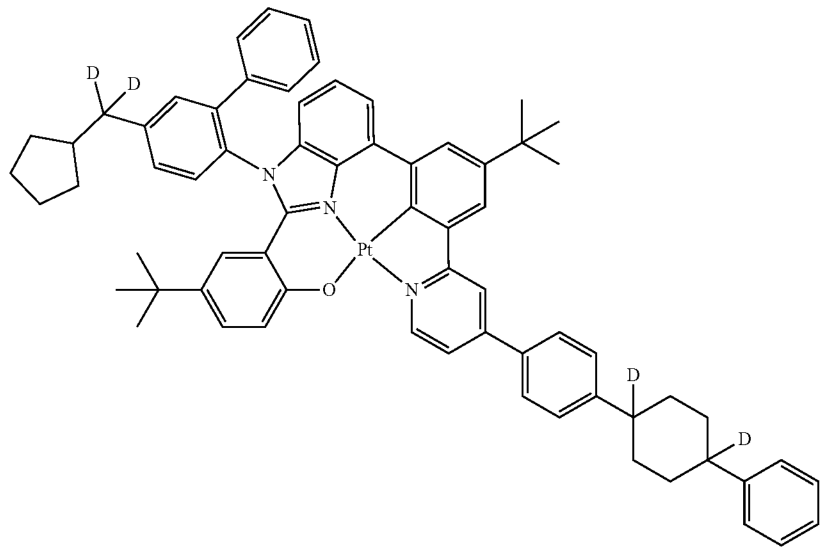
51
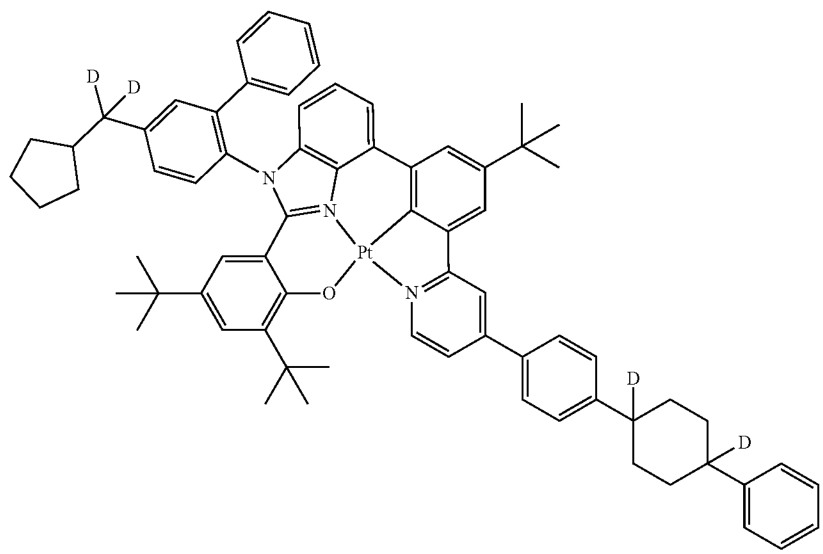
52
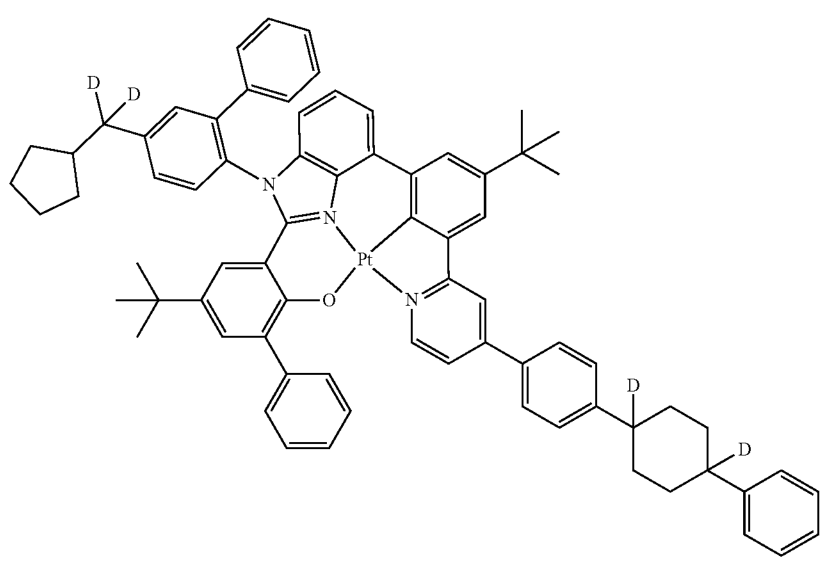

-continued
53
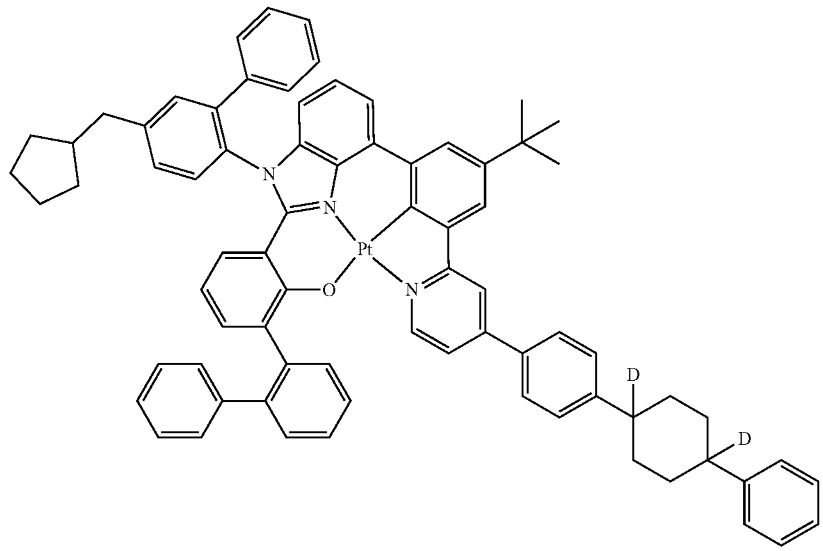
54
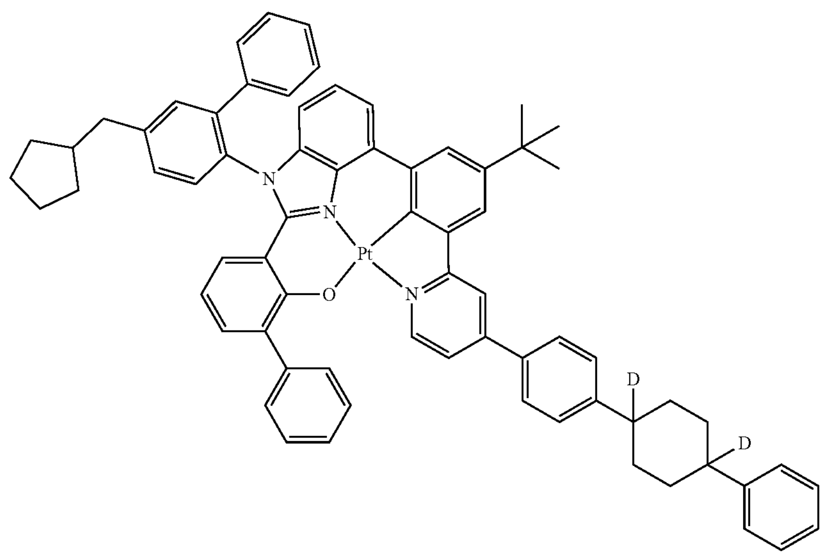
55
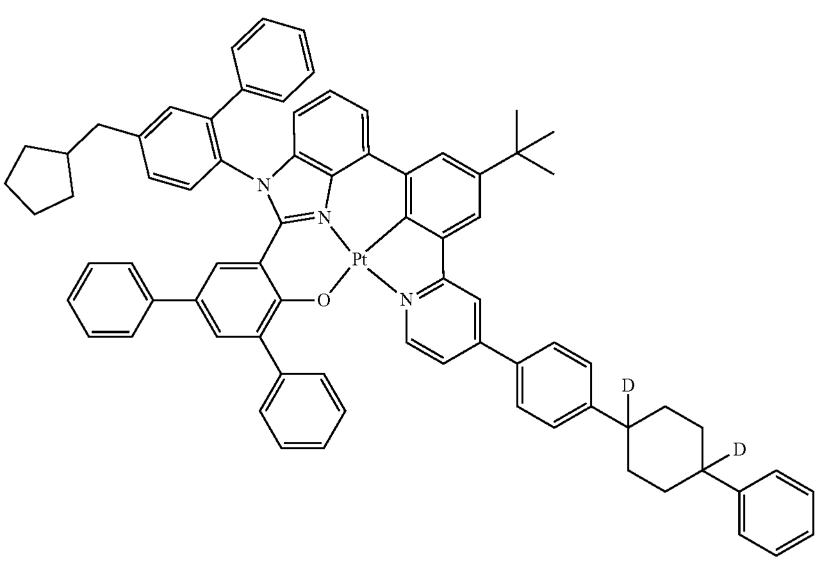

-continued
56
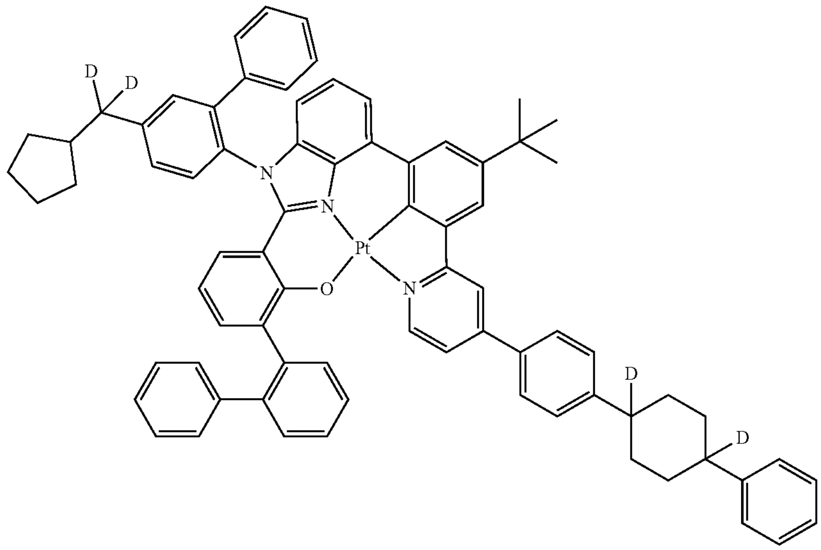
57
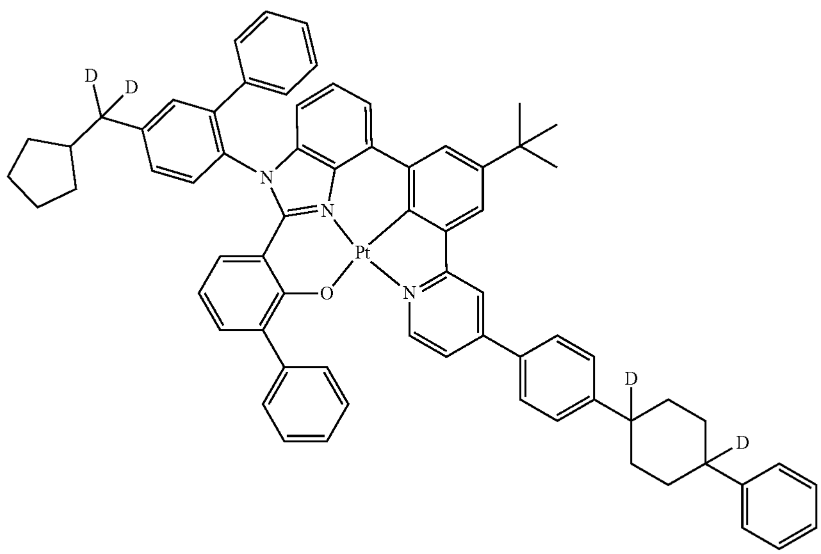
58
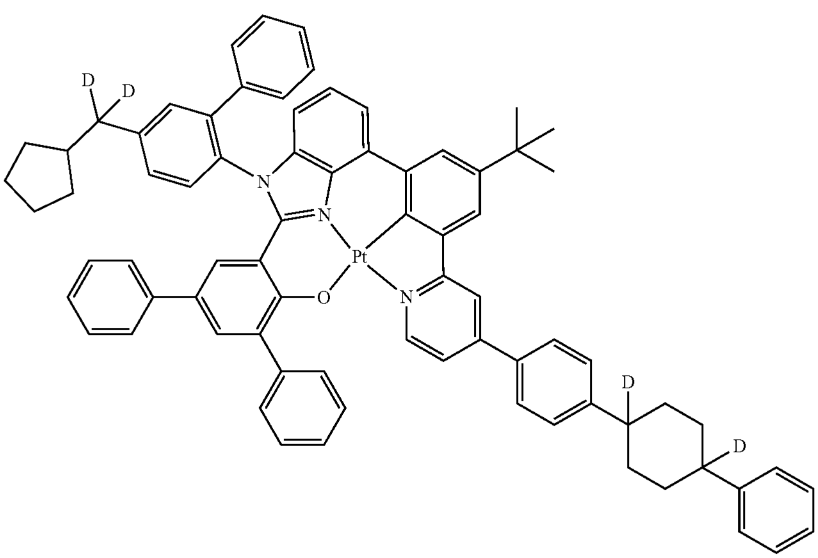

-continued
59
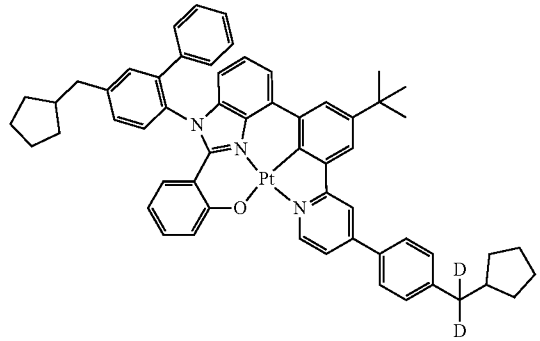
60
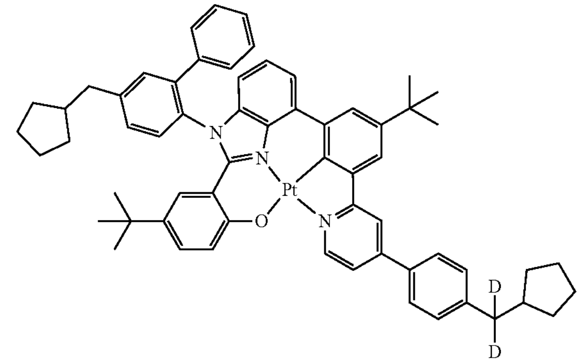
61
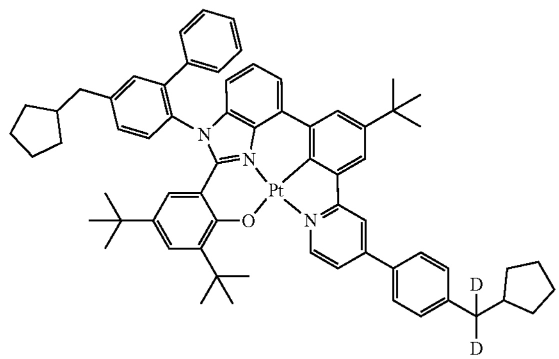
62
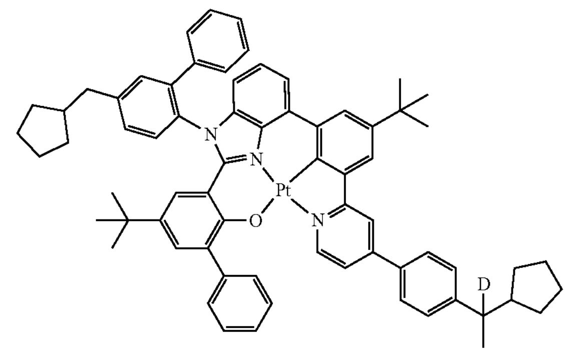
63
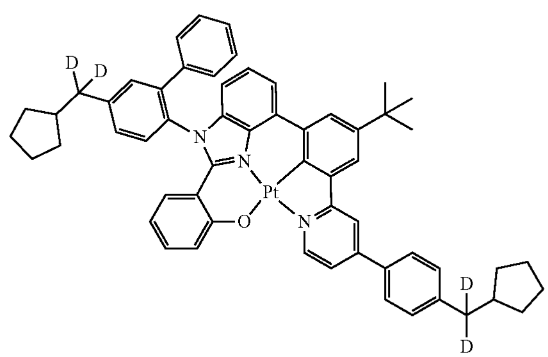
64
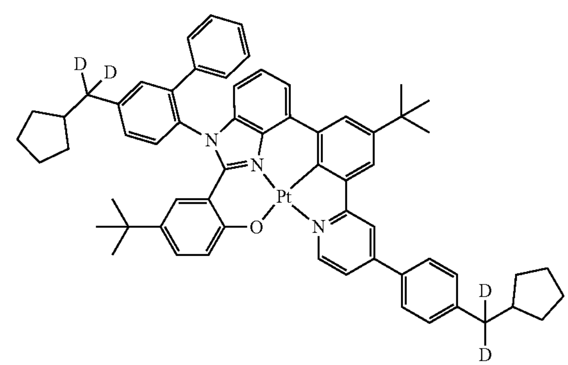
65
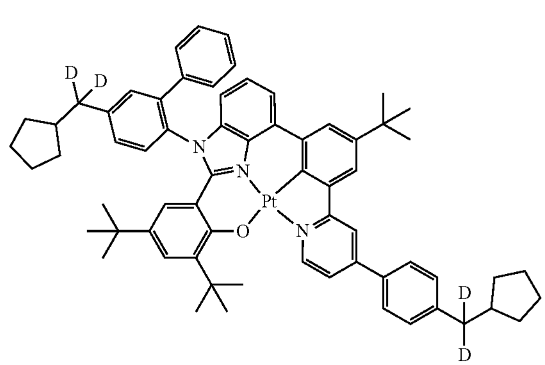
66
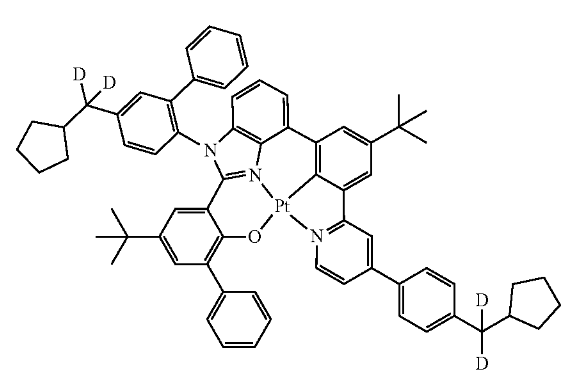

-continued
67
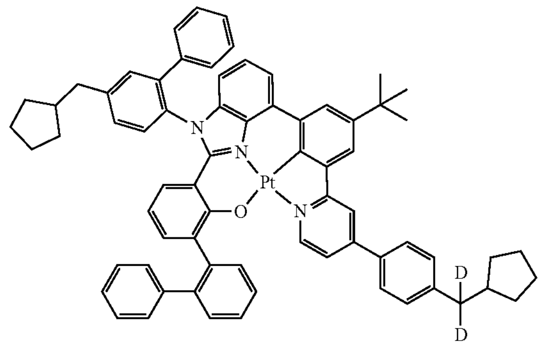
68
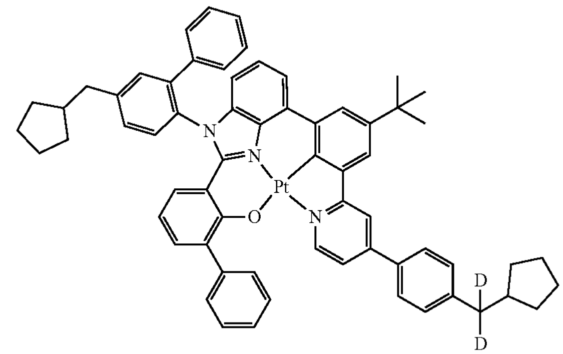
69
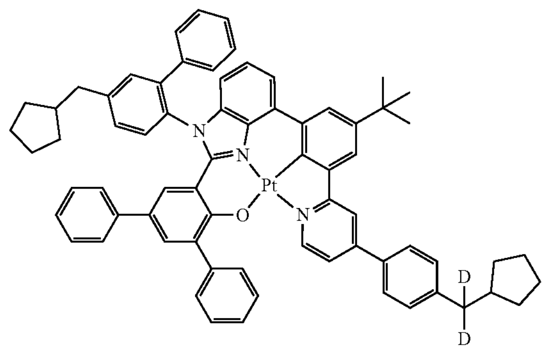
70
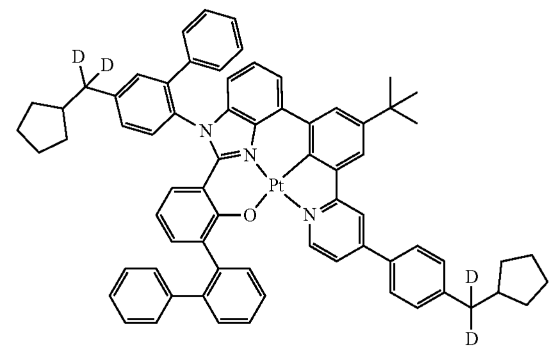
71
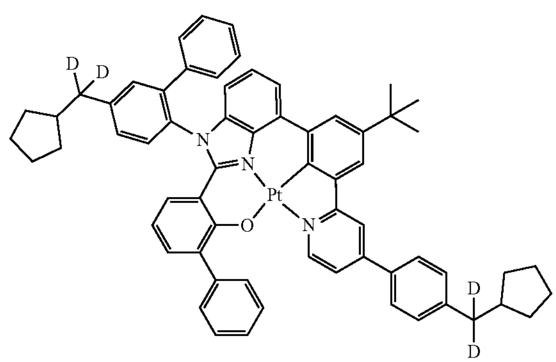
72
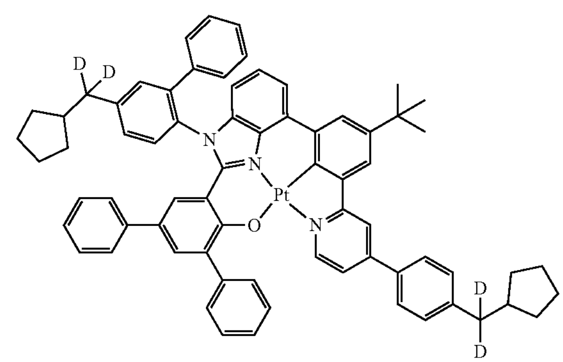
73
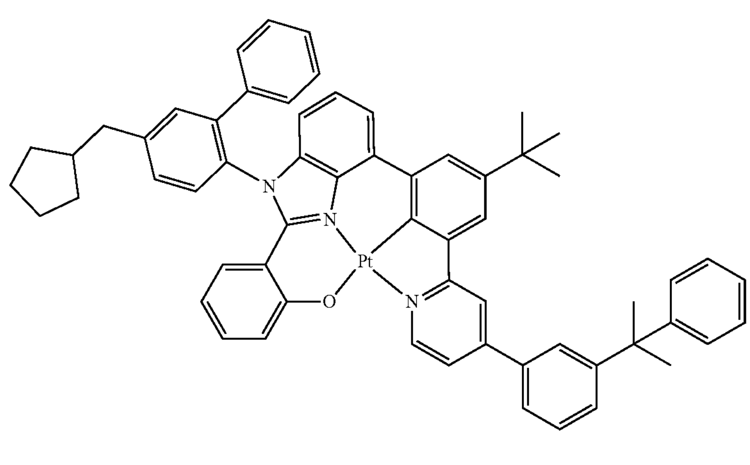

-continued
74
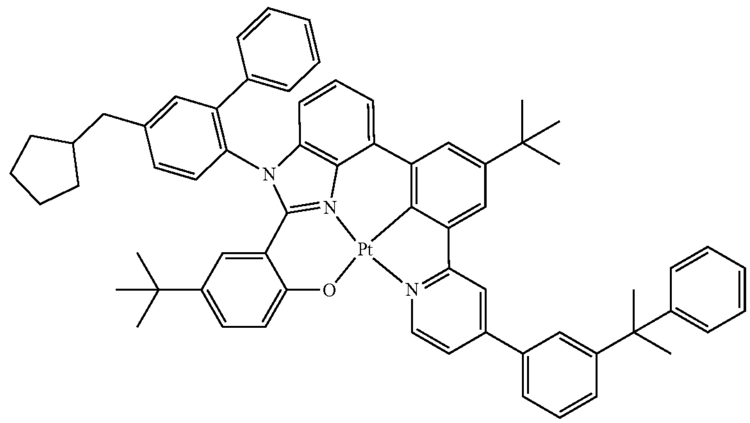
75
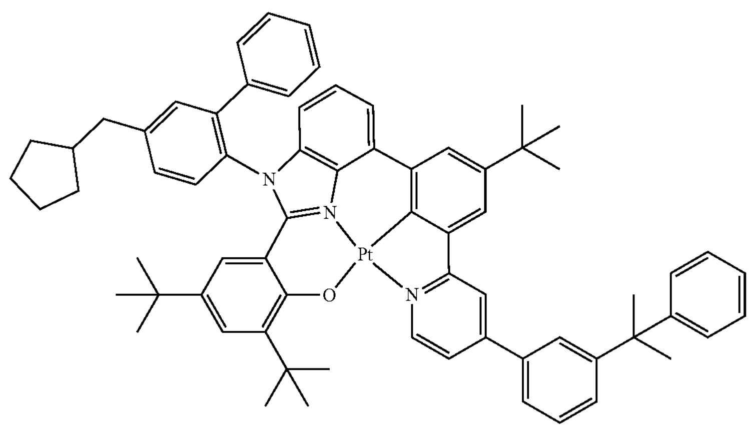
76
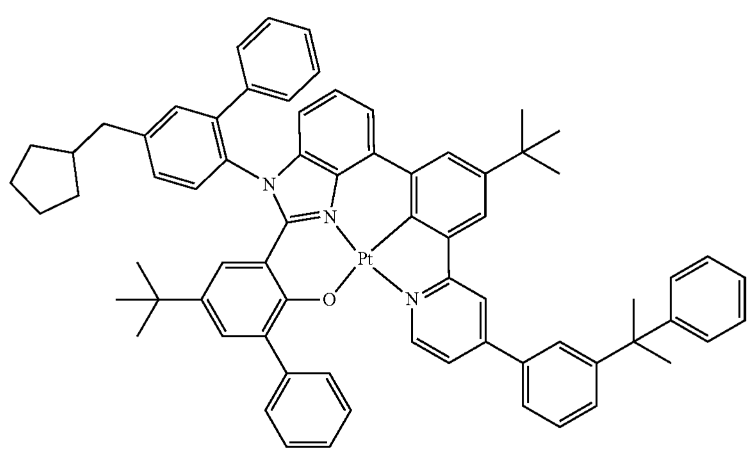

-continued
77
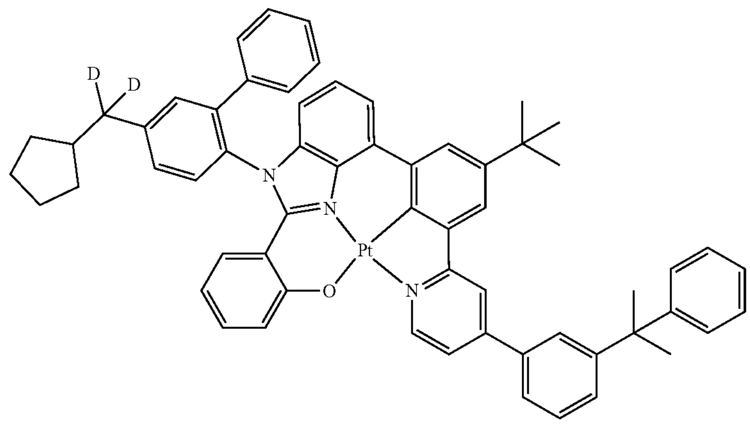
78
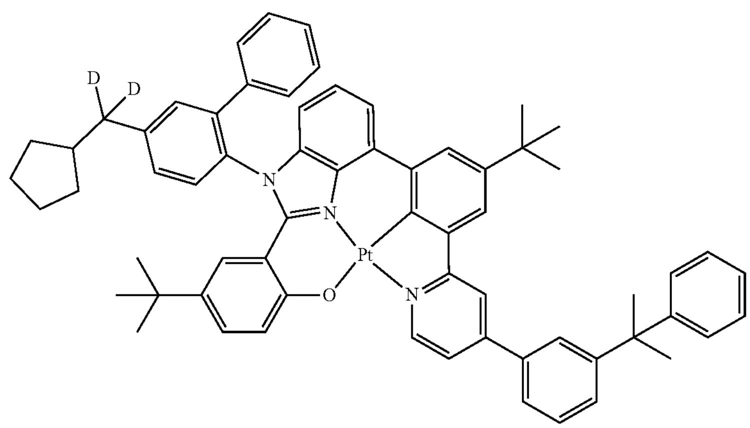
79
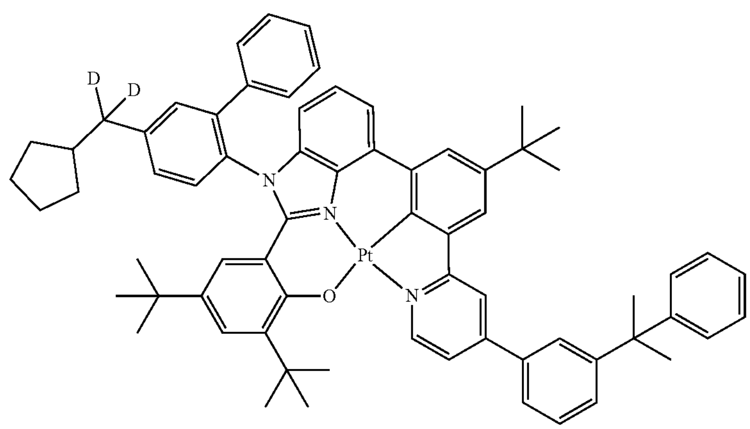

-continued
80
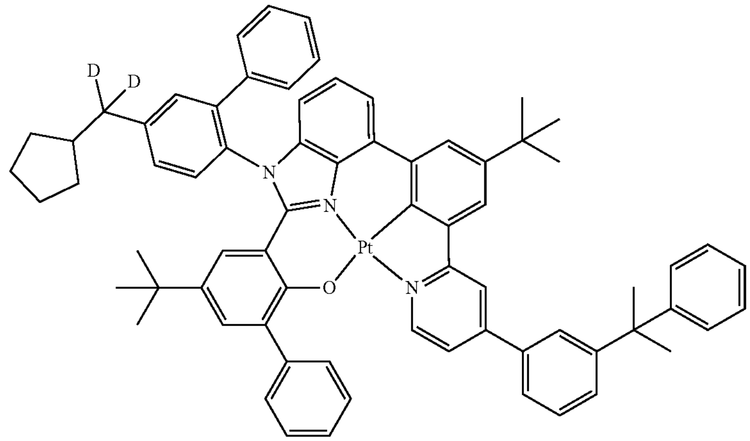
81
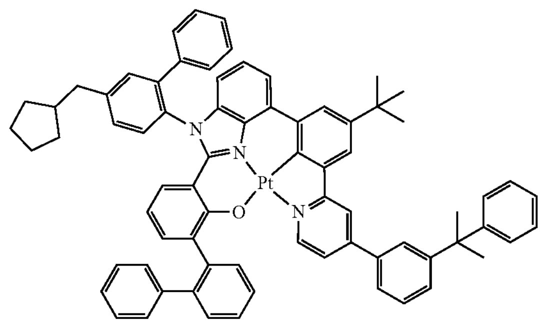
82
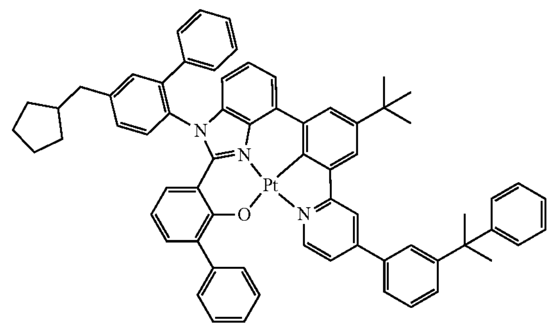
83
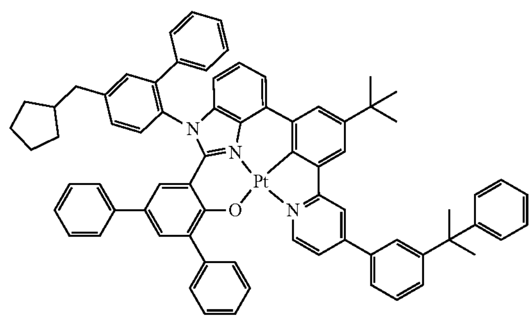
84
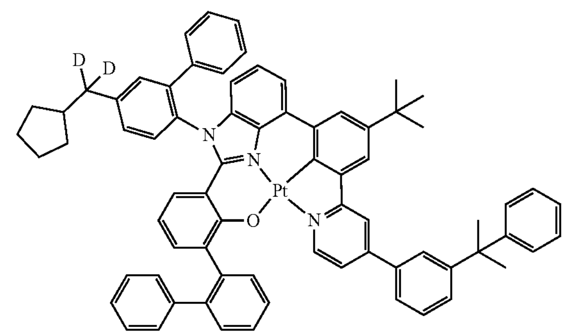
85
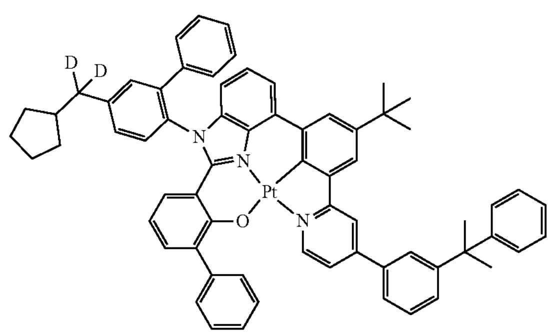
86
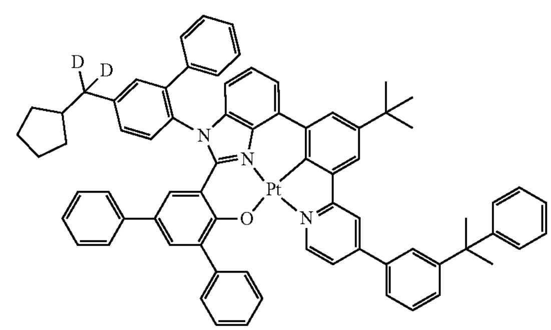

-continued
87
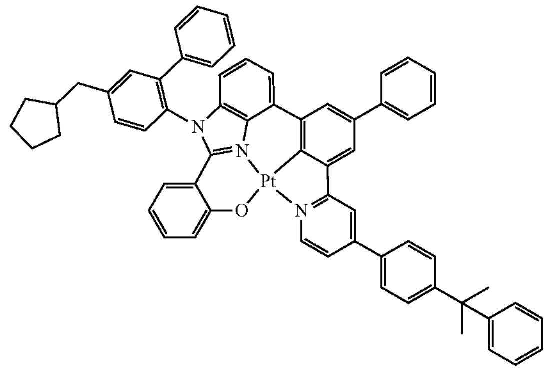
88
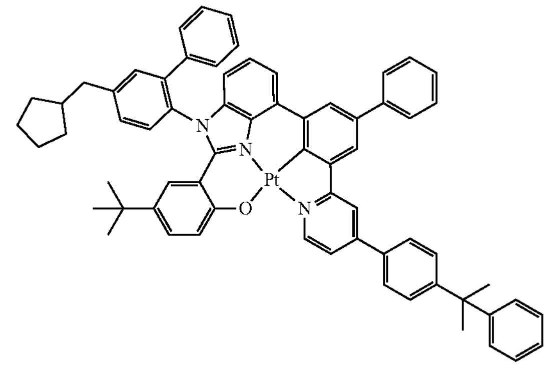
89
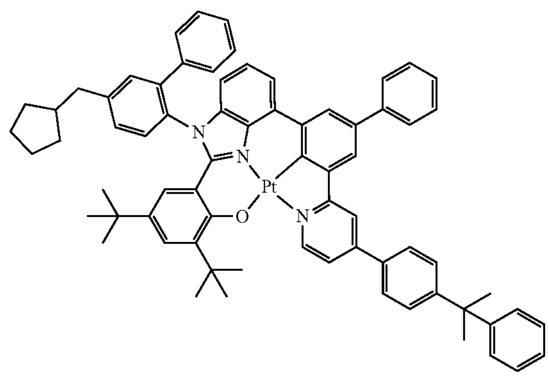
90
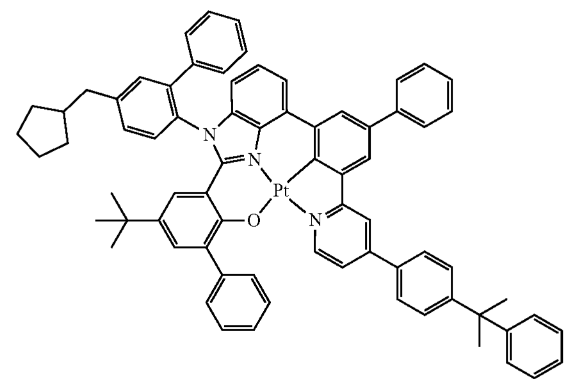
91
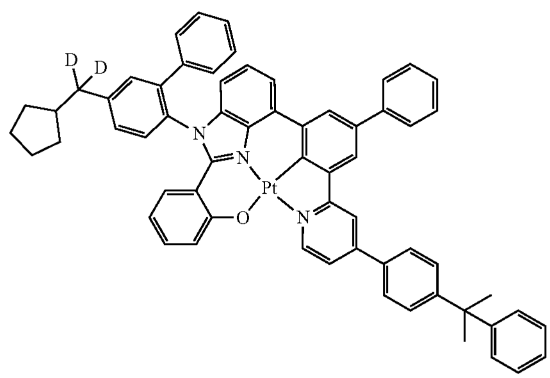
92
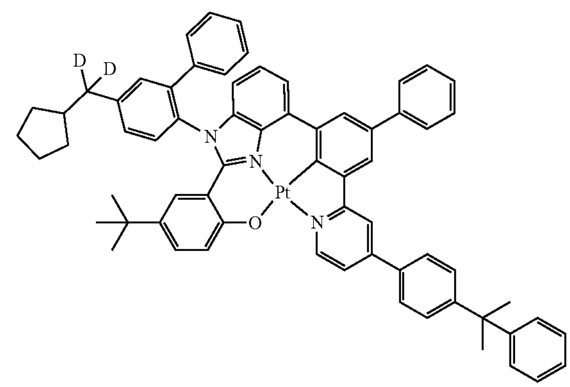
93
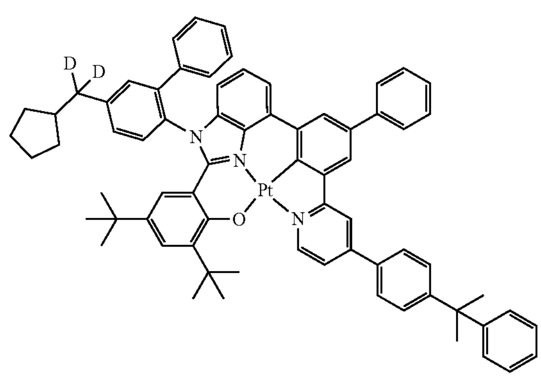
94
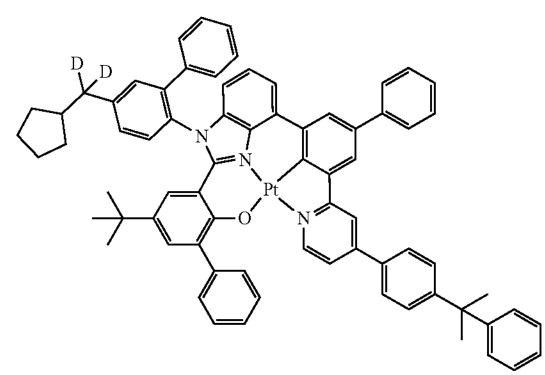

-continued
95
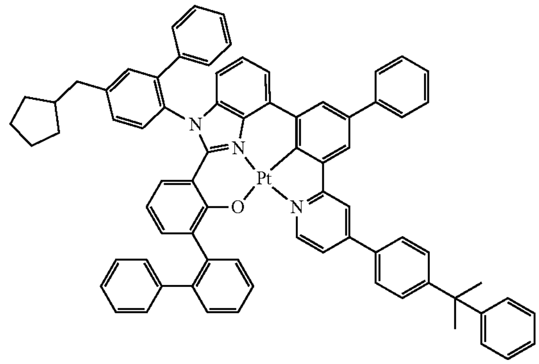
96
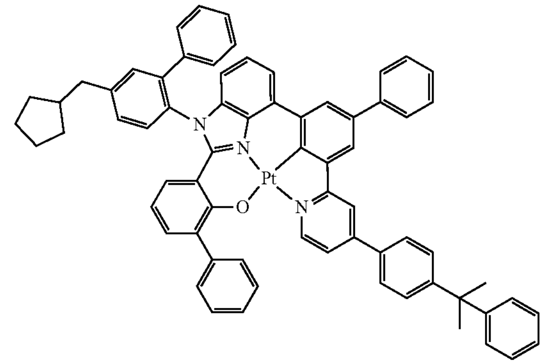
97
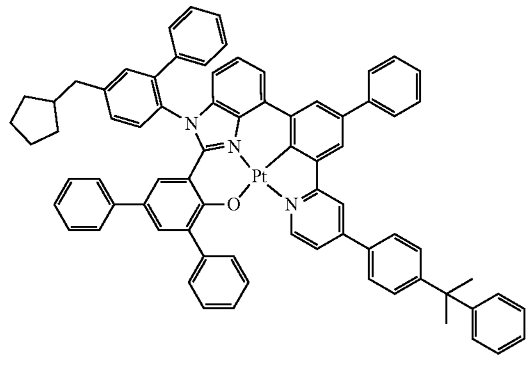
98
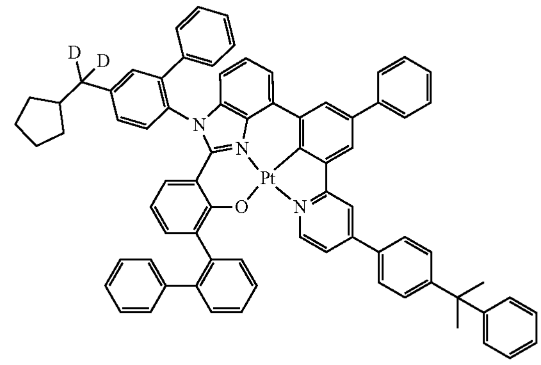
99
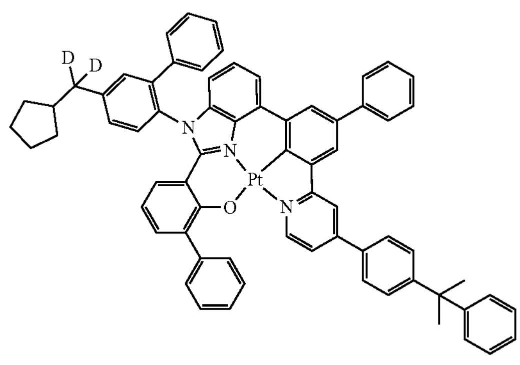
100
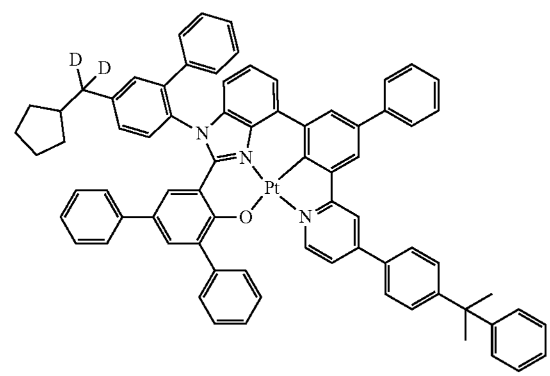
101
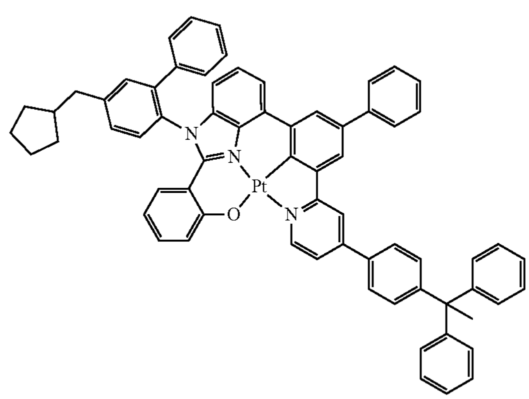
102
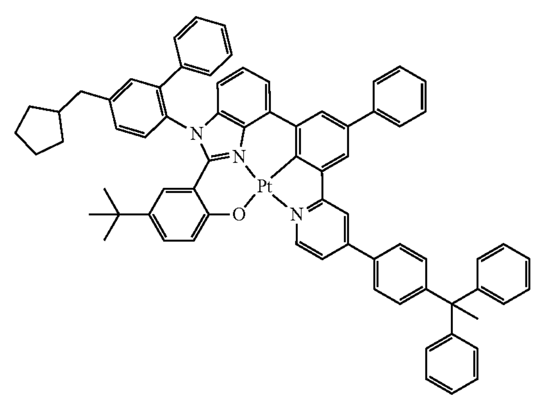

-continued
103
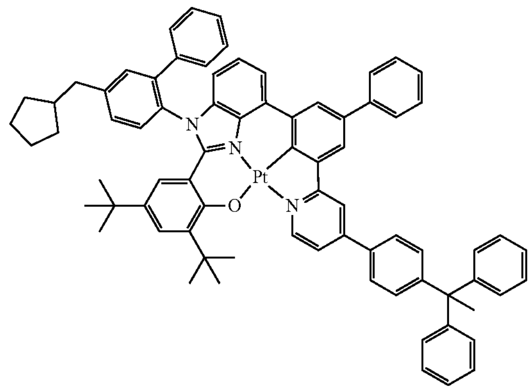
104
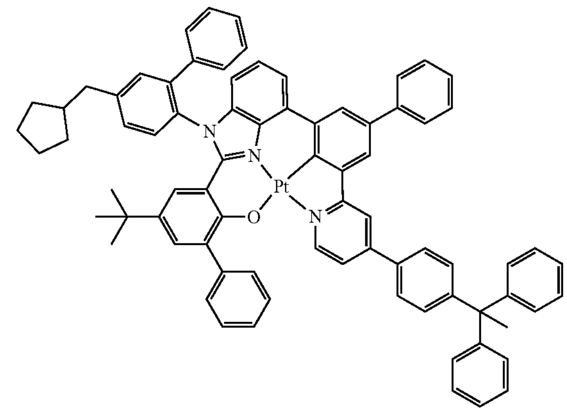
105
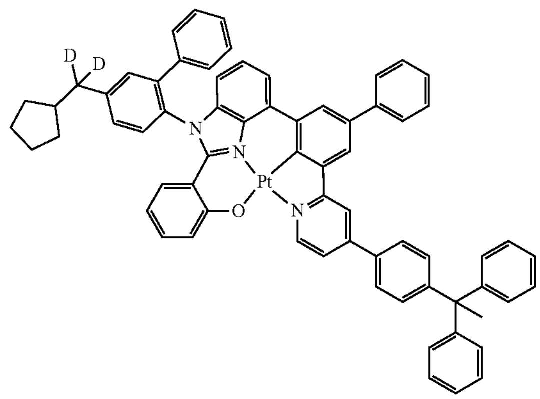
106
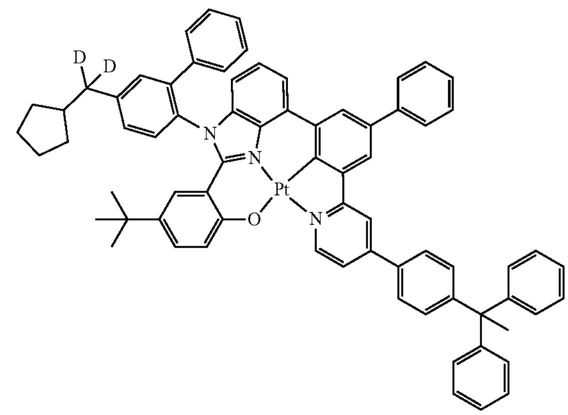
107
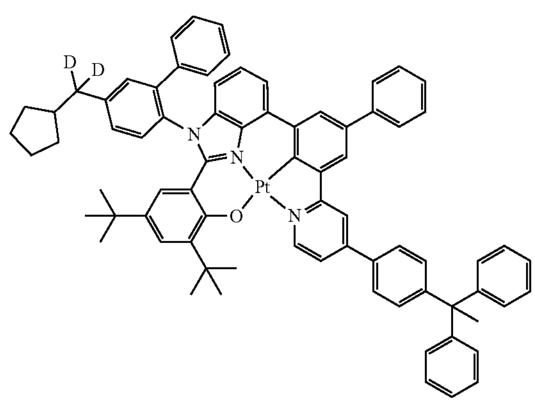
108
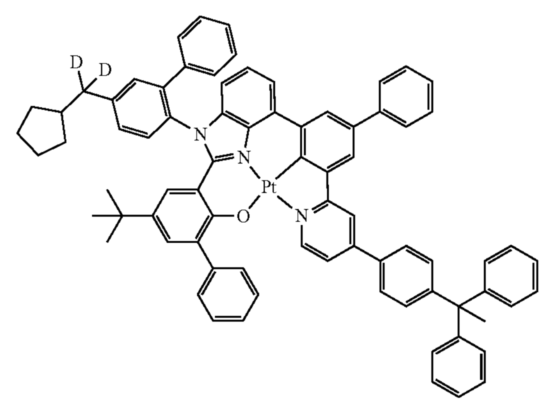

-continued
109
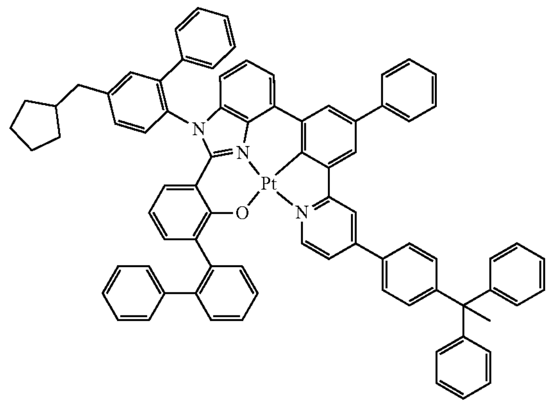
110
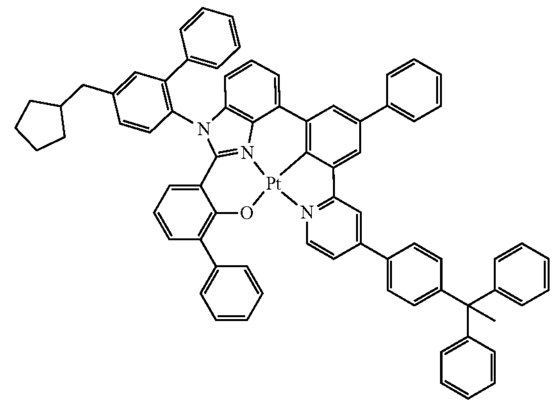
111
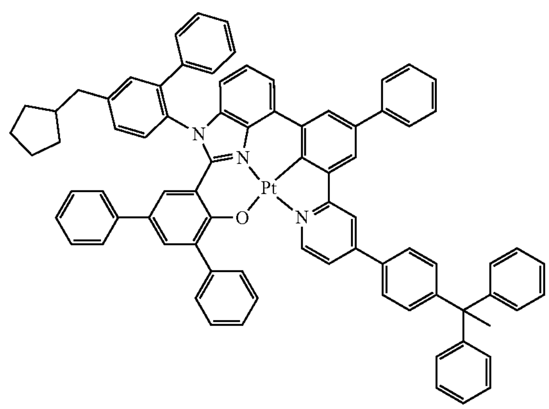
112
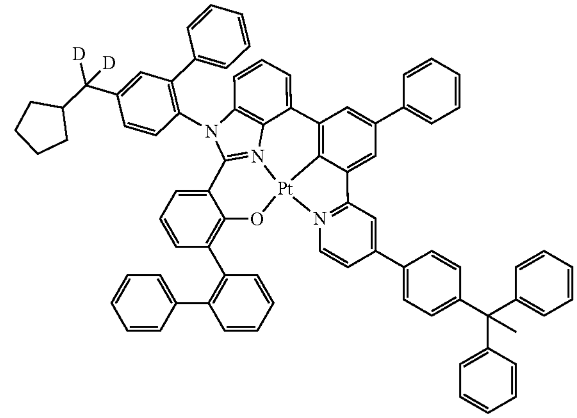
113
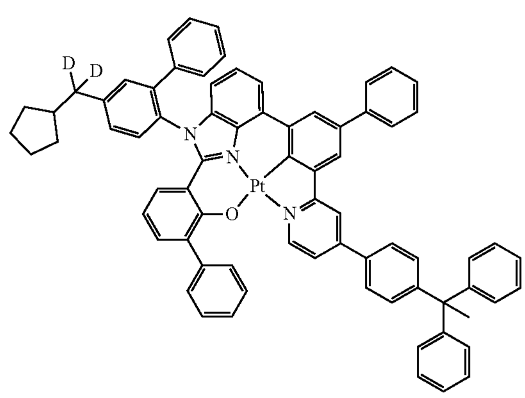
114
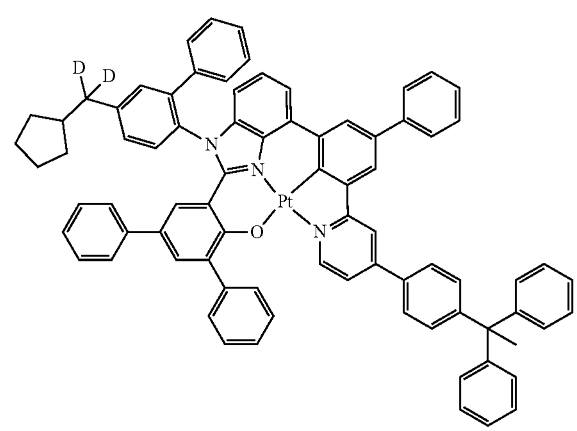

-continued
115
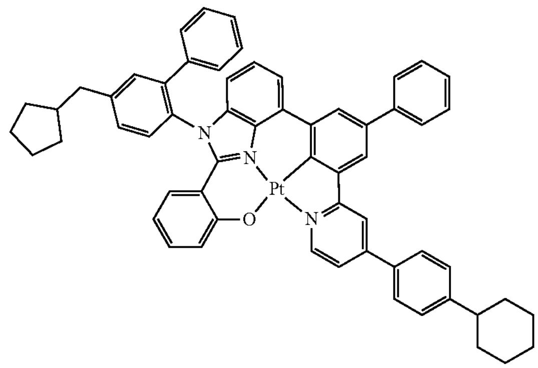
116
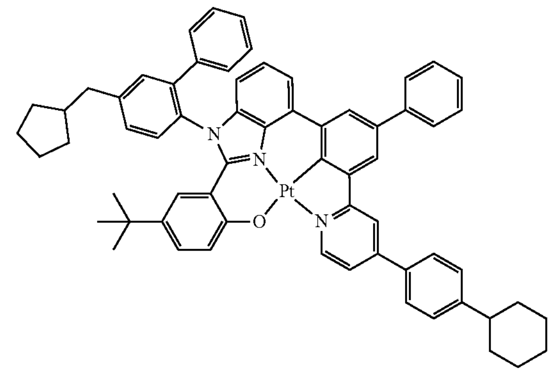
117
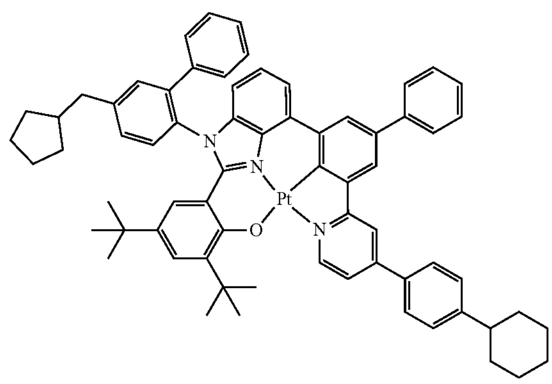
118
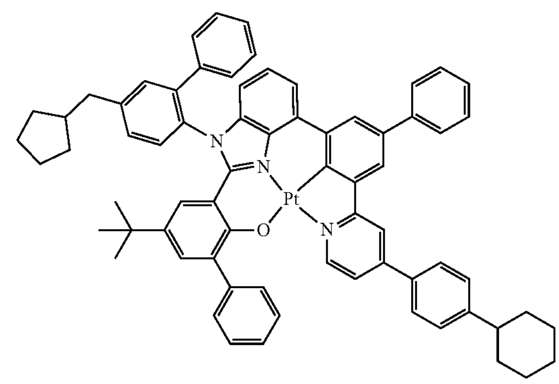
119
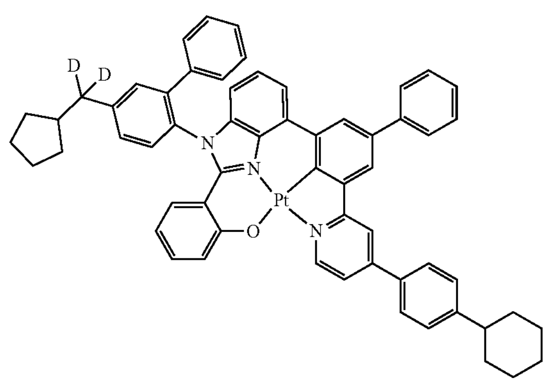
120
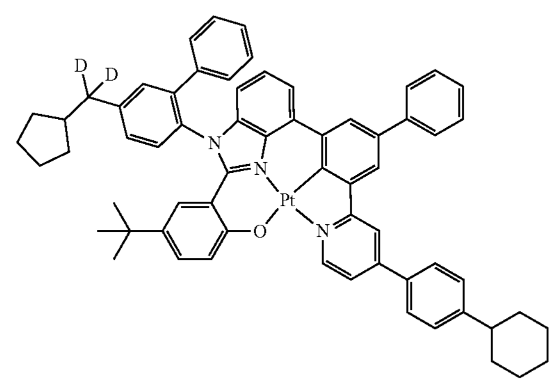
121
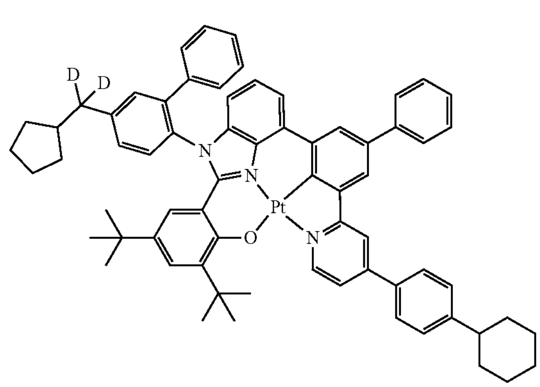
122
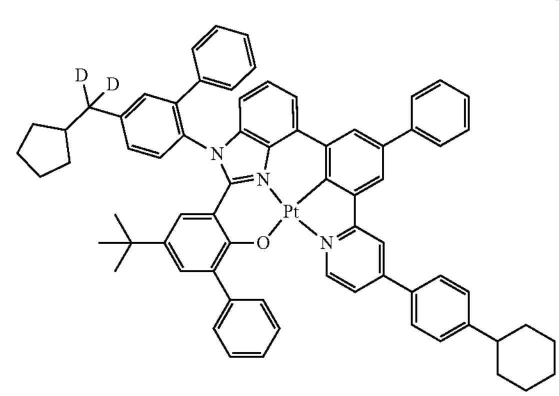

-continued
123
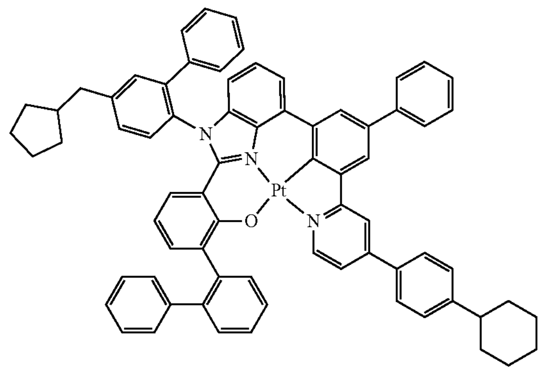
124
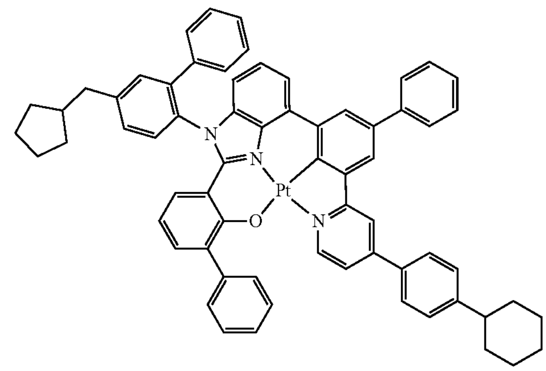
125
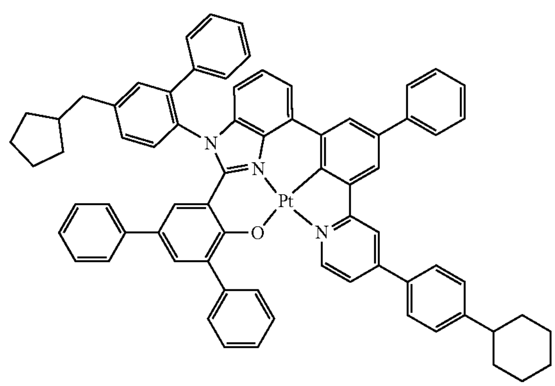
126
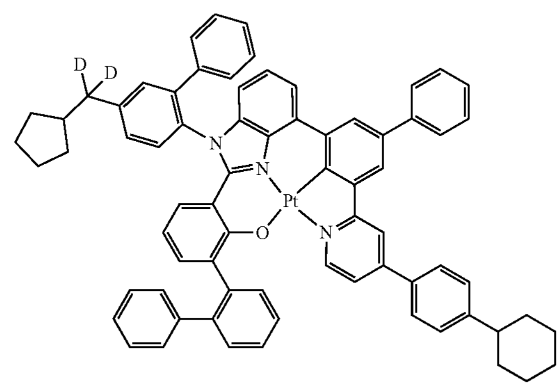
127
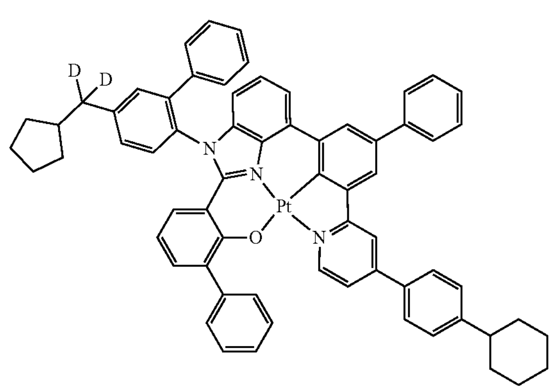
128
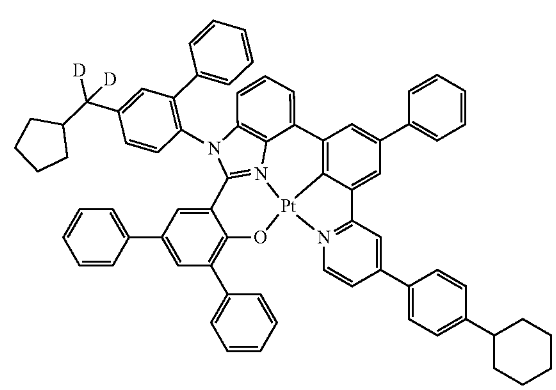

-continued
129
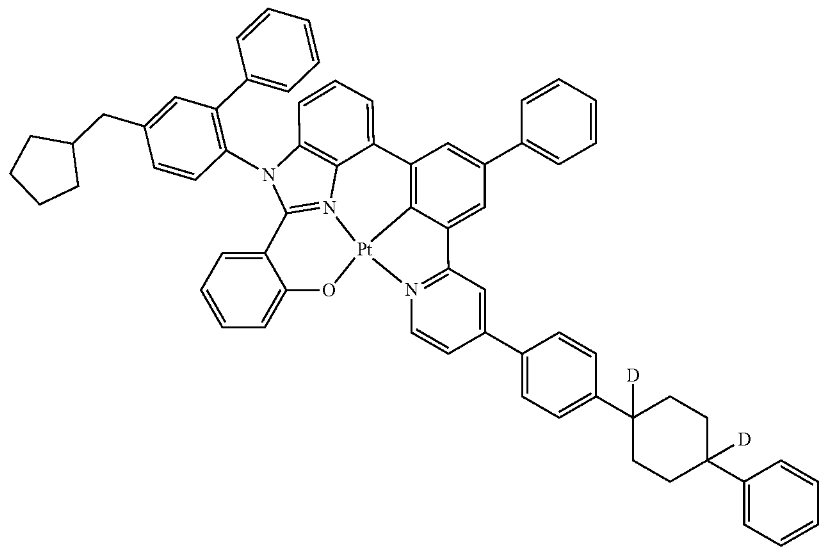
130
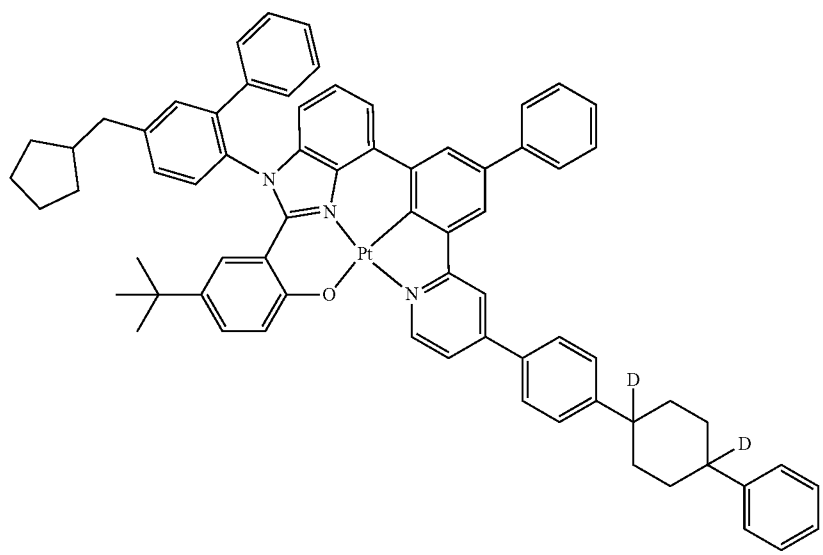
131
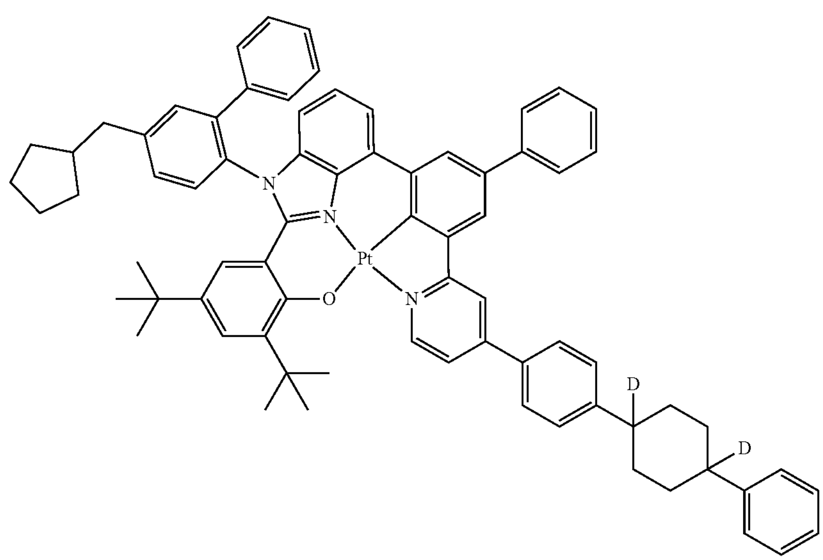

-continued
132
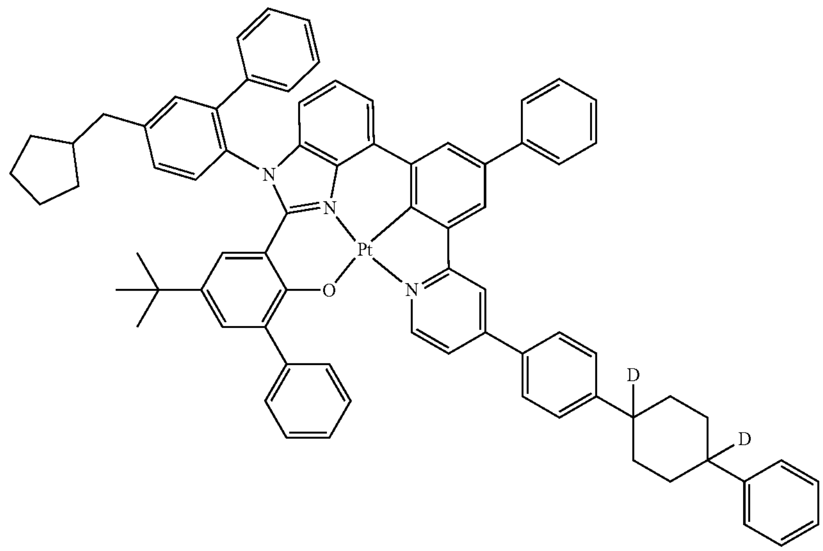
133
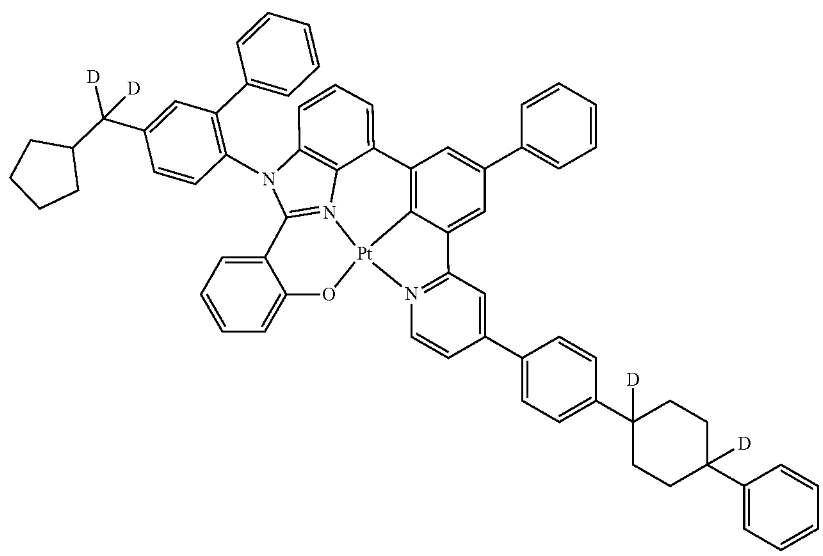
134
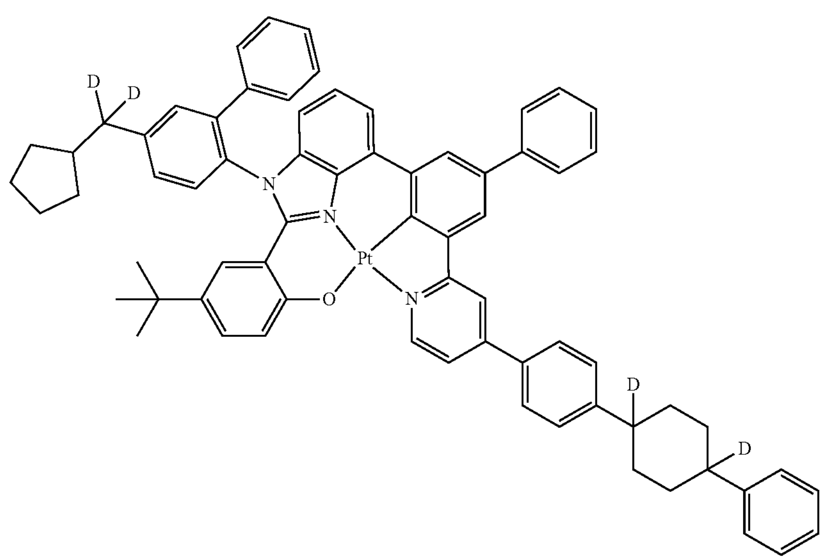

-continued
135
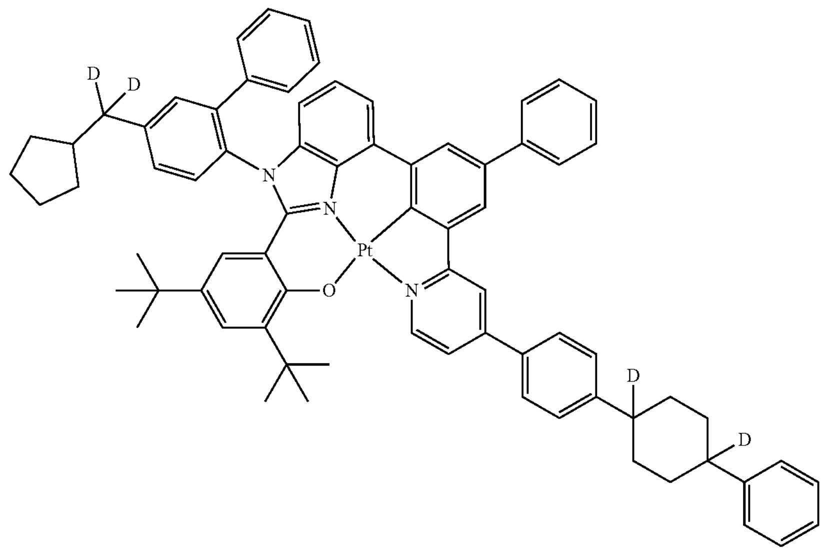
136
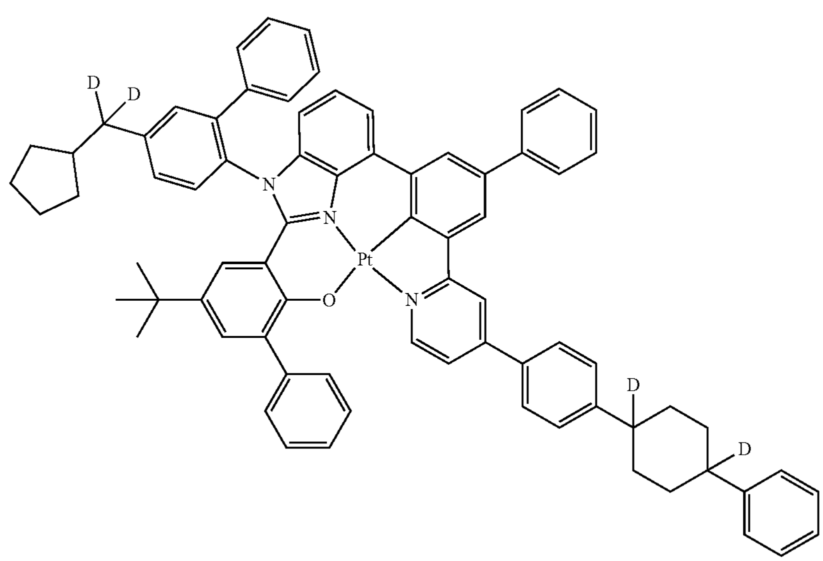

137
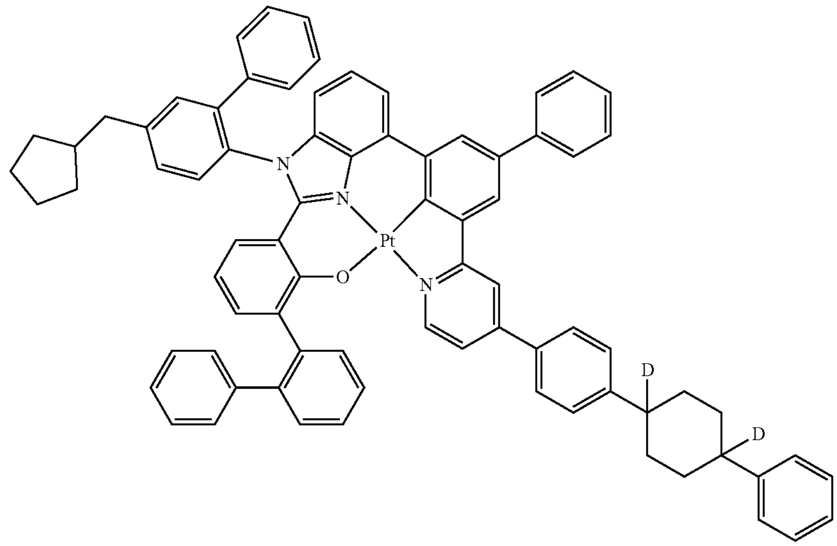
138
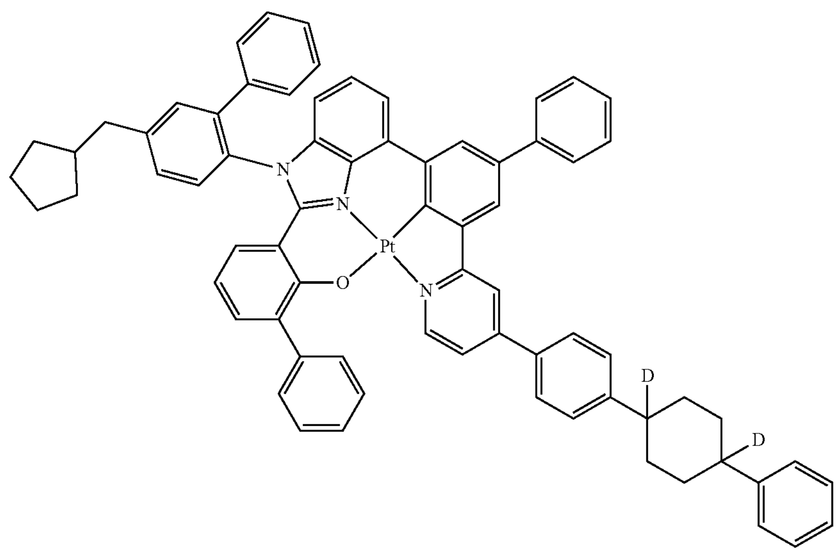
139
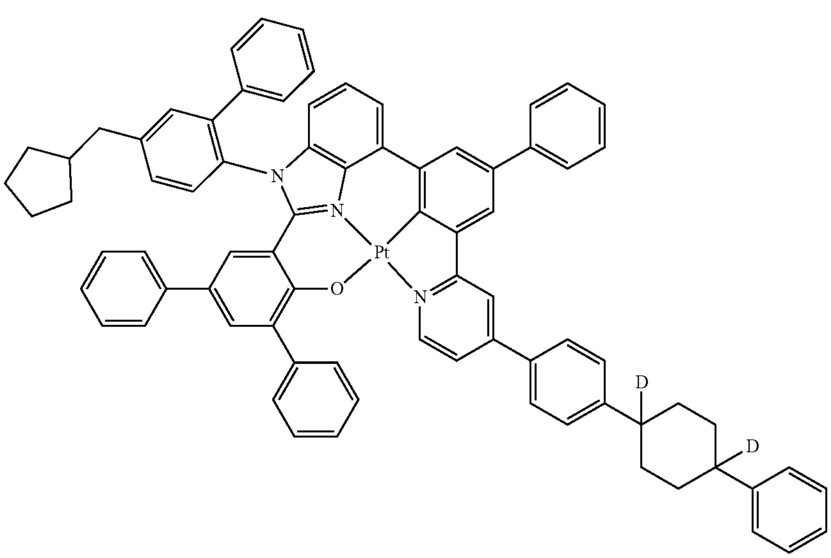

-continued
140
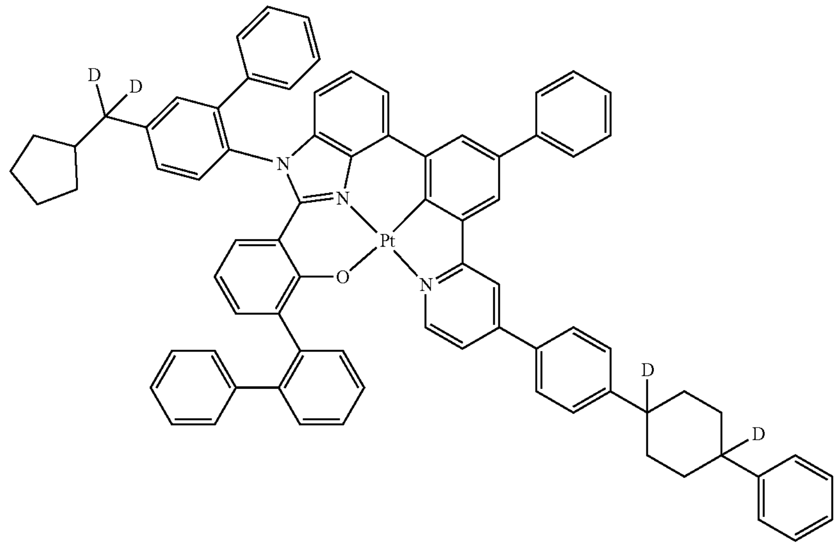
141
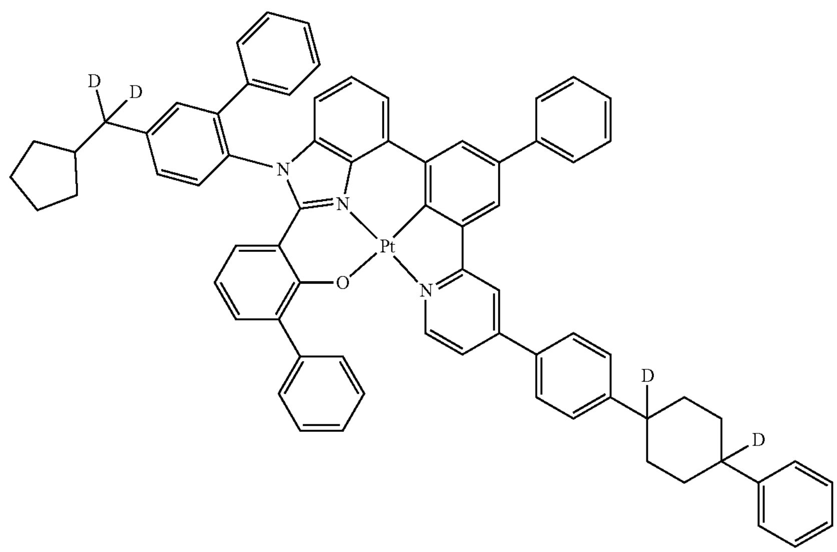
142
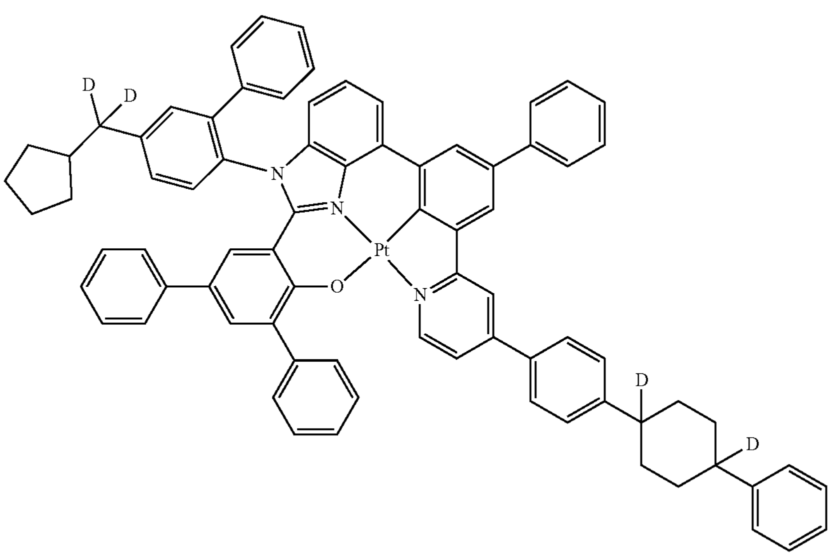

-continued
143
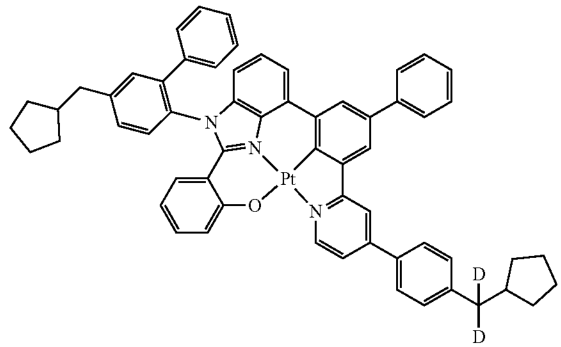
144
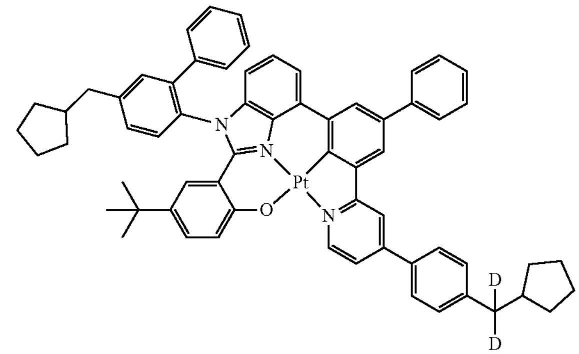
145
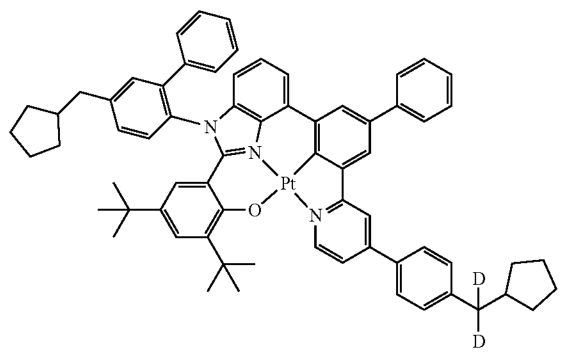
146
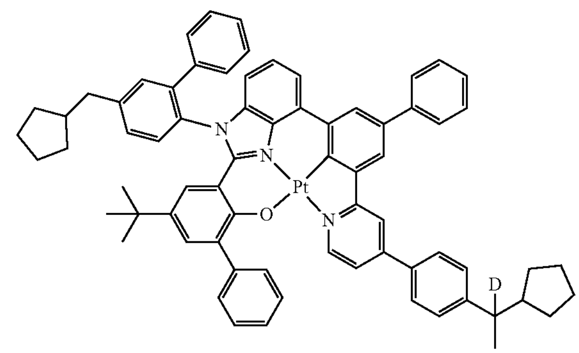
147
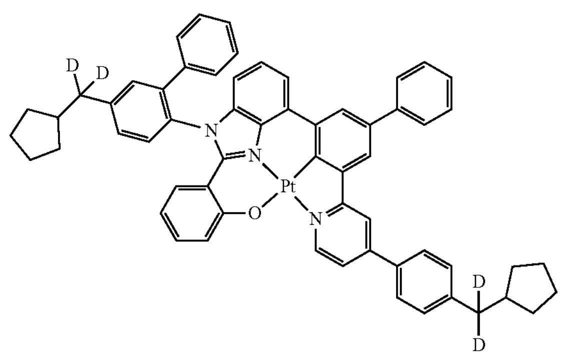
148
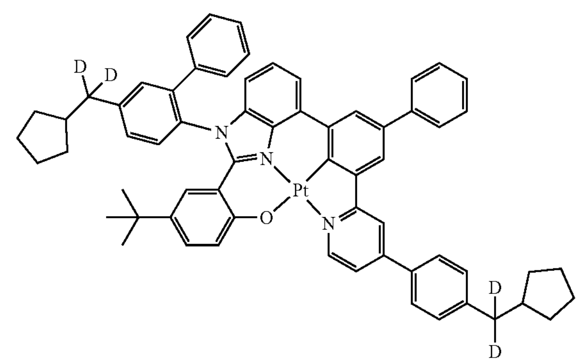
149
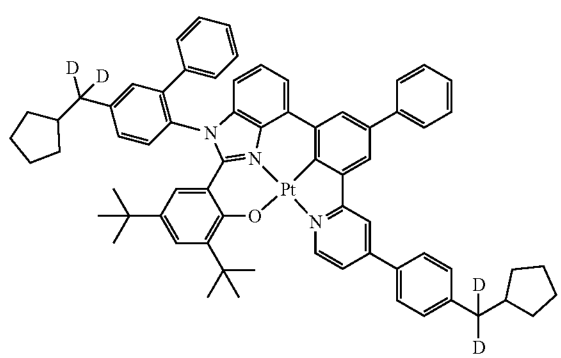
150
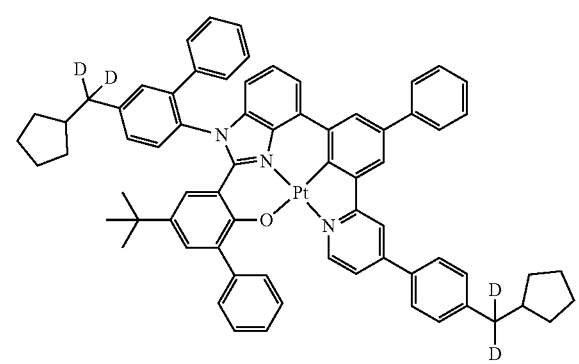

-continued
151
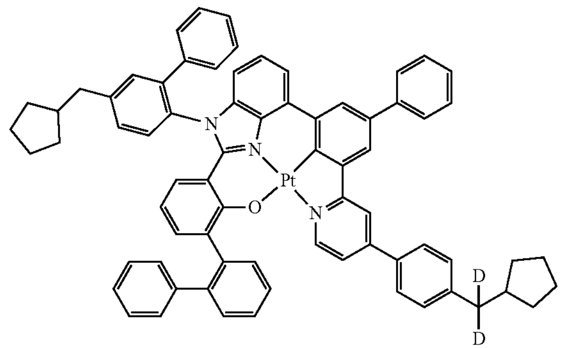
152
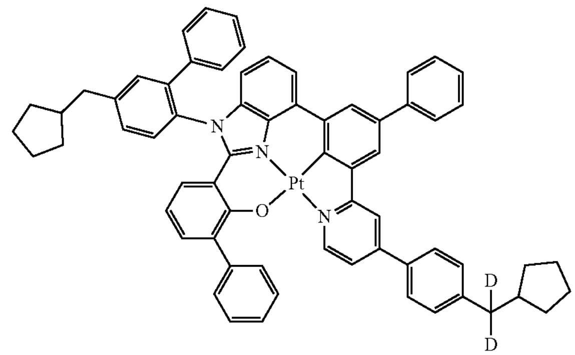
153
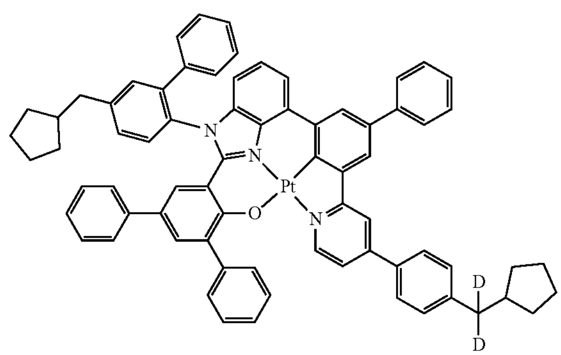
154
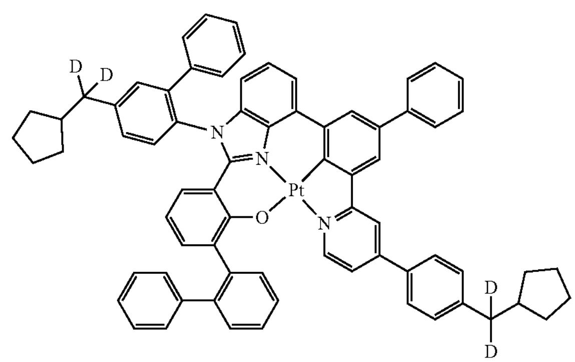
155
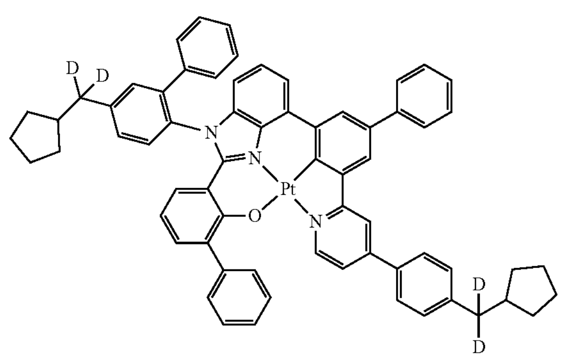
156
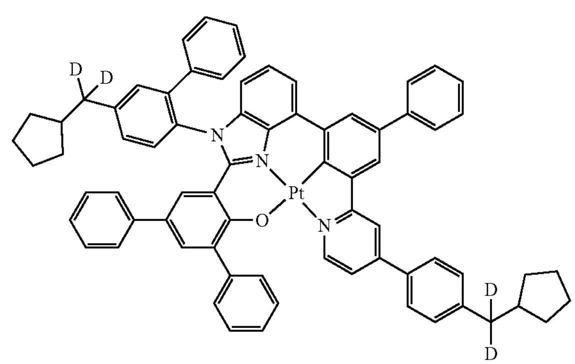
157
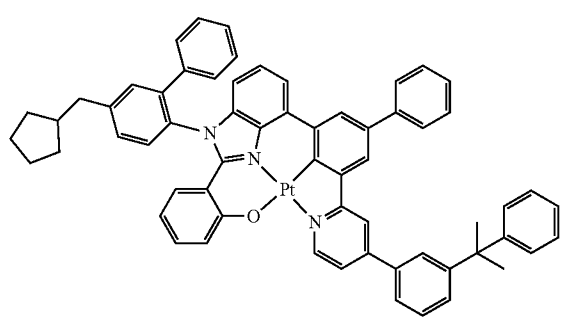
158
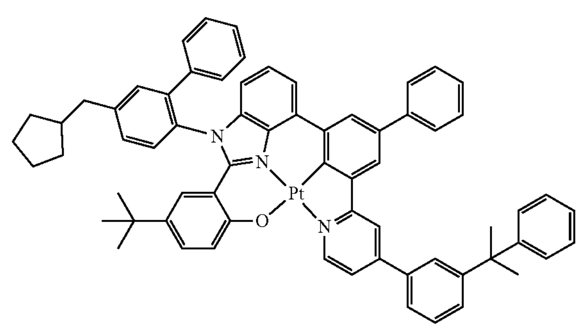

-continued
159
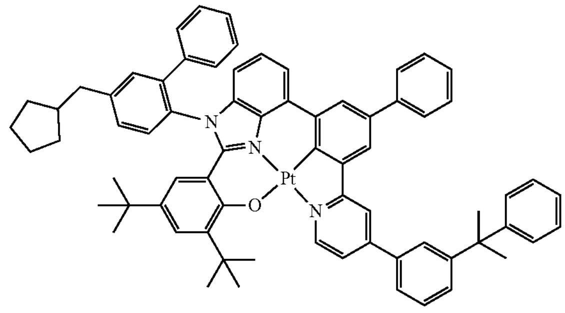
160
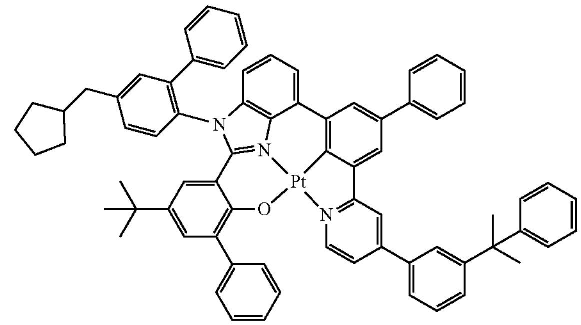
161
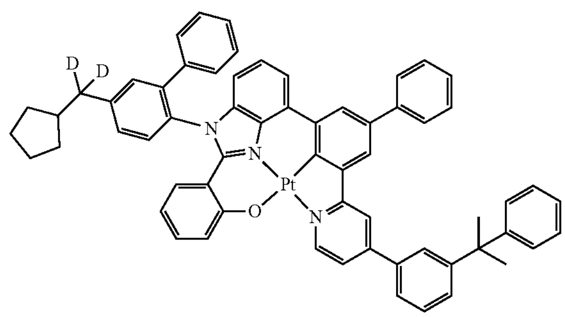
162
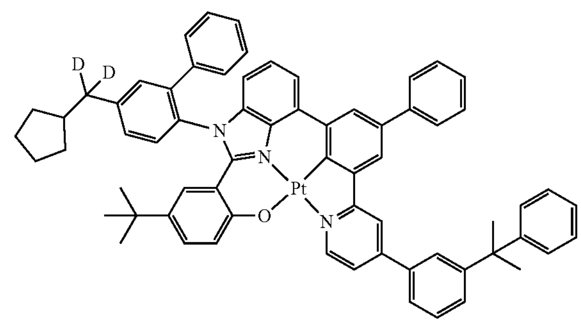
163
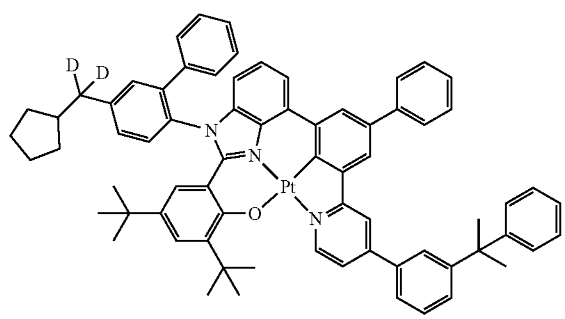
164
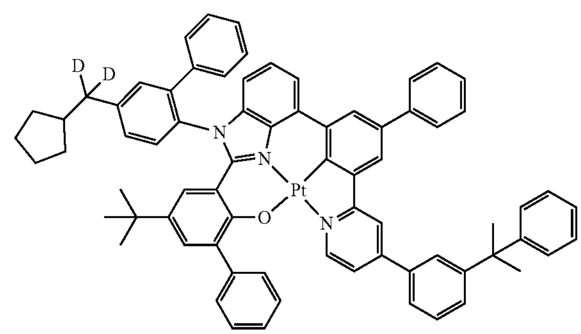
165
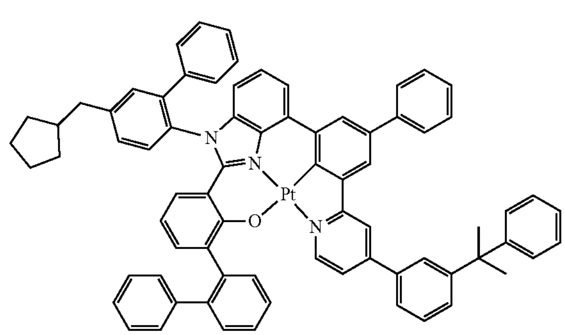
166
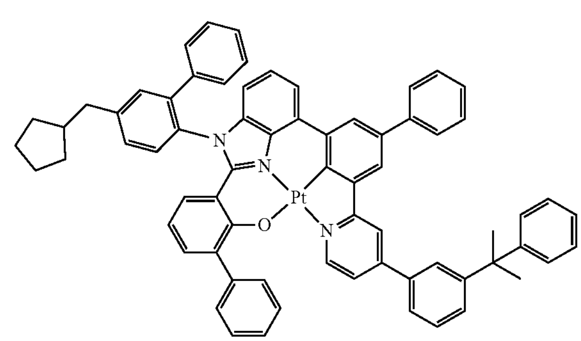

-continued
167
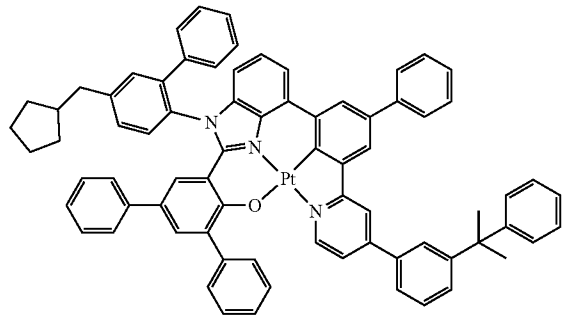
168
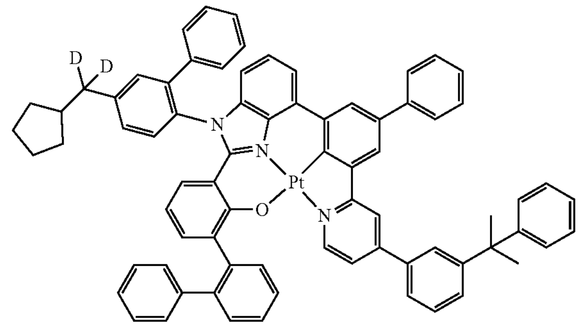
169
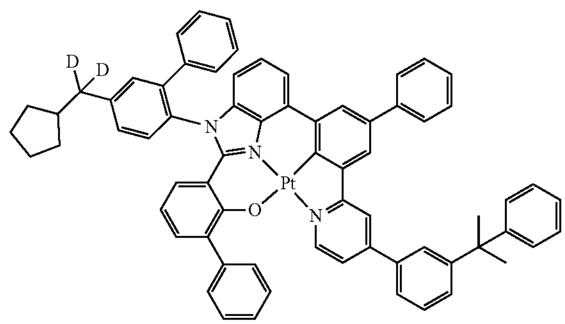
170
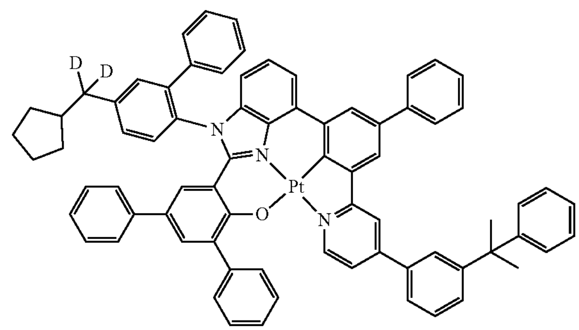
171
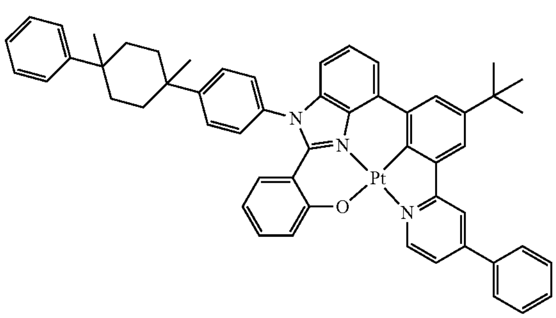
172
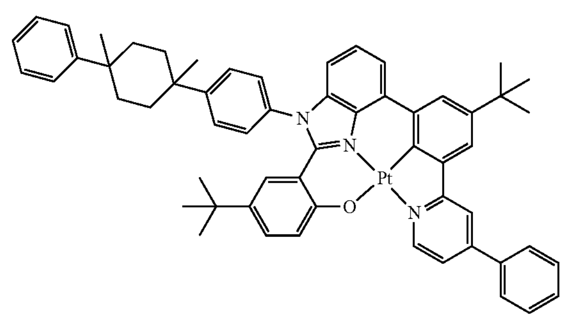
173
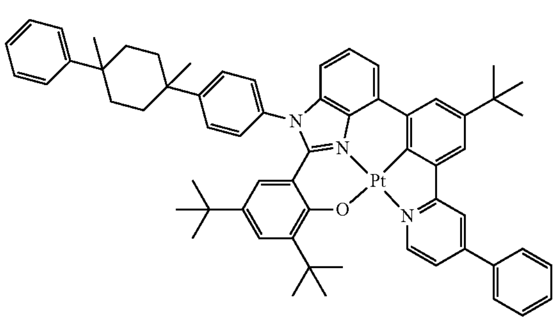
174
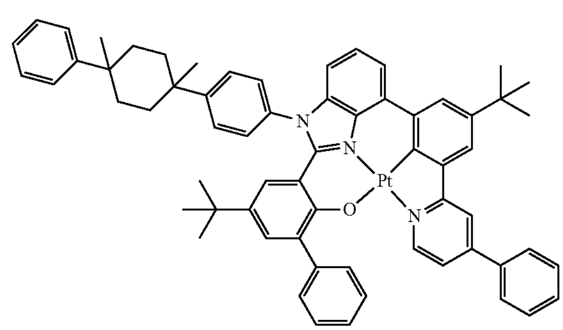

-continued
175
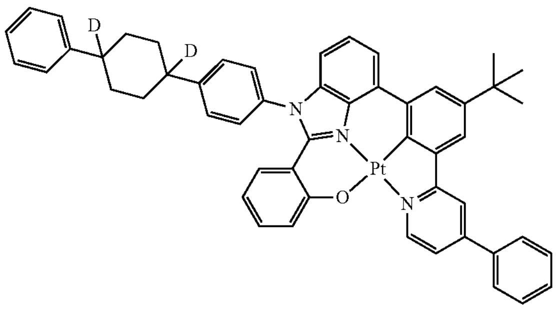
176
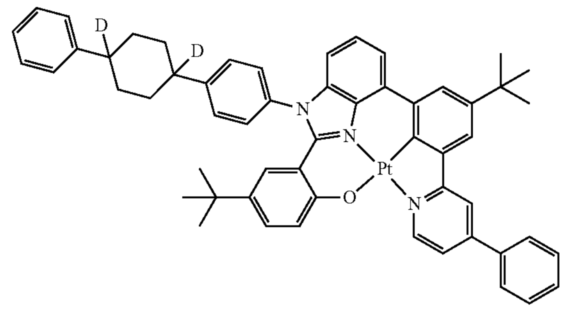
177
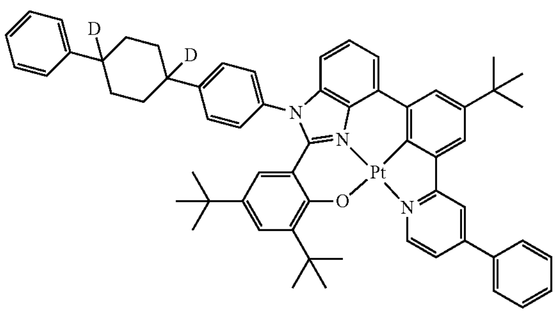
178
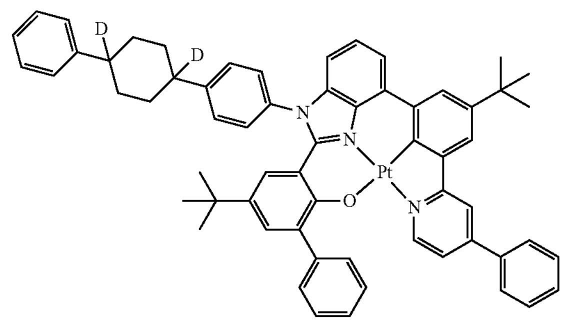
179
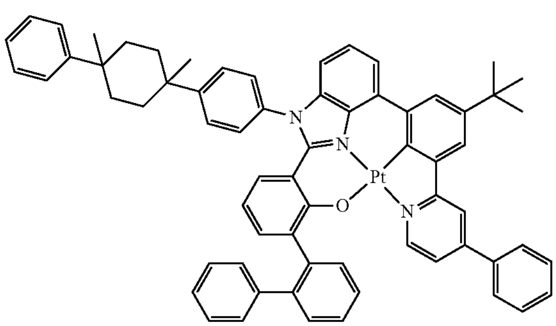
180
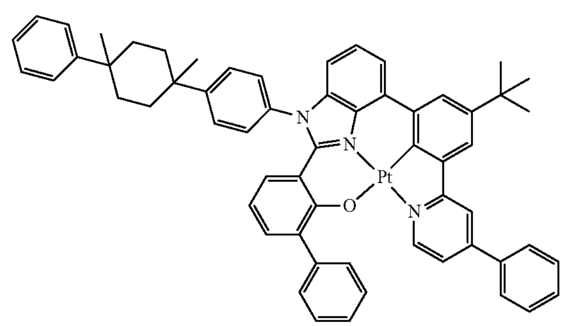
181
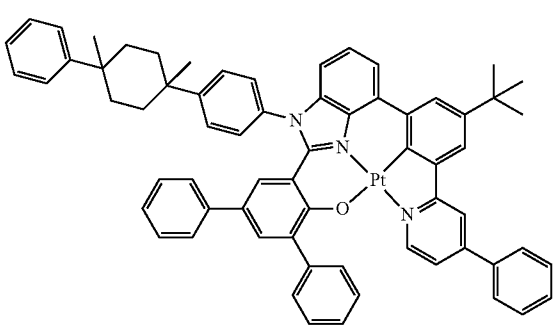
182
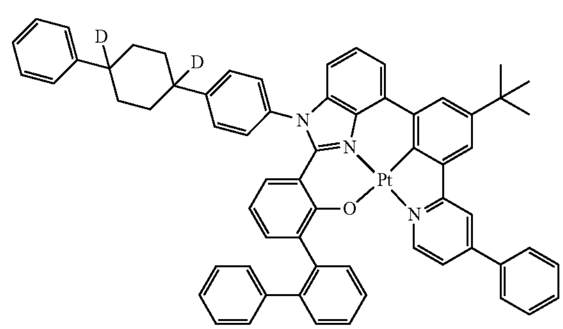

-continued
183
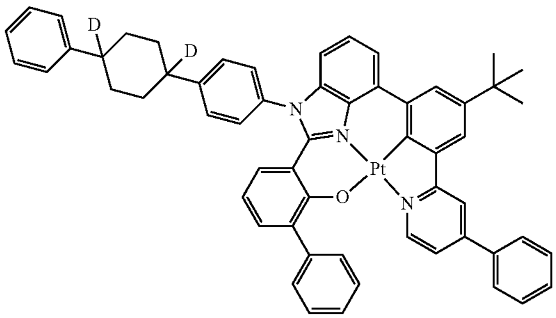
184
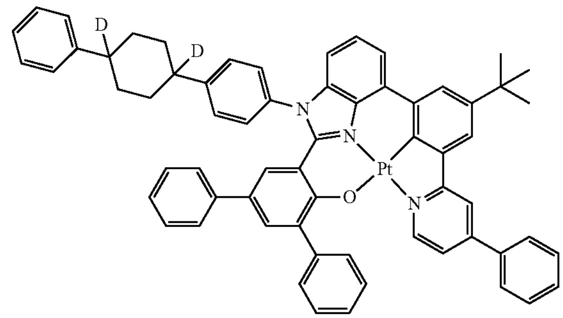
185
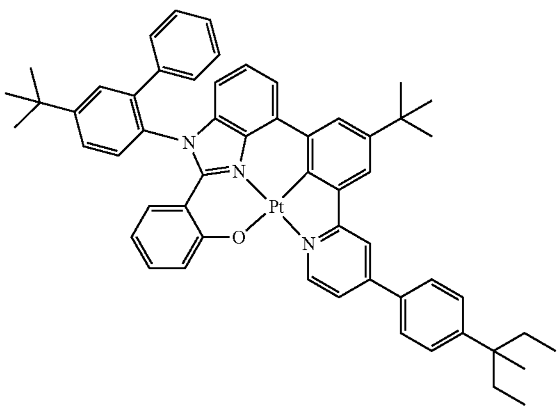
186
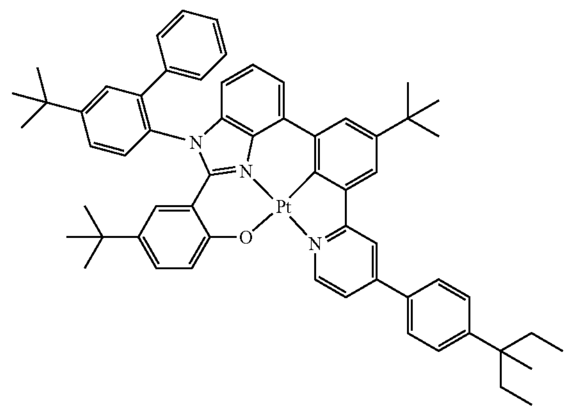
187
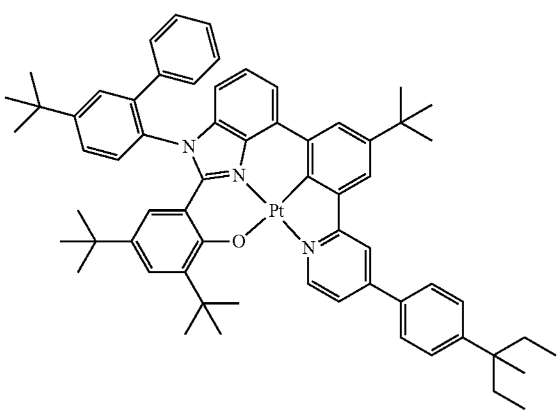
188
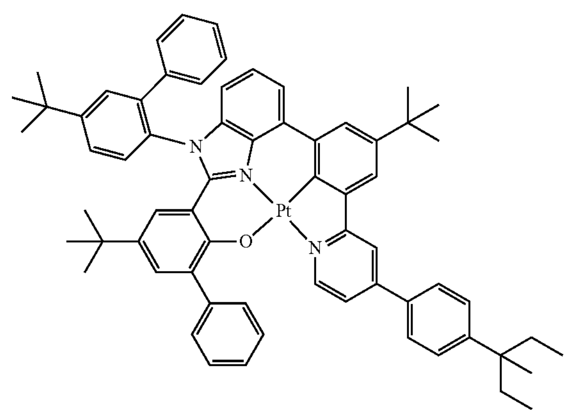
189
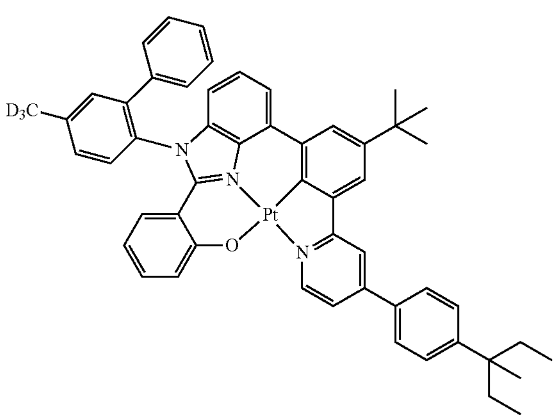
190
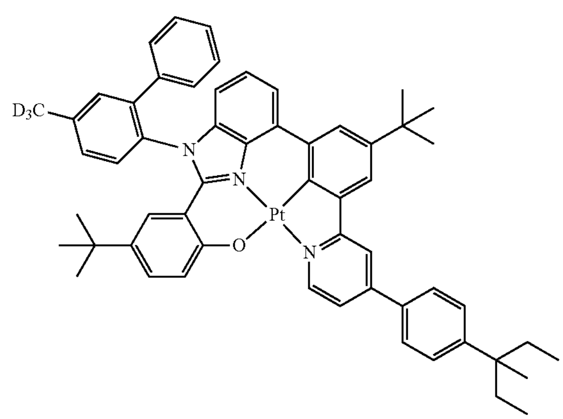

-continued
191
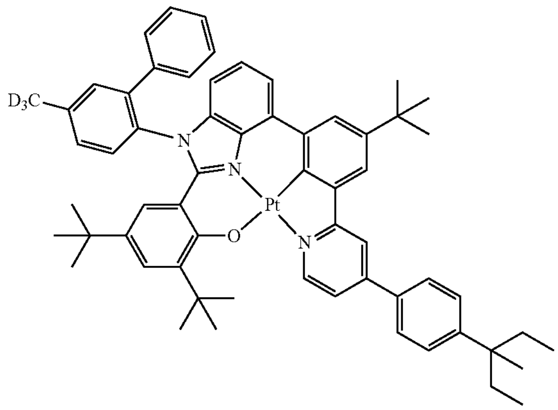
192
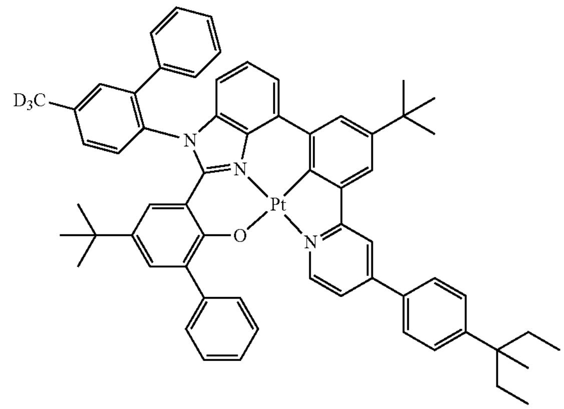
193
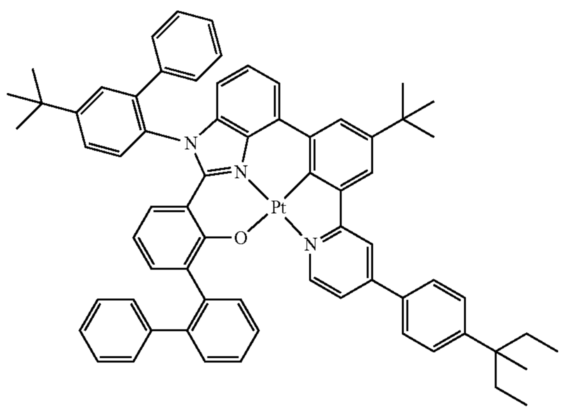
194
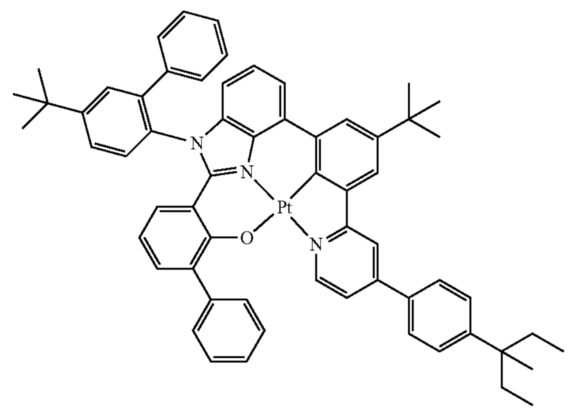
195
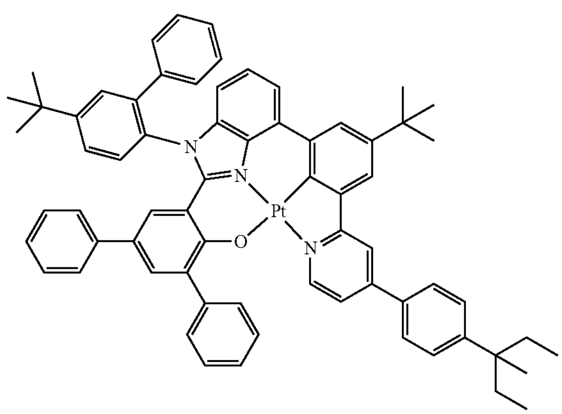
196
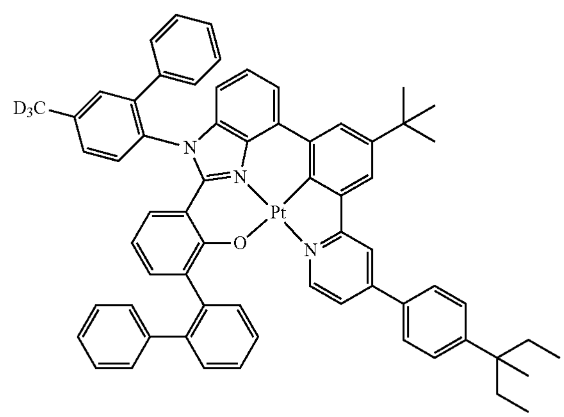

-continued
197
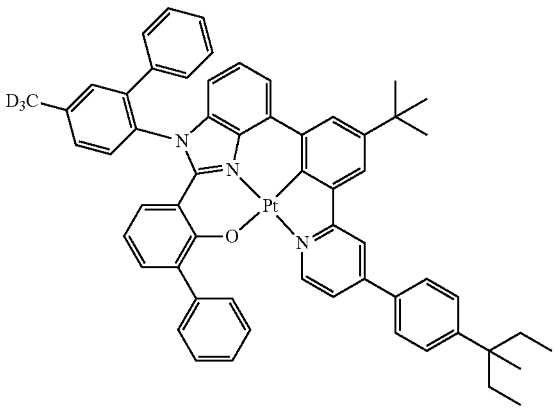
198
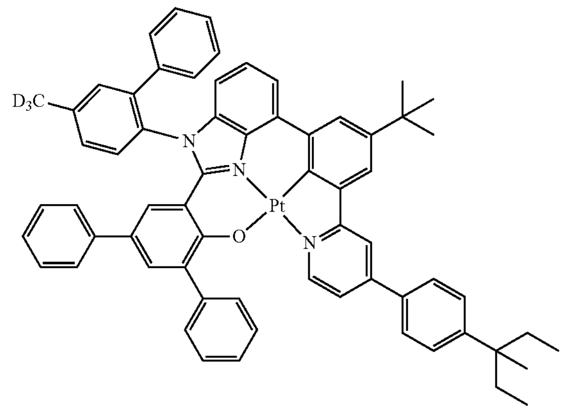
199
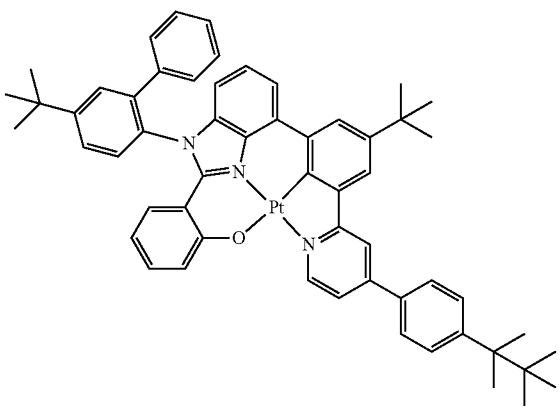
200
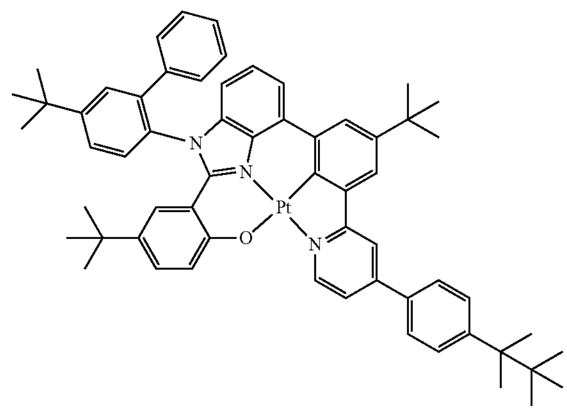
201
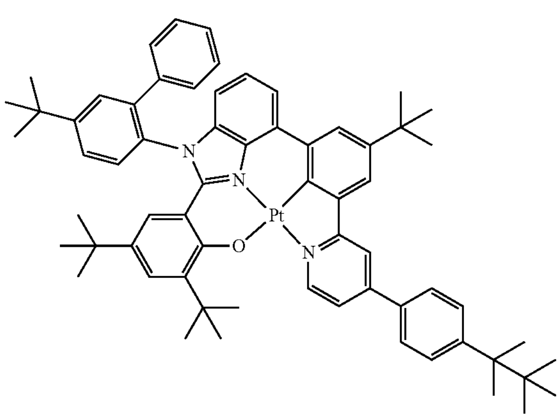
202
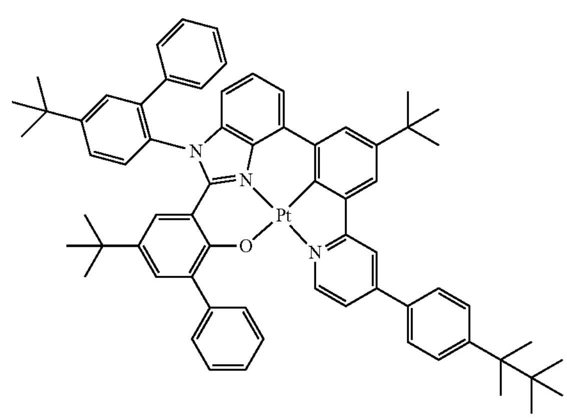

-continued
203
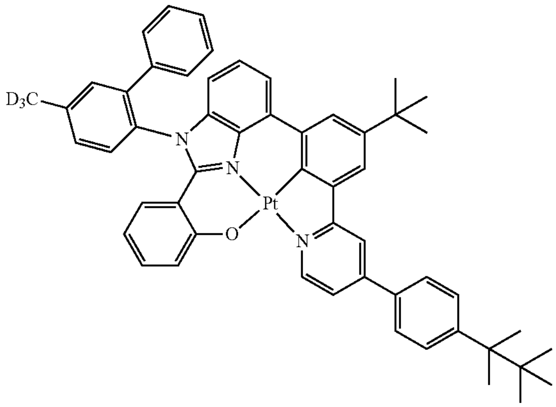
204
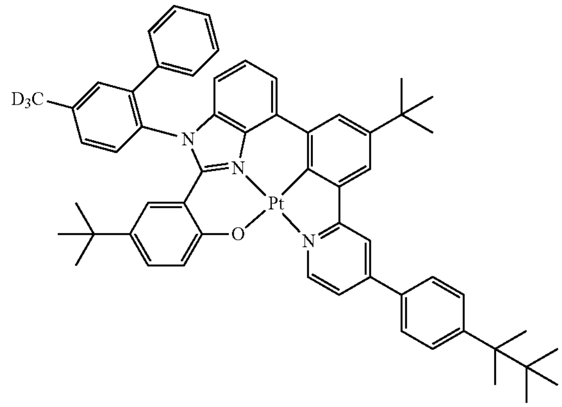
205
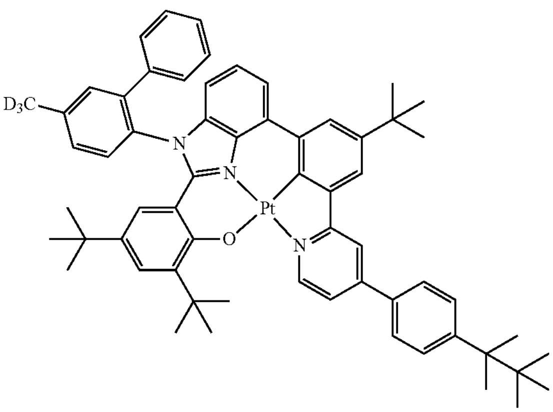
206
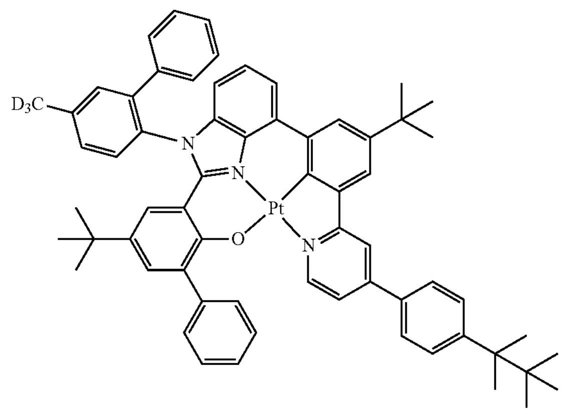
207
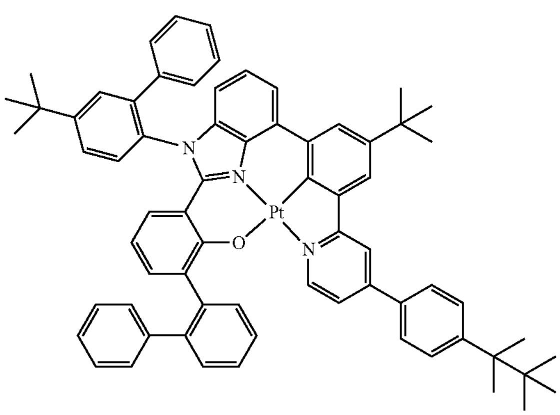
208
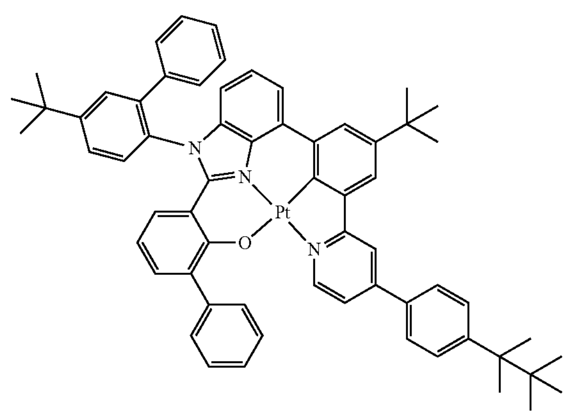

-continued
209
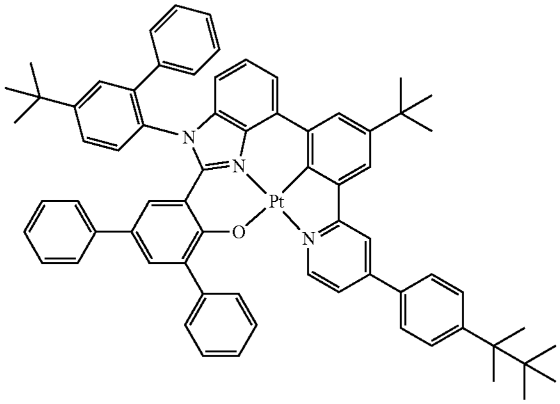
210
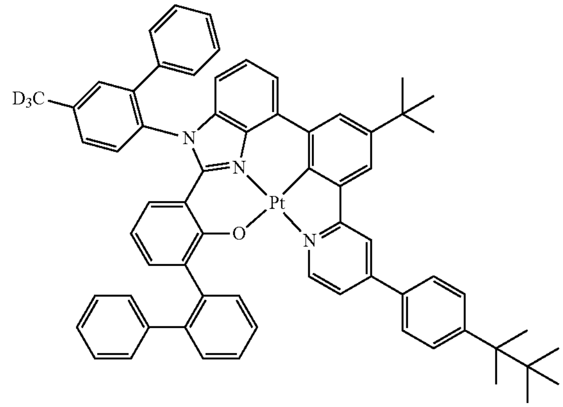
211
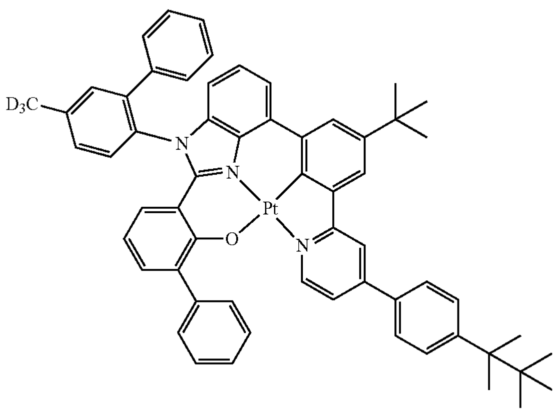
212
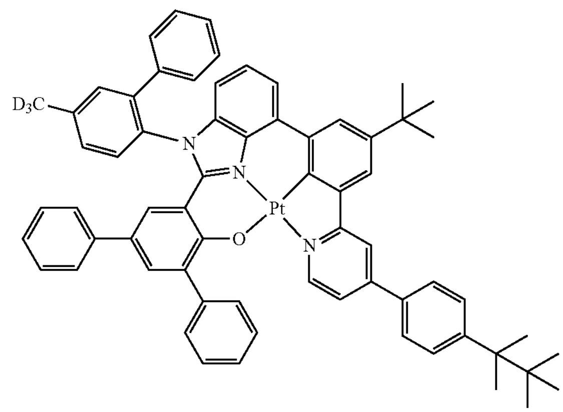
213
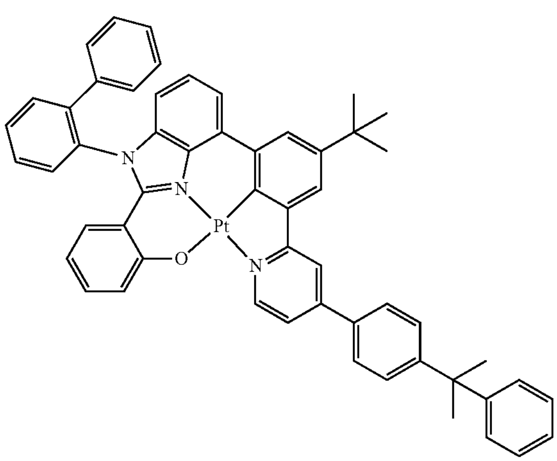
214
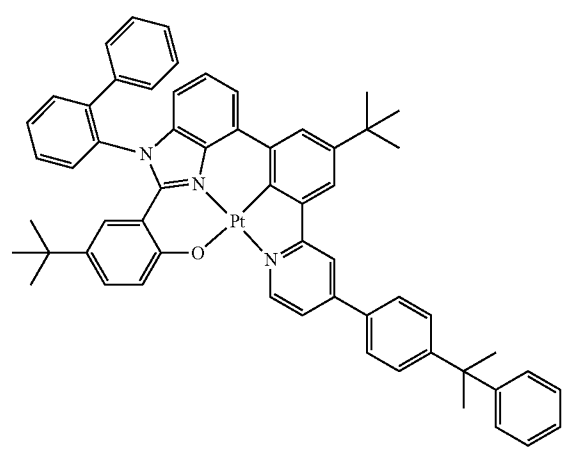

-continued
215
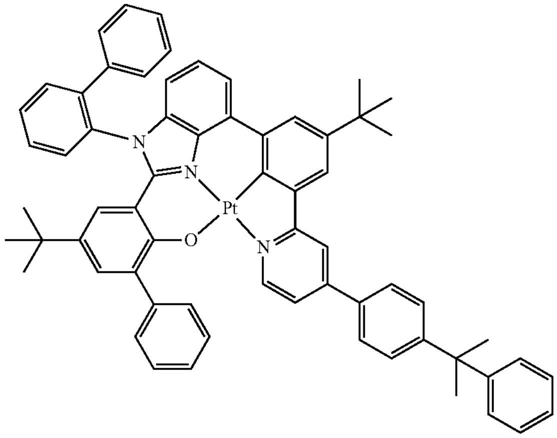
216
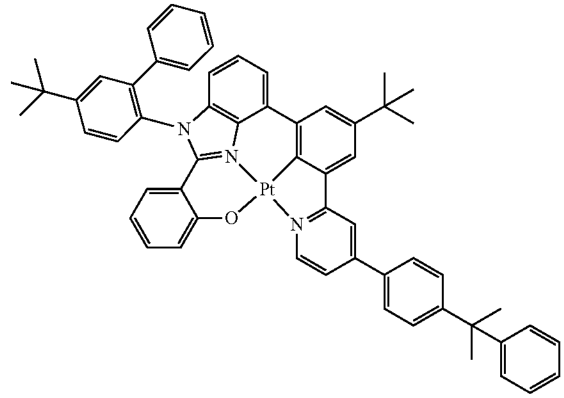
217
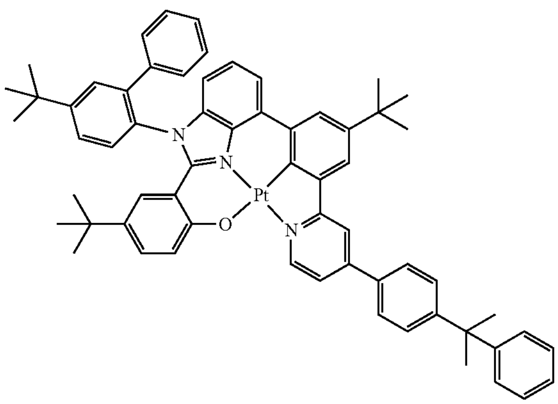
218
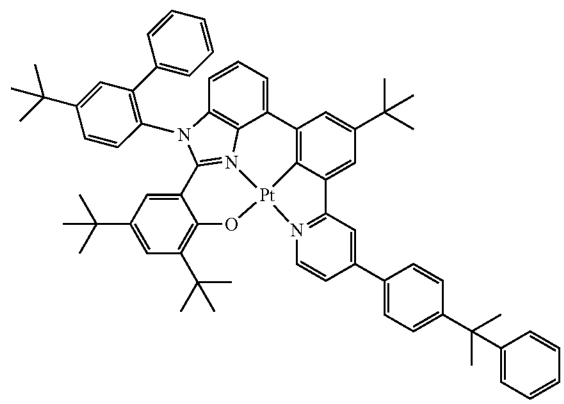
219
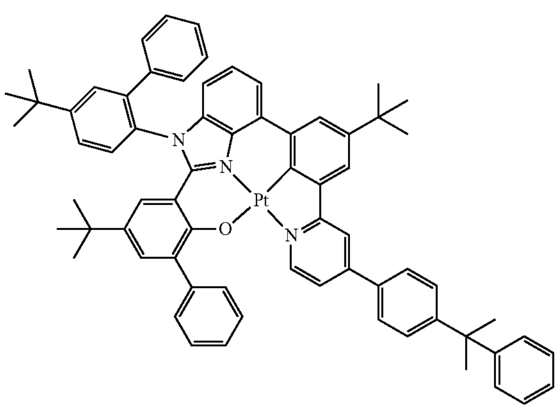
220
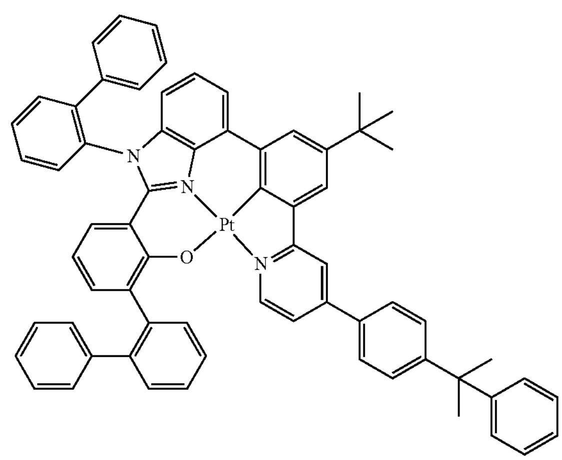

-continued
221
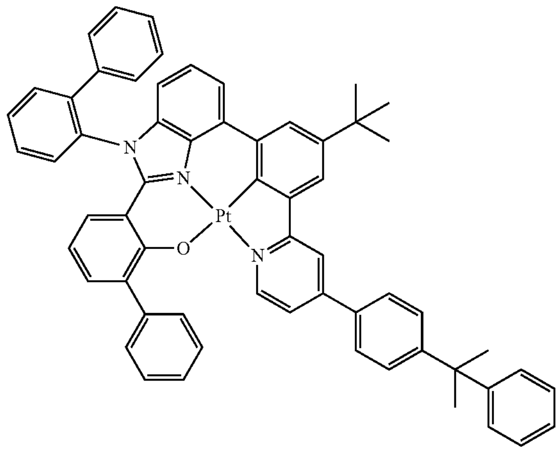
222
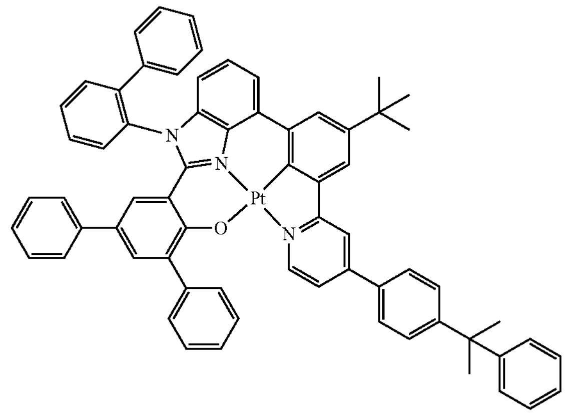
223
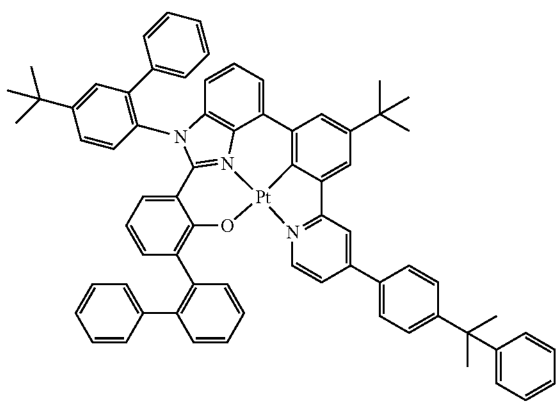
224
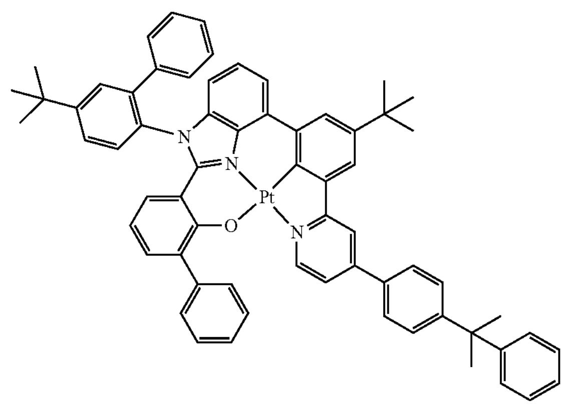
225
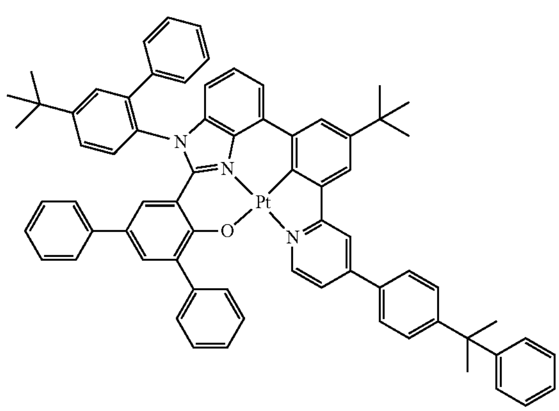
226
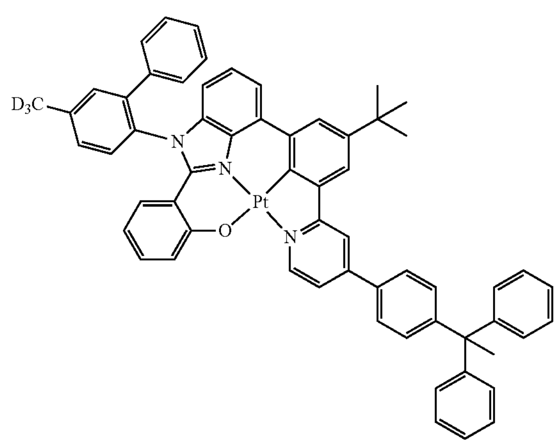

-continued
227
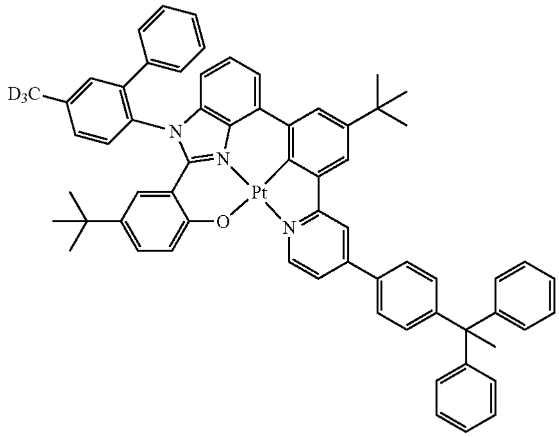
228
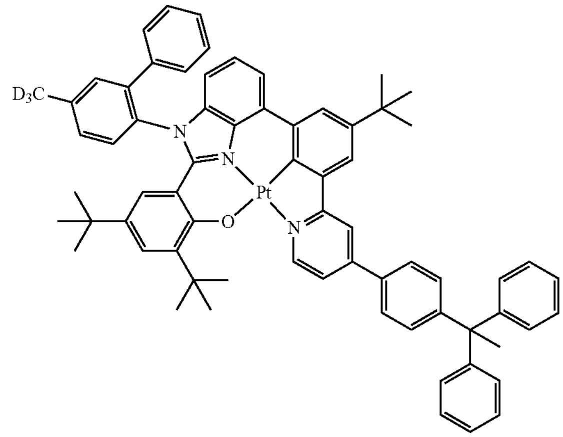
229
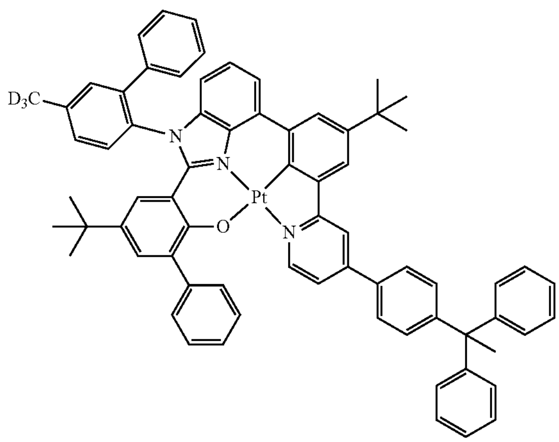
230
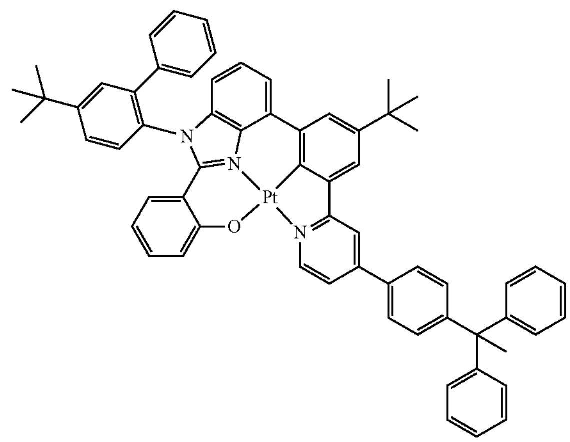
231
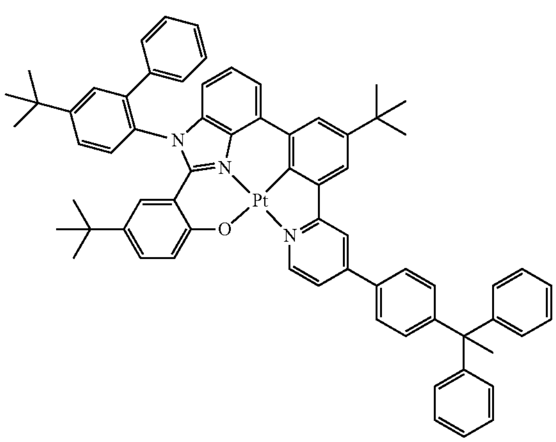
232
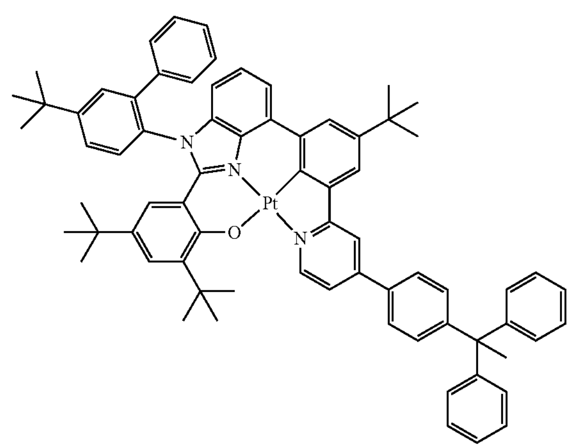

-continued
233
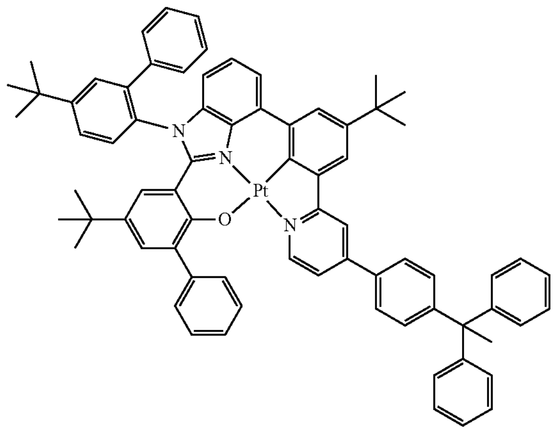
234
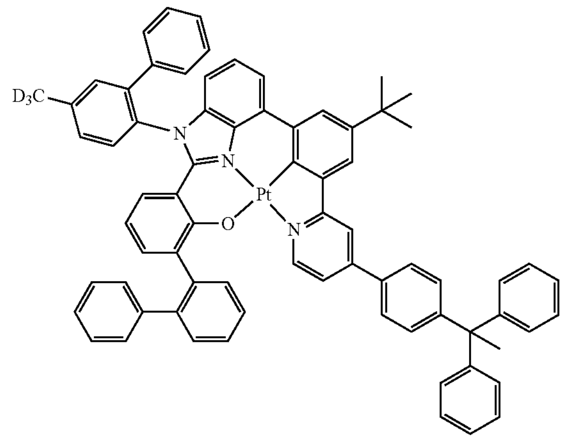
235
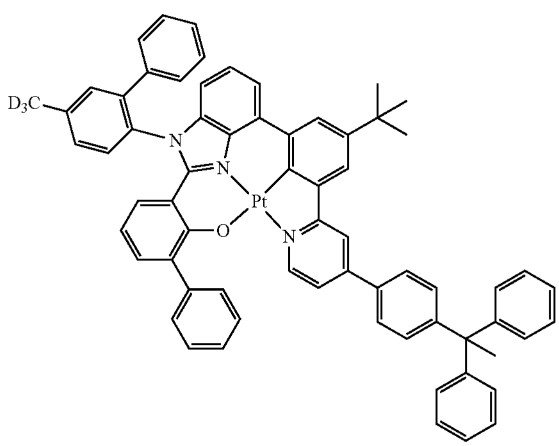
236
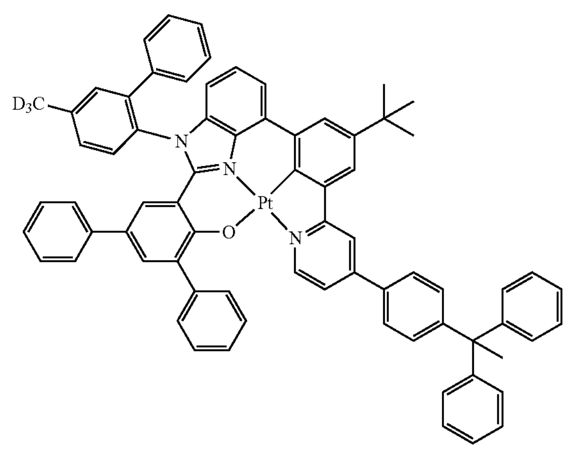
237
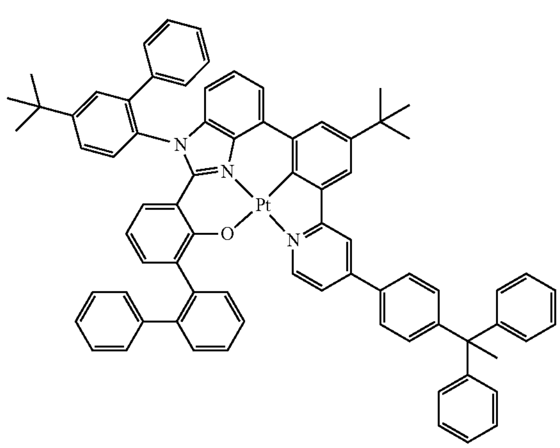
238
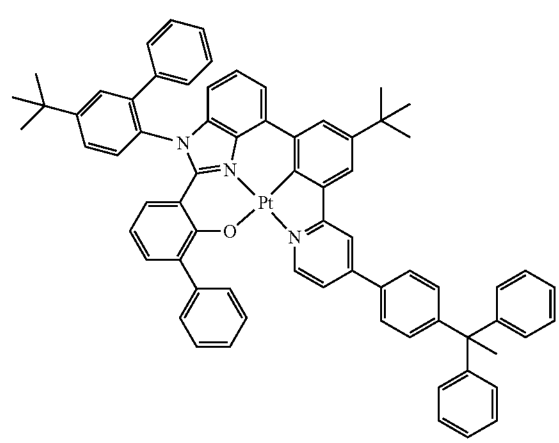

-continued
239
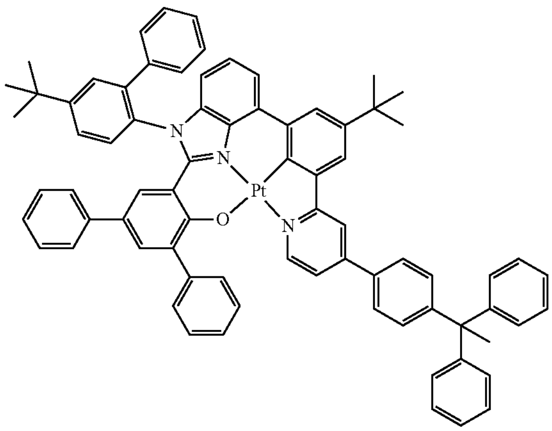
240
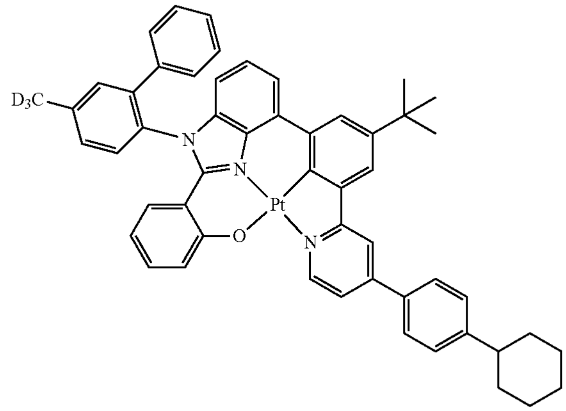
241
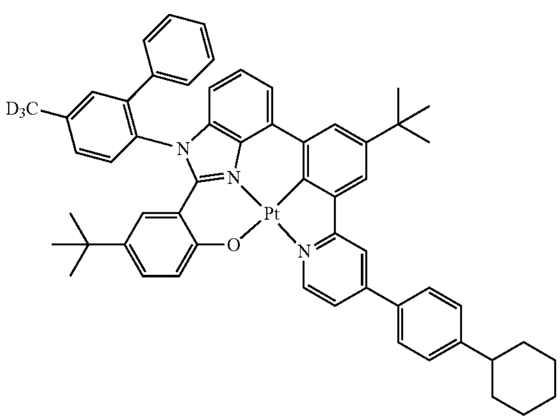
242
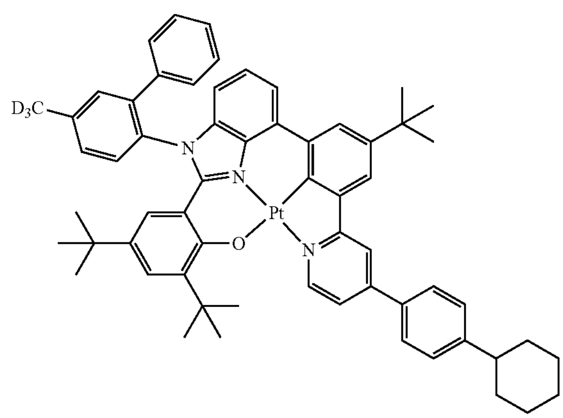
234
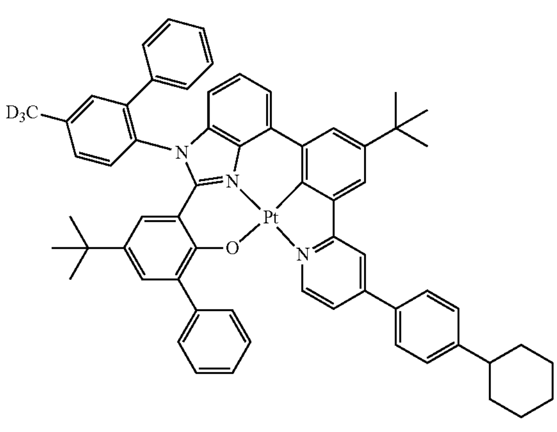
244
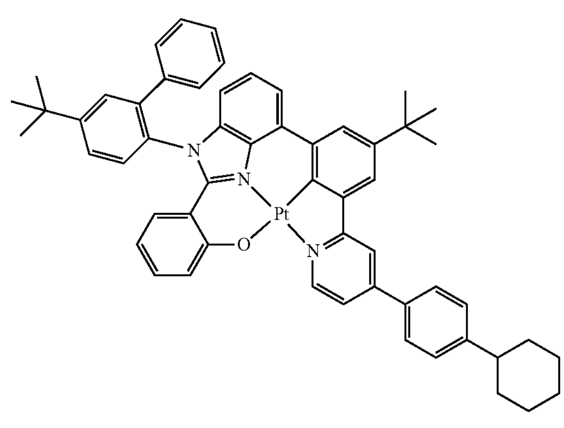

-continued
245
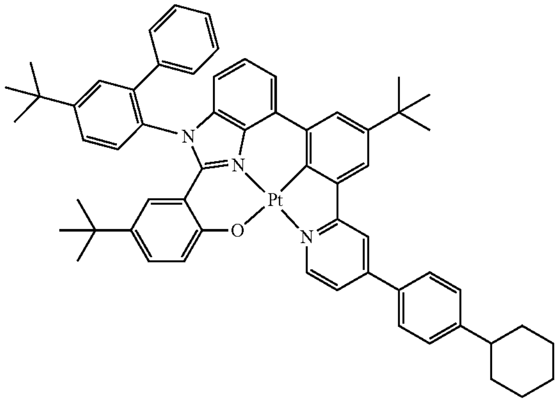
246
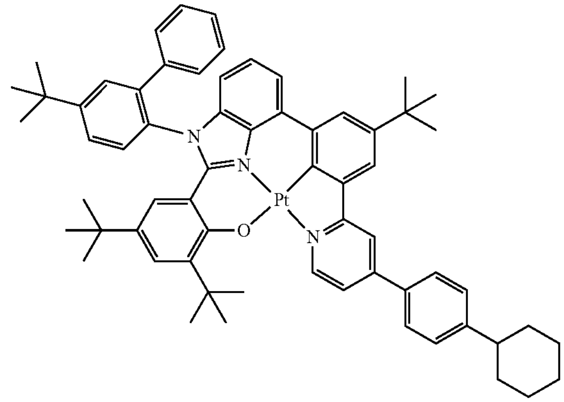
247
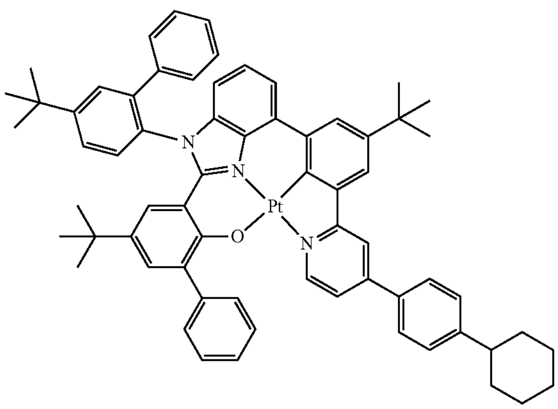
248
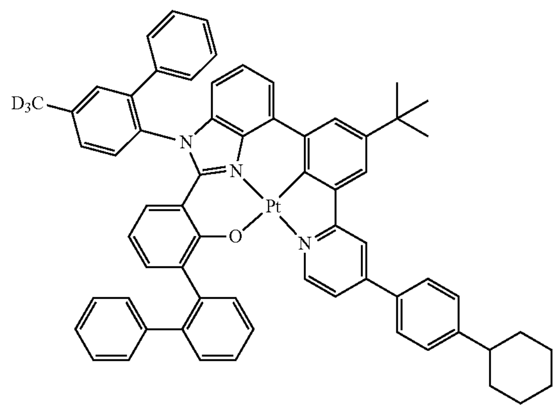
249
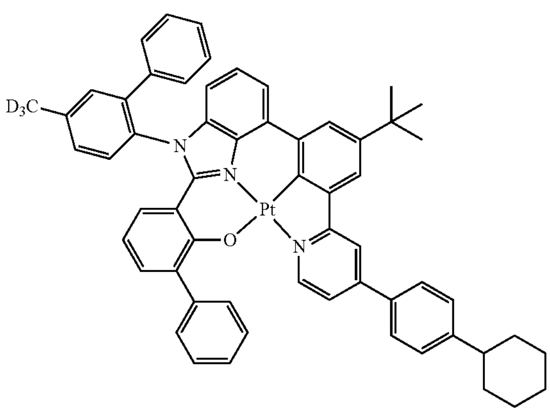
250
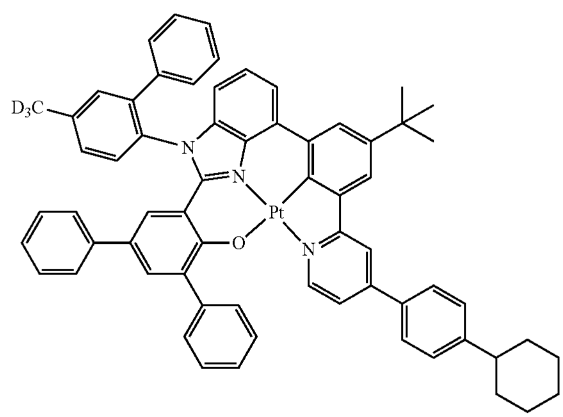

-continued
251
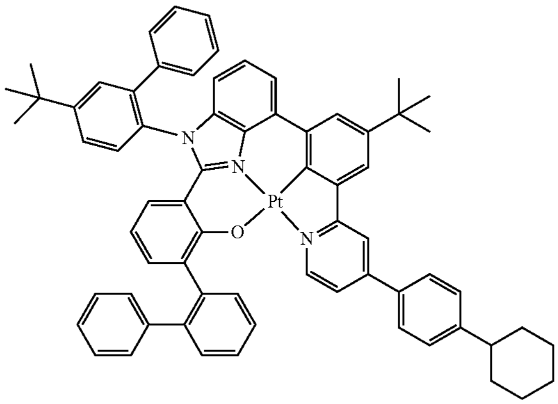
252
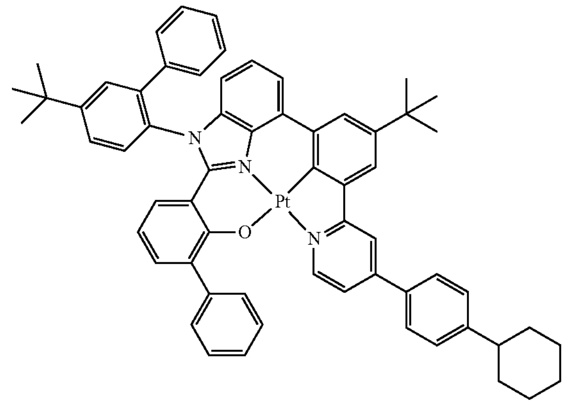
253
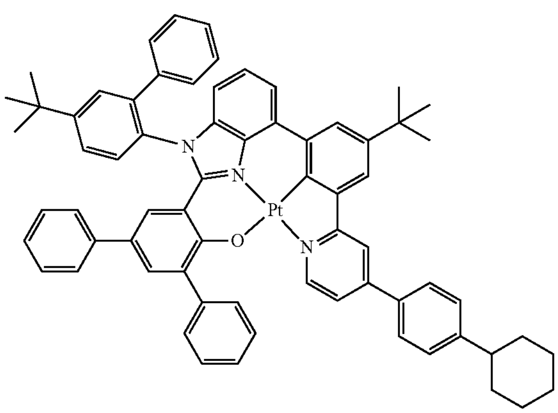
254
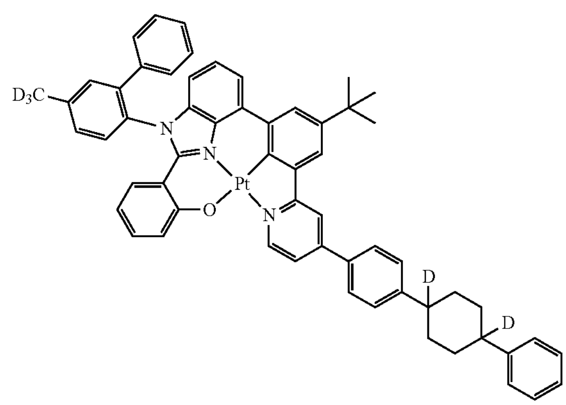
255
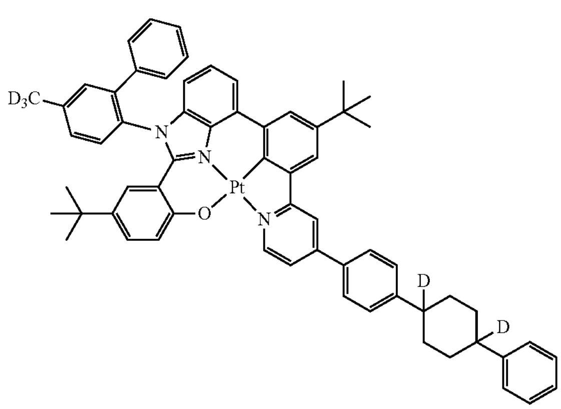
256
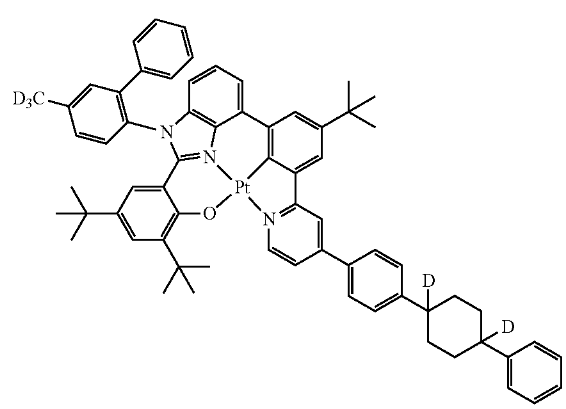

-continued
257
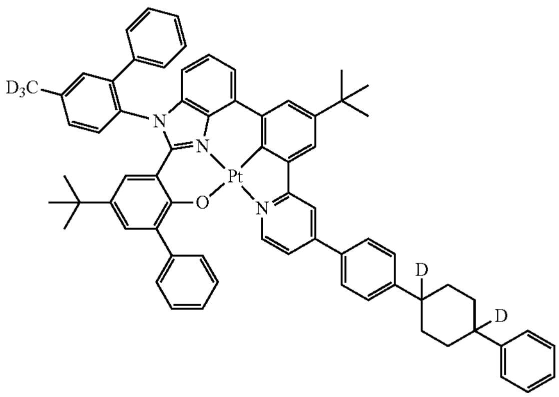
258
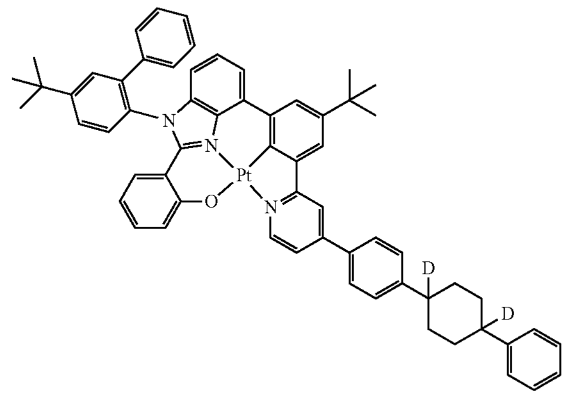
259
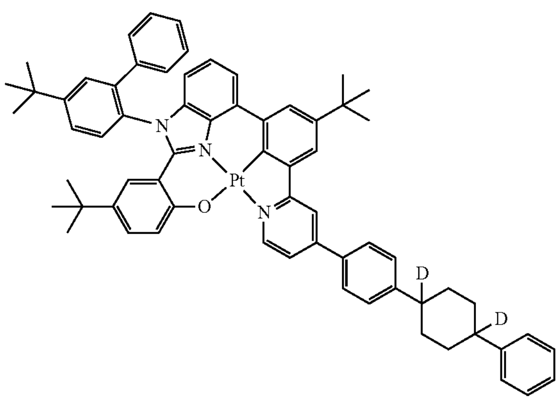
260
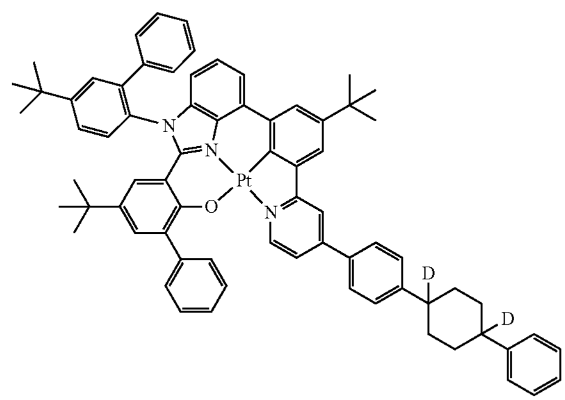
261
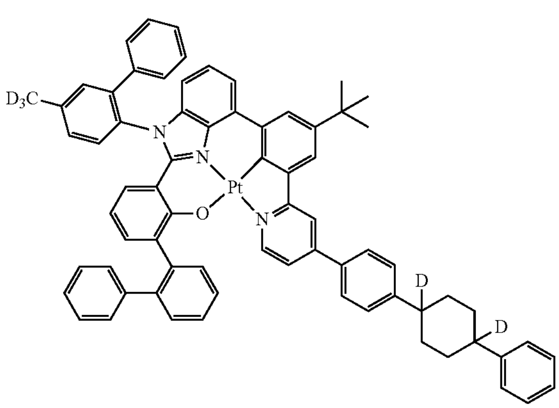
262
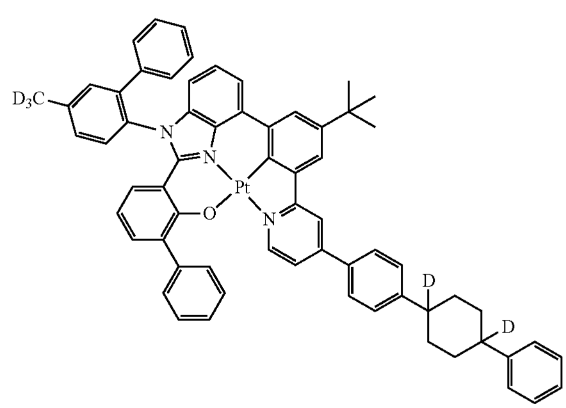

-continued
263
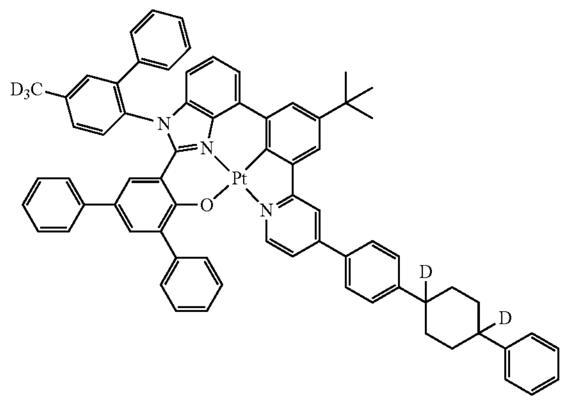
264
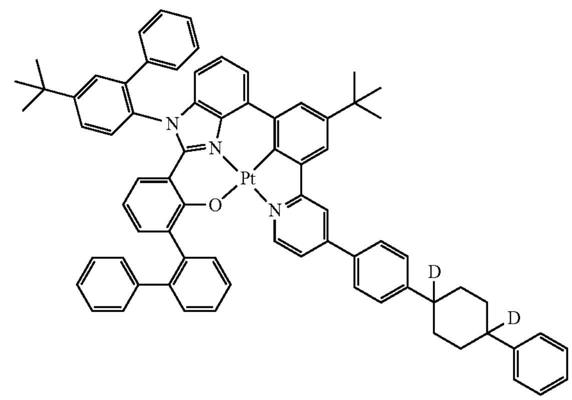
265
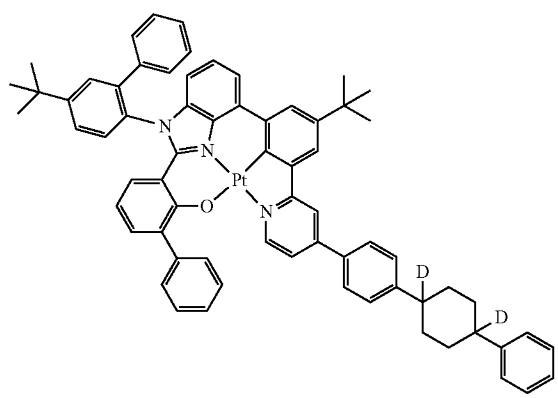
266
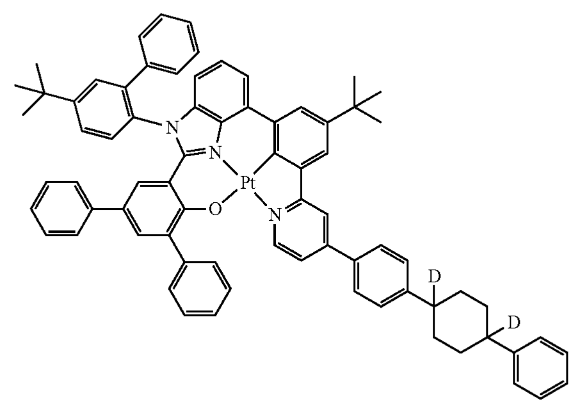
267
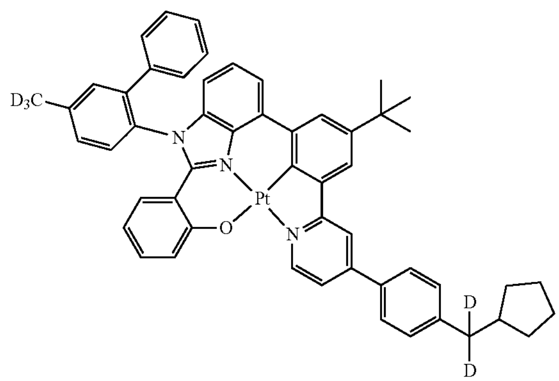
268
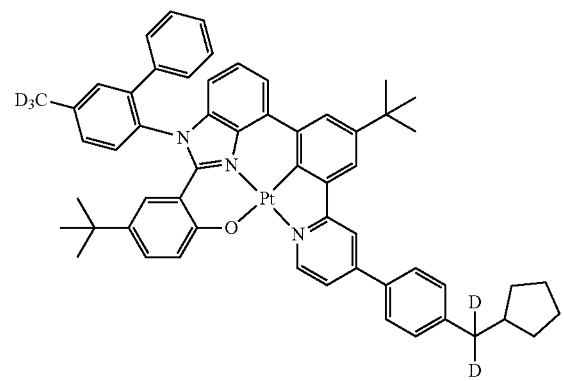
269
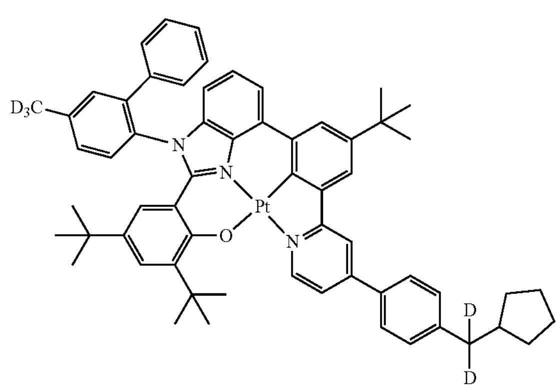
270
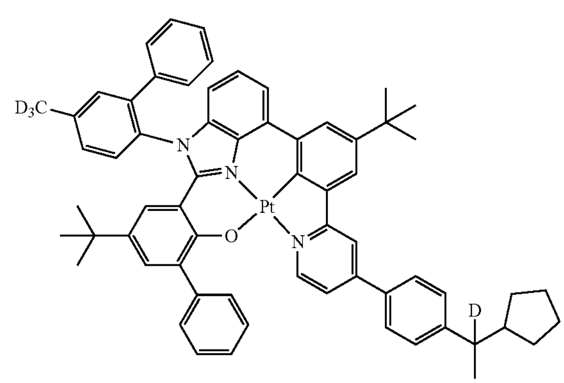

-continued
271
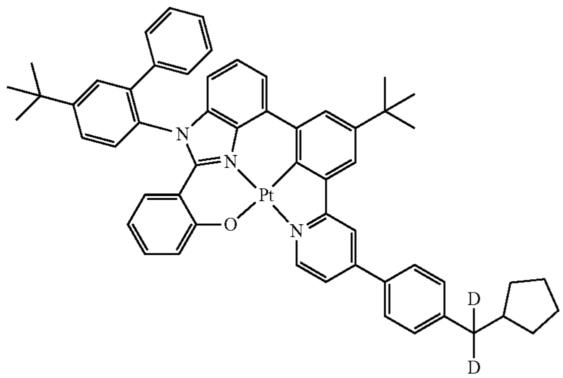
272
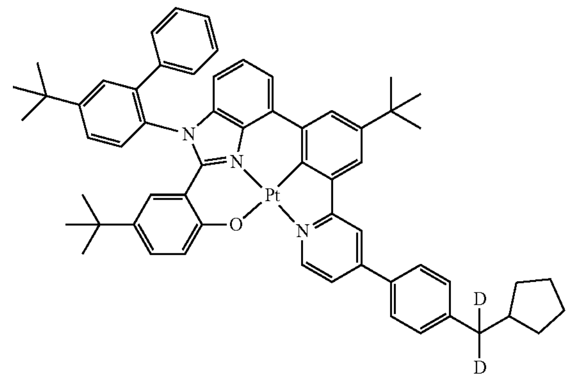
273
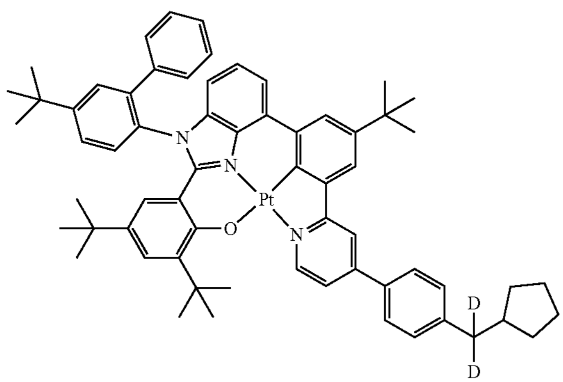
274
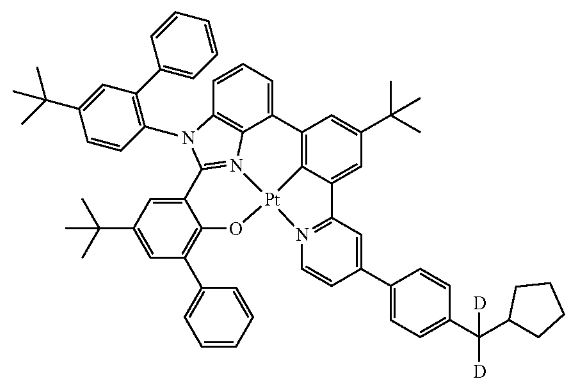
275
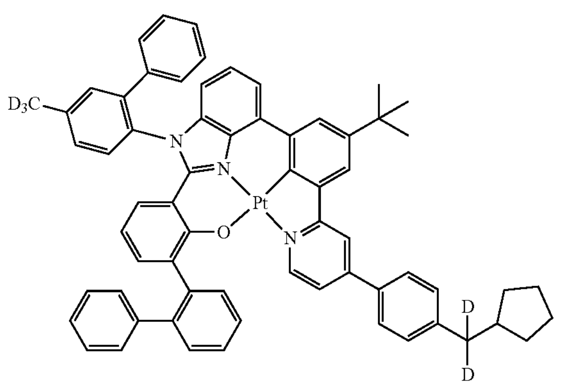
276
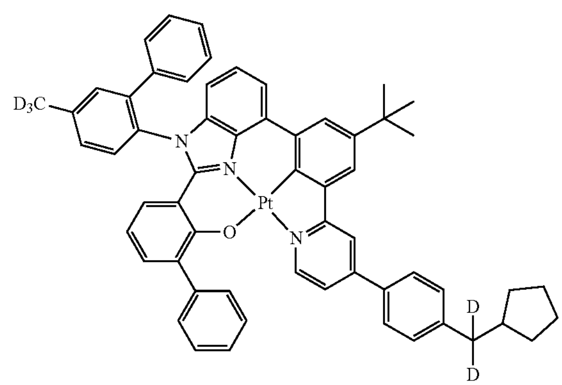
277
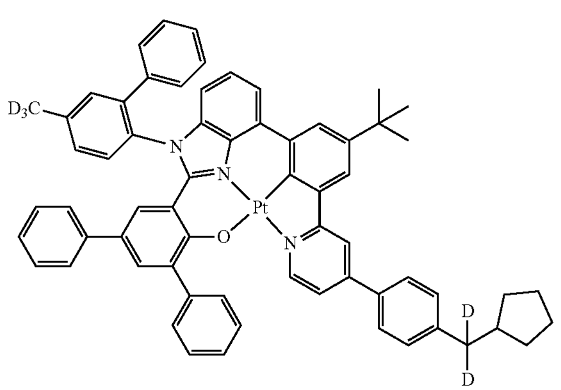
278
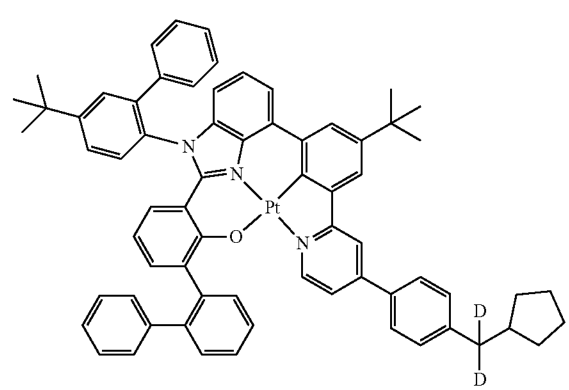

-continued
279
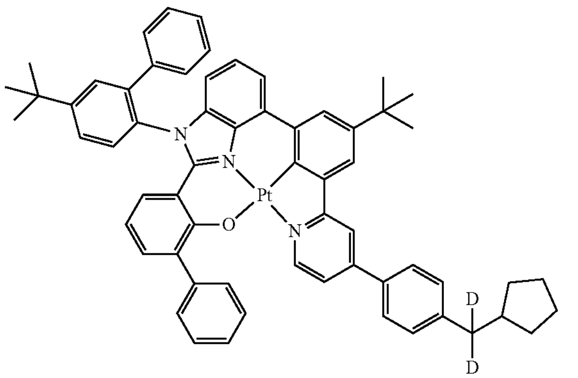
280
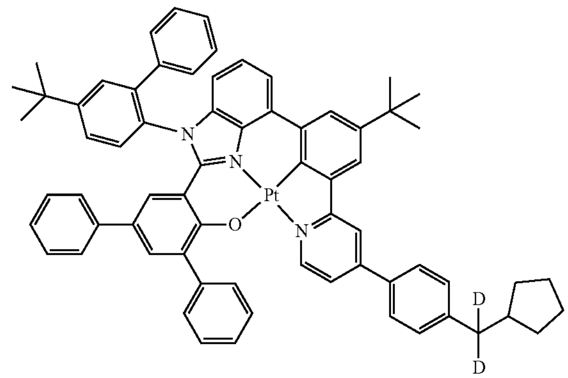
281
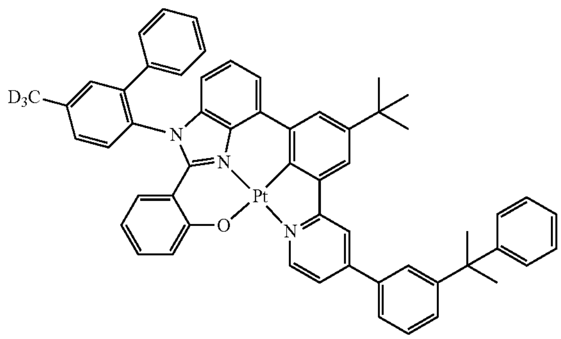
282
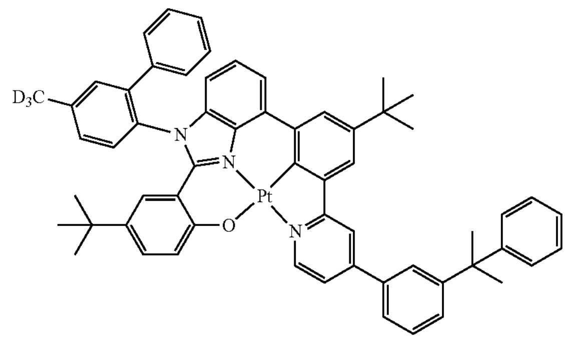
283
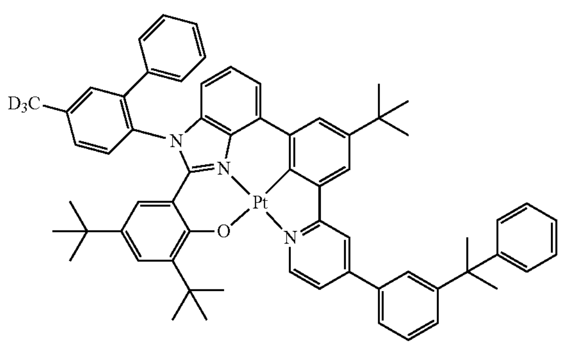
284
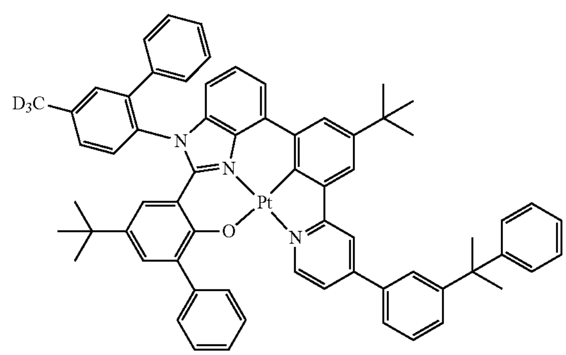
285
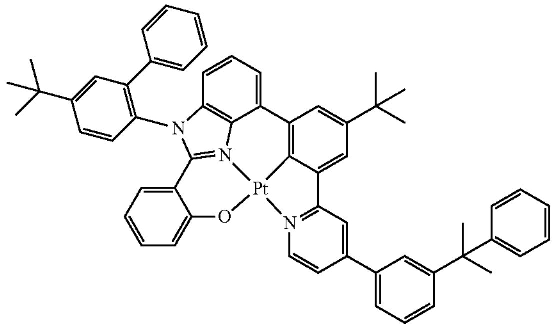
286
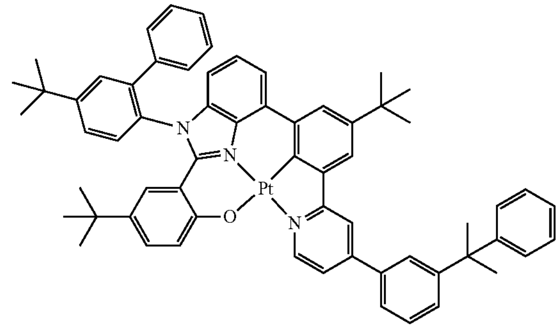

-continued
287
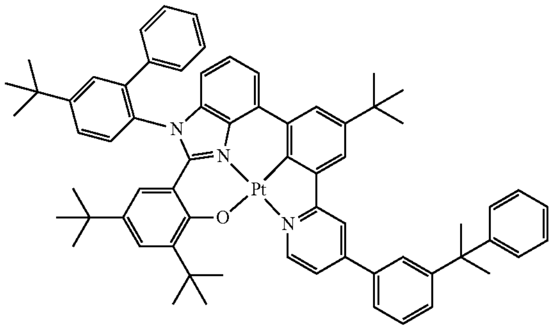
288
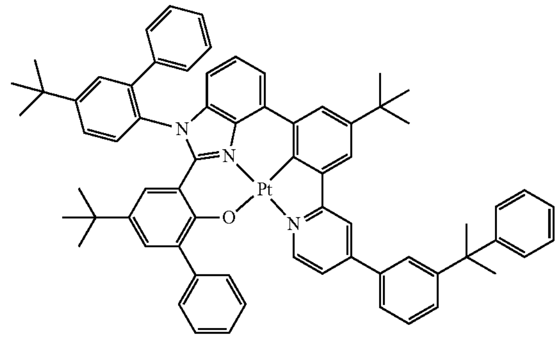
289
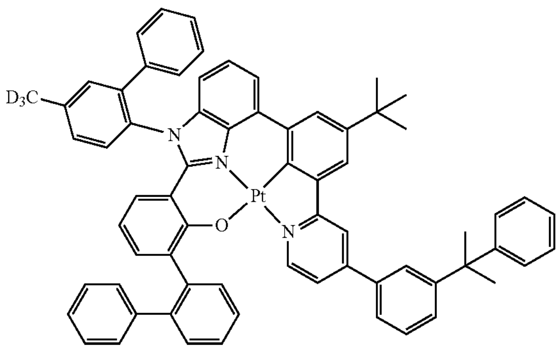
290
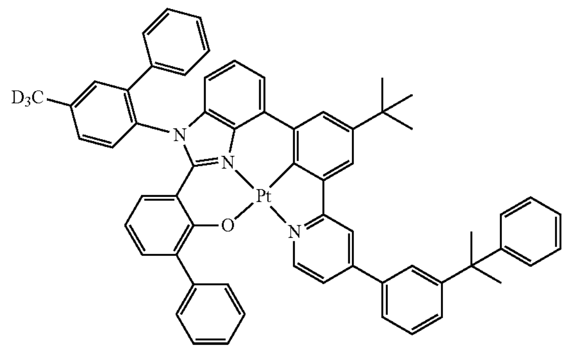
291
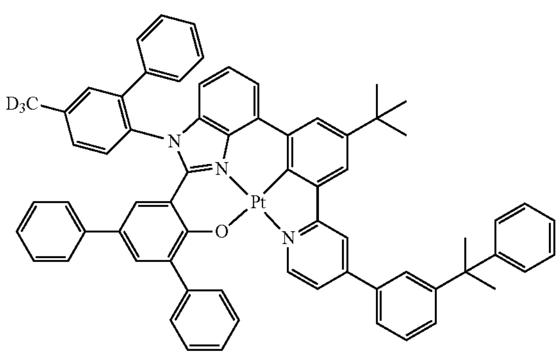
292
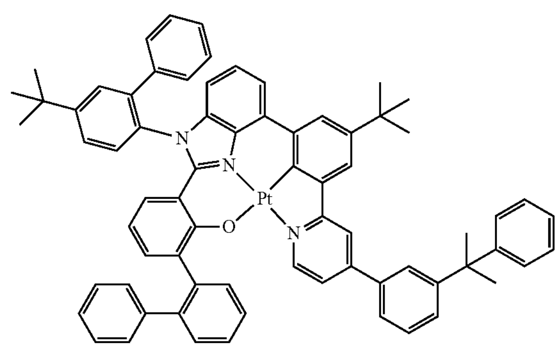
293
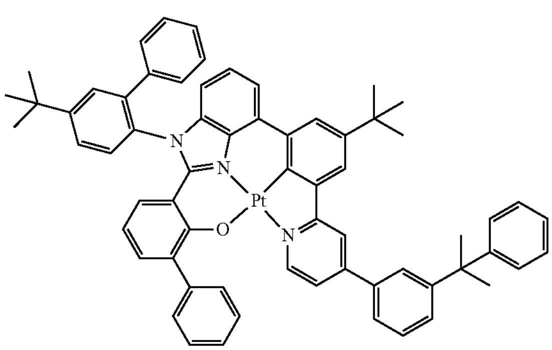
294
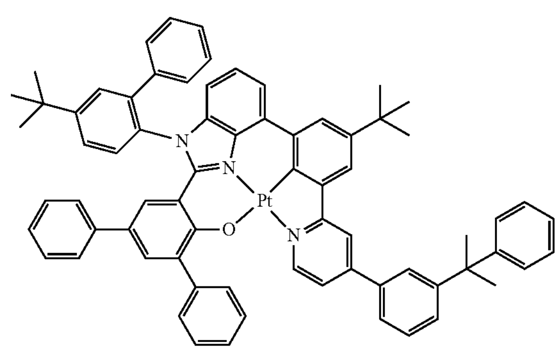

295
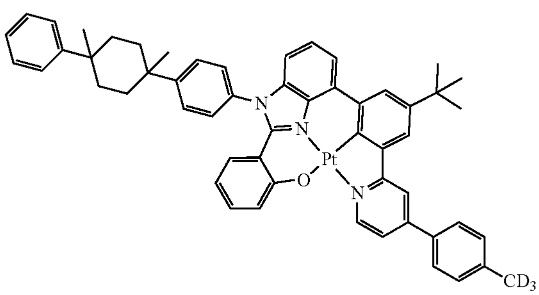
296
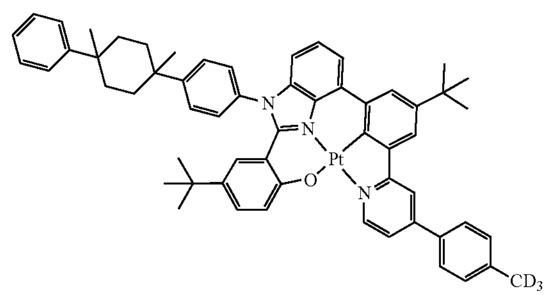
297
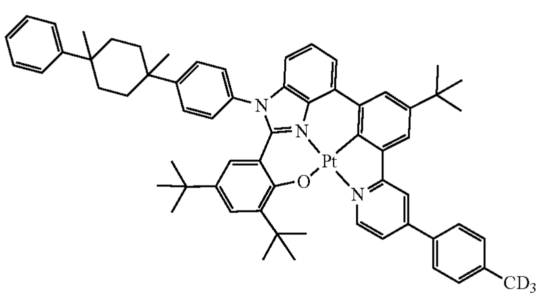
298
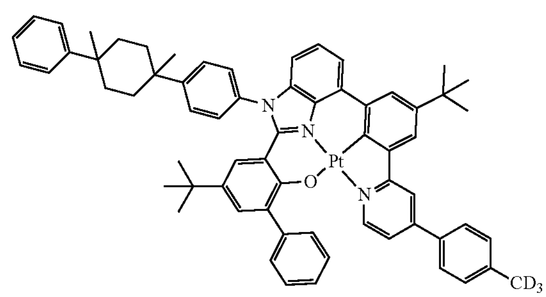
299
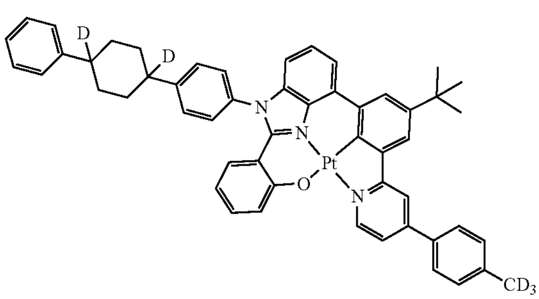
300
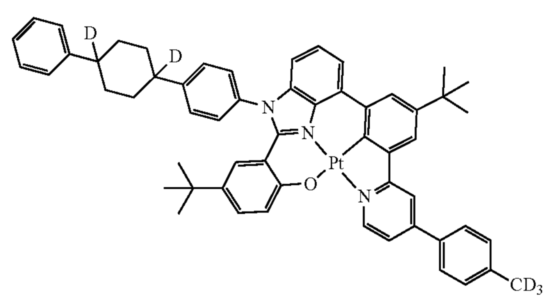
301
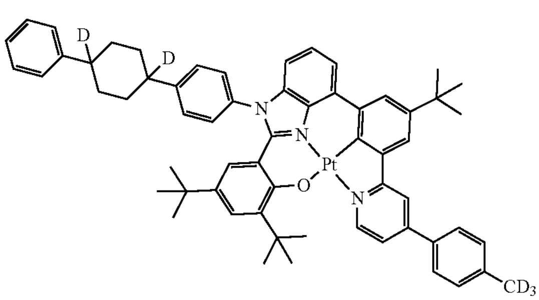
302
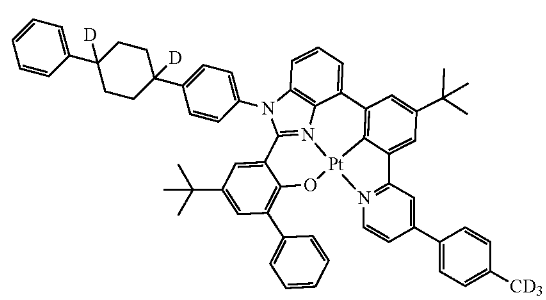
303
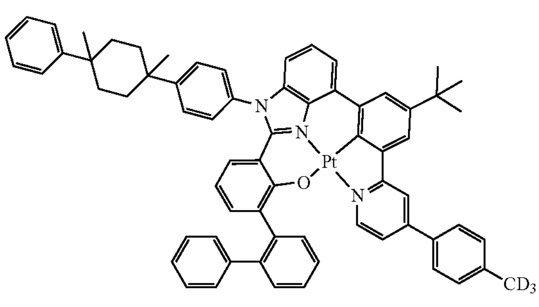
304
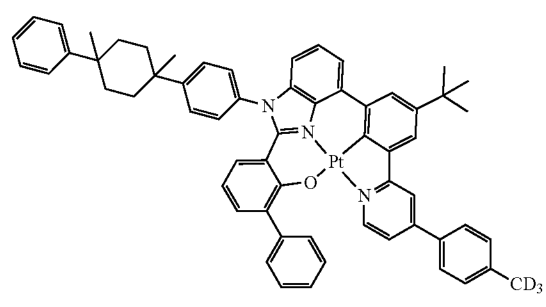

-continued
305
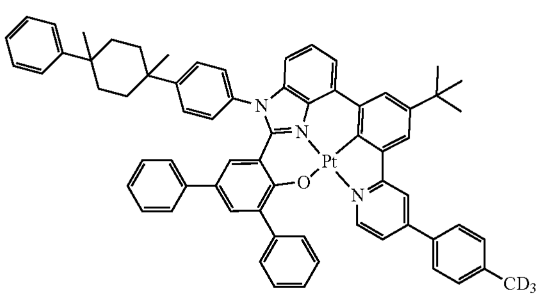
306
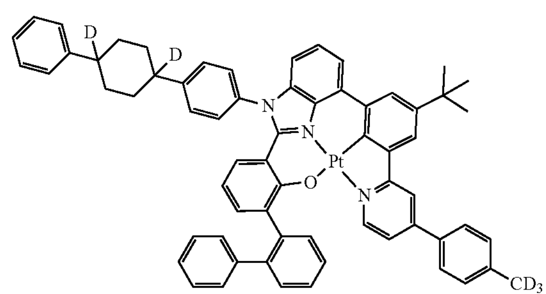
307
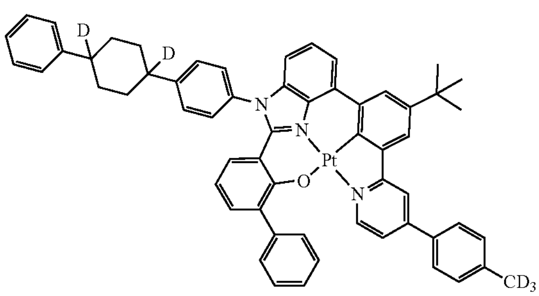
308
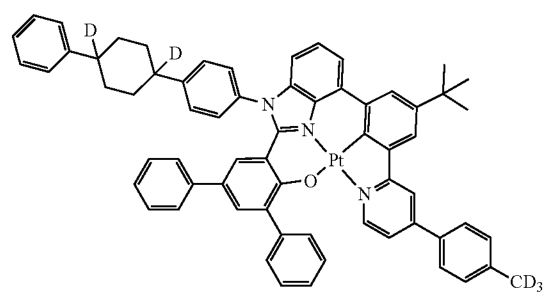
309
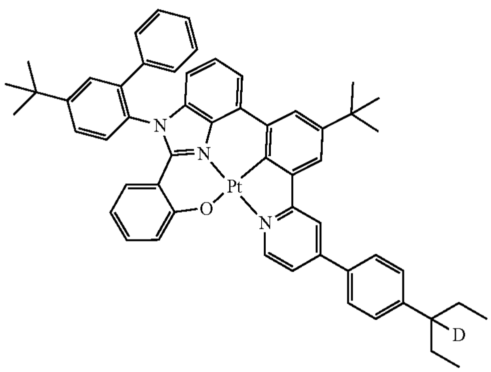
310
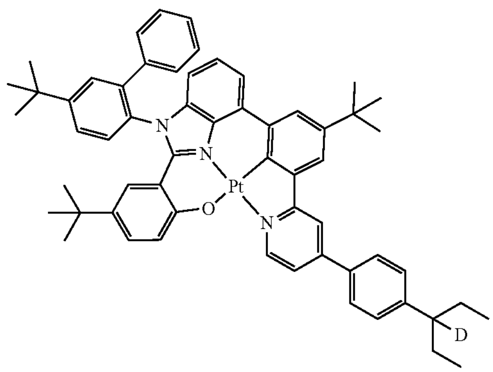
311
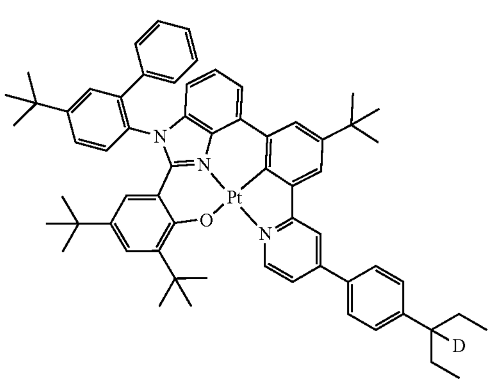
312
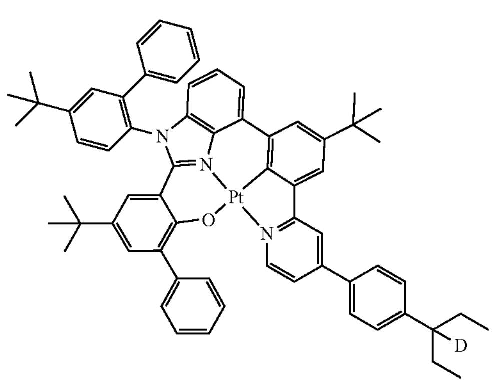

-continued
313
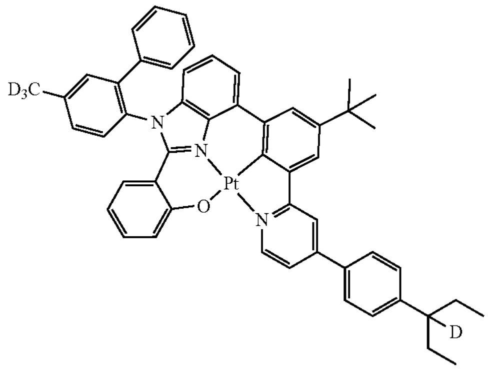
314
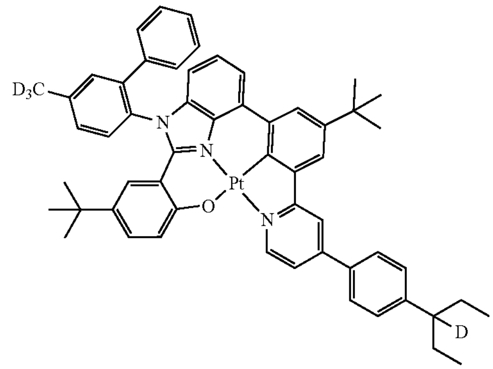
315
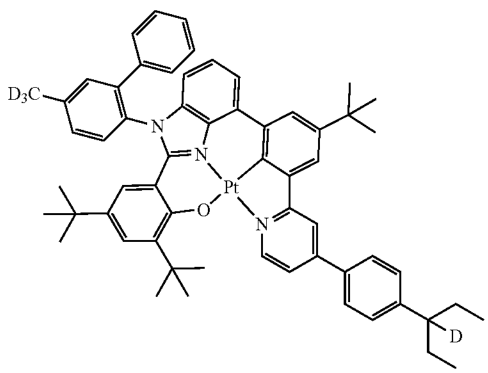
316
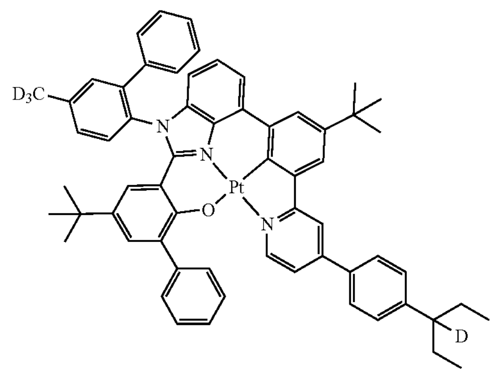
317
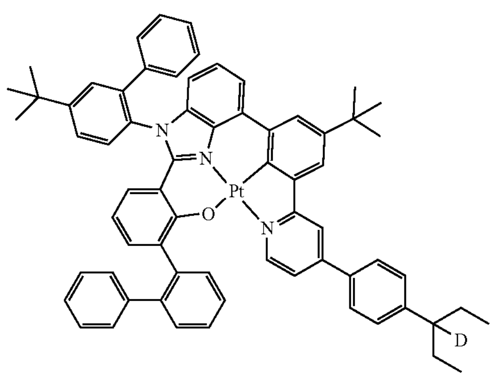
318
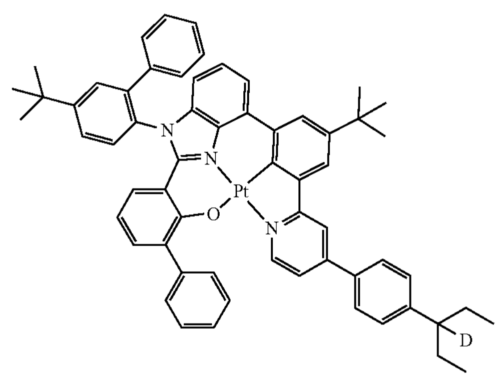
319
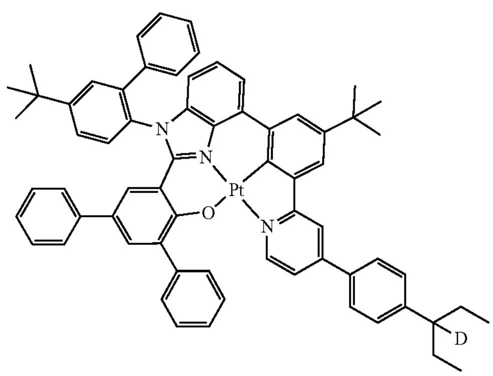
320
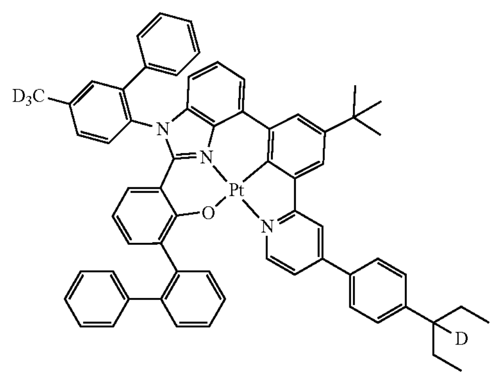

-continued
321
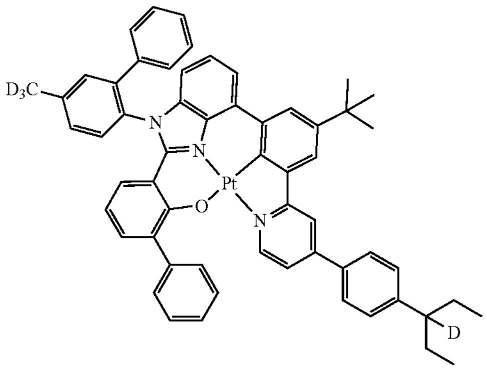
322
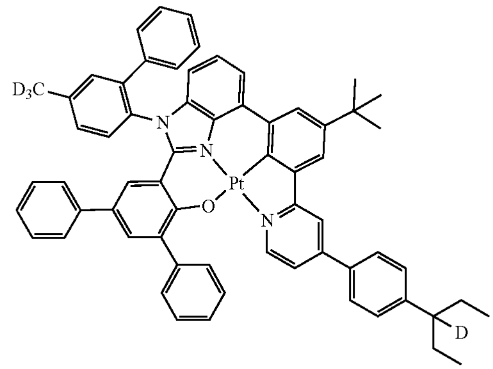
323
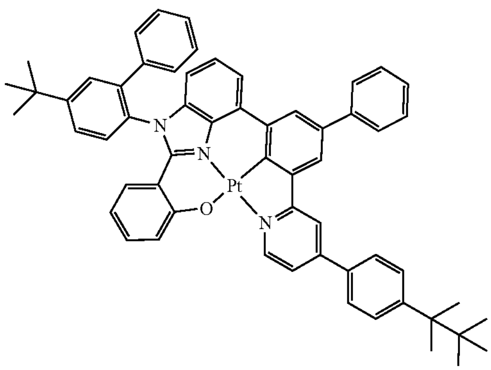
324
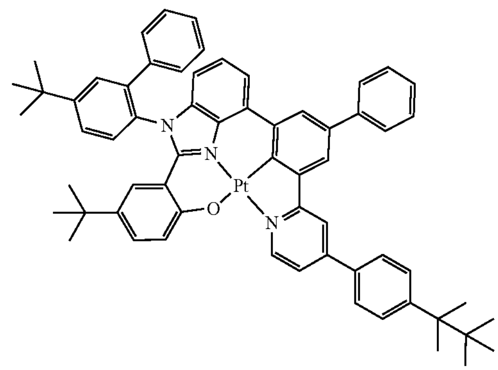
325
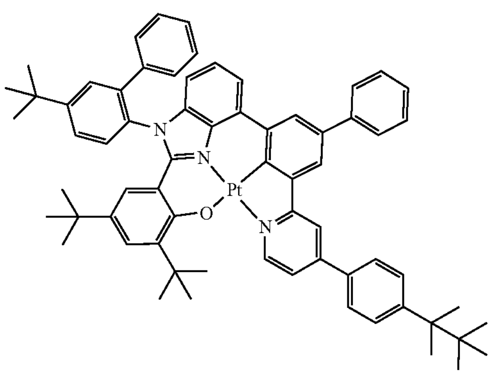
326
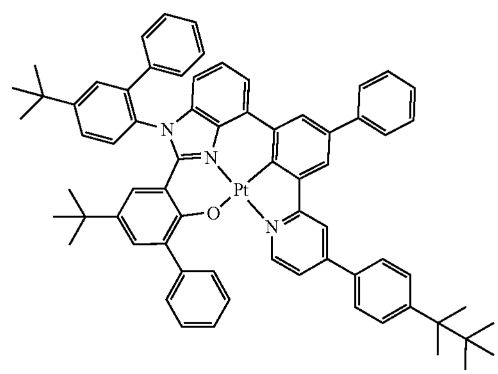
327
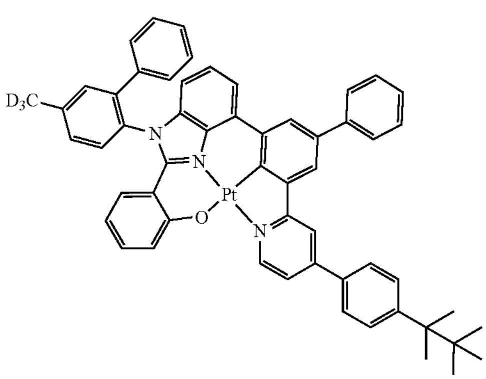
328
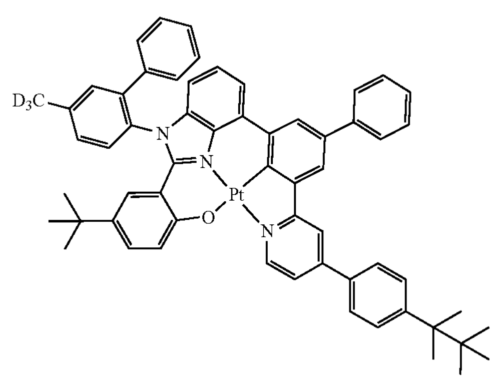

-continued
329
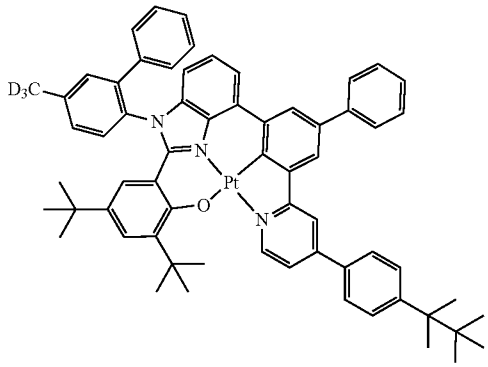
330
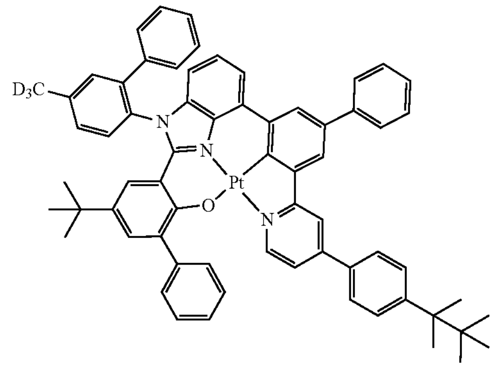
331
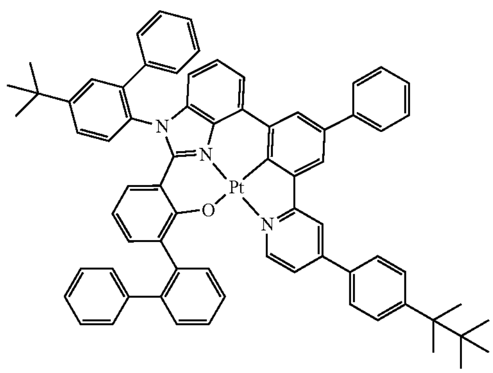
332
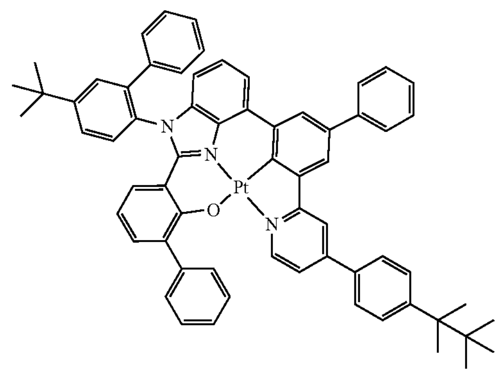
333
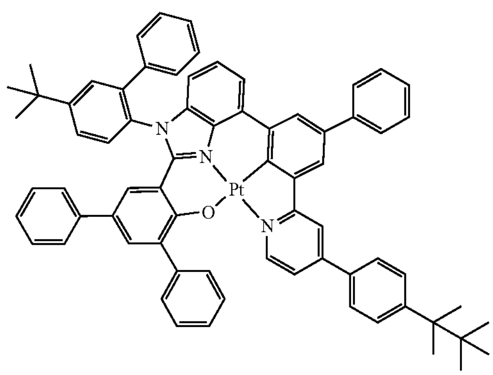
334
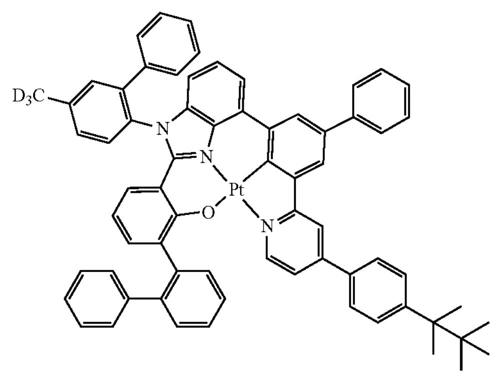
335
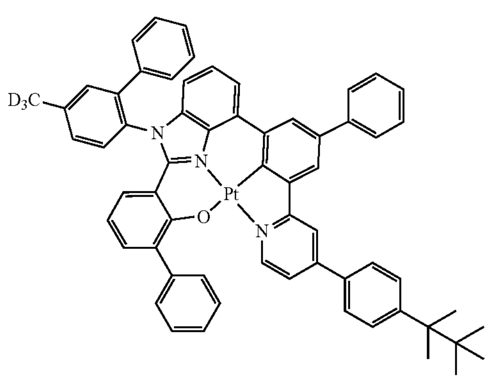
336
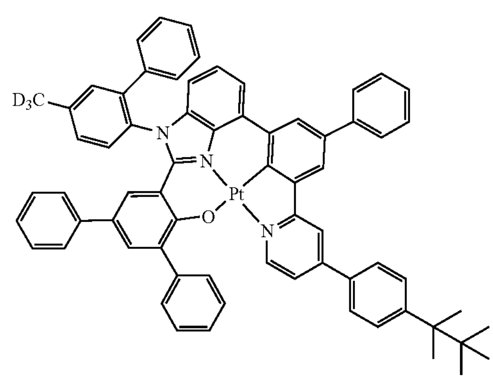

-continued
337
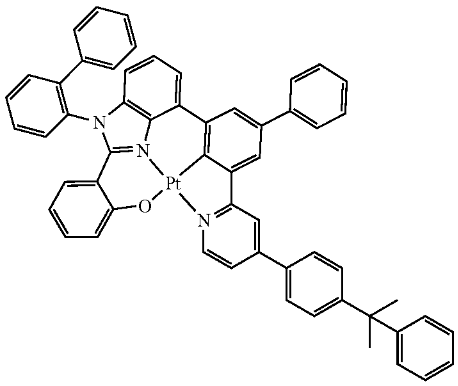
338
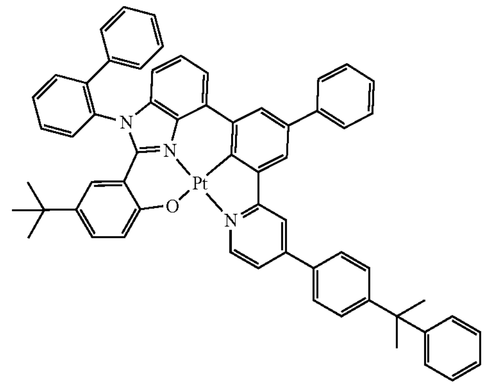
339
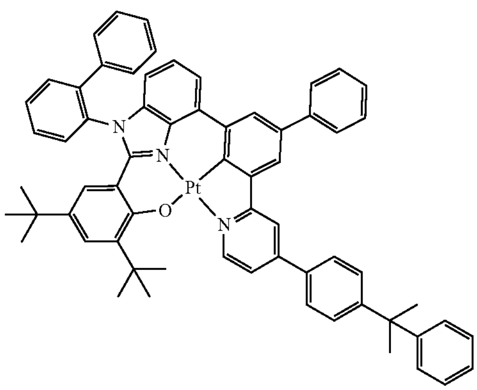
340
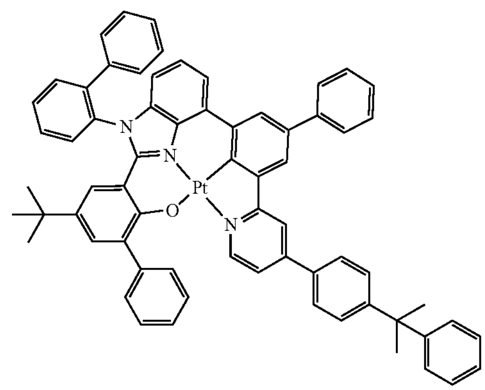
341
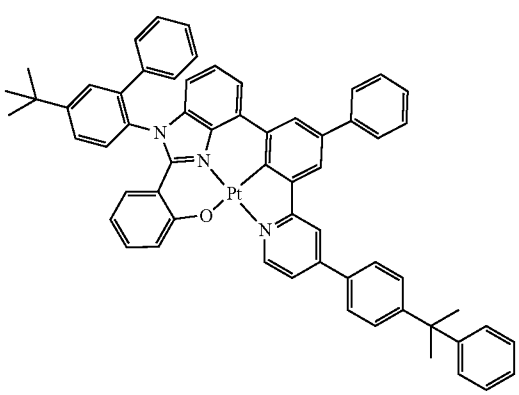
342
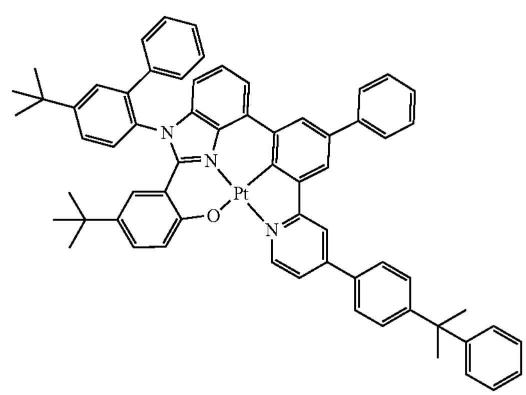
343
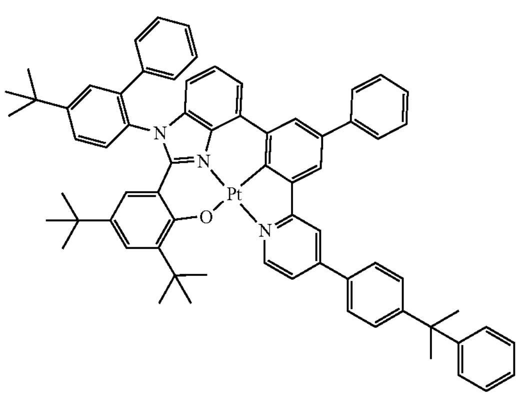
344
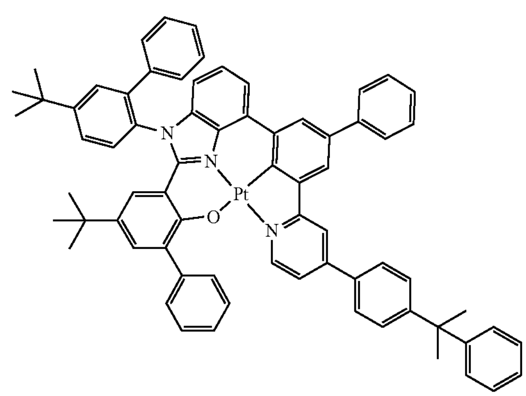

-continued
345
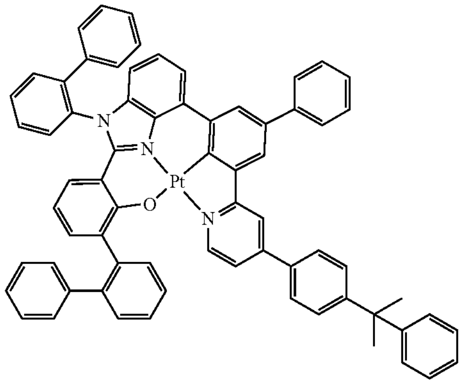
346
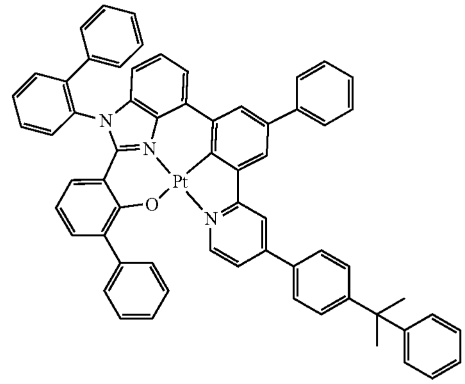
347
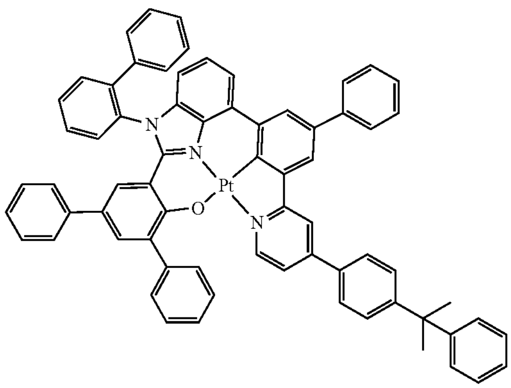
348
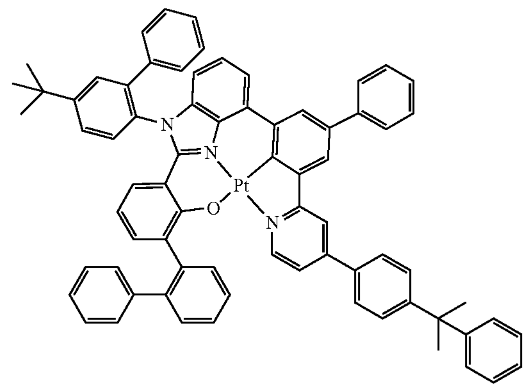
349
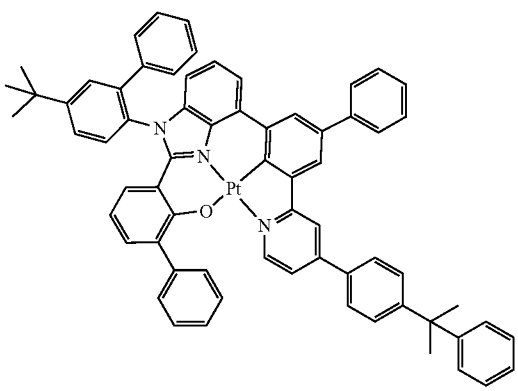
350
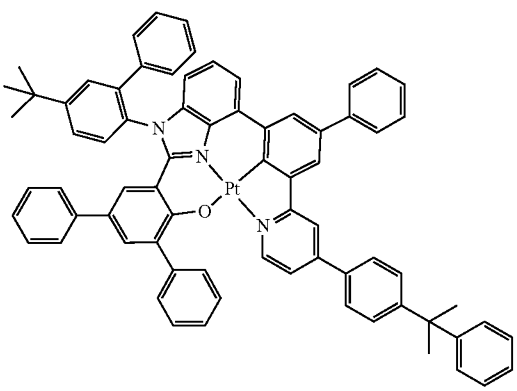
351
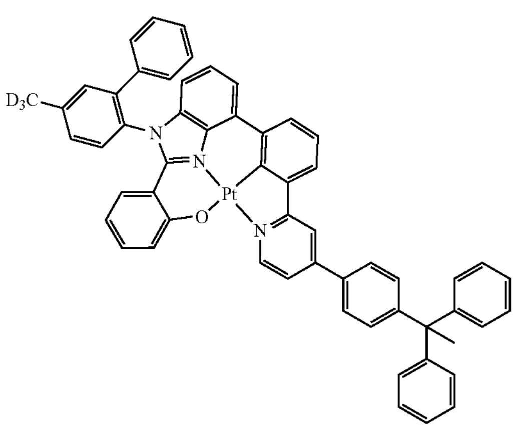
352
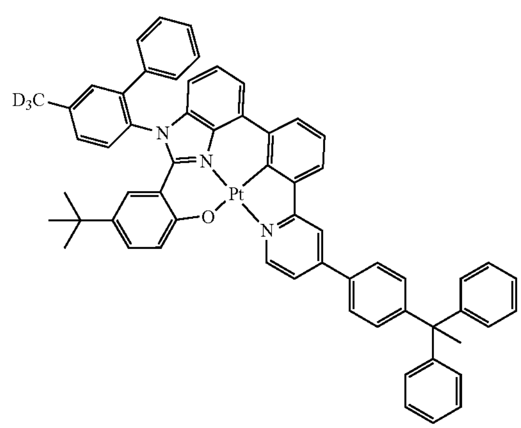

-continued
353
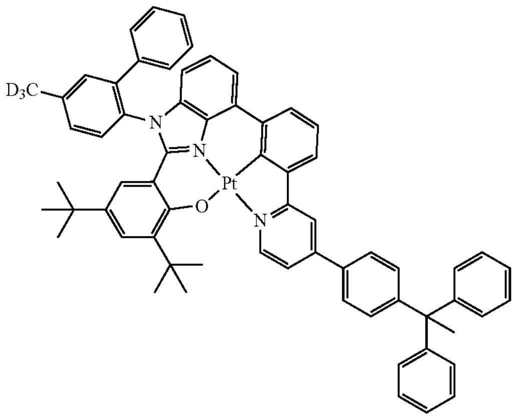
354
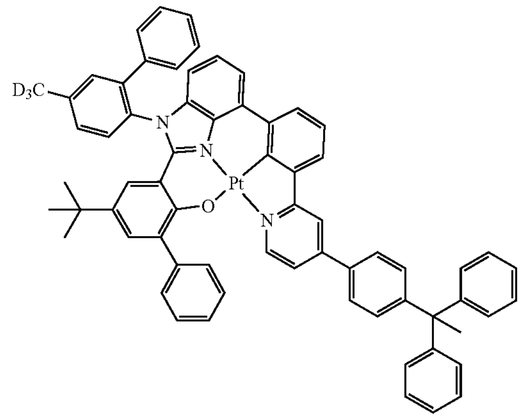
355
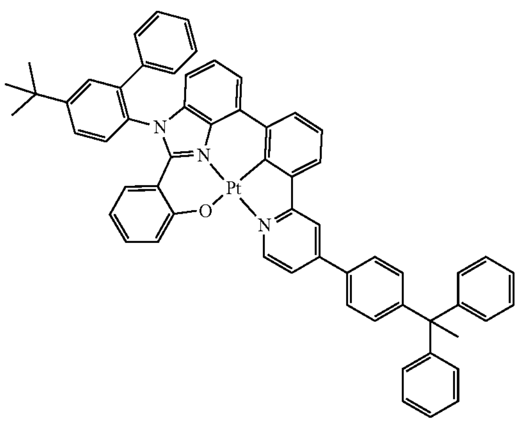
356
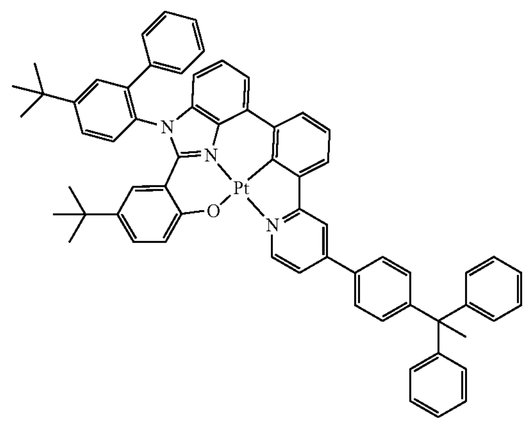
357
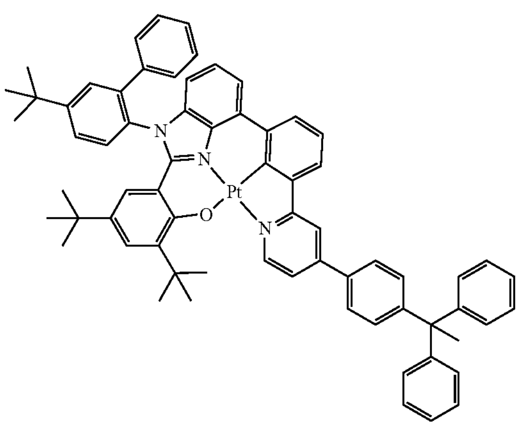
358
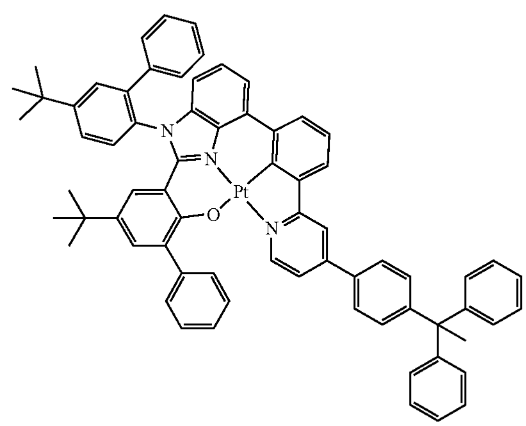

-continued
359
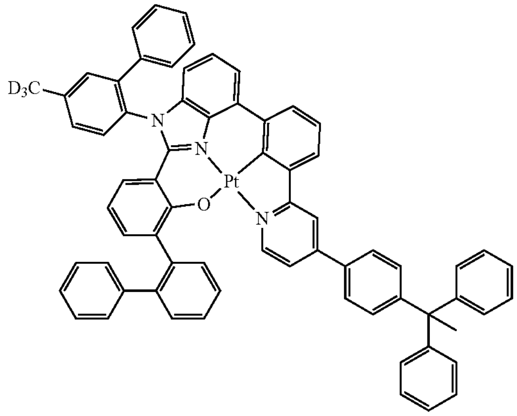
360
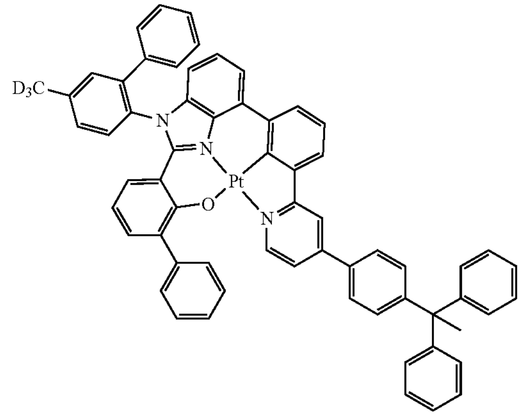
361
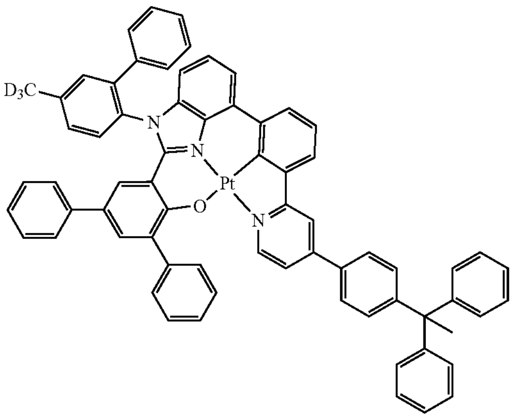
362
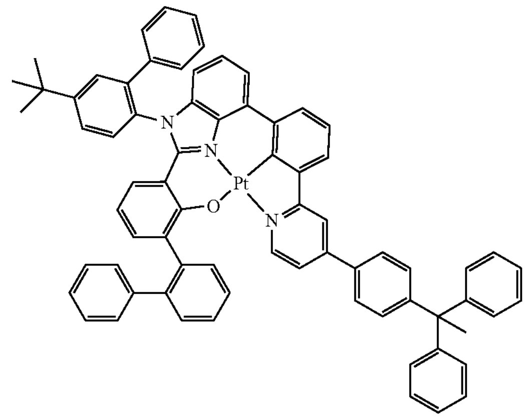
363
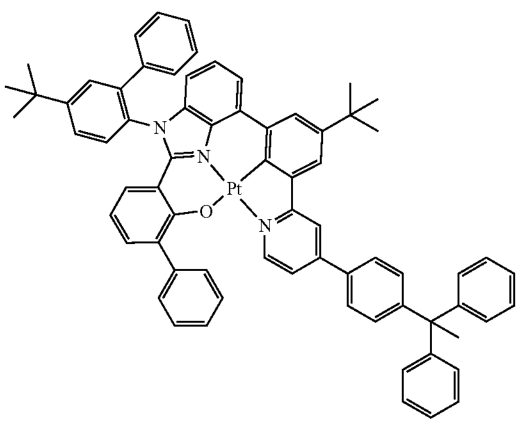
364
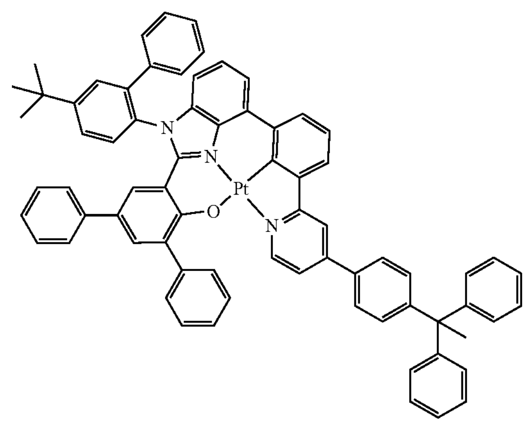
365
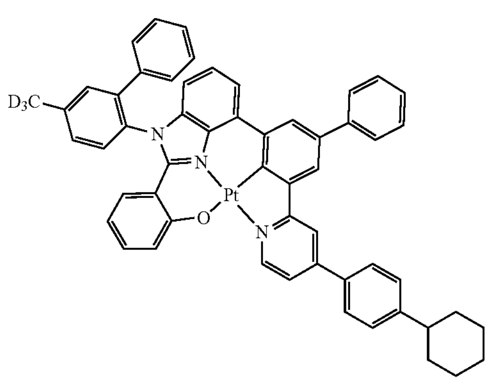
366
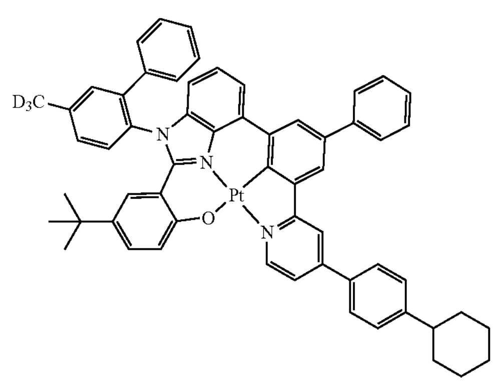

-continued
367
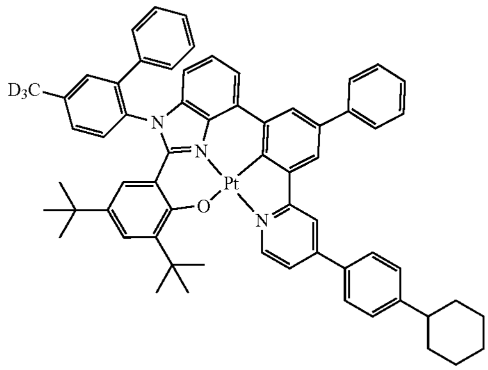
368
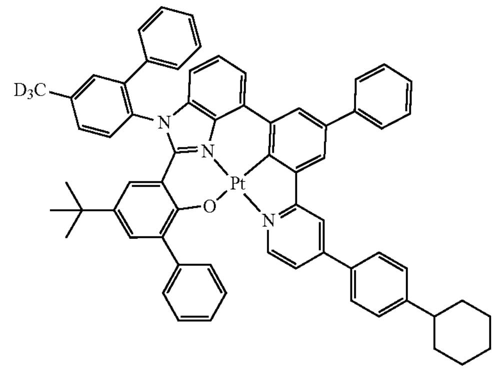
369
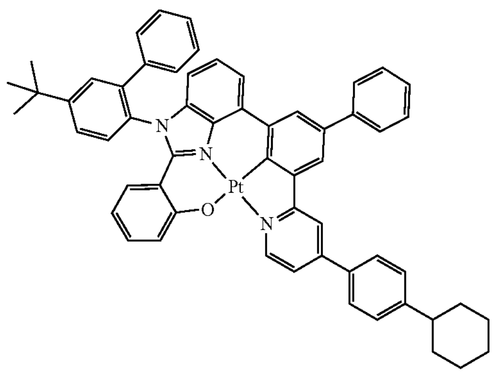
370
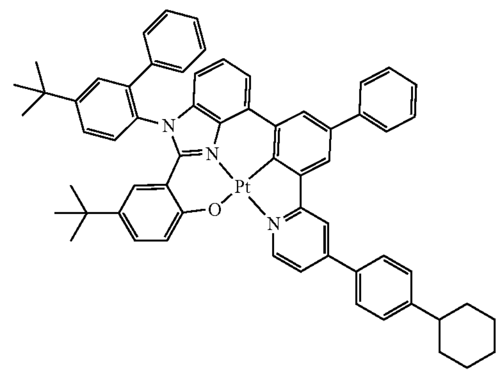
371
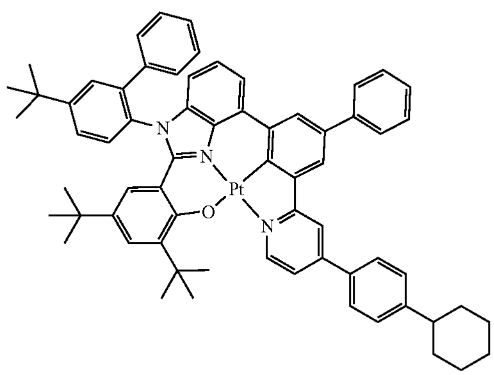
372
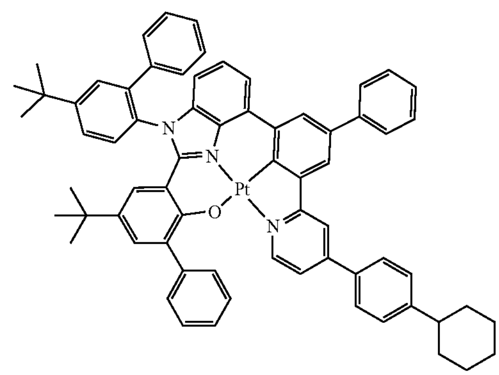
373
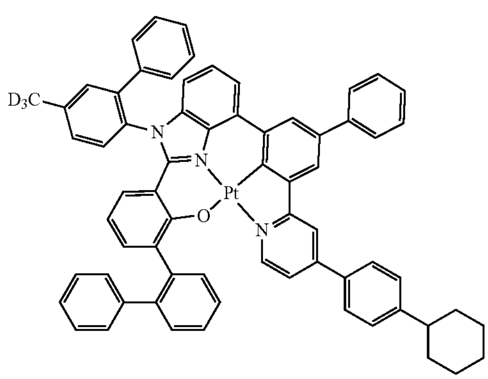
374
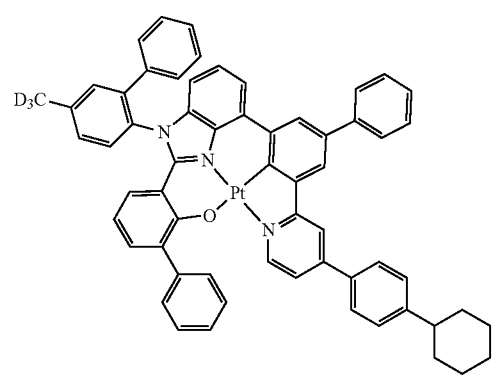

-continued
375
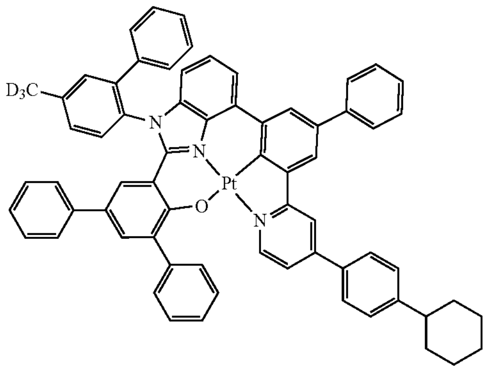
376
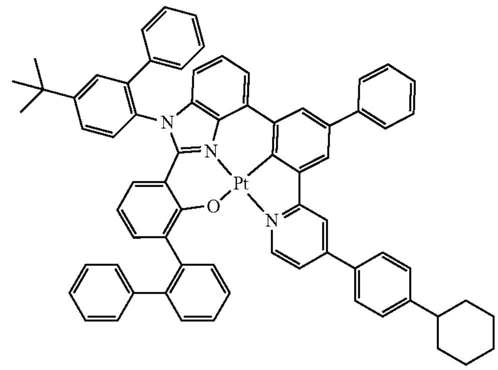
377
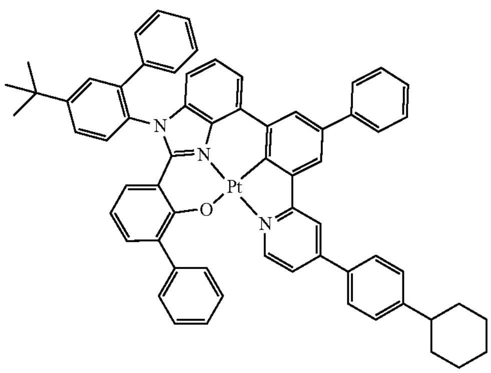
378
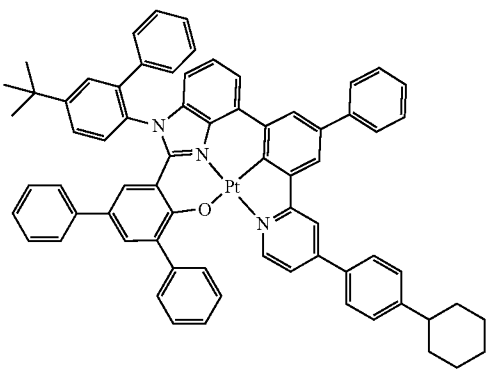
379
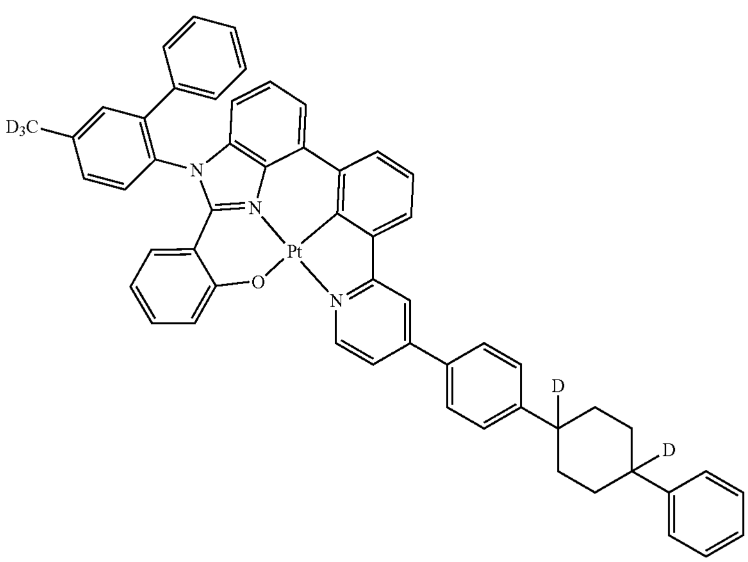

-continued
380
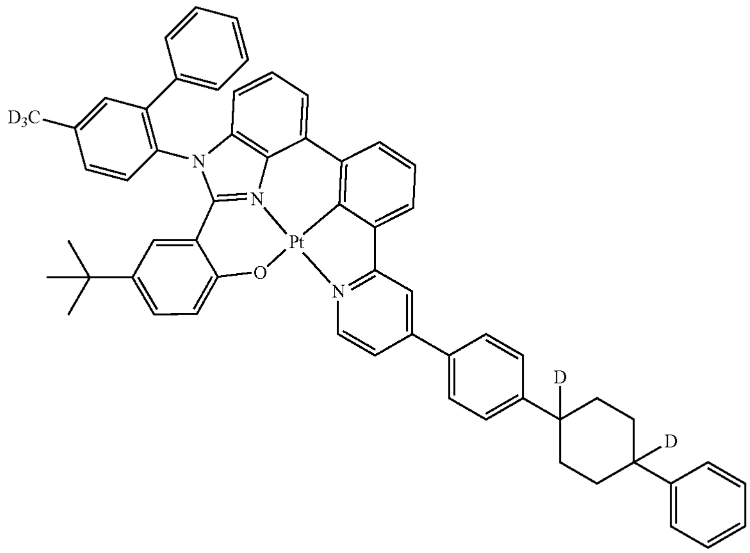
381
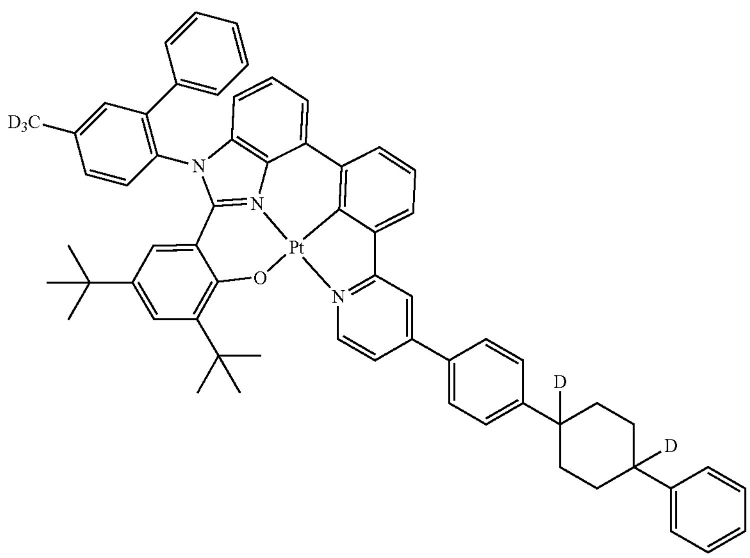
382
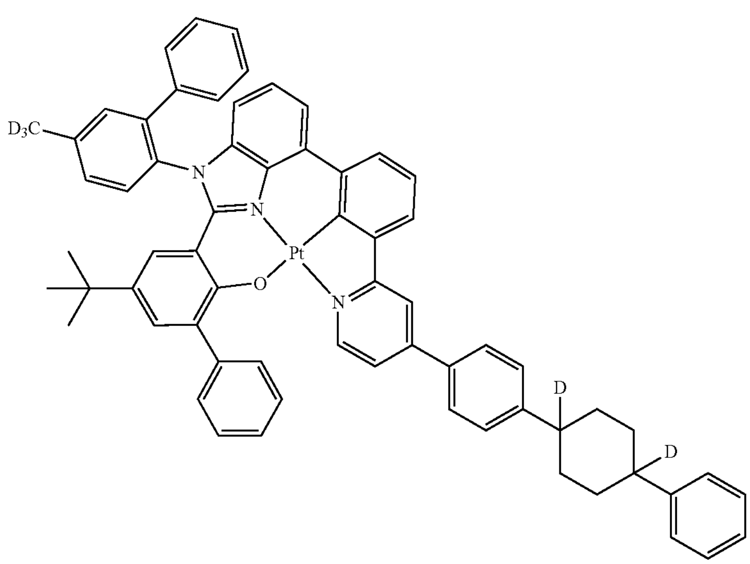

-continued
383
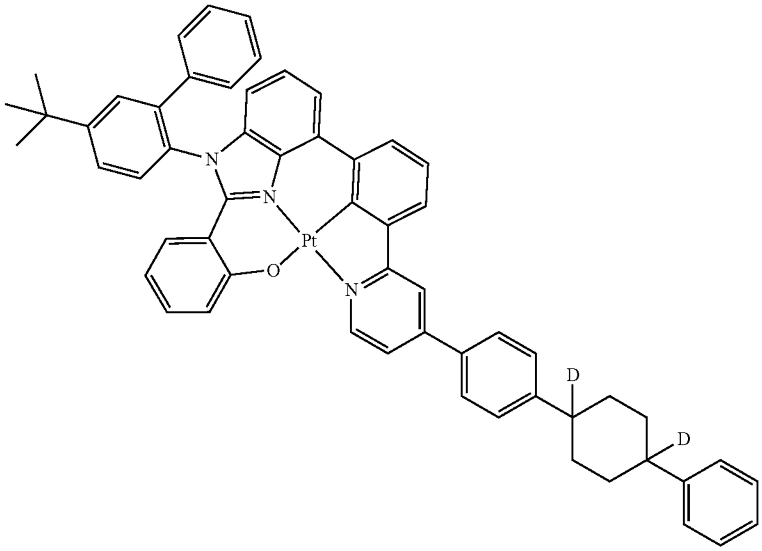
384
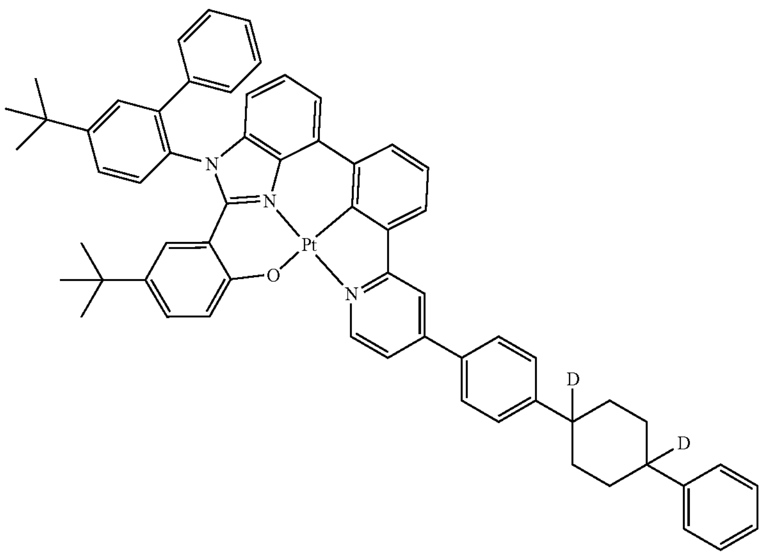
385
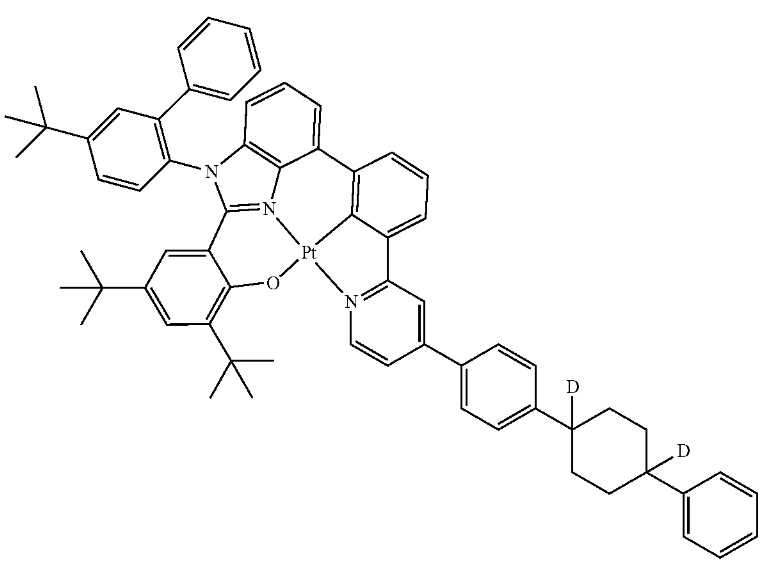

-continued
386
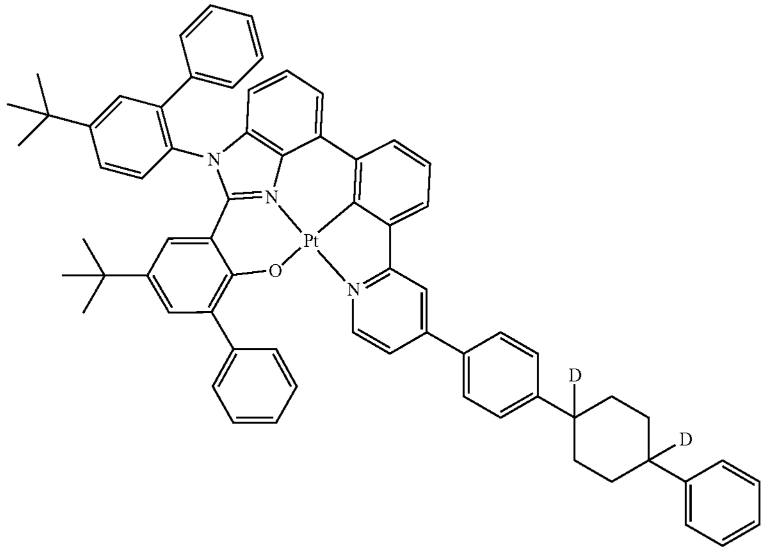
387
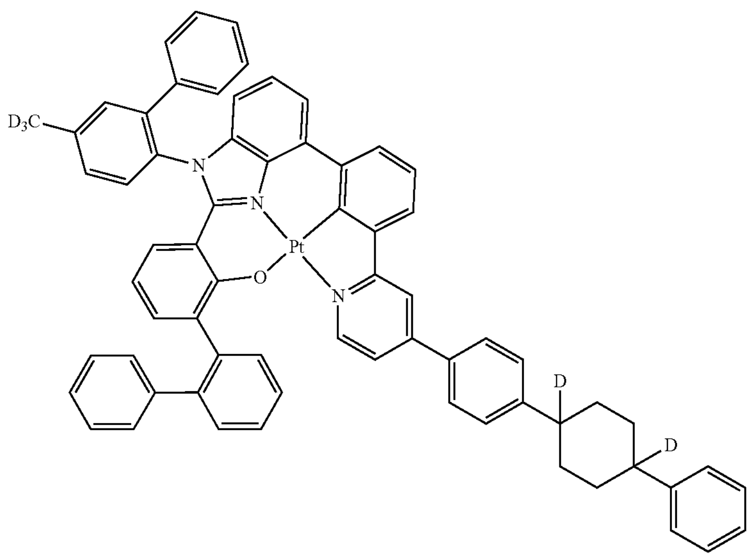
388
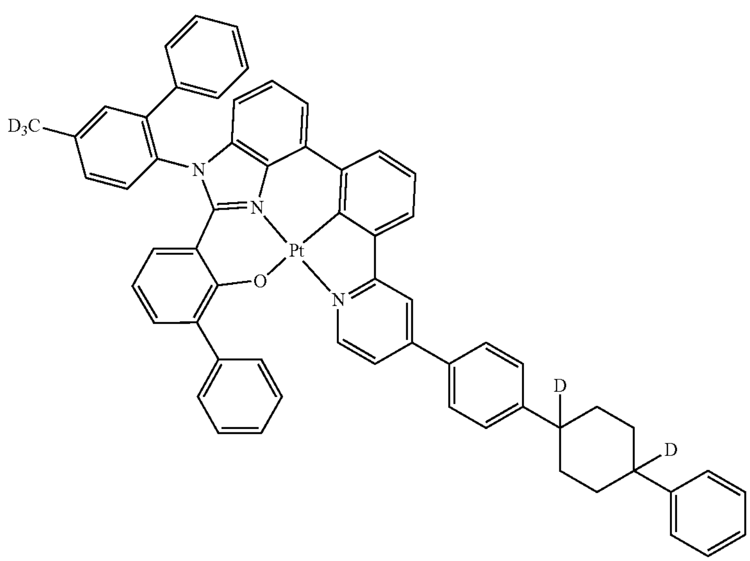

-continued
389
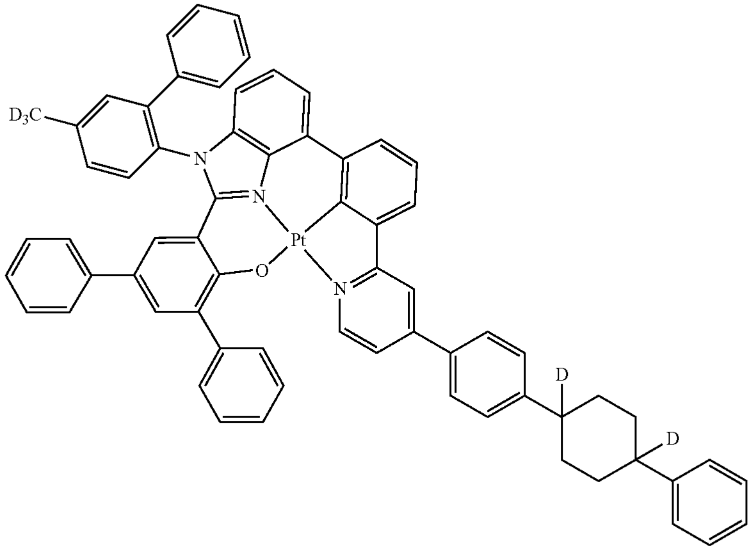
390
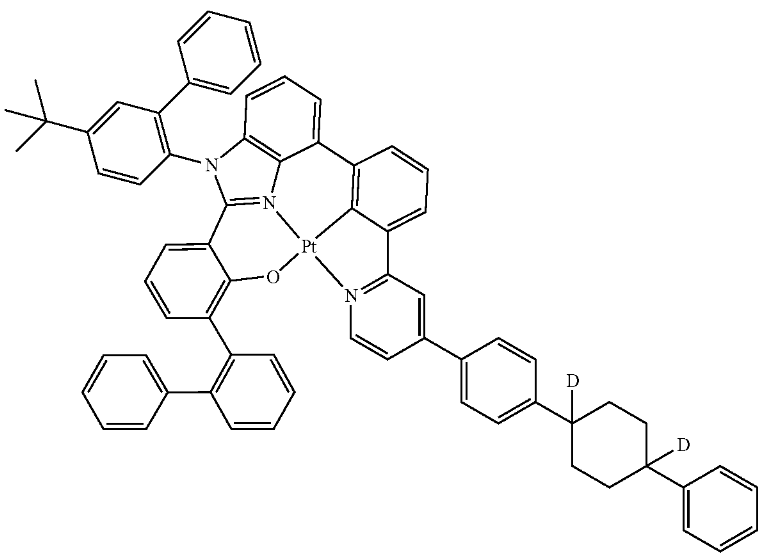
391
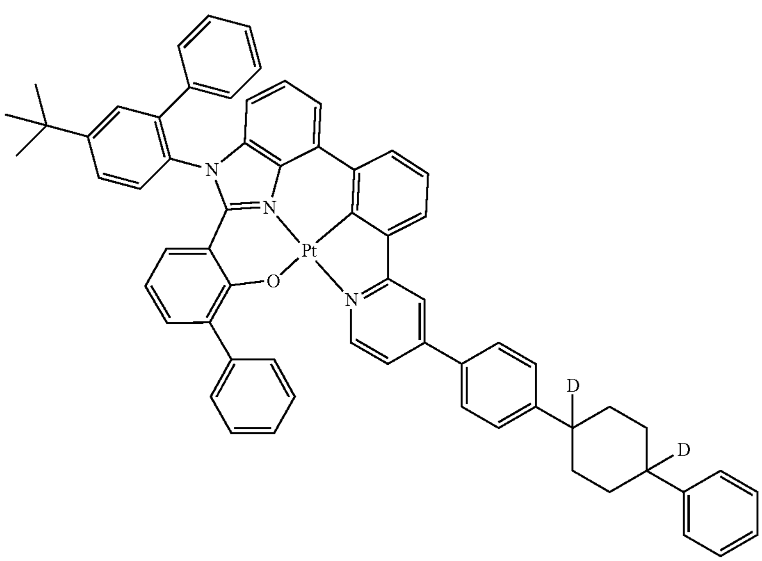

-continued
392
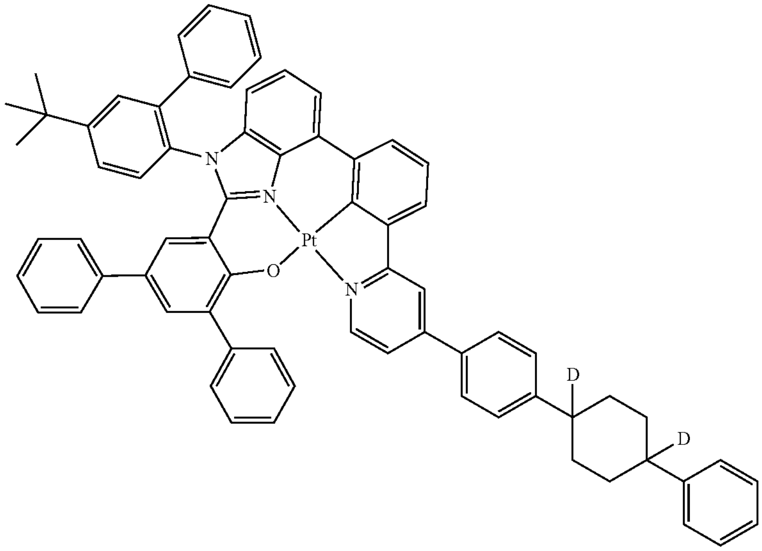
393
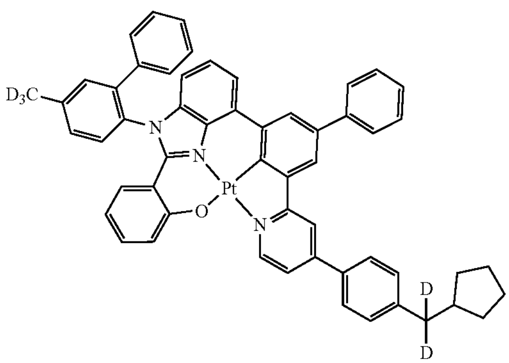
394
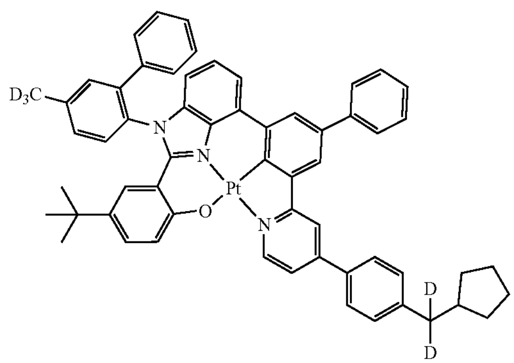
395
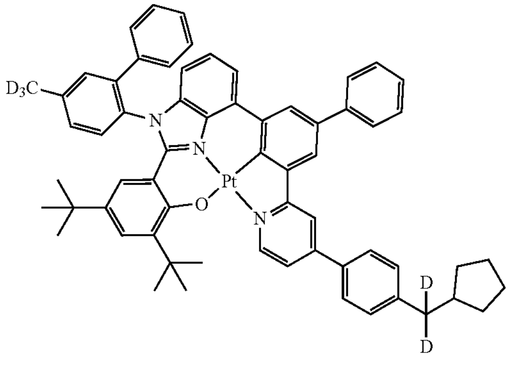
396
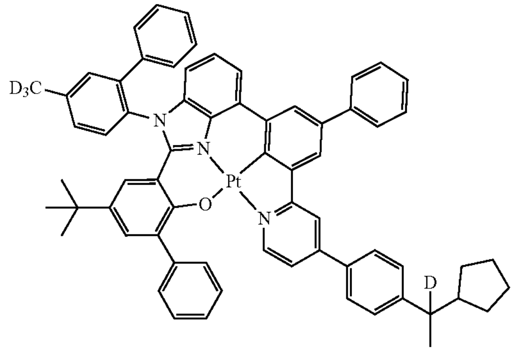

-continued
397
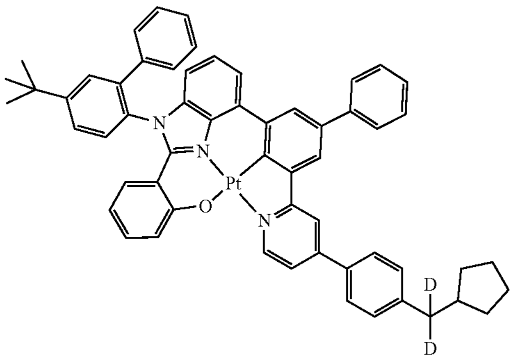
398
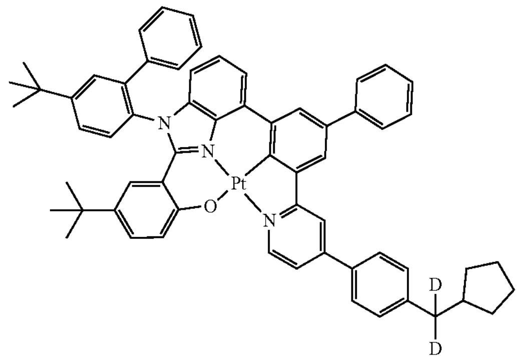
399
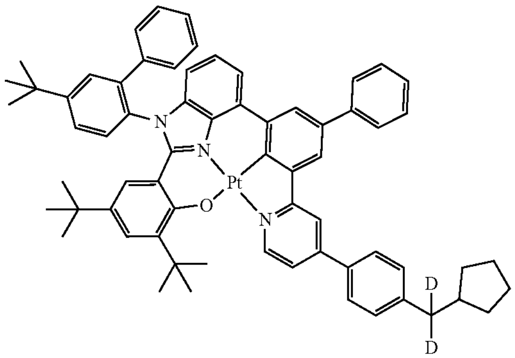
400
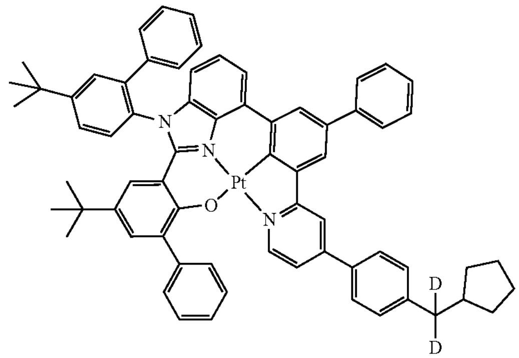
401
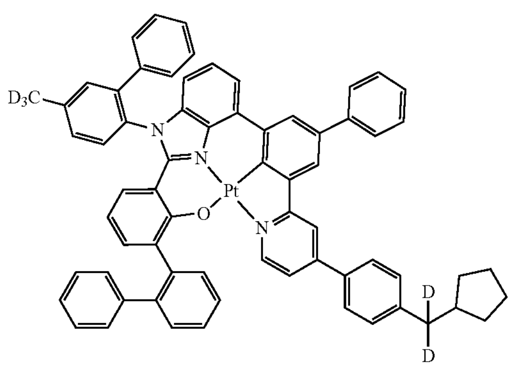
402
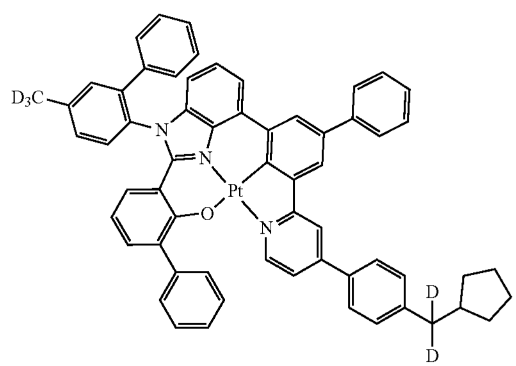
403
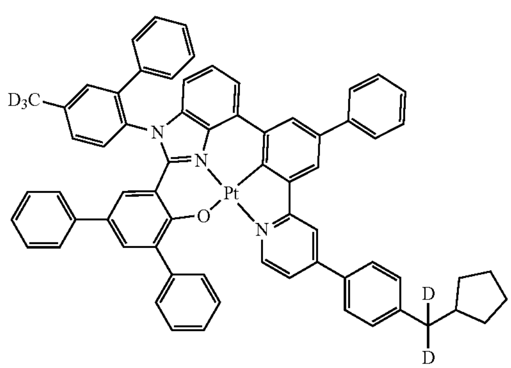
404
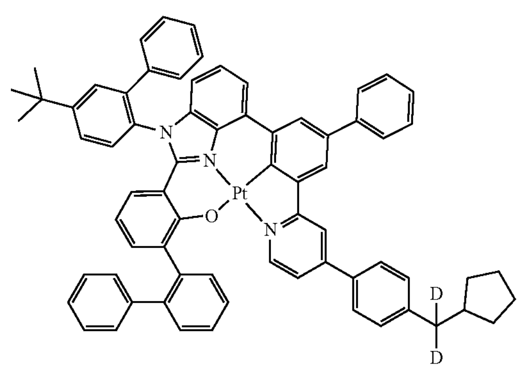

-continued
405
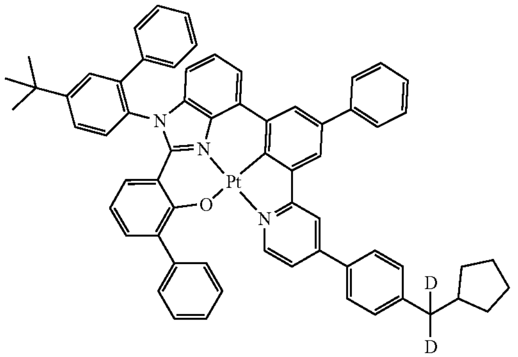
406
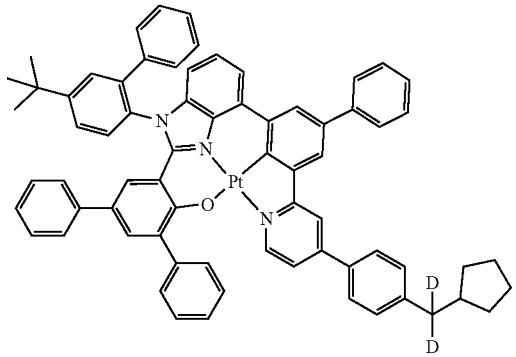
407
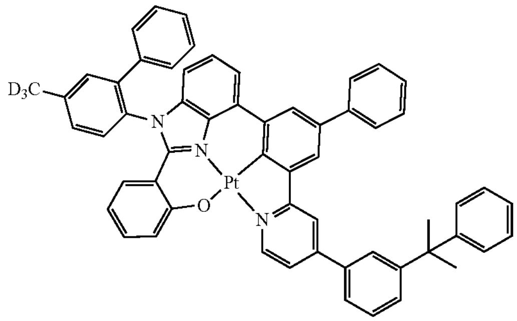
408
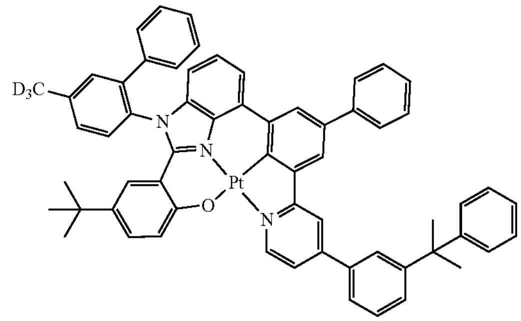
409
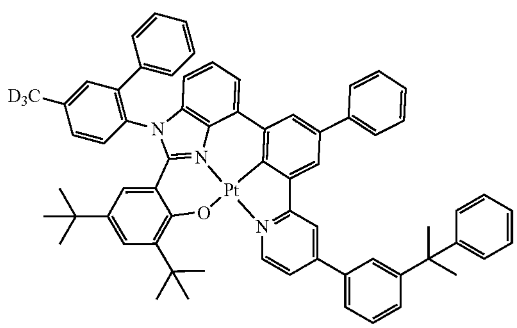
410
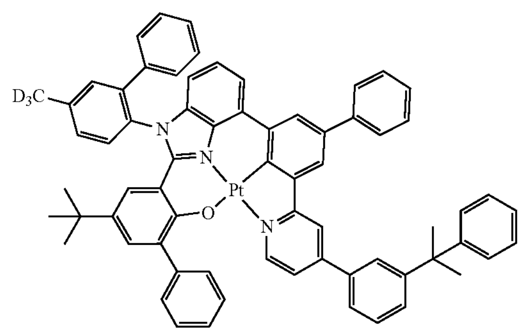
411
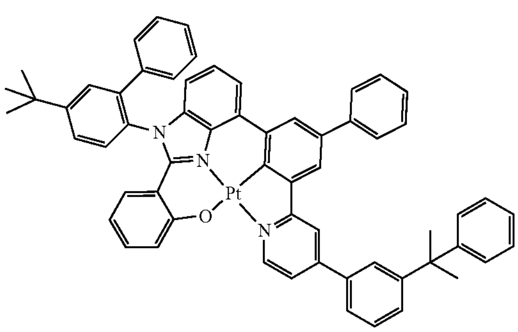
412
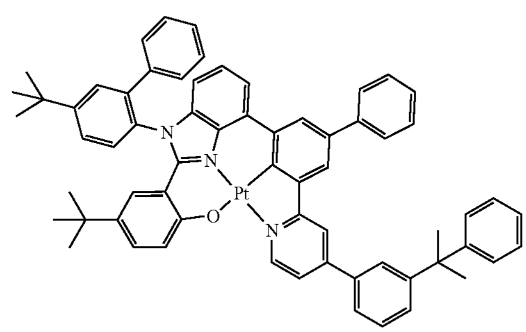

-continued

413

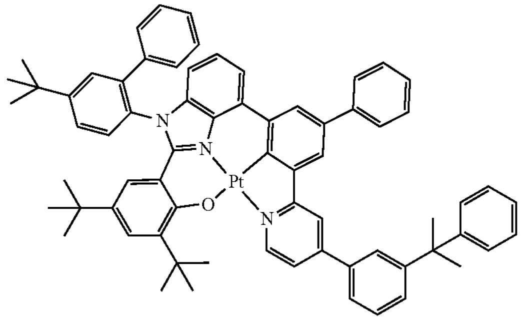

414

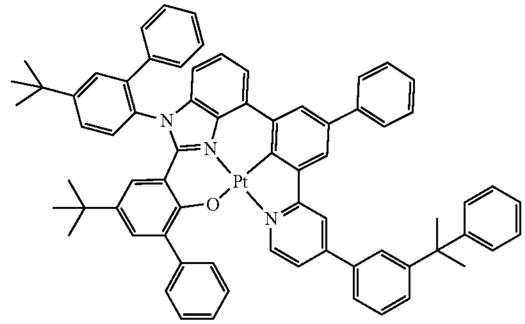

415

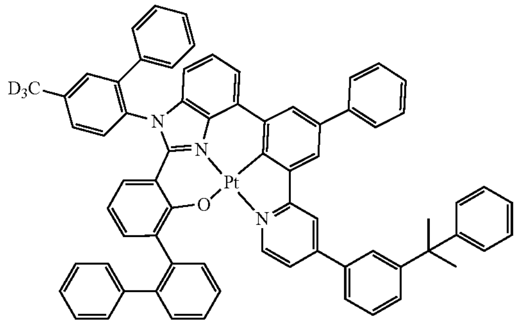

416

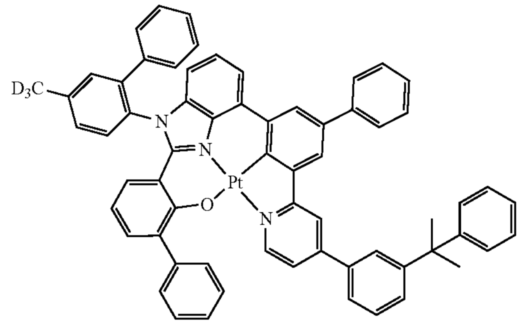

417

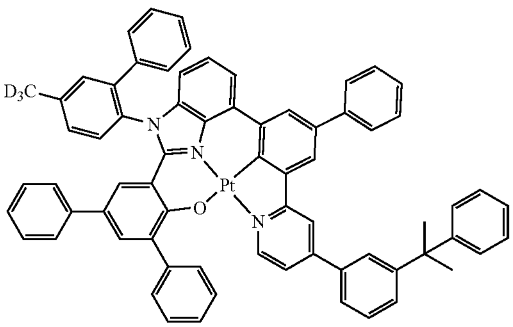

418

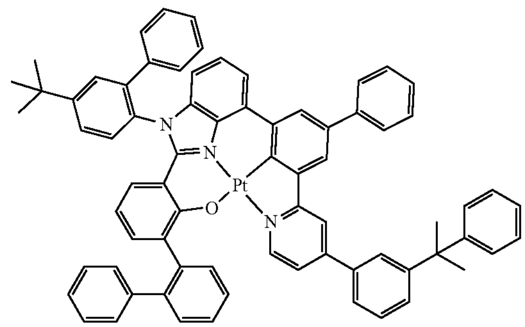

419

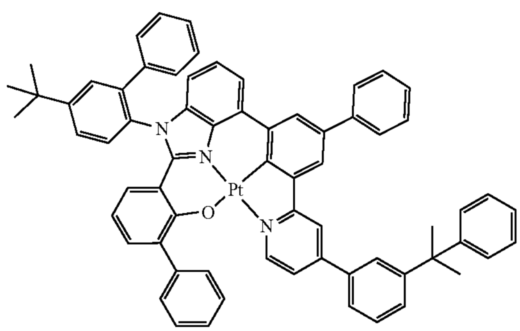

420

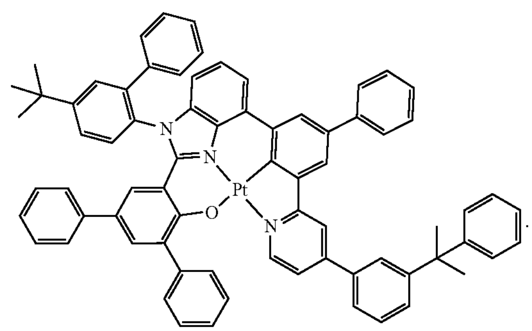

The organometallic compound represented by Formula 1-1 may have excellent electrical characteristics and thermal stability. Thus, an organic light-emitting device having a high luminescence efficiency may be manufactured.

A method of synthesizing the organometallic compound may be apparent to one of ordinary skill in the art by referring to Synthesis Examples provided herein.

Accordingly, the organometallic compound may be suitable for use in an organic layer of an organic light-emitting device, e.g., as a dopant in the organic layer. Thus, according to another aspect, there is provided an organic light-emitting device that may include a first electrode; a second electrode; and an organic layer between the first electrode and the second electrode and including an emission layer, wherein the organic layer may include at least one organometallic compound represented by Formula 1-1.

The organic light-emitting device may include an organic layer including the organometallic compound. Thus, the organic light-emitting device may have excellent driving voltage, excellent luminescence efficiency and external quantum efficiency characteristics.

The organometallic compound may be used in a pair of electrodes of an organic light-emitting device. In some embodiments, the organometallic compound may be included in an emission layer. In this embodiment, the organometallic compound may serve as a dopant, and the emission layer may further include a host (that is, an amount of the organometallic compound may be smaller than that of the host in the emission layer). The emission layer may emit red light or green light, e.g., red light or green light having a maximum emission wavelength of about 500 nanometers (nm) or longer, e.g., about 500 nm to about 650 nm.

In some embodiments, the emission layer may emit green light.

As used herein, the expression the "(organic layer) includes at least one organometallic compound" may be construed as meaning the "(organic layer) may include one organometallic compound of Formula 1-1 or two different organometallic compounds of Formula 1-1".

For example, Compound 1 may only be included in the organic layer as an organometallic compound. In this embodiment, Compound 1 may be included in the emission layer of the organic light-emitting device. In some embodiments, Compounds 1 and 2 may be included in the organic layer as organometallic compounds. In this embodiment, Compounds 1 and 2 may both be included in the same layer (for example, both Compounds 1 and 2 may be included in the emission layer).

The first electrode may be an anode, which is a hole injection electrode, and the second electrode may be a cathode, which is an electron injection electrode. In some embodiments, the first electrode may be a cathode, which is an electron injection electrode, and the second electrode may be an anode, which is a hole injection electrode.

For example, in the organic light-emitting device, the first electrode may be an anode, the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, a buffer layer, or a combination thereof, and the electron transport region may include a hole blocking layer, an electron transport layer, an electron injection layer, or a combination thereof.

The term "organic layer" as used herein refers to a single and/or a plurality of layers between the first electrode and the second electrode in an organic light-emitting device. The "organic layer" may include not only organic compounds but also organometallic complexes including metals.

The FIGURE illustrates a schematic cross-sectional view of an organic light-emitting device 10 according to an exemplary embodiment. Hereinafter, a structure of an organic light-emitting device according to one or more embodiments and a method of manufacturing the organic light-emitting device will be described with reference to the FIGURE. The organic light-emitting device 10 may include a first electrode 11, an organic layer 15, and a second electrode 19, which may be sequentially layered in this stated order.

A substrate may be additionally disposed under the first electrode 11 or on the second electrode 19. The substrate may be a conventional substrate used in organic light-emitting devices, e.g., a glass substrate or a transparent plastic substrate, each having excellent mechanical strength, thermal stability, transparency, surface smoothness, ease of handling, and water repellency.

First Electrode 11 in Organic Light-Emitting Device 10

The first electrode 11 may be formed by depositing or sputtering, onto the substrate, a material for forming the first electrode 11. The first electrode 11 may be an anode. The material for forming the first electrode 11 may include a material with a high work function for easy hole injection. The first electrode 11 may be a reflective electrode, a semi-transmissive electrode, or a transmissive electrode. The material for forming the first electrode 11 may be indium tin oxide (ITO), indium zinc oxide (IZO), tin oxide ($SnO_2$), or zinc oxide (ZnO). In some embodiments, the material for forming the first electrode 11 may be a metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including a plurality of layers. In some embodiments, the first electrode 11 may have a triple-layered structure of ITO/Ag/ITO.

The organic layer 15 may be on the first electrode 11.

Organic Layer 15 in Organic Light-Emitting Device 10

The organic layer 15 may include a hole transport region, an emission layer, and an electron transport region.

Hole Transport Region in Organic Layer 15

The hole transport region may be between the first electrode 11 and the emission layer.

The hole transport region may include a hole injection layer, a hole transport layer, an electron blocking layer, a buffer layer, or a combination thereof.

The hole transport region may include a hole injection layer only or a hole transport layer only. In some embodiments, the hole transport region may include a hole injection layer and a hole transport layer which are sequentially stacked on the first electrode 11. In some embodiments, the hole transport region may include a hole injection layer, a hole transport layer, and an electron blocking layer, which are sequentially stacked on the first electrode 11.

When the hole transport region includes a hole injection layer, the hole injection layer may be formed on the first electrode 11 by using one or more suitable methods, such as vacuum deposition, spin coating, casting, and Langmuir-Blodgett (LB) deposition.

When a hole injection layer is formed by vacuum-deposition, for example, the vacuum deposition may be performed at a temperature in a range of about 100° C. to about 500° C., at a vacuum pressure in a range of about $10^{-8}$ torr to about $10^{-3}$ torr, and at a rate in a range of about 0.01 Angstroms per second (Å/sec) to about 100 Å/sec, though the conditions may vary depending on a compound used as a hole injection material and a structure and thermal properties of a desired hole injection layer.

When a hole injection layer is formed by spin coating, the spin coating may be performed at a rate in a range of about 2,000 revolutions per minute (rpm) to about 5,000 rpm and at a temperature in a range of about 80° C. to 200° C. to facilitate removal of a solvent after the spin coating, though the conditions may vary depending on a compound used as a hole injection material and a structure and thermal properties of a desired hole injection layer.

The conditions for forming a hole transport layer and an electron blocking layer may be inferred from the conditions for forming the hole injection layer.

The hole transport region may include m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate)

(PEDOT/PSS), polyaniline/camphor-sulfonic acid (PANI/CSA), polyaniline/poly(4-styrene sulfonate) (PANI/PSS), a compound represented by Formula 201, a compound represented by Formula 202, or any combination thereof:
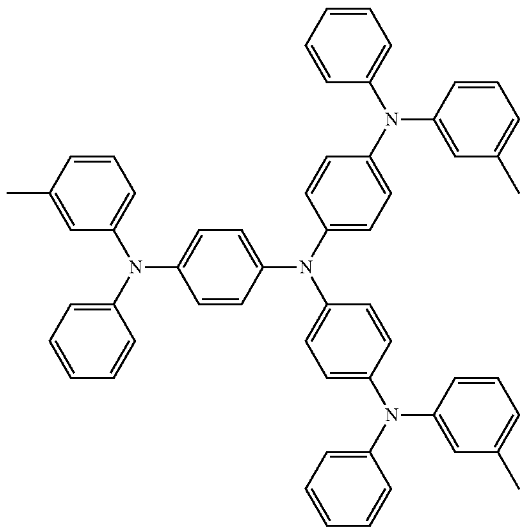
m-MTDATA
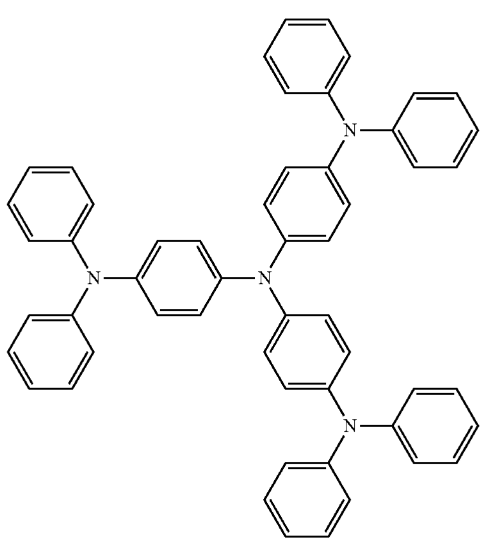
TDATA
-continued
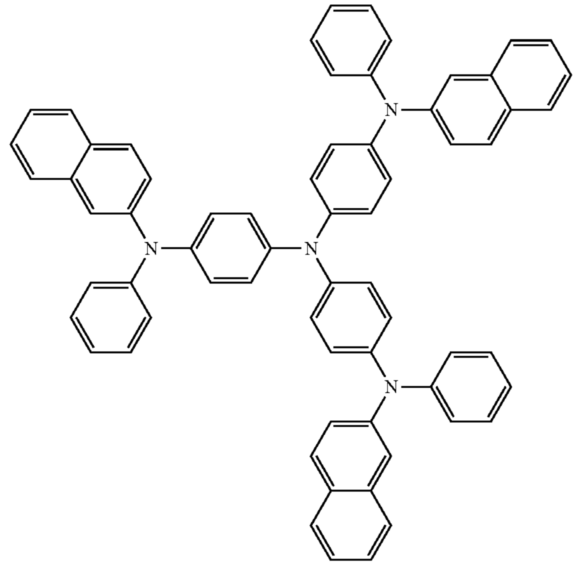
2-TNATA
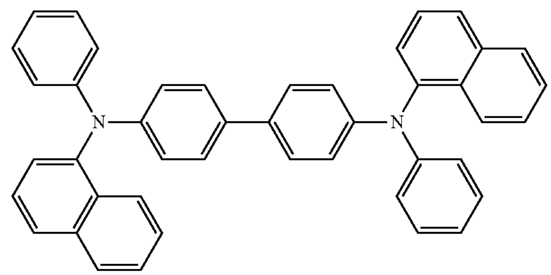
NPB
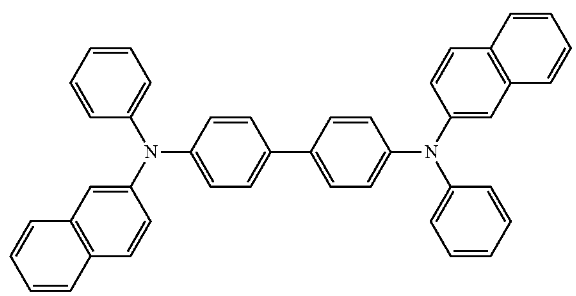
β-NPB
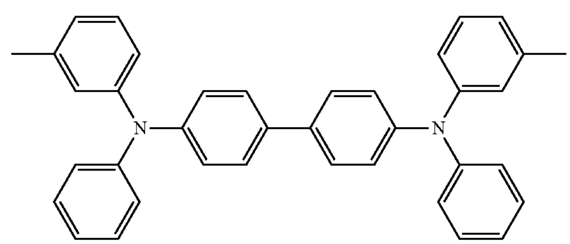
TPD -continued

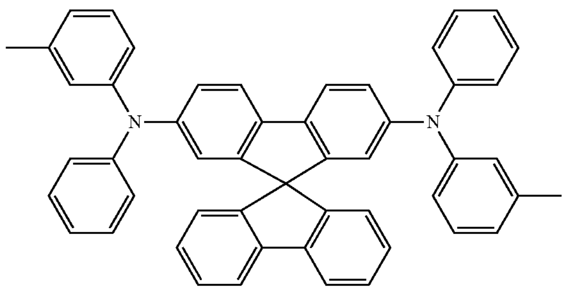

Spiro-TPD

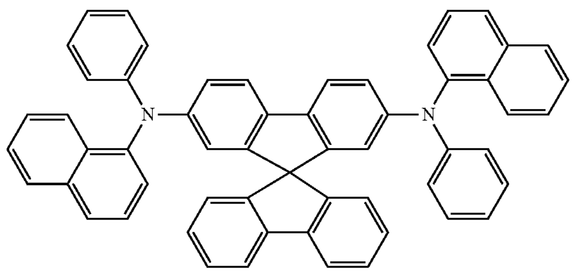

Spiro-NPD

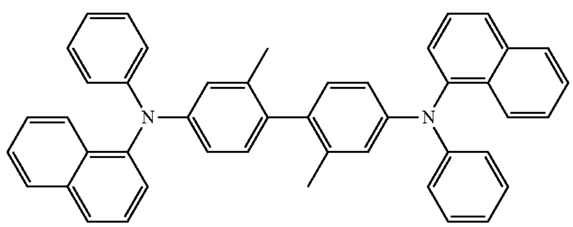

methylated NPB

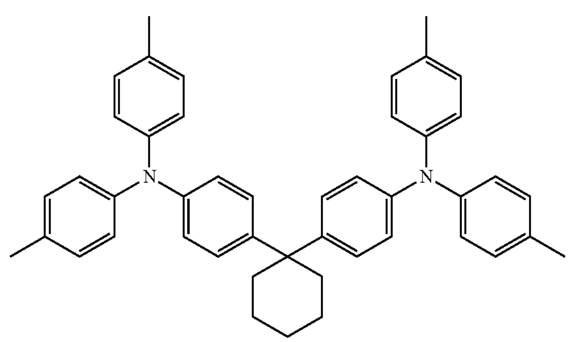

TAPC

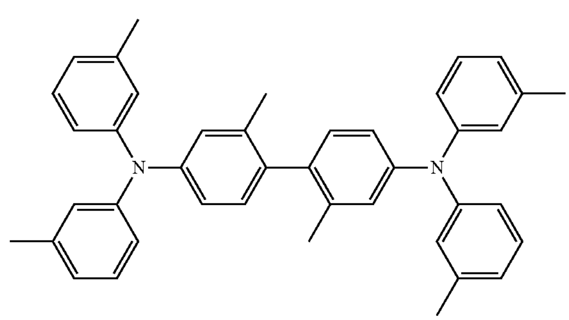

HMTPD

-continued

Formula 201

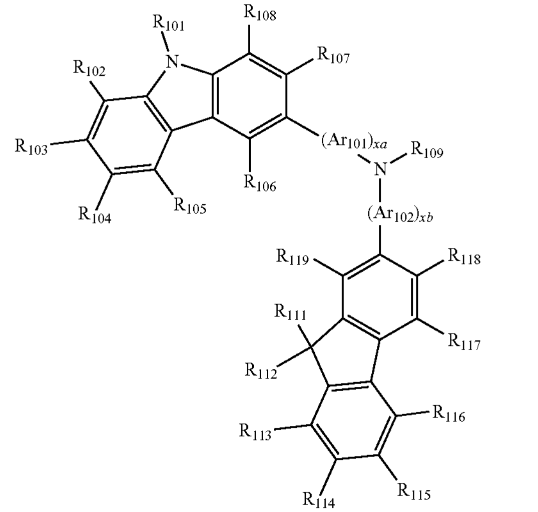

Formula 202

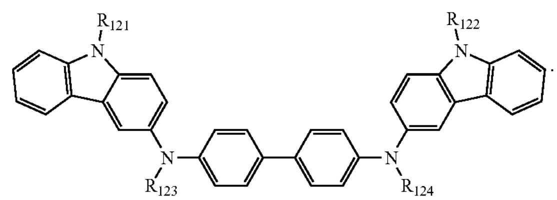

wherein, in Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5. In some embodiments, xa and xb may each independently be an integer from 0 to 2. In some embodiments, xa may be 1, and xb may be 0.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, pentyl group, or a hexyl group), or a $C_1$-$C_{10}$ alkoxy group (e.g., a methoxy group, an ethoxy group, a propoxy group, a butoxy group, or a pentoxy group);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof.

In Formula 201, $R_{109}$ may be a phenyl group, a naphthyl group, an anthracenyl group, or a pyridinyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In some embodiments, the compound represented by Formula 201 may be represented by Formula 201A:

Formula 201A

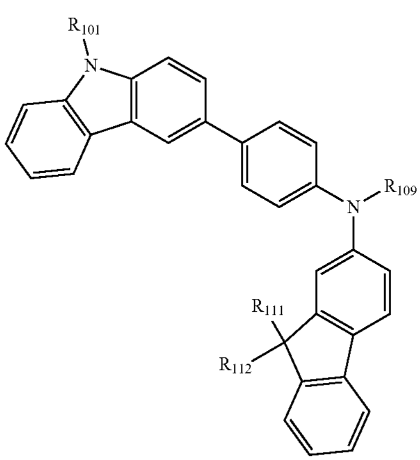

wherein, in Formula 201A, $R_{101}$, $R_{111}$, $R_{112}$, and $R_{109}$ may respectively be understood by referring to the descriptions of $R_{101}$, $R_{111}$, $R_{112}$, and $R_{109}$ provided herein.

In some embodiments, the hole transport region may include one of Compounds HT1 to HT21 or any combination thereof:

HT1

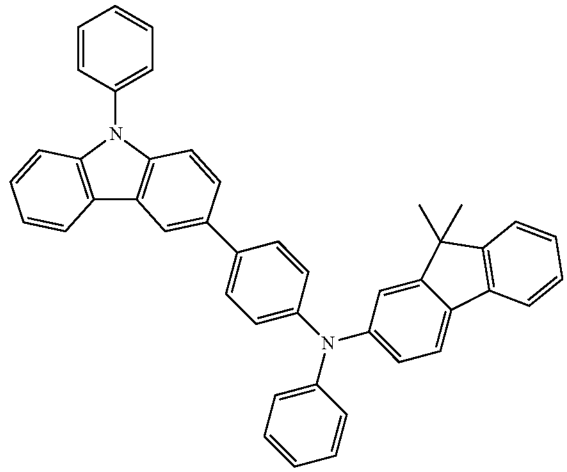

HT2

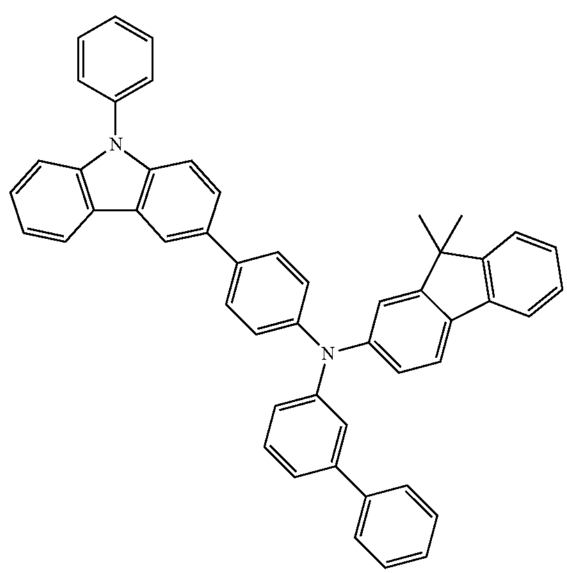

-continued
HT3
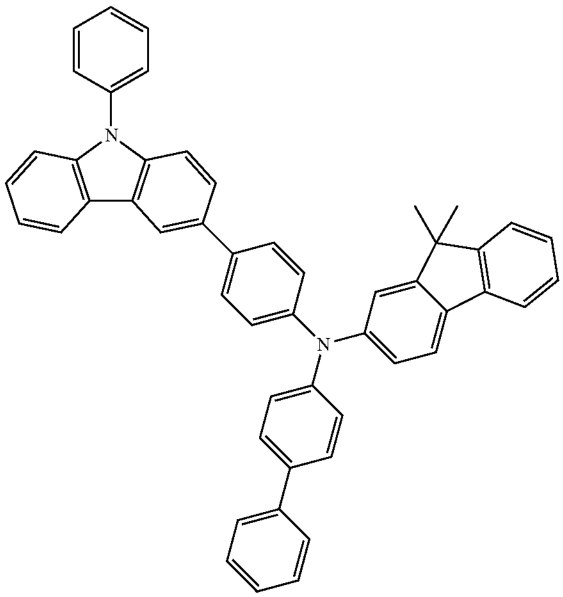
HT4
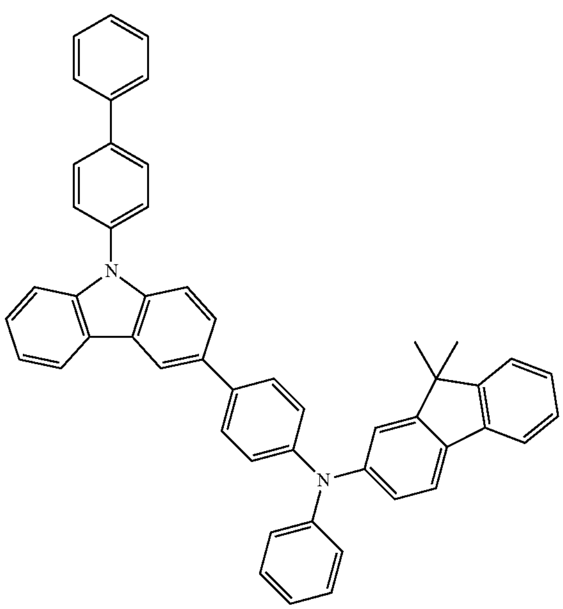
-continued
HT5
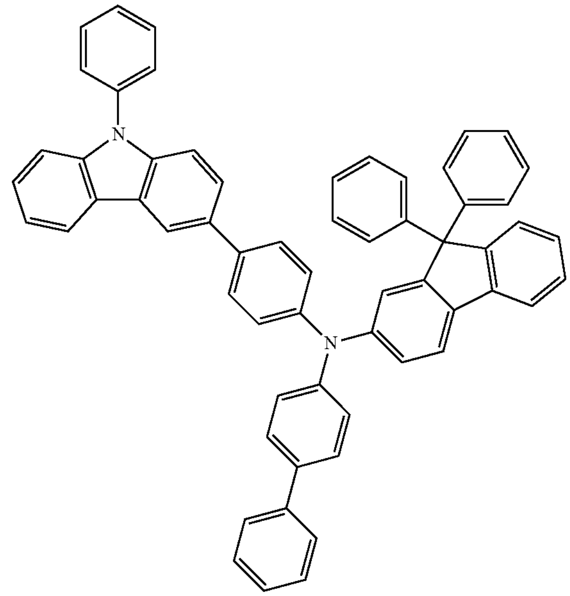
HT6
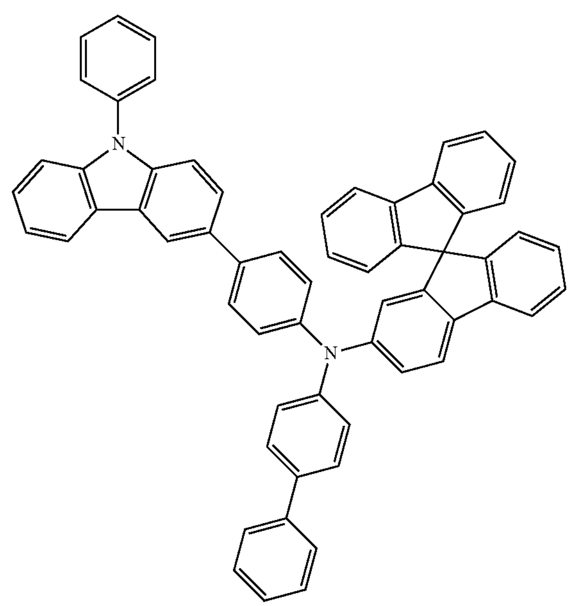

-continued
HT7
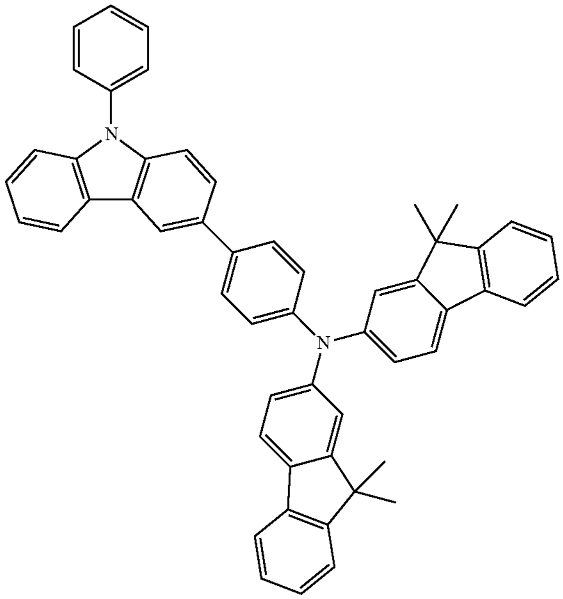
HT8
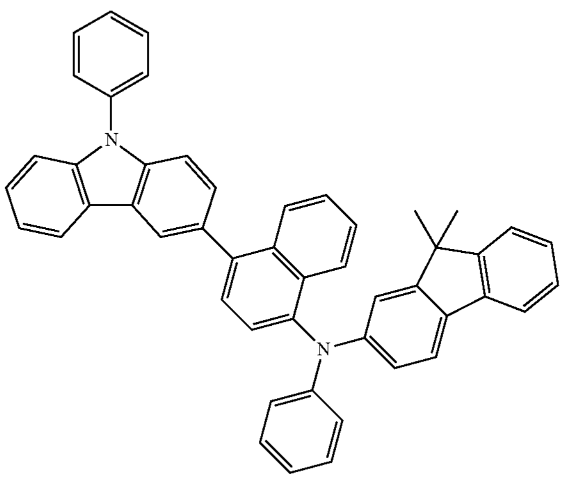
HT9
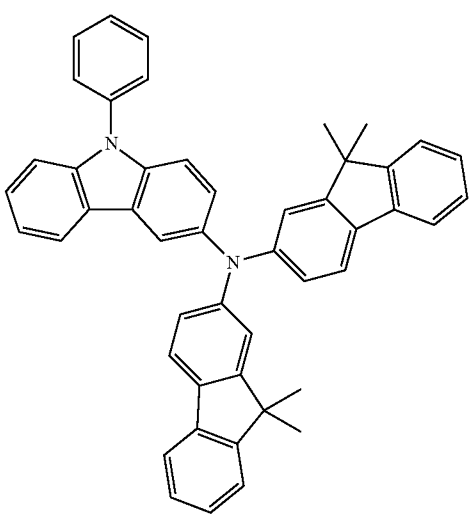
-continued
HT10
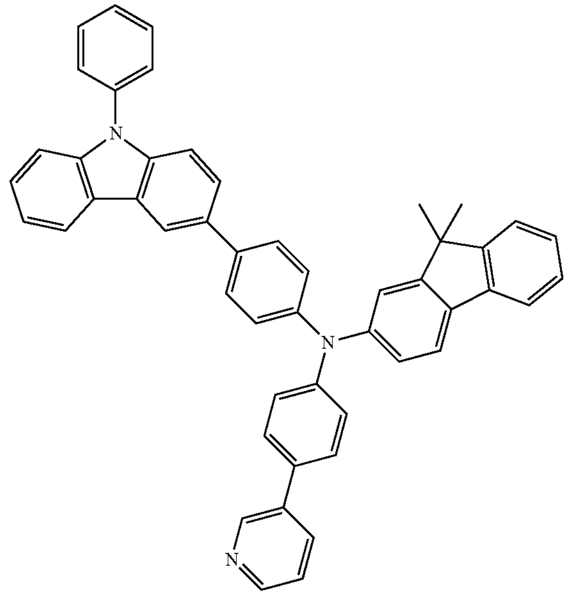
HT11
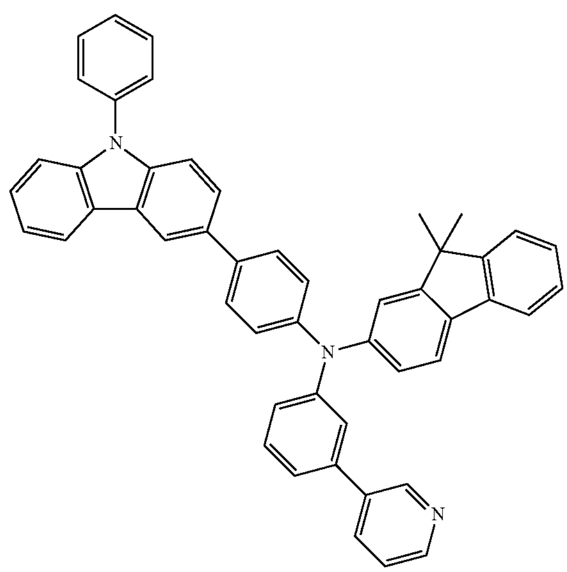

-continued
HT12
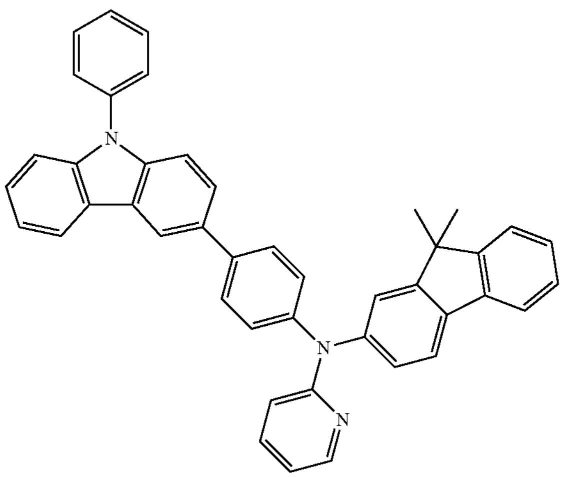
HT13
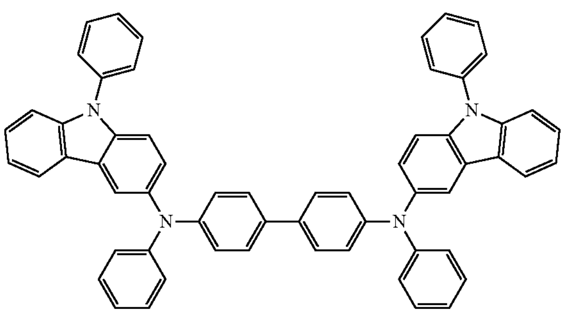
HT14
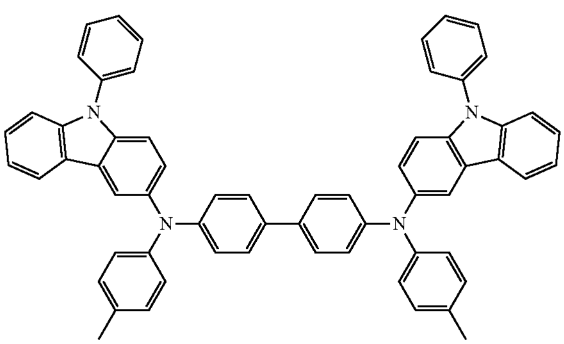
HT15
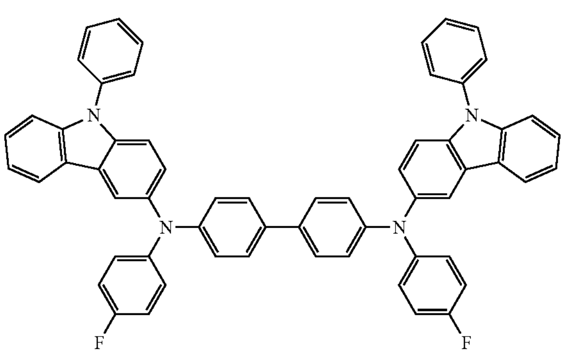
-continued
HT16
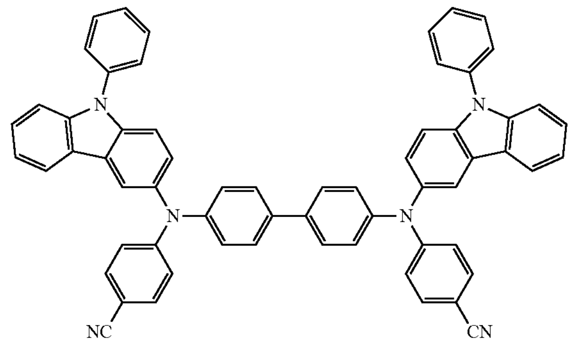
HT17
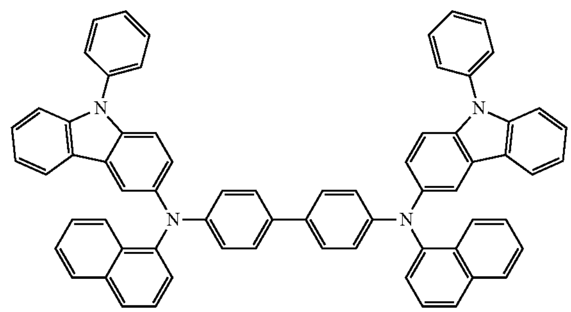
HT18
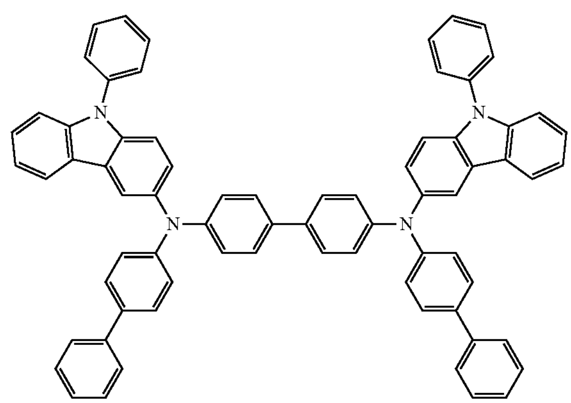
HT19
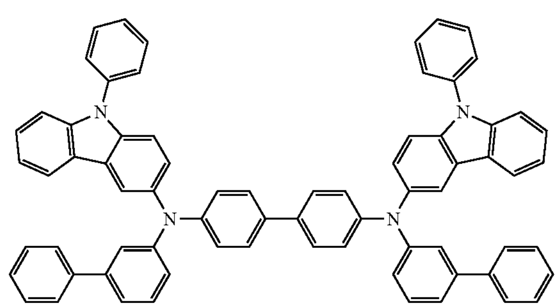

-continued

HT20

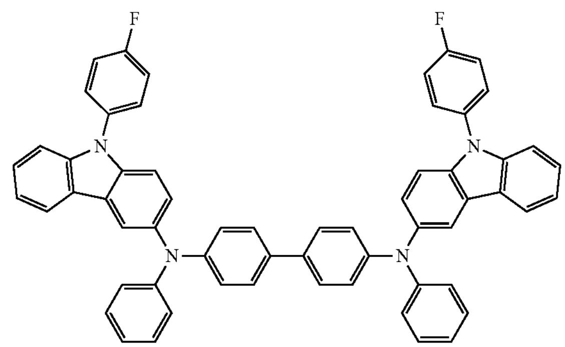

HT21

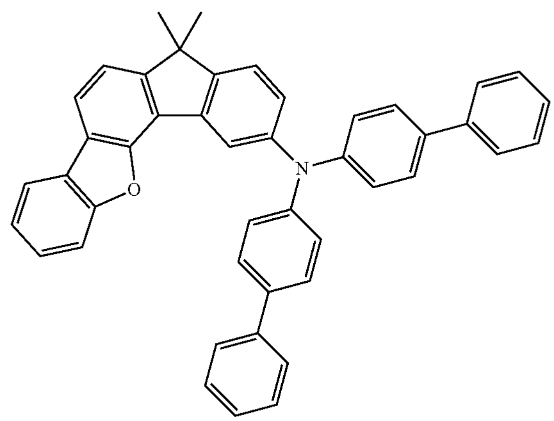

The thickness of the hole transport region may be in a range of about 100 Angstroms (Å) to about 10,000 Å, for example, about 100 Å to about 3,000 Å. When the hole transport region includes a hole injection layer, a hole transport layer, an electron blocking layer, or any combination thereof, the thickness of the hole injection layer may be in a range of about 50 Å to about 10,000 Å, for example, about 100 Å to about 1,000 Å, the thickness of the hole transport layer may be in a range of about 50 Å to about 2,000 Å, for example, about 100 Å to about 1,500 Å. When the thicknesses of the hole transport region, the hole injection layer, and the hole transport layer are within any of these ranges, excellent hole transport characteristics may be obtained without a substantial increase in driving voltage.

The hole transport region may include a charge generating material as well as the aforementioned materials, to improve conductive properties of the hole transport region. The charge generating material may be substantially homogeneously or non-homogeneously dispersed in the hole transport region.

The charge generating material may include, for example, a p-dopant. The p-dopant may be a quinone derivative, a metal oxide, a compound containing a cyano group, or any combination thereof. In some embodiments, the p-dopant may be a quinone derivative, such as tetracyanoquinodimethane (TCNQ), a 2,3,5,6-tetrafluoro-tetracyano-1,4-benzoquinonedimethane (F4-TCNQ), or F6-TCNNQ; a metal oxide, such as a tungsten oxide or a molybdenum oxide; a compound containing a cyano group, such as Compound HT-D1; or any combination thereof:

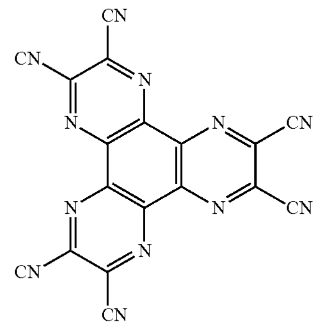

HT-D1

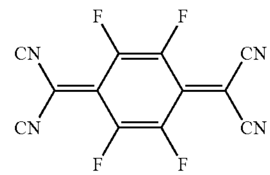

F4-TCNQ

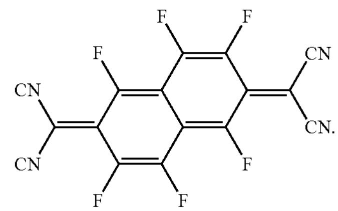

F6-TCNNQ

The hole transport region may further include a buffer layer.

The buffer layer may compensate for an optical resonance distance depending on a wavelength of light emitted from the emission layer to improve the efficiency of an organic light-emitting device.

When the hole transport region includes an electron blocking layer, a material for forming the electron blocking layer may include the material for forming a hole transport region, the host material described herein or any combination thereof. In some embodiments, when the hole transport region includes an electron blocking layer, mCP described herein, Compound H21, H-H1, or any combination thereof may be used for forming the electron blocking layer.

Emission Layer in Organic Layer 15

An emission layer may be formed on the hole transport region by using one or more suitable methods, such as vacuum deposition, spin coating, casting, or LB deposition. When the emission layer is formed by vacuum deposition or spin coating, vacuum deposition and coating conditions for forming the emission layer may be generally similar to those conditions for forming a hole injection layer, though the conditions may vary depending on a compound that is used.

The emission layer may include a host and a dopant, and the dopant may include the organometallic compound represented by Formula 1-1 described herein.

Host in Emission Layer

The host may include TPBi, TBADN, ADN (also known as "DNA"), CBP, CDBP, TCP, mCP, Compound H50, Compound H51, Compound H52, or any combination thereof:

-continued
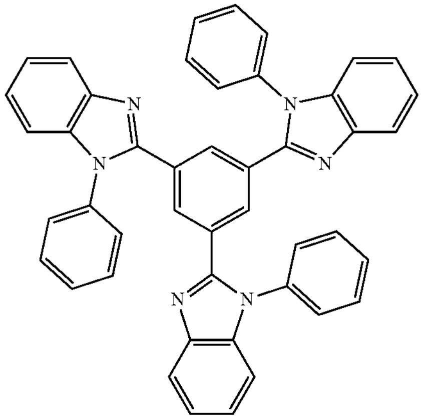
TPBi
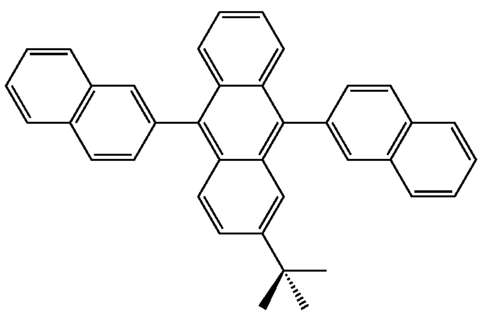
TBADN
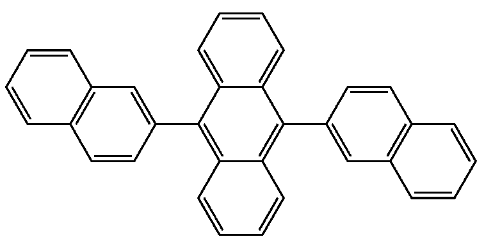
ADN
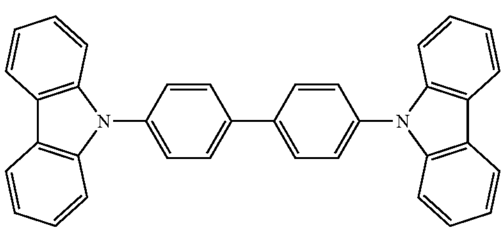
CBP
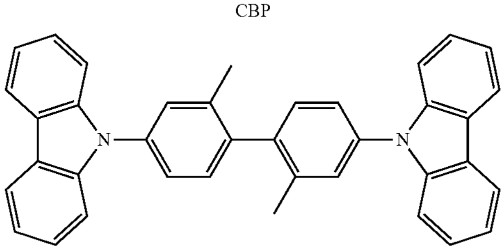
CDBP
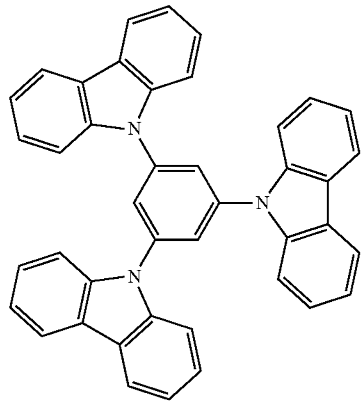
TCP
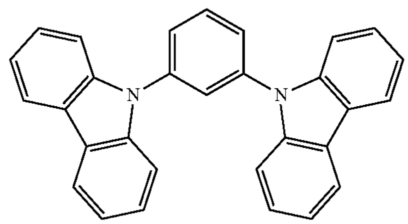
mCP
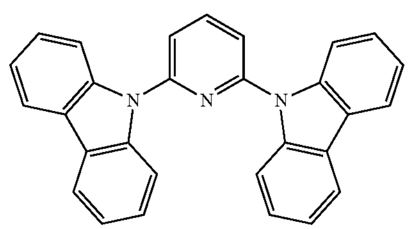
H50
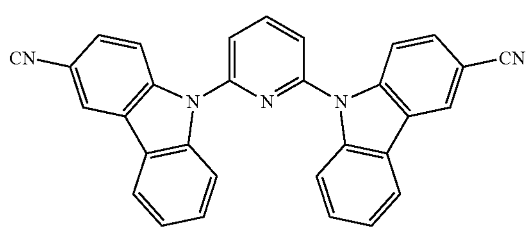
H51

-continued

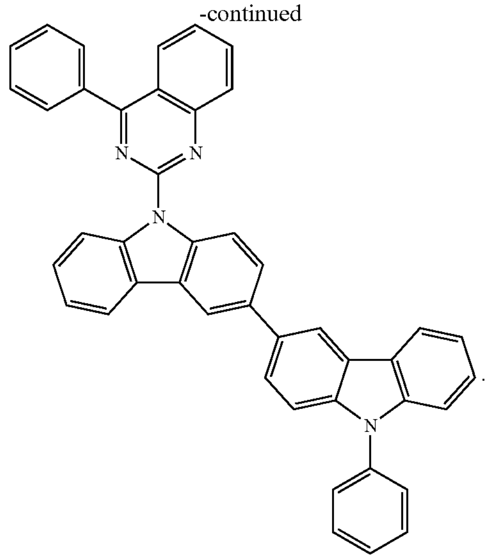

H52

The host may consist of one type of compound or a mixture of at least two different kinds of compounds.

In an embodiment, the host may include an electron transporting host including at least one electron transporting moiety, a hole transporting host not including an electron transporting moiety, or any combination thereof.

The electron transporting moiety may include a cyano group, a π electron-depleted nitrogen-containing cyclic group, a group represented by one of following Formulae, or any combination thereof:

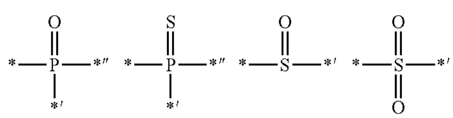

wherein, in the Formulae above, *, *', and *" may each indicate a binding site to an adjacent atom.

For example, the electron transporting host may include at least one π electron-rich cyclic group and at least one electron transporting moiety.

In some embodiments, the hole transporting host may include at least one π electron-rich cyclic group and not include an electron transporting moiety.

In one or more embodiments, the host may include an electron transporting host and a hole transporting host, and the electron transporting host may be different from the hole transporting host.

The term "π electron-depleted nitrogen-containing cyclic group" as used herein refers to a cyclic group having at least one *—N=*' moiety. Examples thereof may include an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group.

The π electron-rich cyclic group refers to a cyclic group not including a *—N=*' moiety. Examples thereof may include a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, and a triindolobenzene group.

According to another embodiment, the electron transporting host may include a compound represented by Formula E-1.

In one or more embodiments, the hole transporting host may include a compound represented by Formula H-1.

$[Ar_{301}]_{xb11}$-$[(L_{301})_{xb1}$-$R_{301}]_{xb21}$ Formula E-1 wherein, in Formula E-1, $Ar_{301}$ may be a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, xb11 may be 1, 2, or 3, $L_{301}$ may each independently be a single bond, a group represented by one of the Formulae below, a $C_5$-$C_{60}$ carbocyclic group unsubstituted or substituted with at least one $R_{10a}$ or a $C_1$-$C_{60}$ heterocyclic group unsubstituted or substituted with at least one $R_{10a}$, wherein in Formulae, *, *', and *" each indicate a binding site to an adjacent atom,

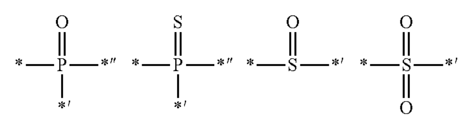

xb1 may be an integer from 1 to 5, $R_{301}$ may be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_{301}$)($Q_{302}$)($Q_{303}$), —N($Q_{301}$)($Q_{302}$), —B($Q_{301}$)($Q_{302}$), —C(═O)($Q_{301}$), —S(═O)$_2$($Q_{301}$), —S(═O)($Q_{301}$), —P(═O)($Q_{301}$)($Q_{302}$), or —P(═S)($Q_{301}$)($Q_{302}$), xb21 may be an integer from 1 to 5, wherein $Q_{301}$ to $Q_{303}$ may each independently be a $C_1$-$C_{10}$ alkyl group, a $C_1$-$C_{10}$ alkoxy group, a phenyl group, a biphenyl group, a terphenyl group, or a naphthyl group, $R_{10a}$ may be understood by referring to the description of $T_{11}$ provided herein, and at least one of Conditions 1 to 3 may be satisfied:

Condition 1 at least one of $Ar_{301}$, $L_{301}$, and $R_{301}$ in Formula E-1 may each independently include a π electron-depleted nitrogen-containing cyclic group, Condition 2

$L_{301}$ in Formula E-1 may be a group represented by one of the following Formulae:

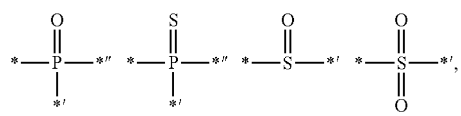

Condition 3

$R_{301}$ in Formula E-1 may be a cyano group, —S(═O)$_2$($Q_{301}$), —S(═O)($Q_{301}$), —P(═O)($Q_{301}$)($Q_{302}$), or —P(═S)($Q_{301}$)($Q_{302}$).

Formula H-1

$$Ar_{401}—(L_{401})_{xd1}—(Ar_{402})_{xd11}$$

11

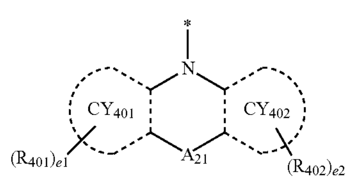

12

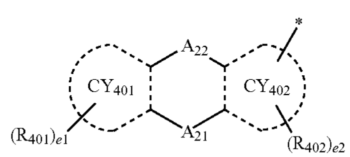

wherein, in Formulae H-1, 11, and 12, $L_{401}$ may be:

a single bond; or a π electron-rich cyclic group (e.g., a benzene group, a heptalene group, an indene group, a naphthalene group, an azulene group, an indacene group, acenaphthylene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentacene group, a hexacene group, a rubicene group, a coronene group, an ovalene group, a pyrrole group, an isoindole group, an indole group, a furan group, a thiophene group, a benzofuran group, a benzothiophene group, a benzocarbazole group, a dibenzocarbazole group, a dibenzofuran group, a dibenzothiophene group, a dibenzothiophene sulfone group, a carbazole group, a dibenzosilole group, an indenocarbazole group, an indolocarbazole group, a benzofurocarbazole group, a benzothienocarbazole group, or a triindolobenzene group) unsubstituted or substituted with deuterium, a $C_1$-$C_{10}$ alkyl group, a $C_1$-$C_{10}$ alkoxy group, a π electron-rich cyclic group (e.g., a phenyl group, a naphthyl group, a fluorenyl group, a carbazolyl group, a dibenzofuranyl group, a dibenzothiophenyl group, a triphenylenyl group, a biphenyl group, a terphenyl group, or a tetraphenyl group (or, quaterphenyl)), —Si($Q_{401}$)($Q_{402}$)($Q_{403}$), or any combination thereof, xd1 may be an integer from 1 to 10, and when xd1 is 2 or greater, at least two $L_{401}$(s) may be identical to or different from each other, $Ar_{401}$ may be a group represented by Formula 11 or a group represented by Formula 12, $Ar_{402}$ may be:

a group represented by Formula 11 or a group represented by Formula 12; or a π electron-rich cyclic group (e.g., a phenyl group, a naphthyl group, a fluorenyl group, a carbazolyl group, a dibenzofuranyl group, a dibenzothiophenyl group, a biphenyl group, a terphenyl group, or a triphenylenyl group) unsubstituted or substituted with deuterium, a $C_1$-$C_{20}$ alkyl group, a $C_1$-$C_{20}$ alkoxy group, a π electron-rich cyclic group (e.g., a phenyl group, a naphthyl group, a fluorenyl group, a carbazolyl group, a dibenzofuranyl group, a dibenzothiophenyl group, a biphenyl group, a terphenyl group, or a triphenylenyl group), or any combination thereof, xd11 may be an integer from 0 to 10 (for example, an integer from 1 to 10), and when xd11 is 2 or greater, at least two $Ar_{402}$(s) may be identical to or different from each other, $CY_{401}$ and $CY_{402}$ may each independently be a π electron-rich cyclic group (e.g., a benzene group, a naphthalene group, a fluorene group, a carbazole group, a benzocarbazole group, an indolocarbazole group, a dibenzofuran group, a dibenzothiophene group, a dibenzosilole group, a benzonaphthofuran group, a benzonapthothiophene group, or a benzonaphthosilole group), $A_{21}$ may be a single bond, O, S, N($R_{51}$), C($R_{51}$)($R_{52}$), or Si($R_{51}$)($R_{52}$), $A_{22}$ may be a single bond, O, S, N($R_{53}$), C($R_{53}$)($R_{54}$), or Si($R_{53}$)($R_{54}$), at least one of $A_{21}$ and $A_{22}$ in Formula 12 may not be a single bond, $R_{51}$ to $R_{54}$ and $R_{401}$ to $R_{402}$ may each independently be:

hydrogen or deuterium;

a $C_1$-$C_{20}$ alkyl group and a $C_1$-$C_{20}$ alkoxy group, each unsubstituted or substituted with deuterium, a π electron-rich cyclic group (e.g., a phenyl group, a naphthyl group, a fluorenyl group, a carbazolyl group, a dibenzofuranyl group, or a dibenzothiophenyl group), or any combination thereof;

a π electron-rich cyclic group (e.g., a phenyl group, a naphthyl group, a fluorenyl group, a carbazolyl group, a dibenzofuranyl group, a dibenzothiophenyl group, a biphenyl group, a terphenyl group, or a triphenylenyl group) unsubstituted or substituted with deuterium, a $C_1$-$C_{20}$ alkyl group, a $C_1$-$C_{20}$ alkoxy group, a π electron-rich cyclic group (e.g., a phenyl group, a naphthyl group, a fluorenyl group, a carbazolyl group, a dibenzofuranyl group, a dibenzothiophenyl group, a biphenyl group, a terphenyl group, or a triphenylenyl group), or any combination thereof, $$—Si(Q_{404})(Q_{405})(Q_{406}),$$

e1 and e2 may each independently be an integer from 0 to 10, wherein $Q_{401}$ to $Q_{406}$ may each independently be hydrogen, deuterium, a $C_1$-$C_{20}$ alkyl group, a $C_1$-$C_{20}$ alkoxy group, or a π electron-rich cyclic group (e.g., a phenyl group, a naphthyl group, a fluorenyl group, a carbazolyl group, a dibenzofuranyl group, a dibenzothiophenyl group, or a biphenyl group), and

* indicates a binding site to an adjacent atom.

In an embodiment, in Formula E-1, $Ar_{301}$ may be a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, or a dibenzothiophene group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, at least one of $L_{301}$(s) in the number of xb1 may each independently be an imidazole group, a pyrazole group, a thiazole group, an isothiazole group, an oxazole group, an isoxazole group, a pyridine group, a pyrazine group, a pyridazine group, a pyrimidine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, or an azacarbazole group, each unsubstituted or substituted with deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, $—P(=O)(Q_{31})(Q_{32})$, or any combination thereof, and $R_{301}$ may be hydrogen, deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a tetraphenyl group, a naphthyl group, $—Si(Q_{31})(Q_{32})(Q_{33})$, $—N(Q_{31})(Q_{32})$, $—B(Q_{31})(Q_{32})$, $—C(=O)(Q_{31})$, $—S(=O)_2(Q_{31})$, or $—P(=O)(Q_{31})(Q_{32})$, wherein $Q_{31}$ to $Q_{33}$ may each independently be a $C_1$-$C_{10}$ alkyl group, a $C_1$-$C_{10}$ alkoxy group, a phenyl group, a biphenyl group, a terphenyl group, or a naphthyl group.

In one or more embodiments, $R_{301}$ may be represented by one of Formulae 7-1 to 7-9:

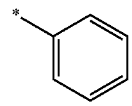

7-1

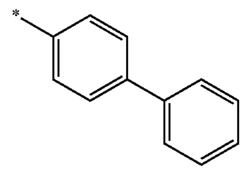

7-2

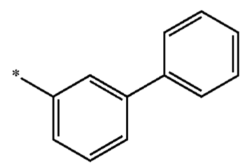

7-3

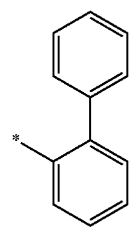

7-4

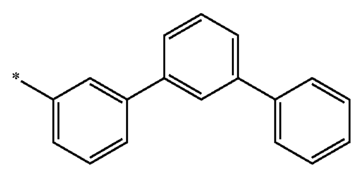

7-5

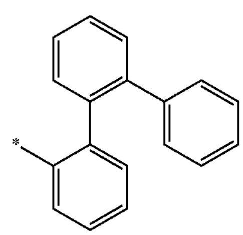

7-6

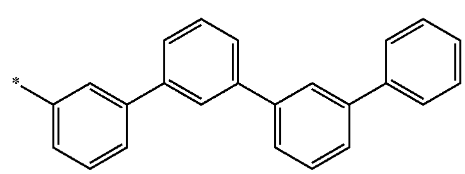

7-7

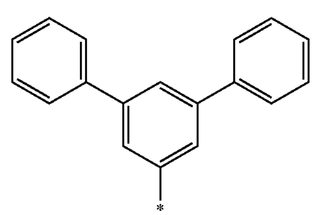

7-8

-continued
7-9
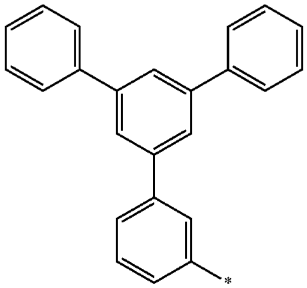
The electron transporting host may be, for example, at least one of Compounds H-E1 to H-E84:
H-E1
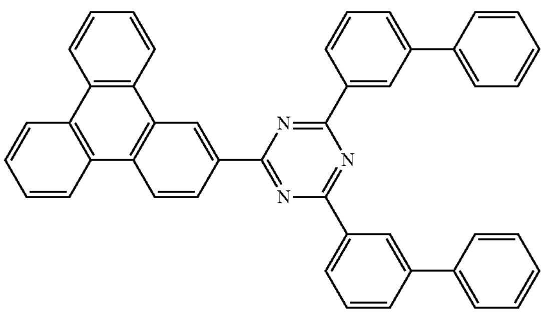
H-E2
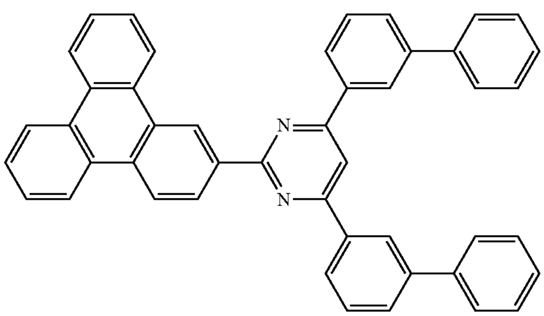
H-E3
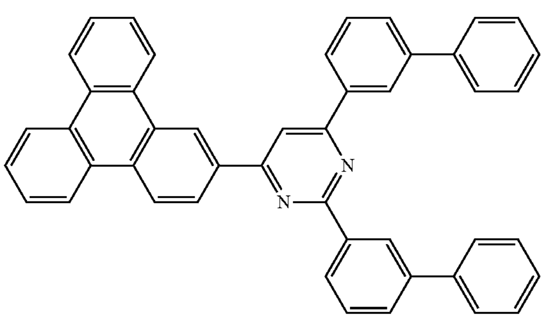
-continued
H-E4
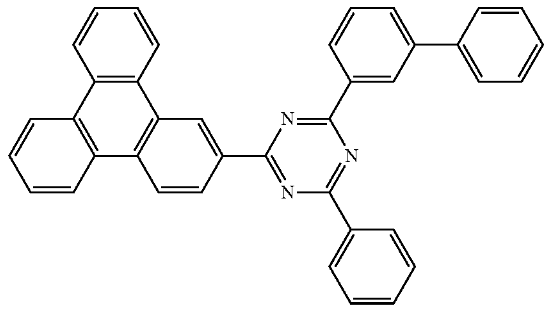
H-E5
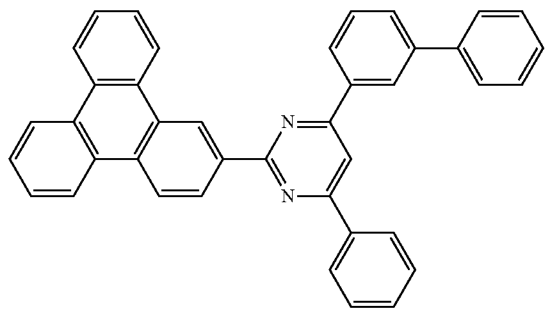
H-E6
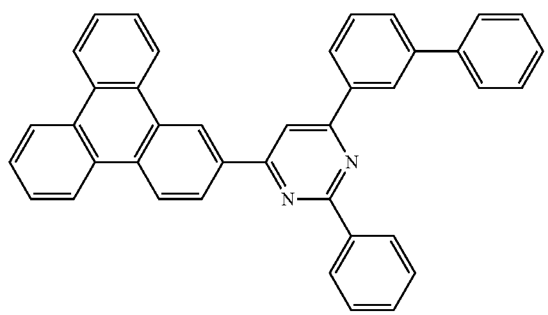
H-E7
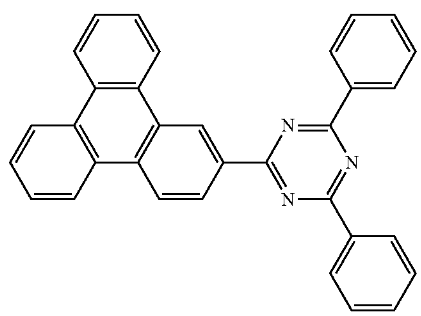
H-E8
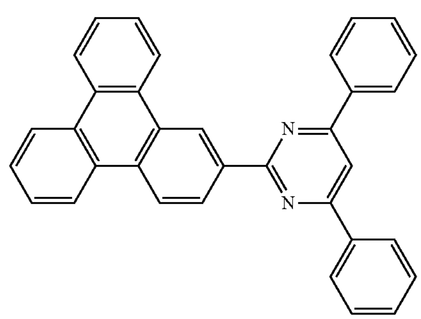

-continued
H-E9
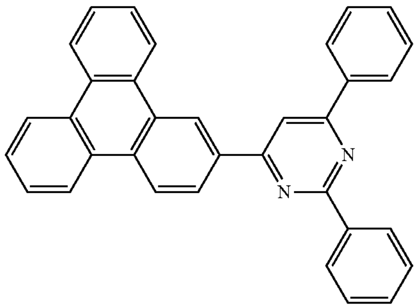
H-E10
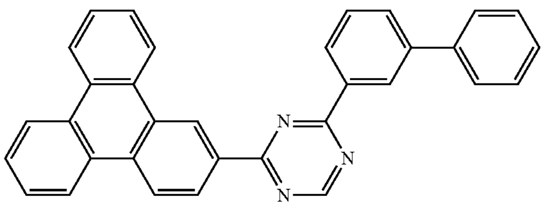
H-E11
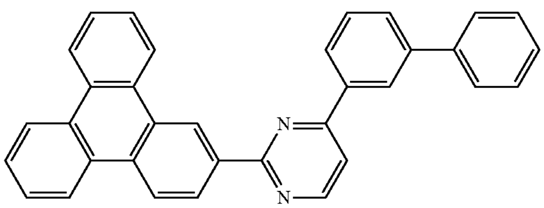
H-E12
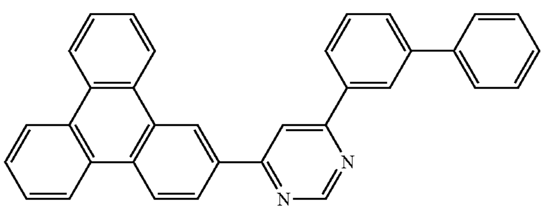
H-E13
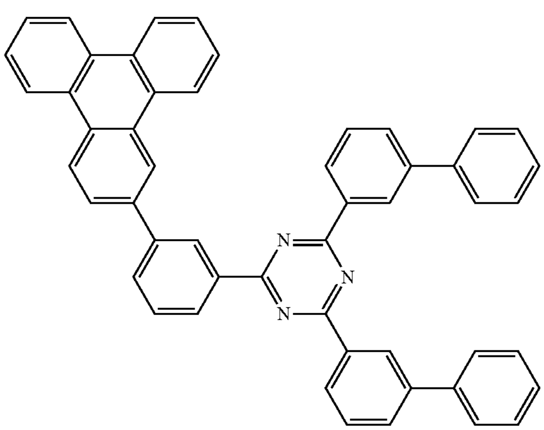
-continued
H-E14
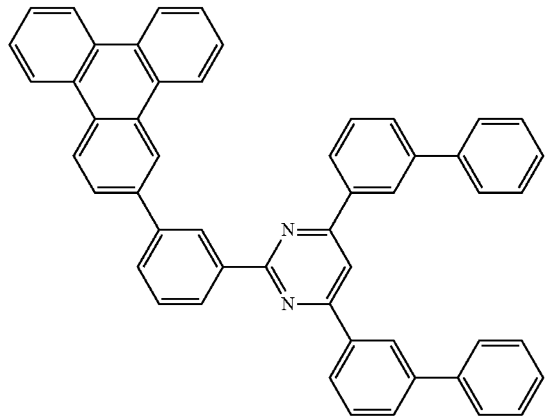
H-E15
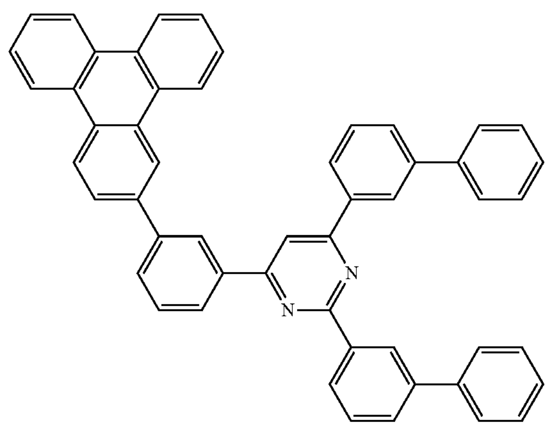
H-E16
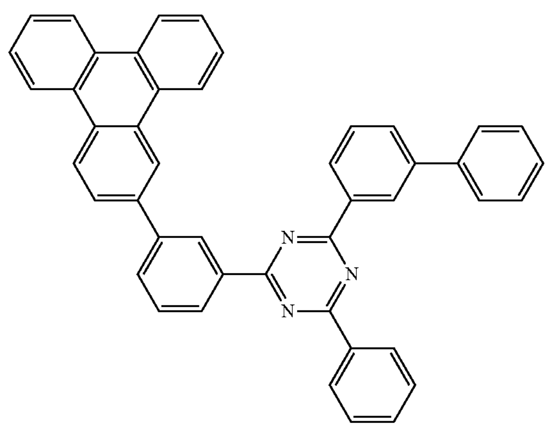

-continued
H-E17
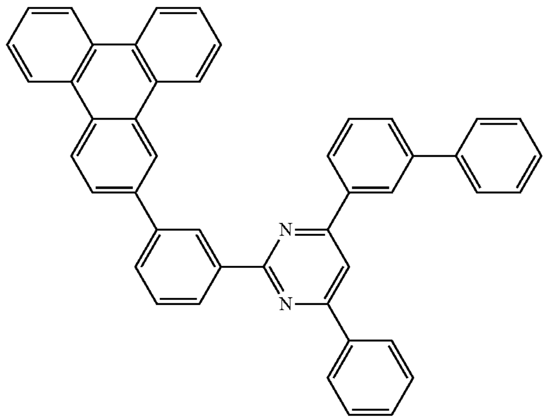
H-E18
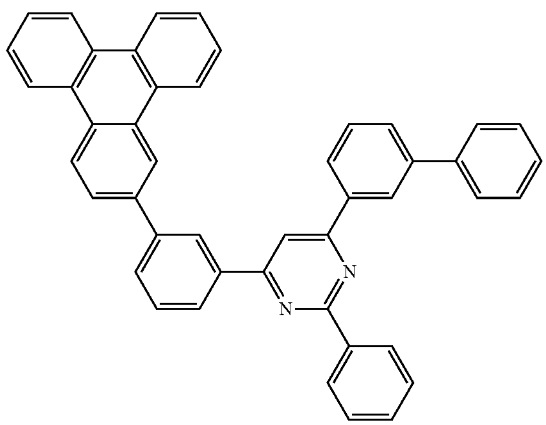
H-E19
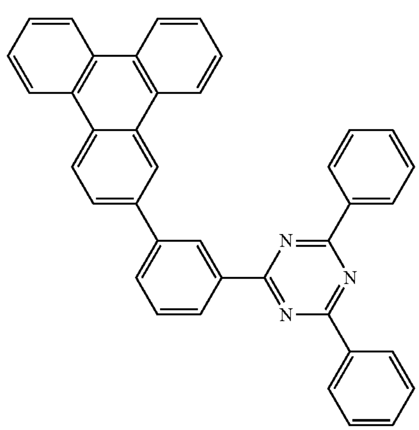
-continued
H-E20
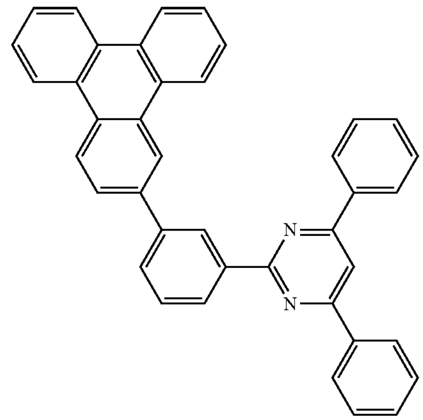
H-E21
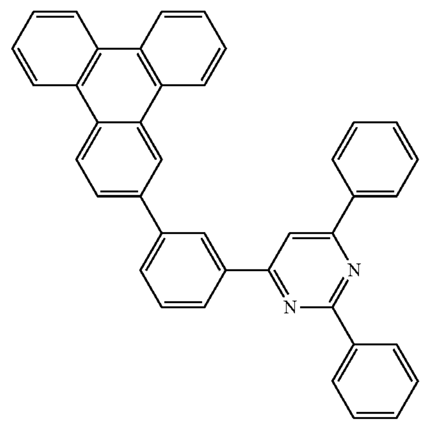
H-E22
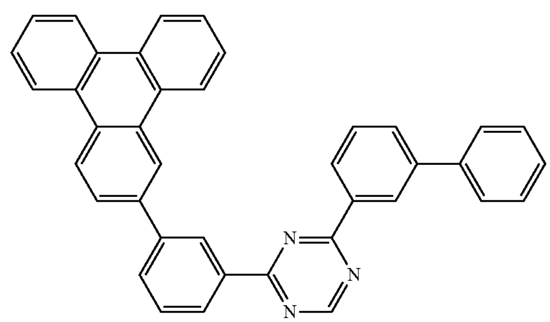
H-E23
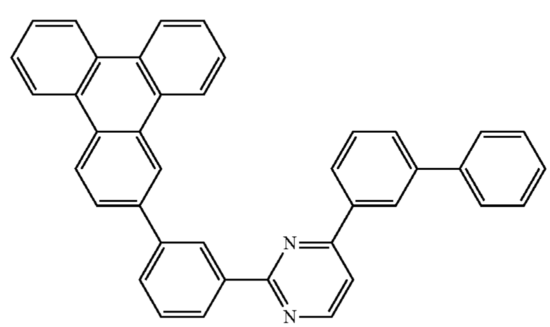

-continued
H-E24
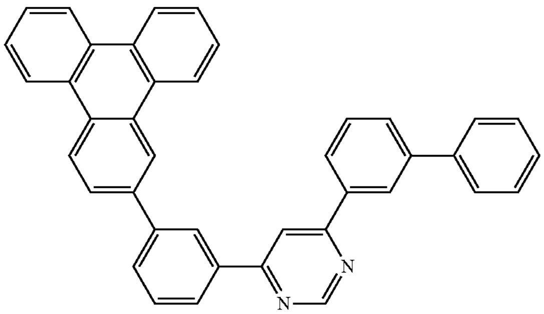
H-E25
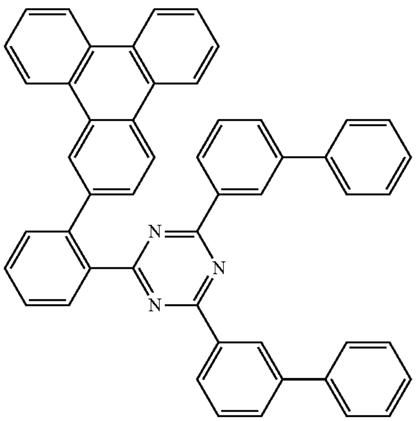
H-E26
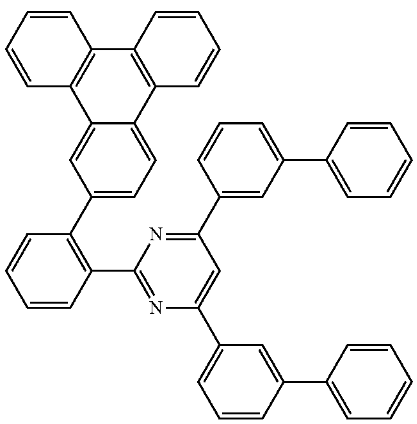
H-E27
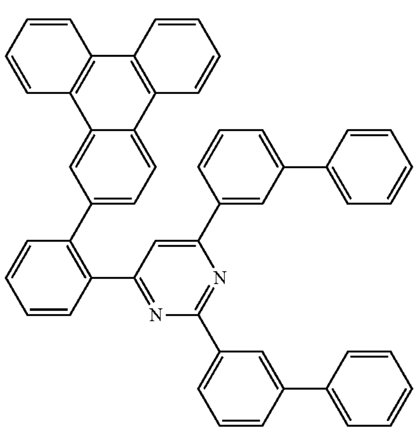
-continued
H-E28
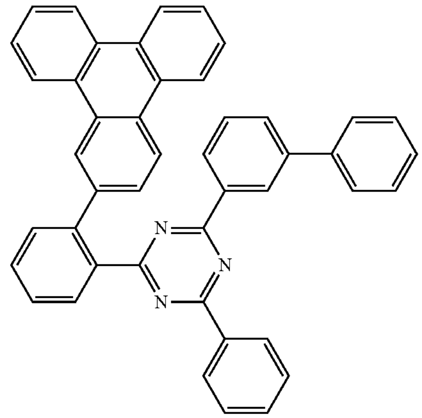
H-E29
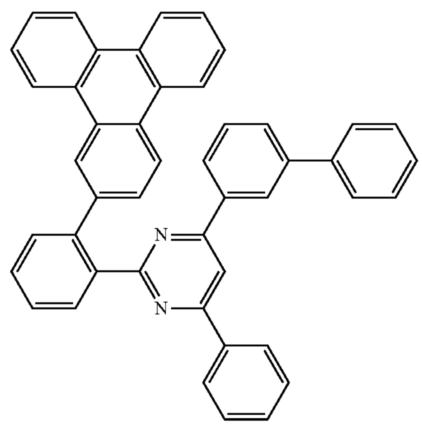
H-E30
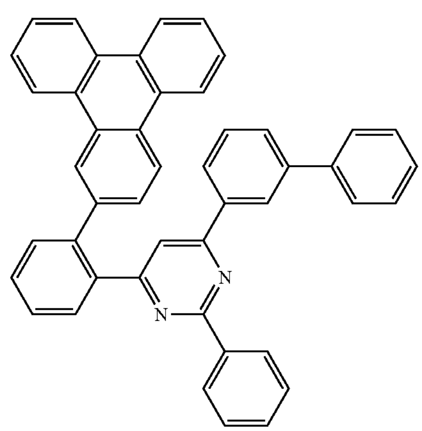

-continued
H-E31
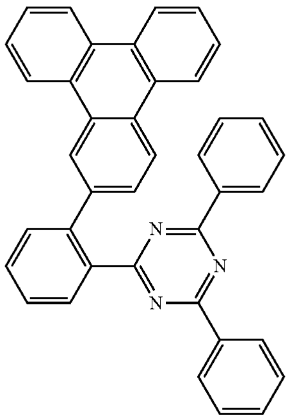
H-E32
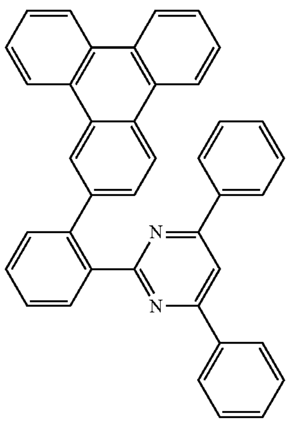
H-E33
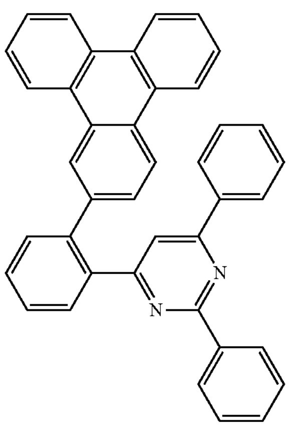
H-E34
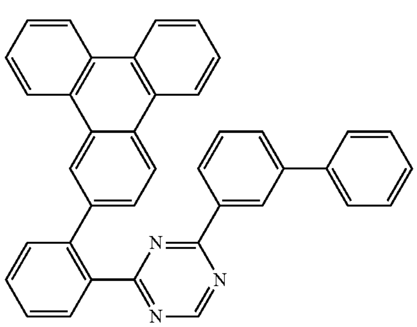
-continued
H-E35
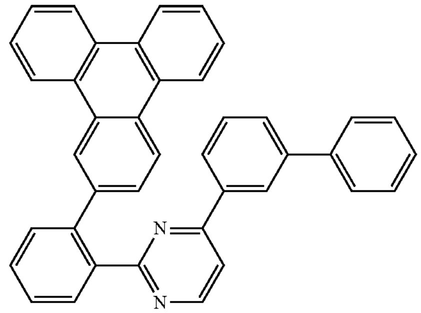
H-E36
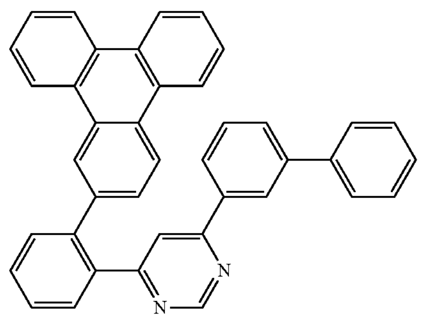
H-E37
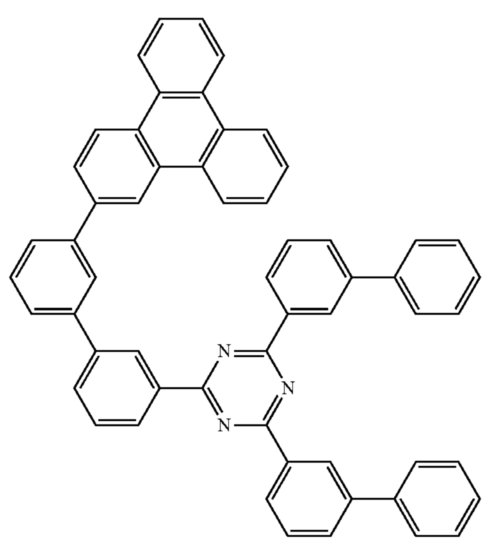

-continued
H-E38
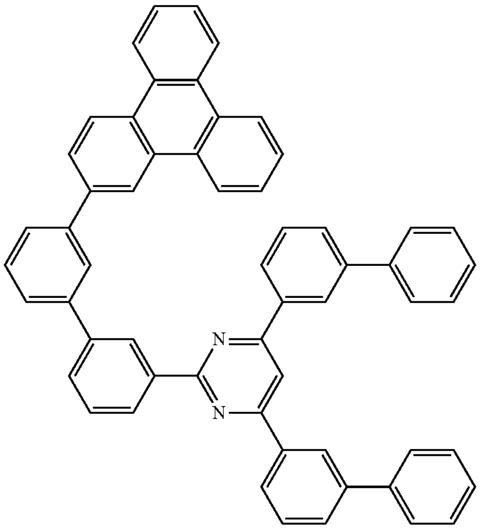
H-E39
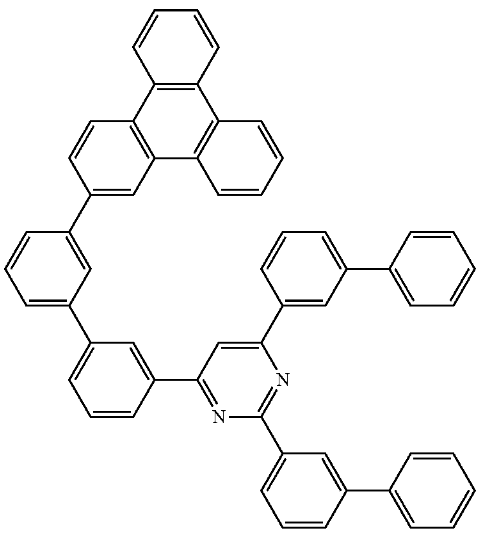
H-E40
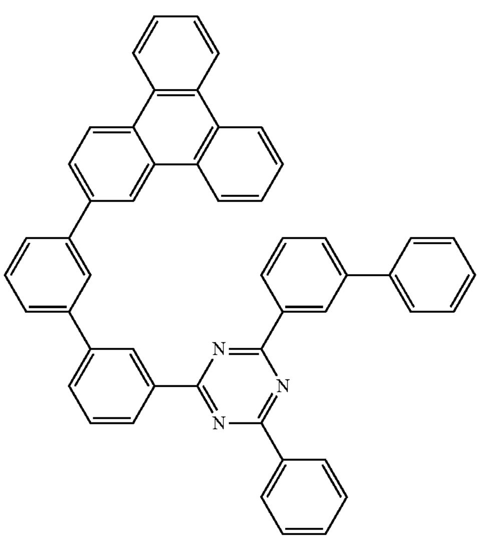
-continued
H-E41
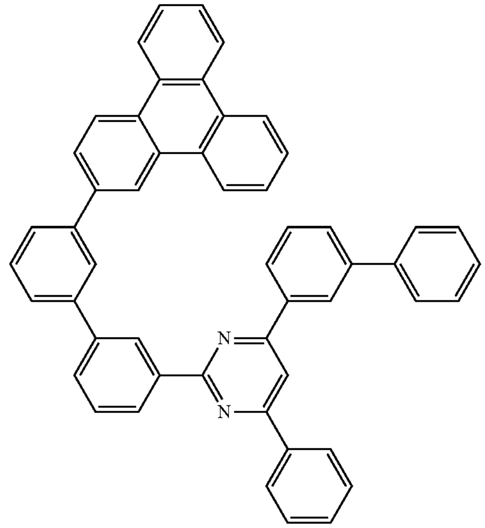
H-E42
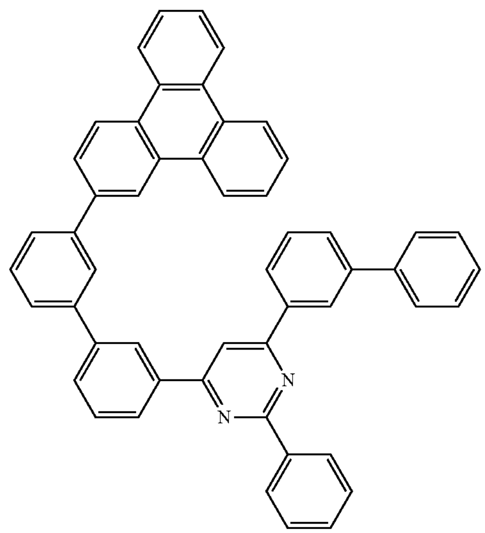
H-E43
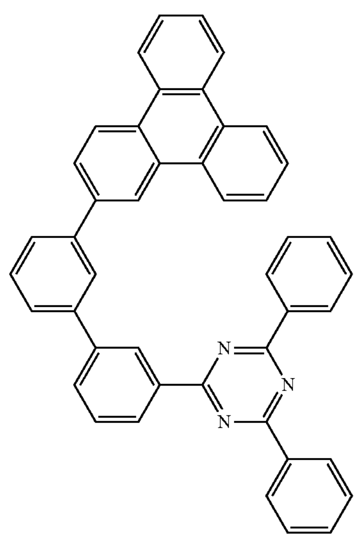

-continued
H-E44
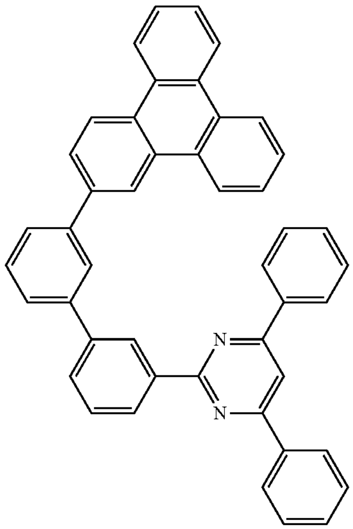
H-E45
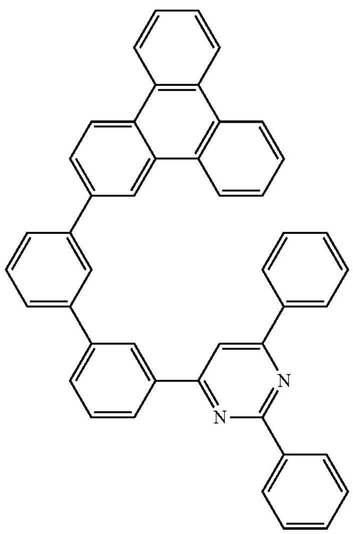
H-E46
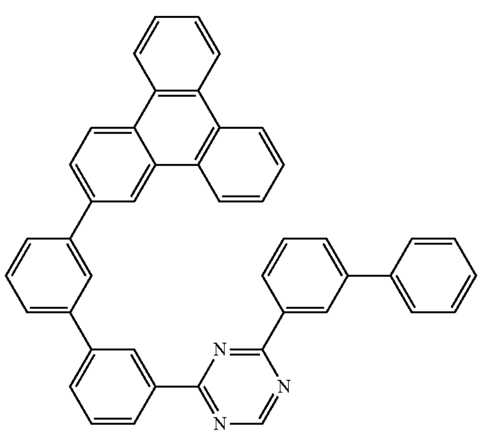
-continued
H-E47
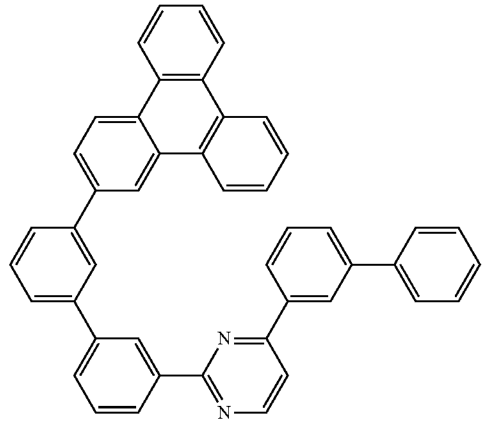
H-E48
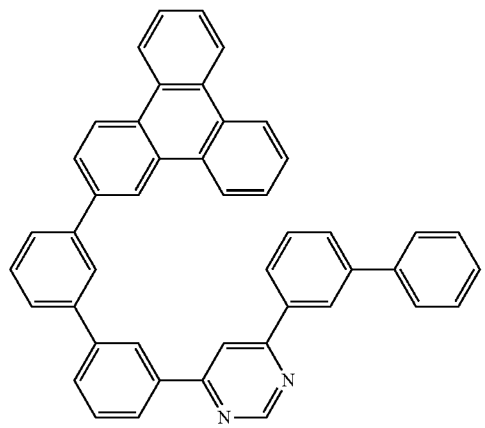
H-E49
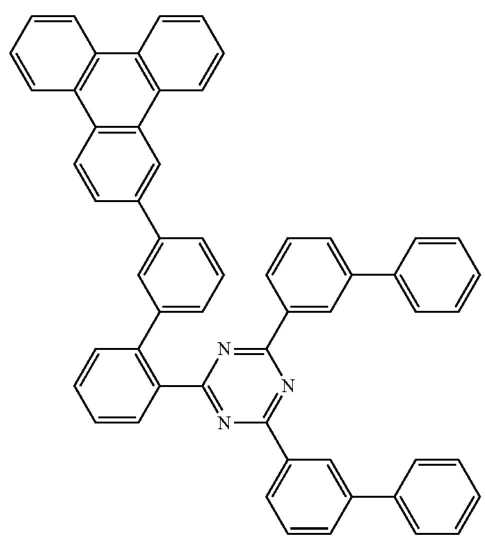

H-E50
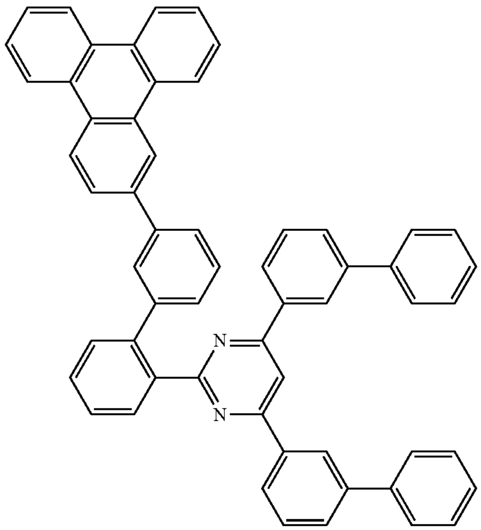
H-E51
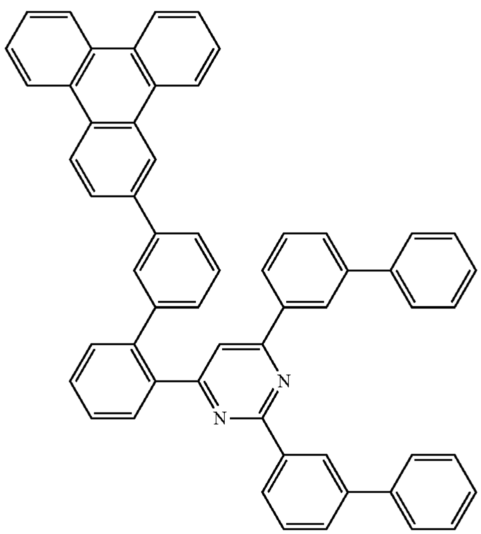
H-E52
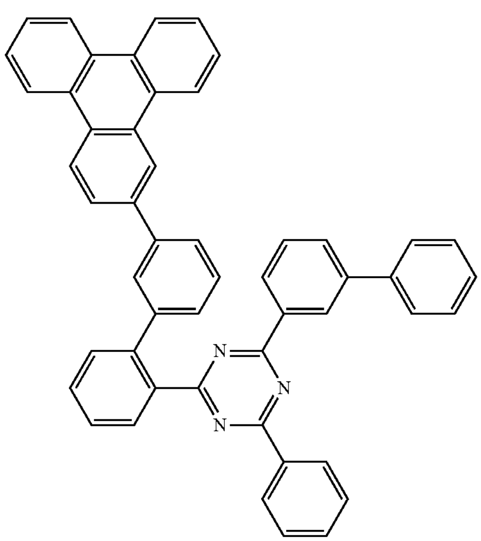
H-E53
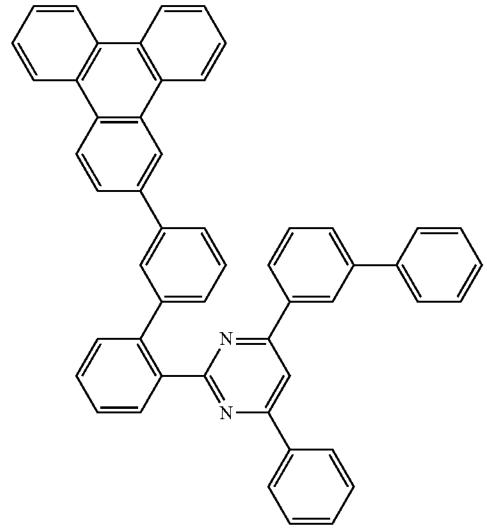
H-E54
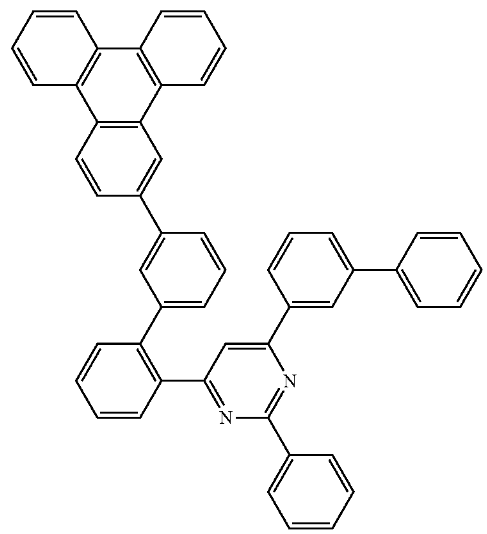
H-E55
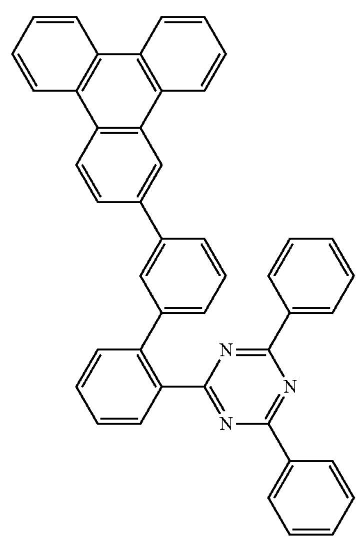

-continued
H-E56
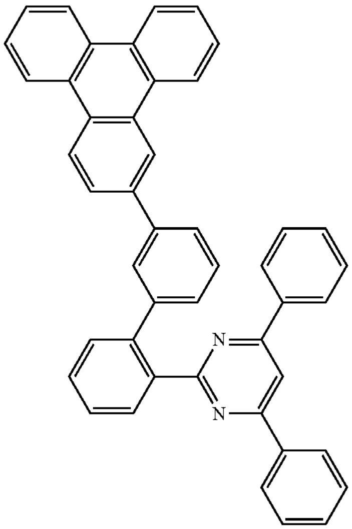
H-E57
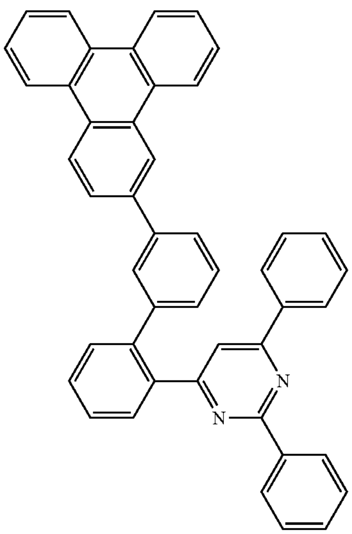
H-E58
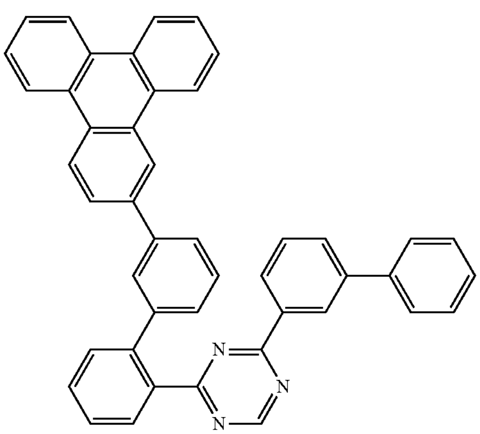
-continued
H-E59
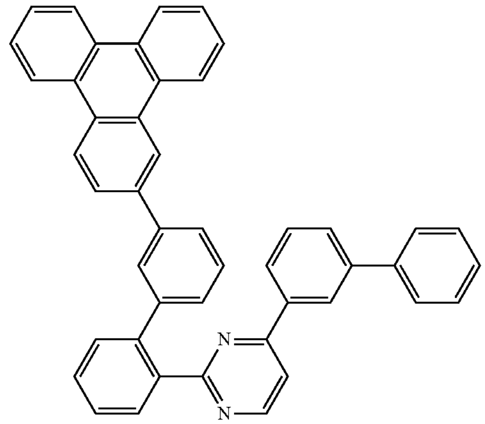
H-E60
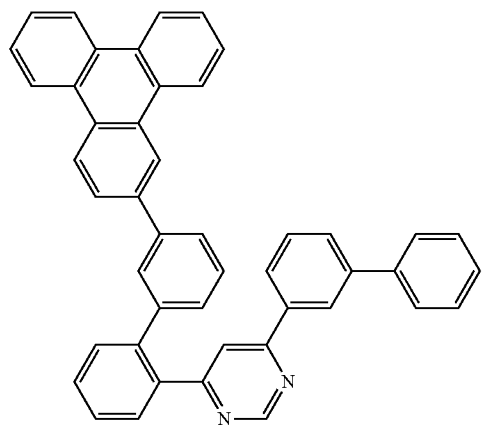
H-E61
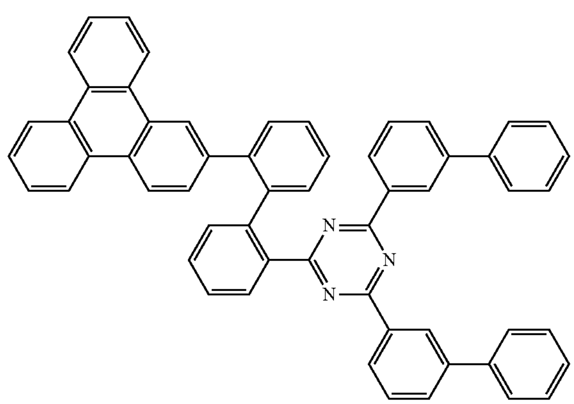

-continued
H-E62
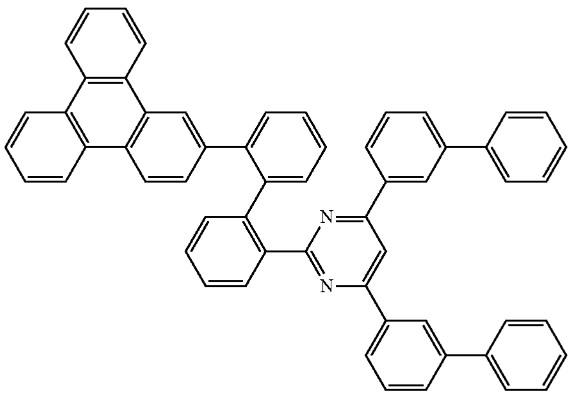
H-E63
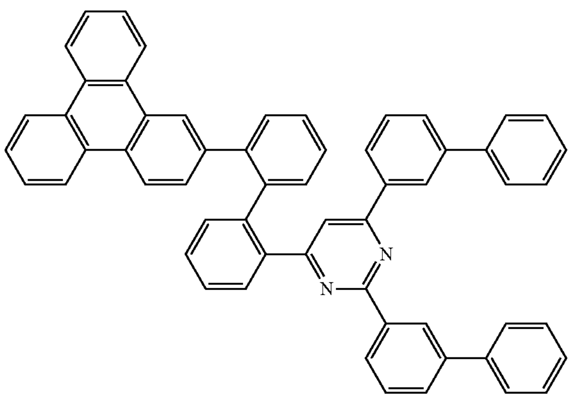
H-E64
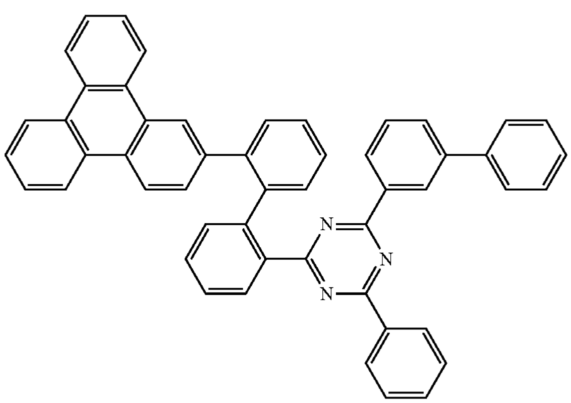
H-E65
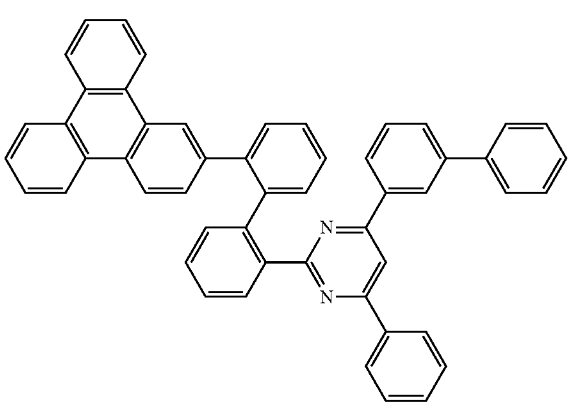
-continued
H-E66
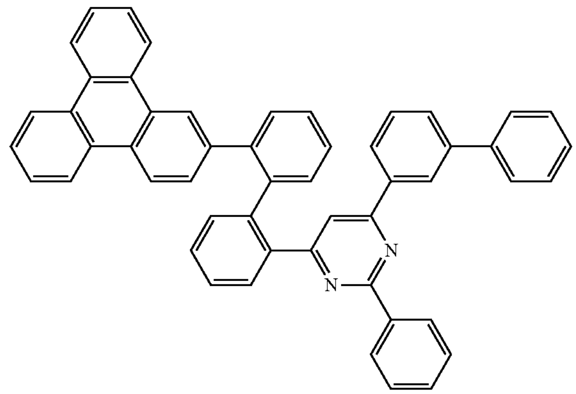
H-E67
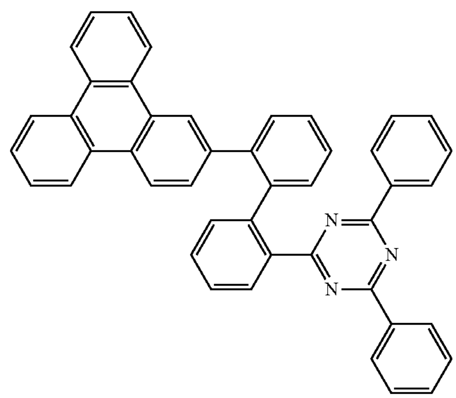
H-E68
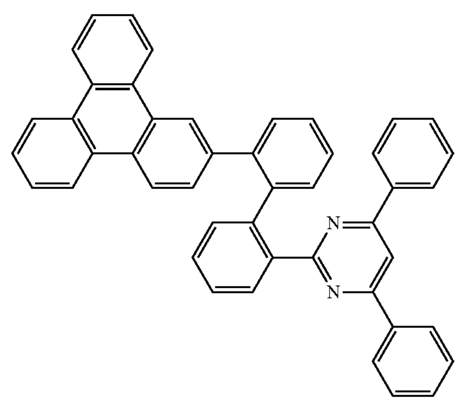
H-E69
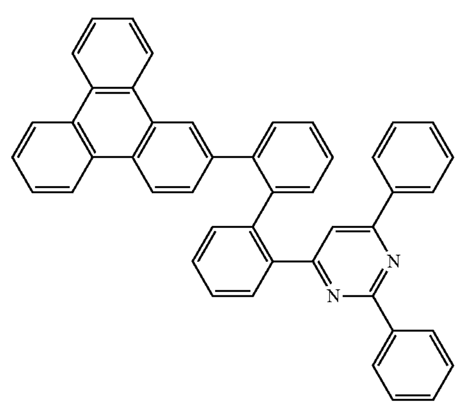

-continued
H-E70
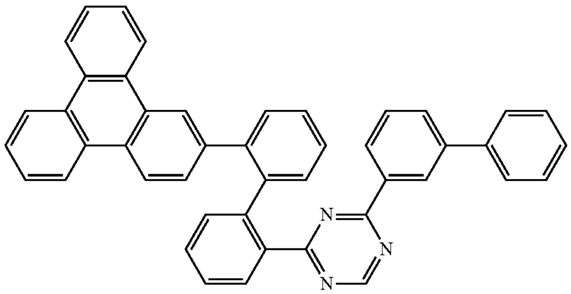
H-E71
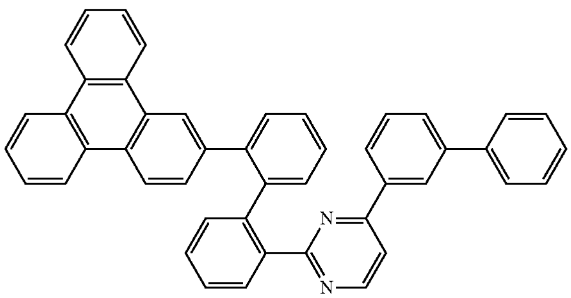
H-E72
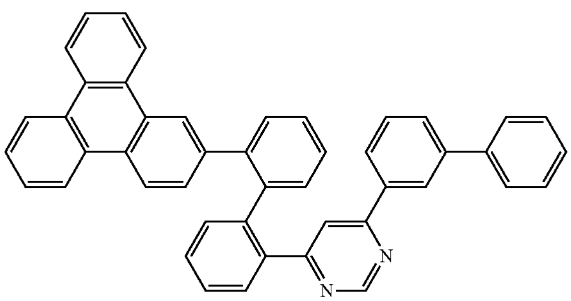
H-E73
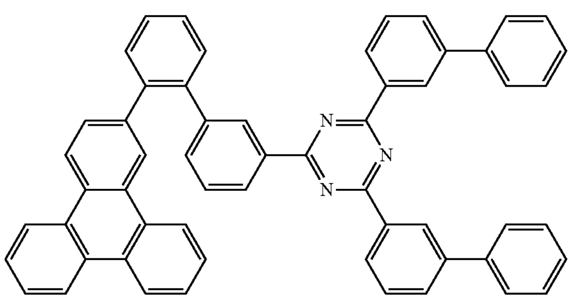
H-E74
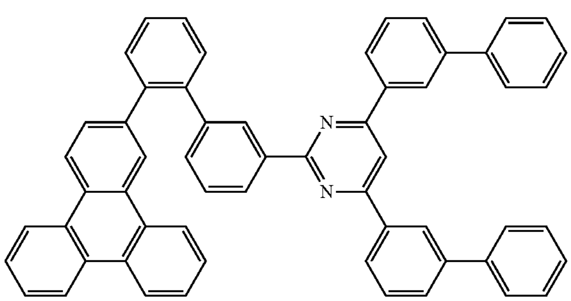
-continued
H-E75
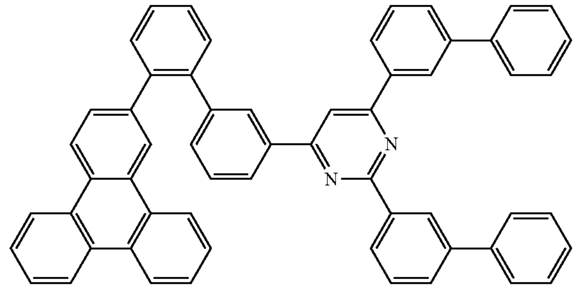
H-E76
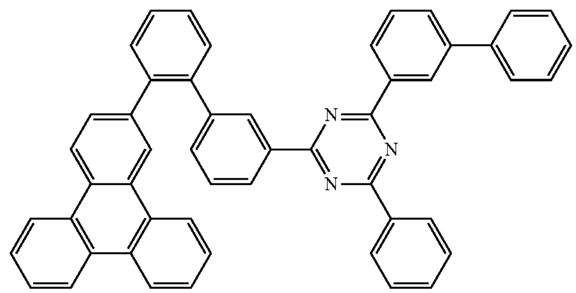
H-E77
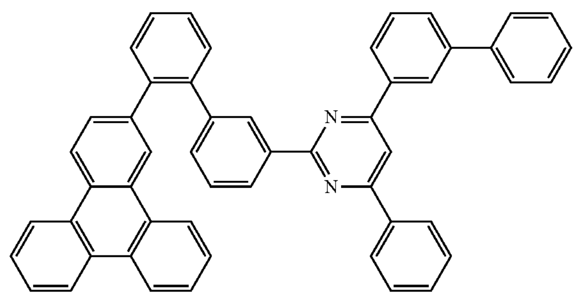
H-E78
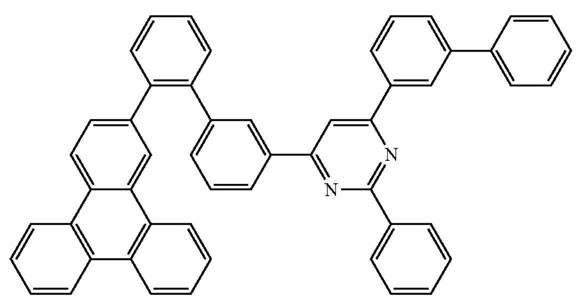
H-E79
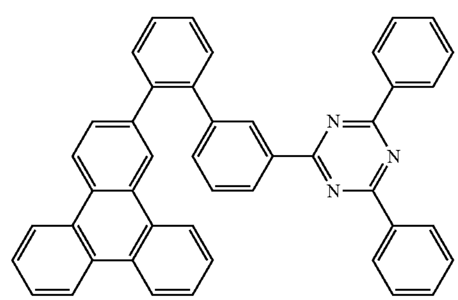

-continued
H-E80
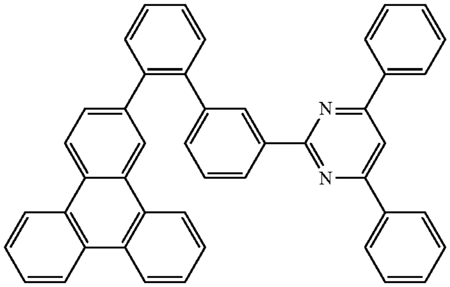
H-E81
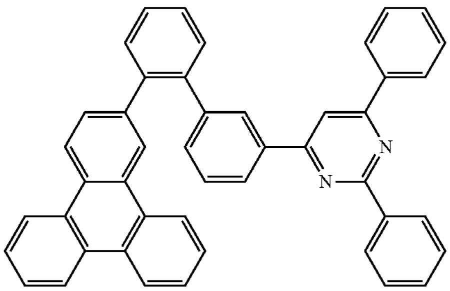
H-E82
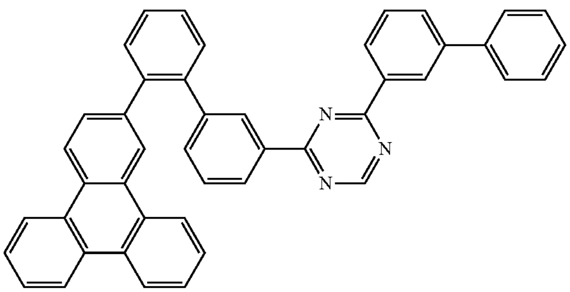
H-E83
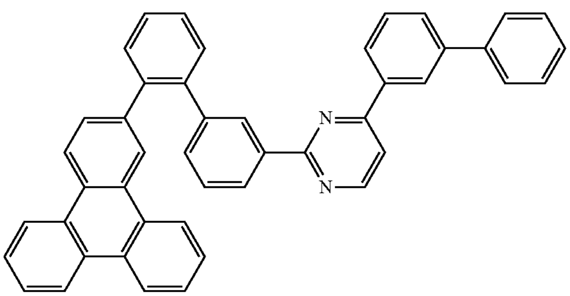
H-E84
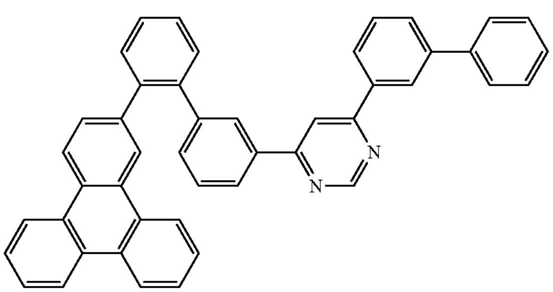
In some embodiments, the hole transporting host may be at least one of Compounds H-H1 to H-H103:
H-H1
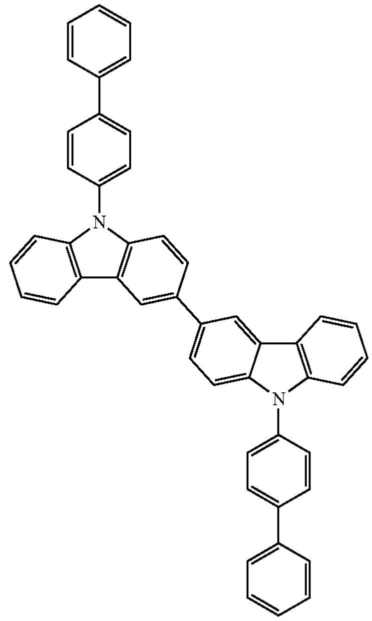
H-H2
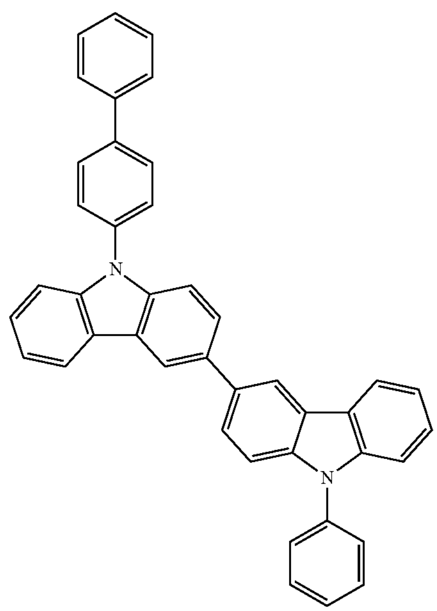

-continued
H-H3
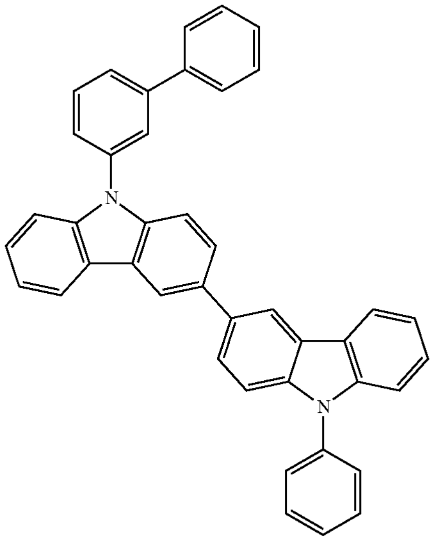
H-H4
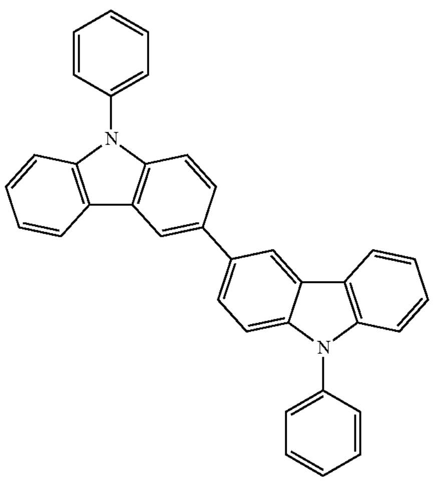
H-H5
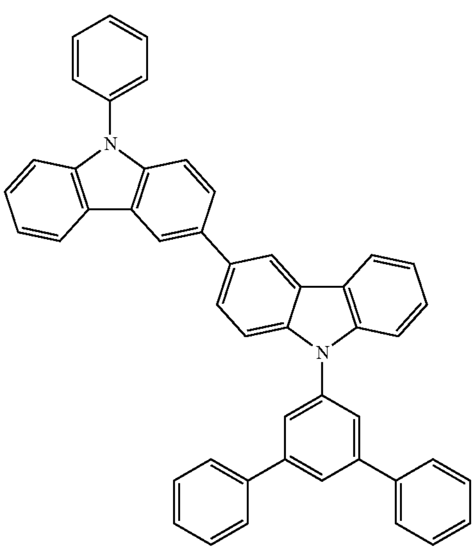
-continued
H-H6
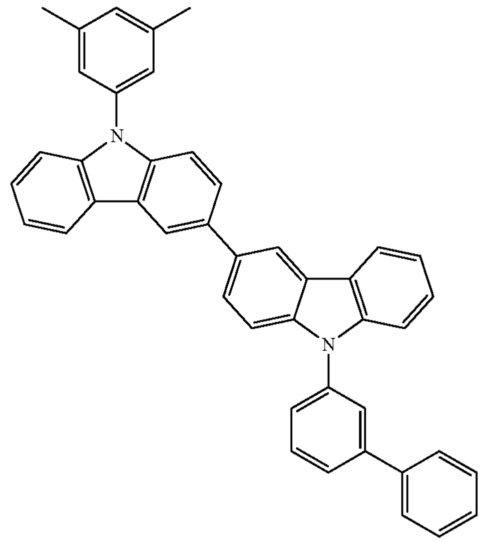
H-H7
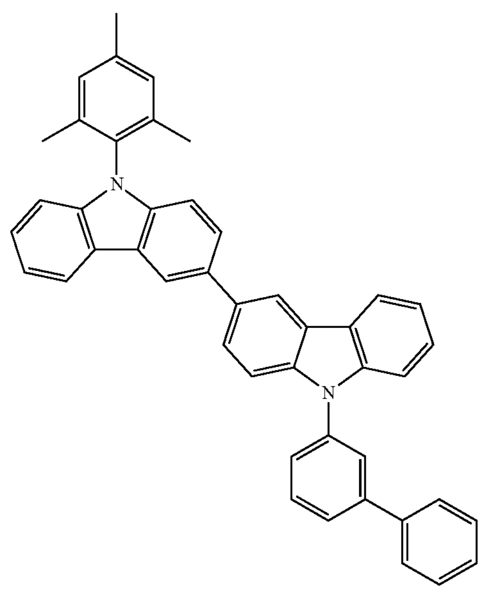

-continued
H-H8
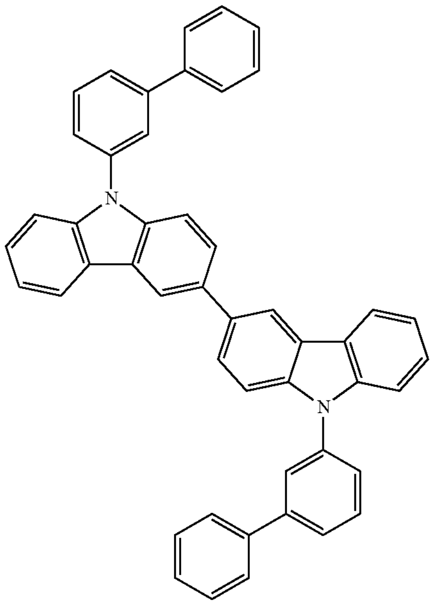
H-H9
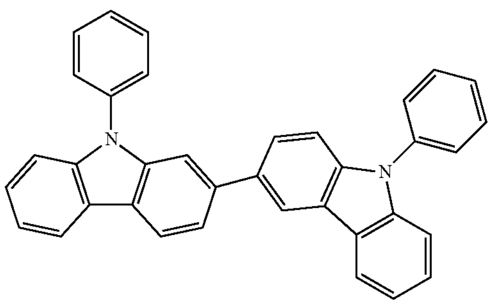
H-H10
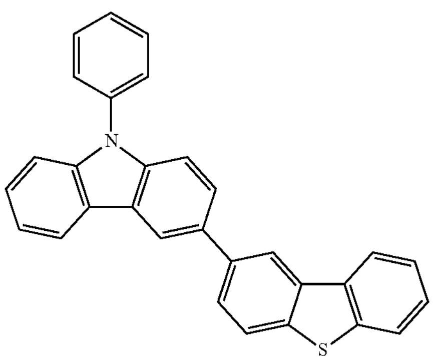
H-H11
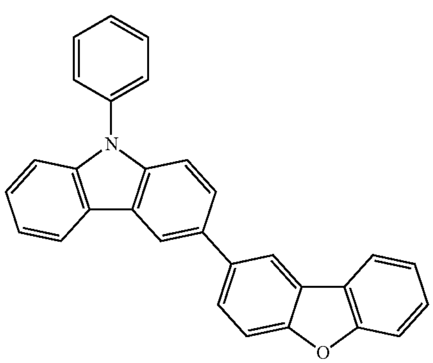
-continued
H-H12
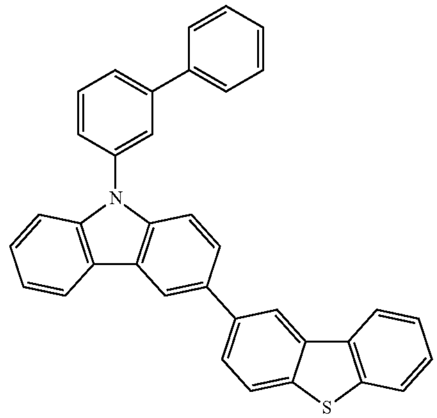
H-H13
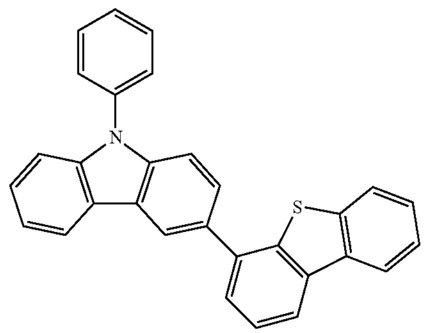
H-H14
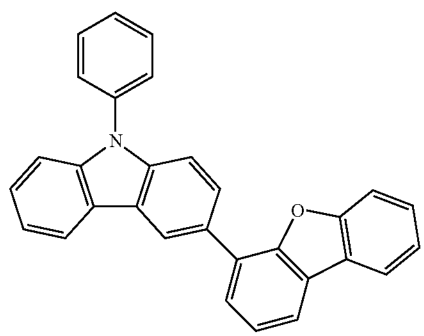
H-H15
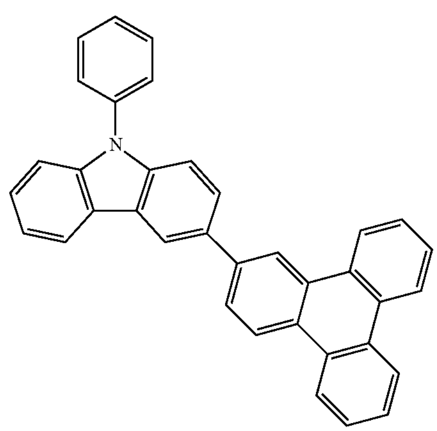

-continued
H-H16
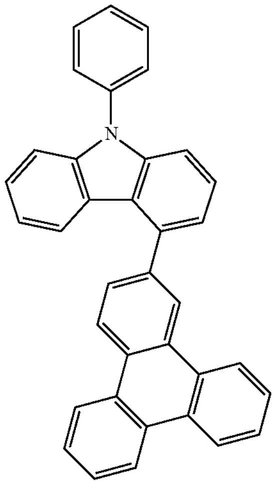
H-H17
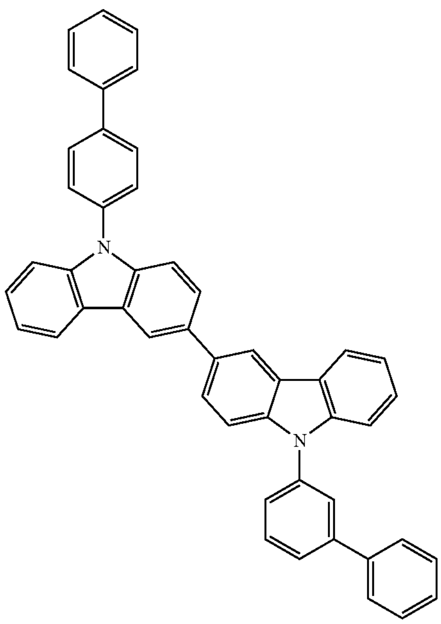
H-H18
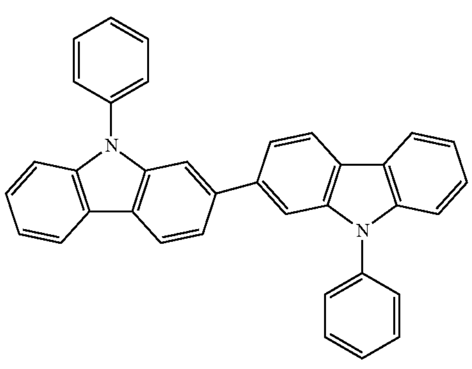
-continued
H-H19
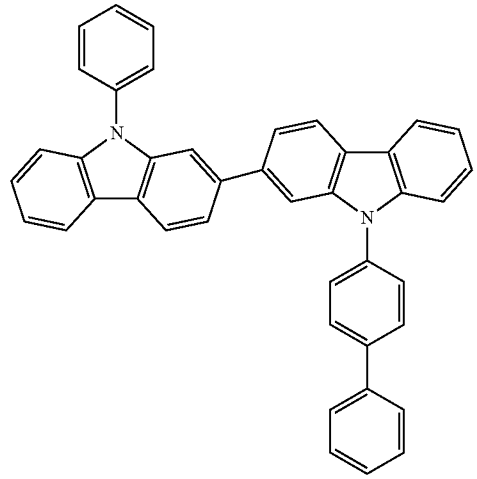
H-H20
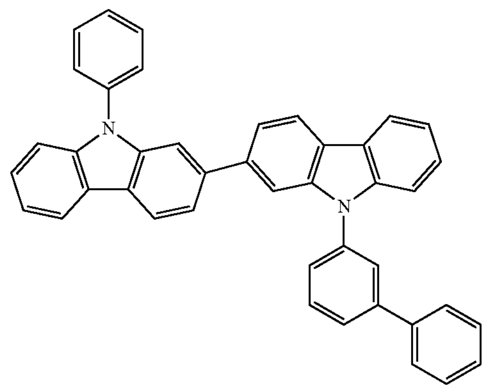
H-H21
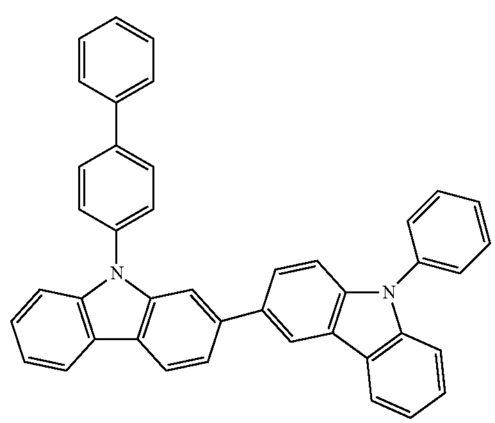

-continued
H-H22
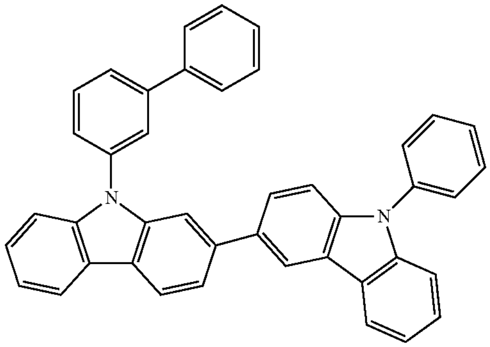
H-H23
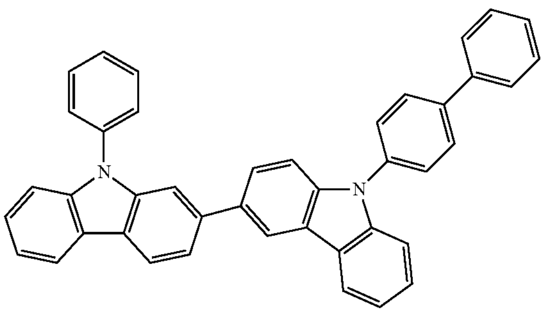
H-H24
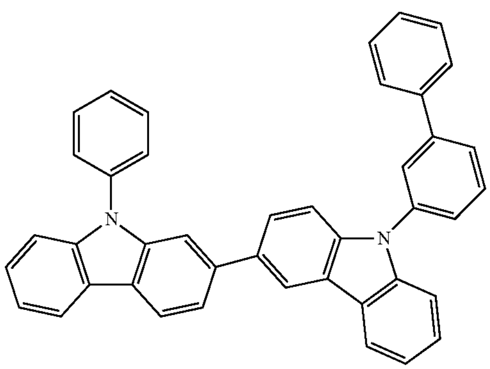
H-H25
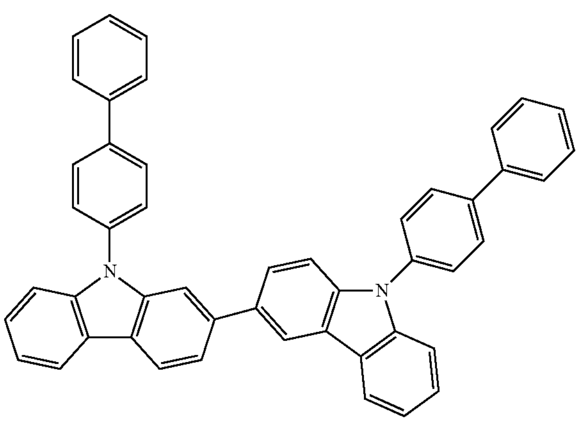
-continued
H-H26
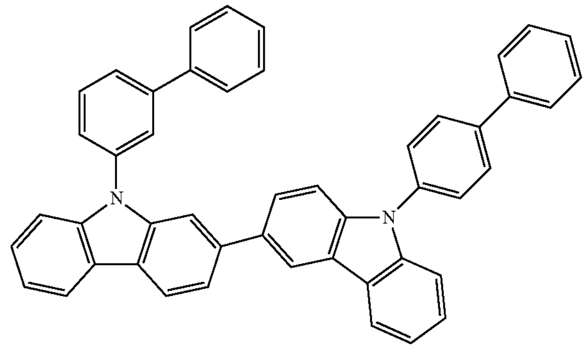
H-H27
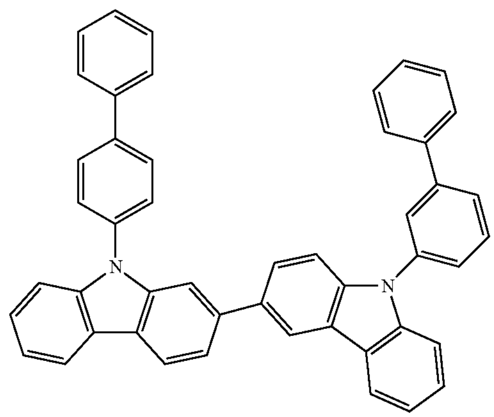
H-H28
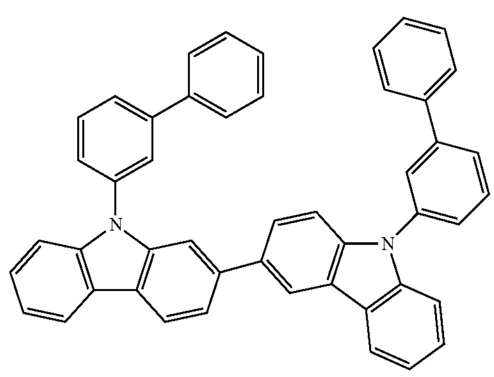

H-H29
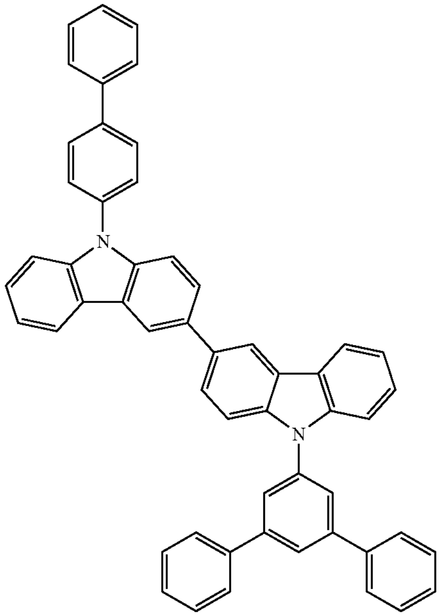
H-H30
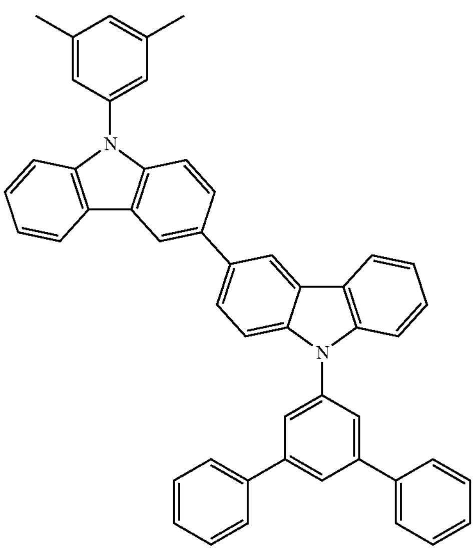
H-H31
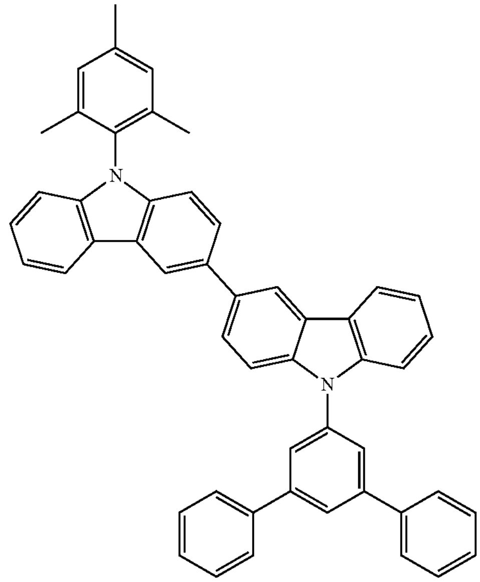
H-H32
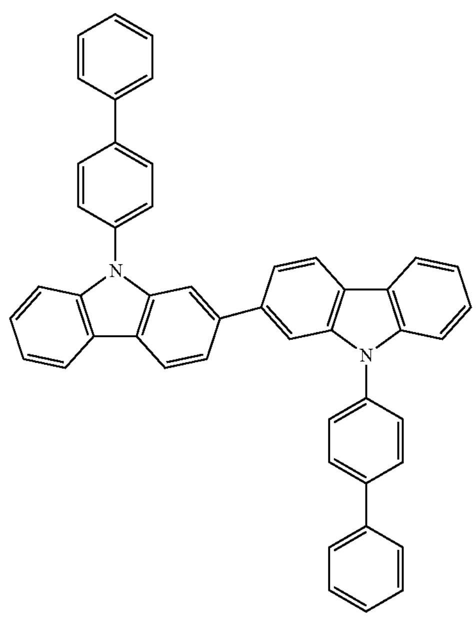

-continued
H-H33
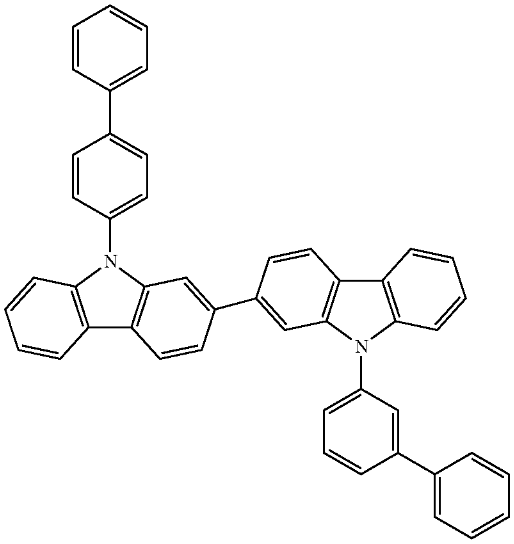
H-H34
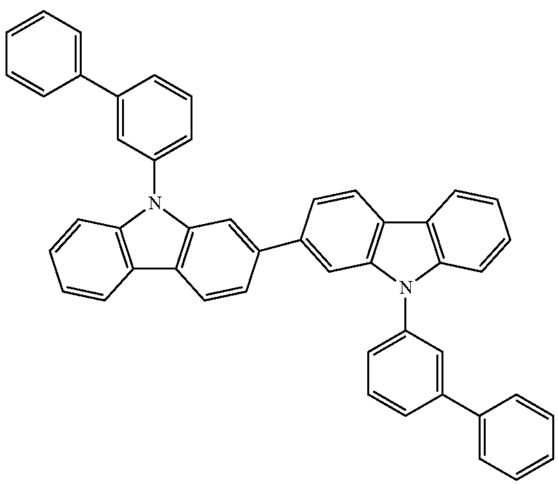
H-H35
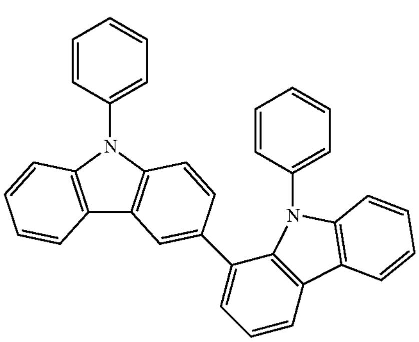
-continued
H-H36
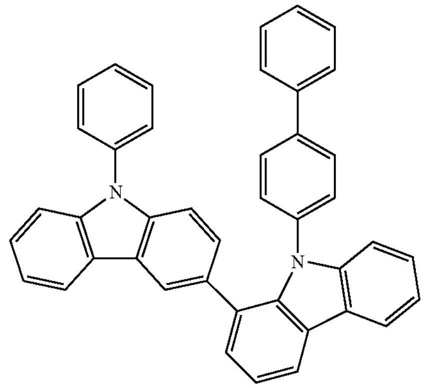
H-H37
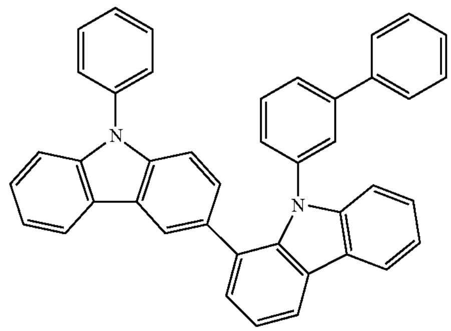
H-H38
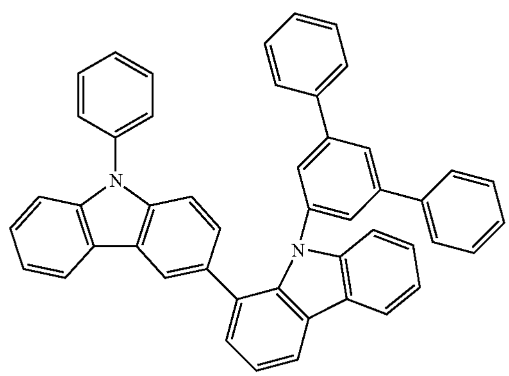
H-H39
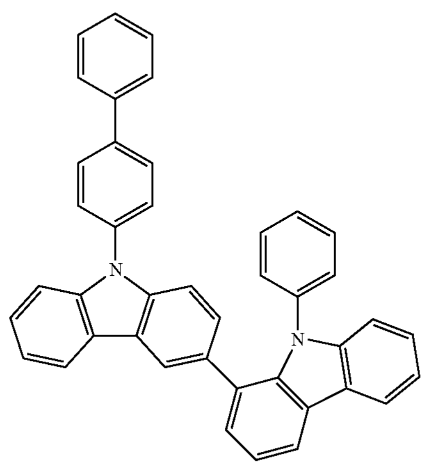

-continued
H-H40
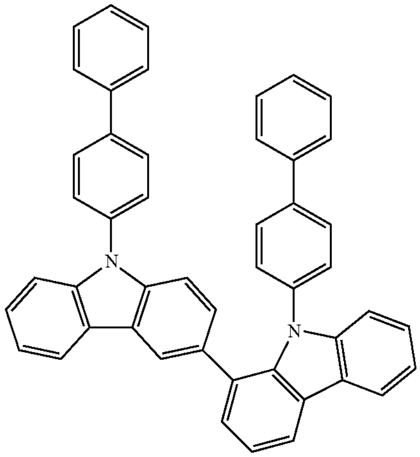
H-H41
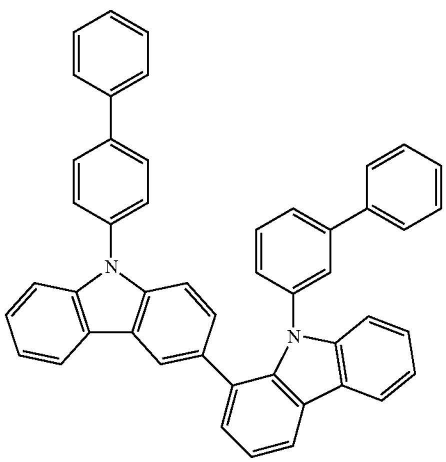
H-H42
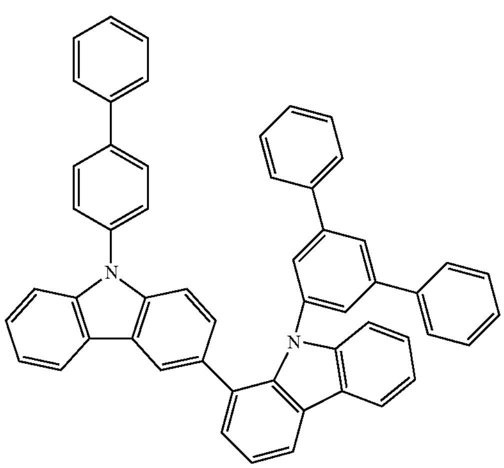
-continued
H-H43
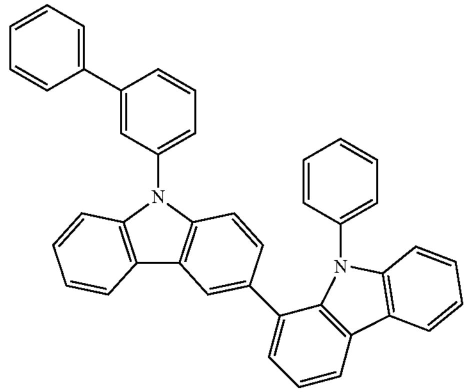
H-H44
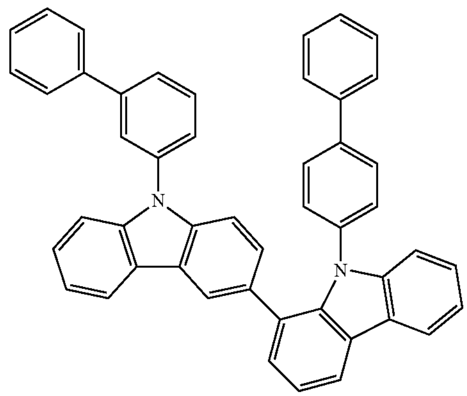
H-H45
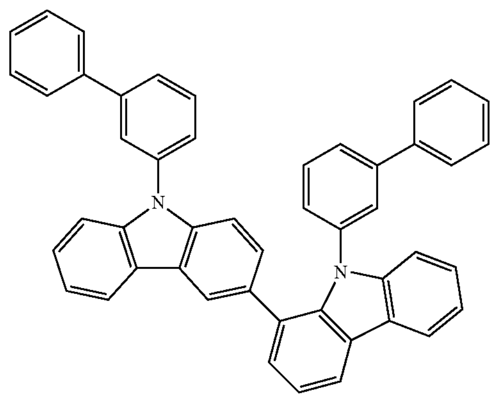
H-H46
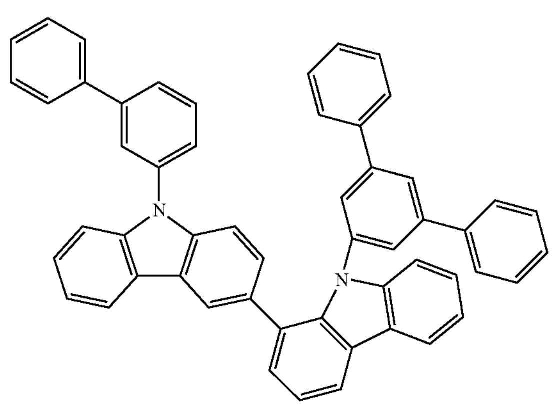

-continued
H-H47
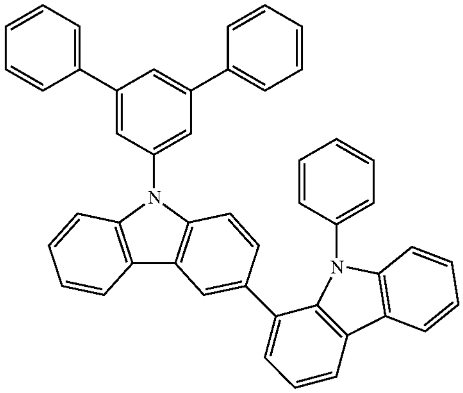
H-H48
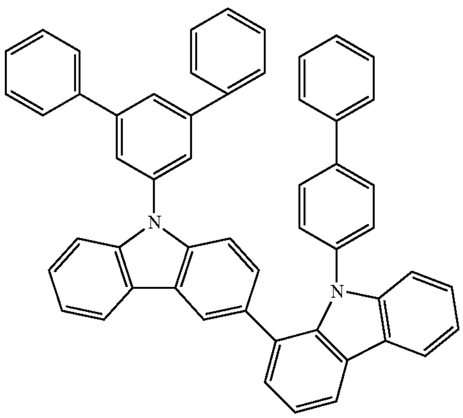
H-H49
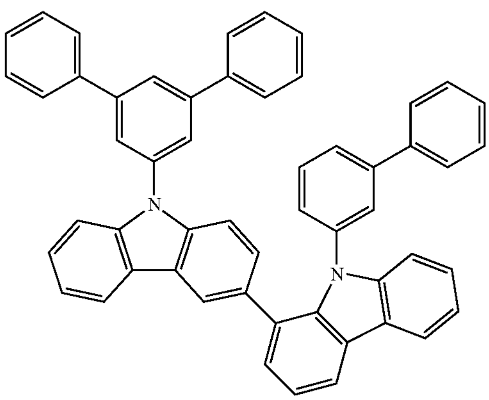
H-H50
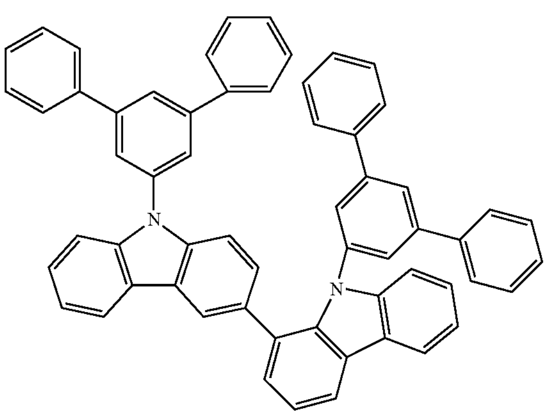
-continued
H-H51
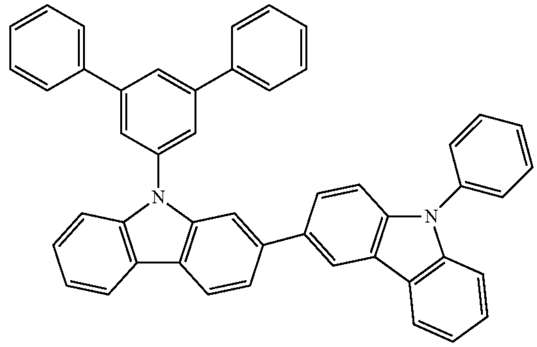
H-H52
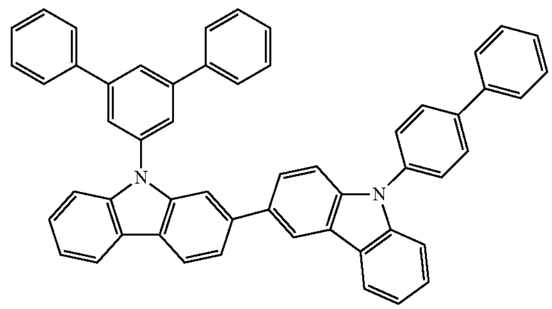
H-H53
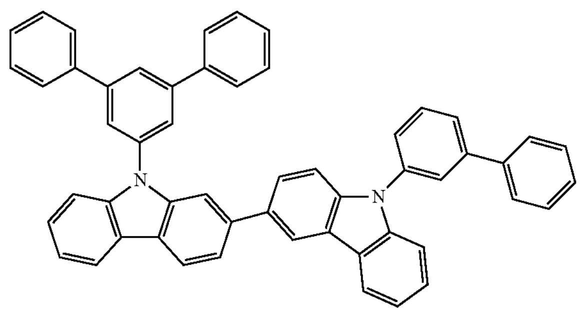
H-H54
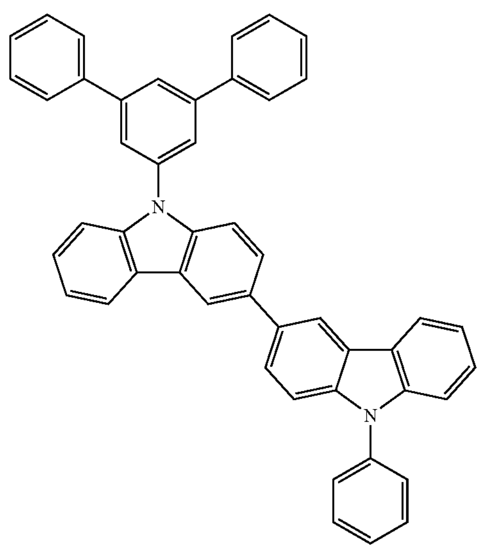

-continued
H-H55
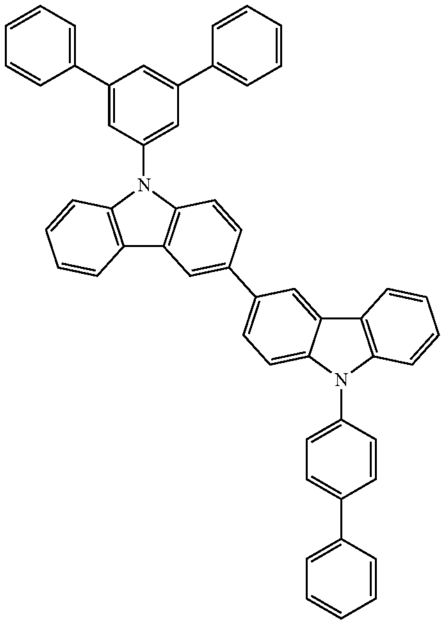
H-H56
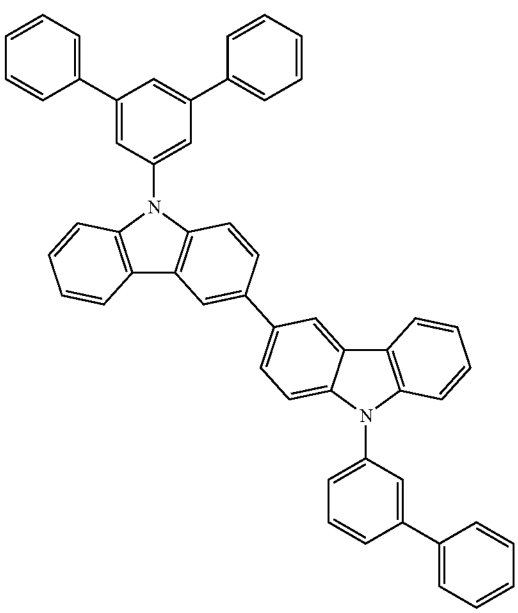
-continued
H-H57
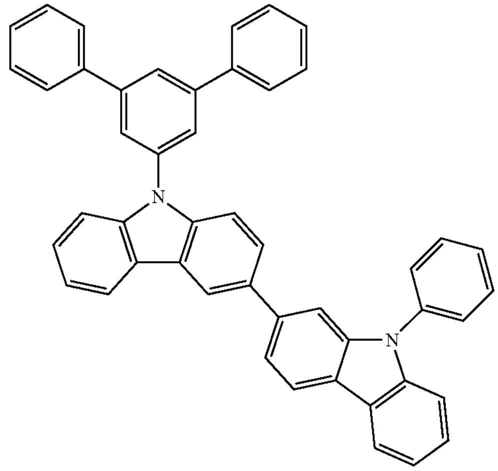
H-H58
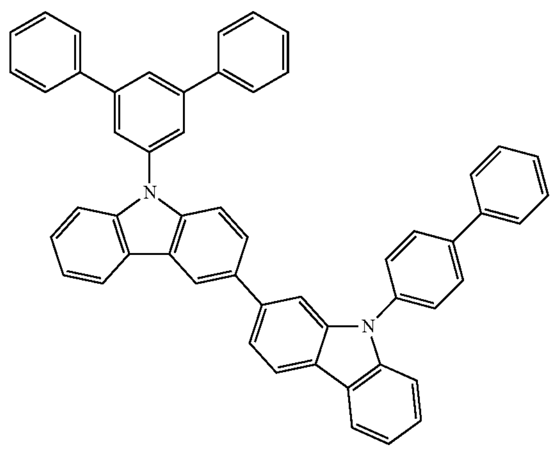
H-H59
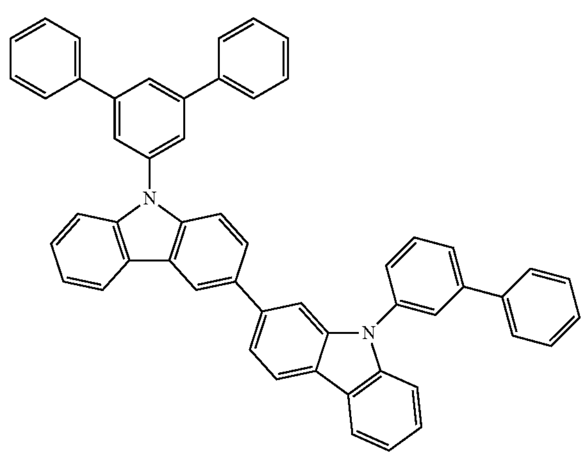

-continued
H-H60
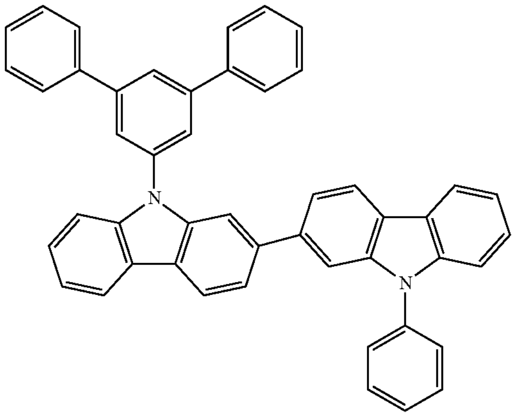
H-H61
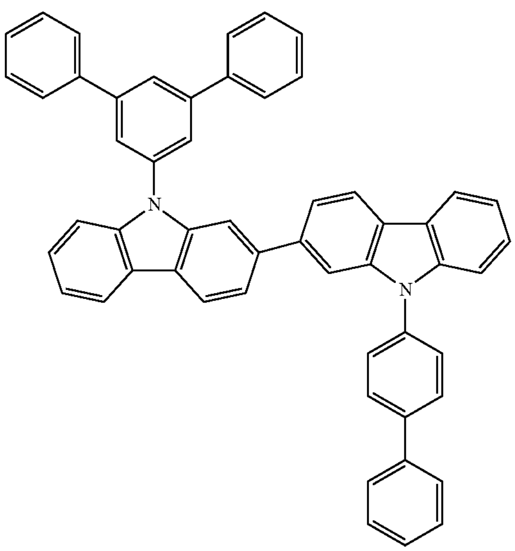
H-H62
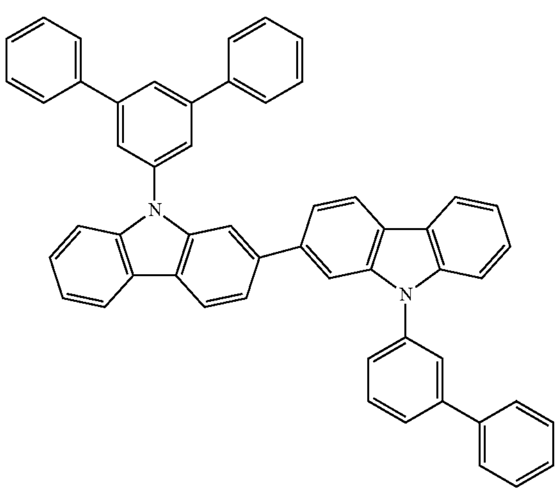
-continued
H-H63
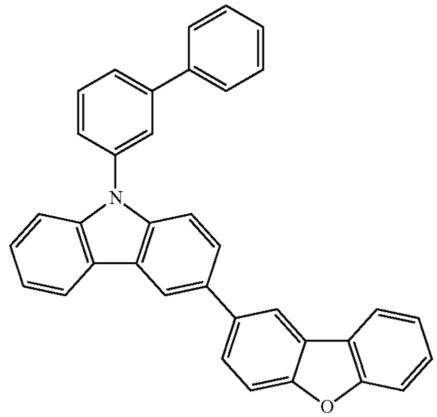
H-H64
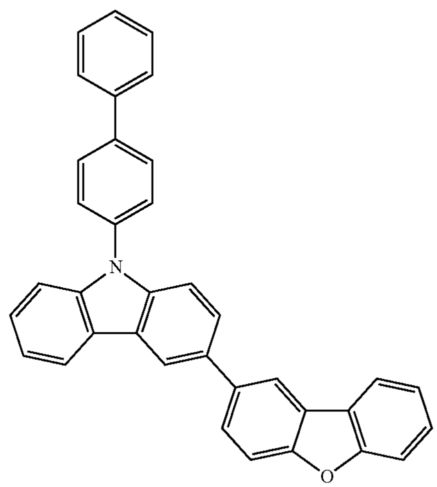
H-H65
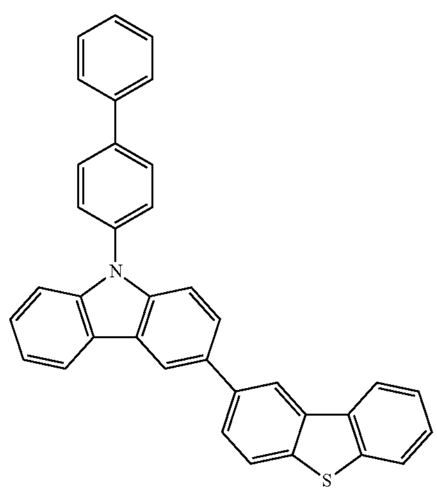

-continued
H-H66
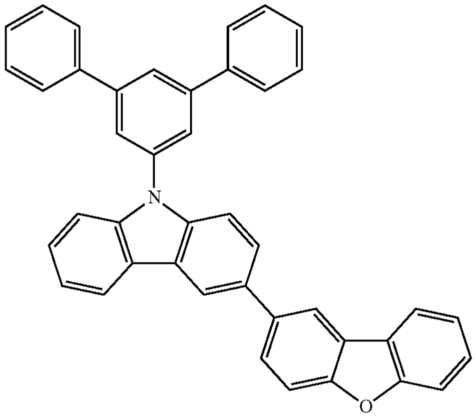
H-H67
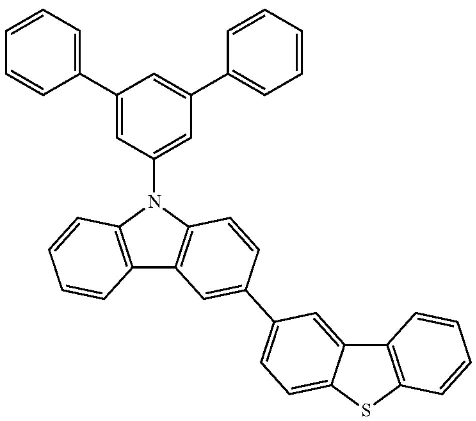
H-H68
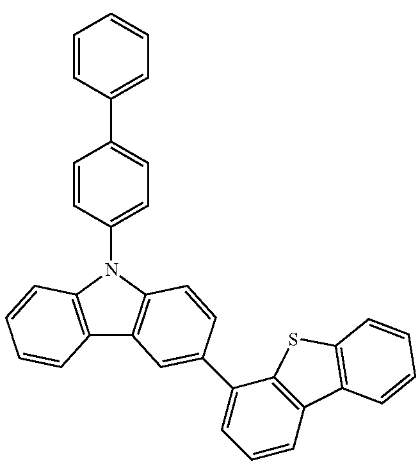
-continued
H-H69
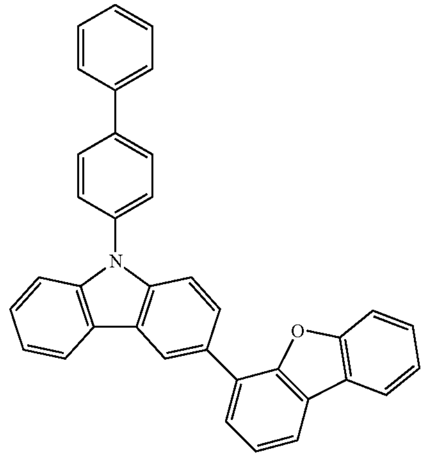
H-H70
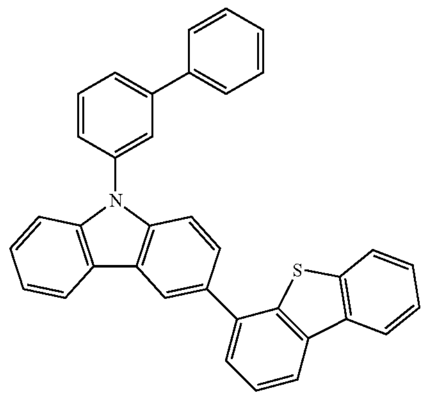
H-H71
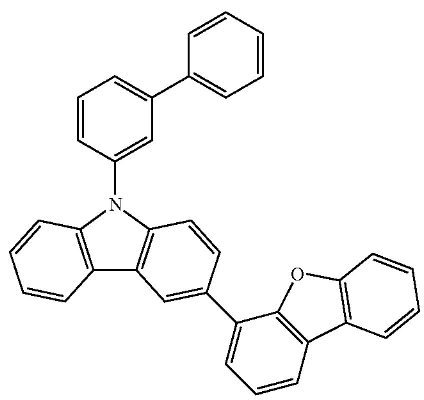
H-H72
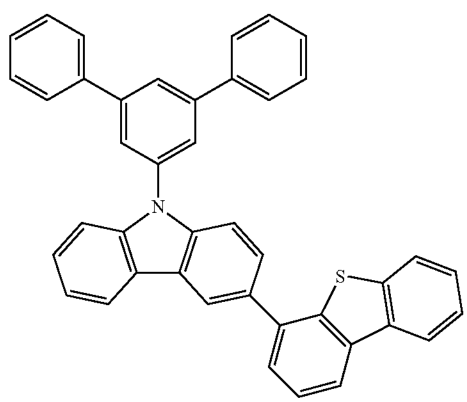

H-H73
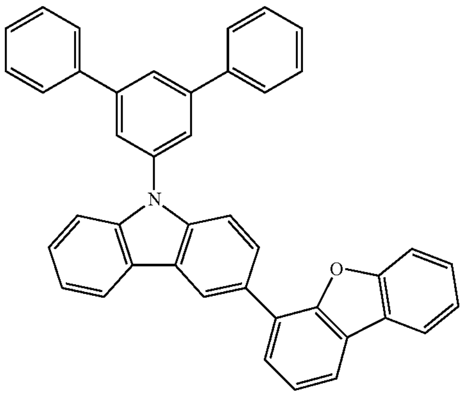
H-H74
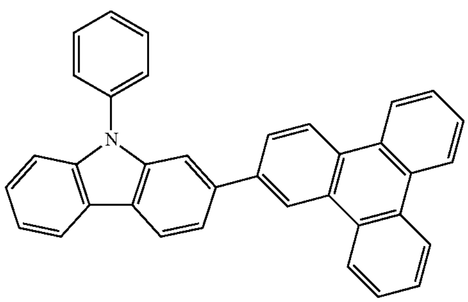
H-H75
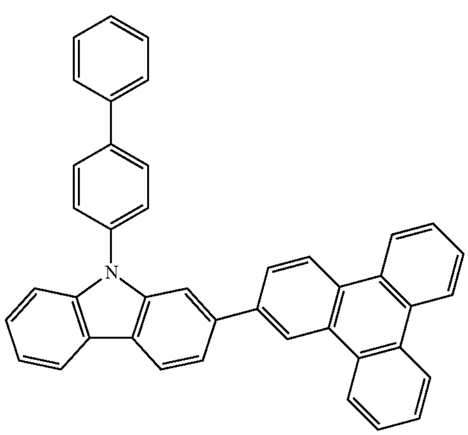
H-H76
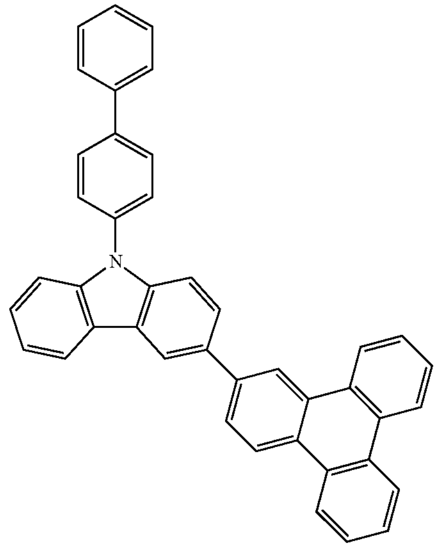
H-H77
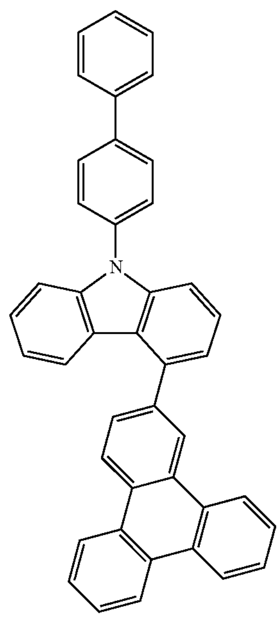
H-H78
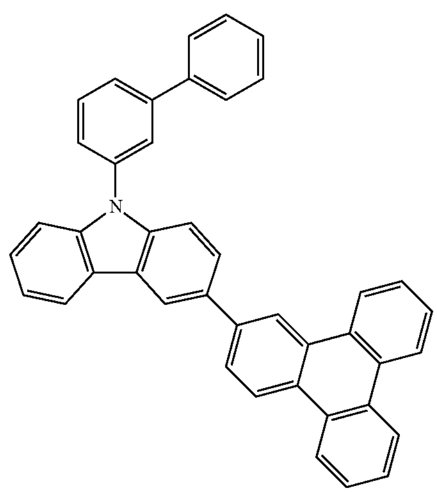

-continued
H-H79
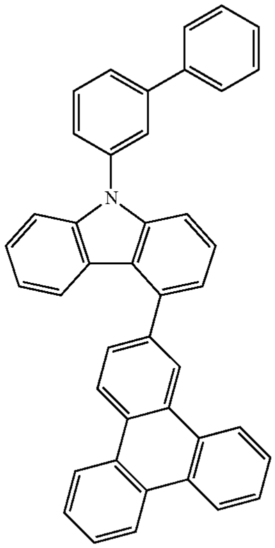
H-H80
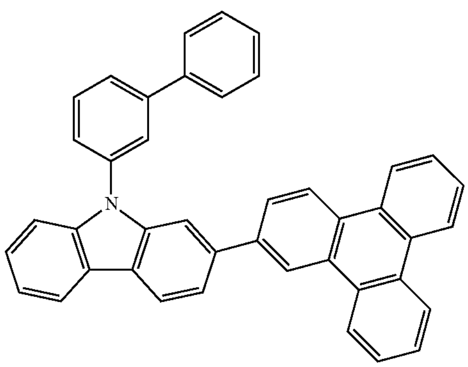
H-H81
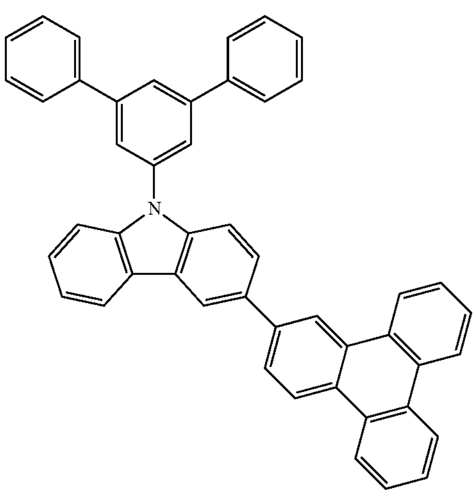
-continued
H-H82
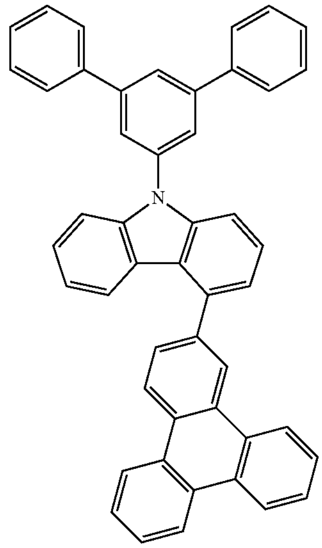
H-H83
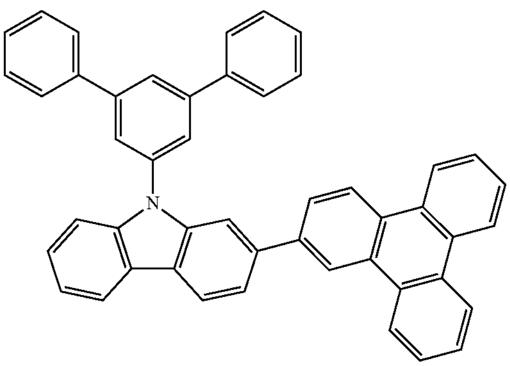
H-H84
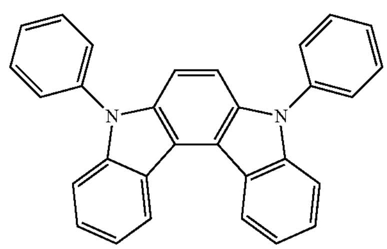
H-H85
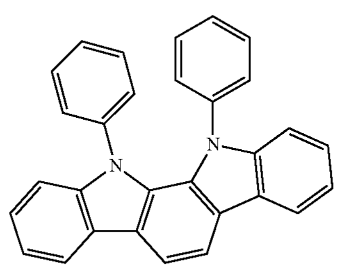

-continued
H-H86
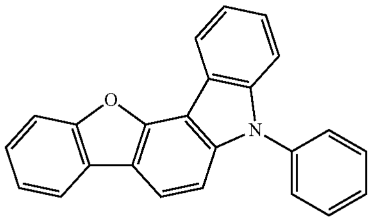
H-H87
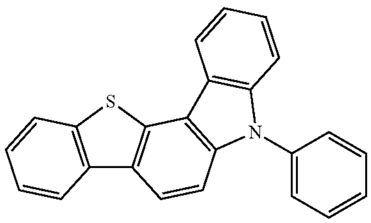
H-H88
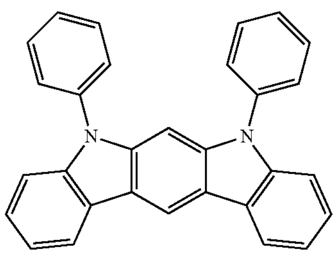
H-H89
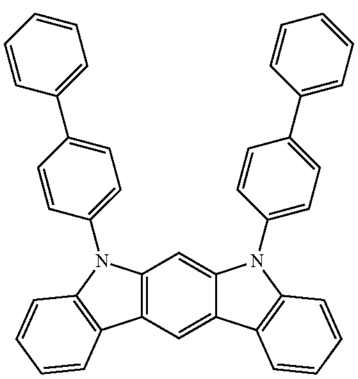
H-H90
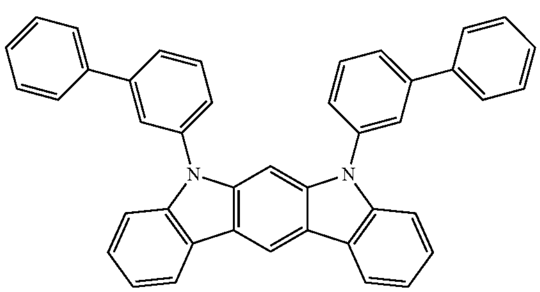
-continued
H-H91
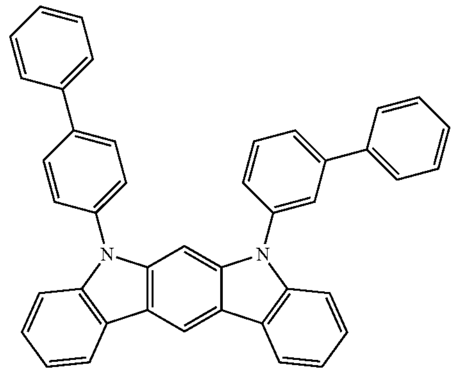
H-H92
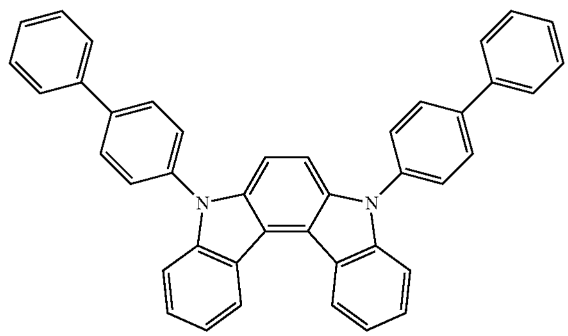
H-H93
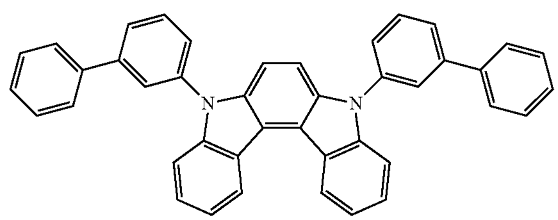
H-H94
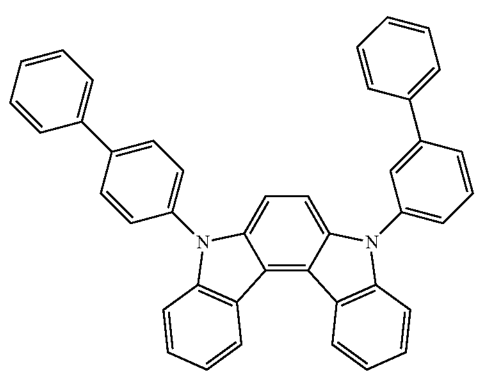

-continued

H-H95

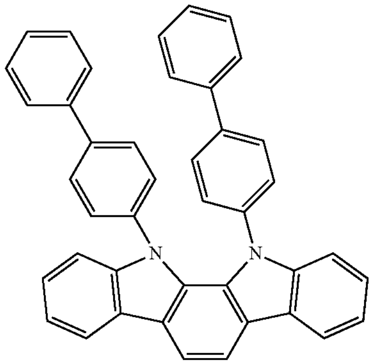

H-H96

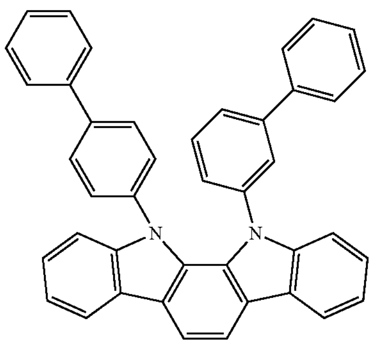

H-H97

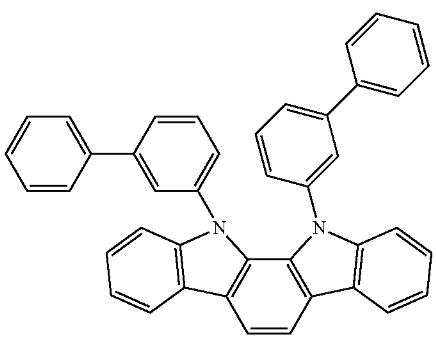

H-H98

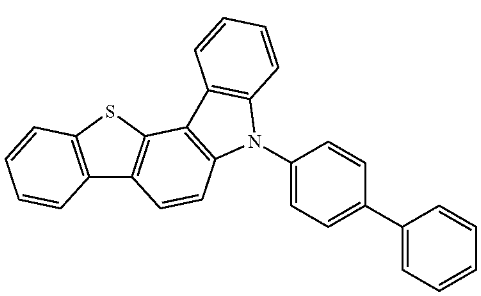

H-H99

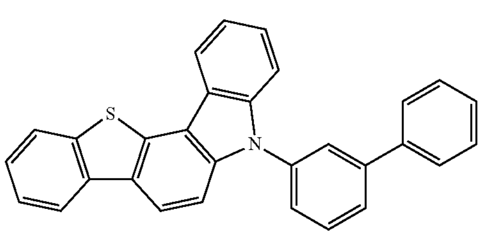

-continued

H-H100

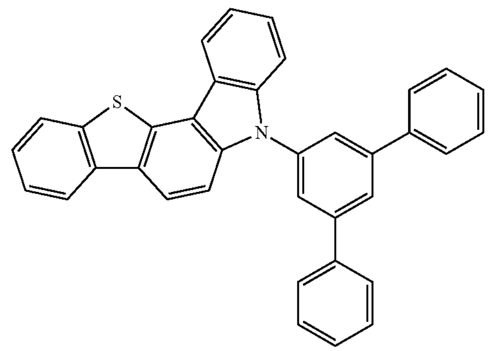

H-H101

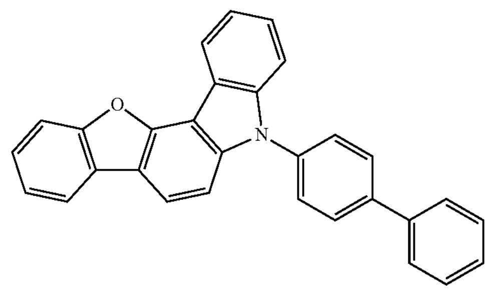

H-H102

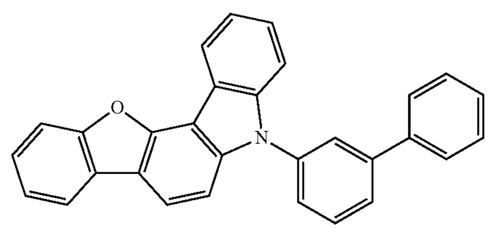

H-H103

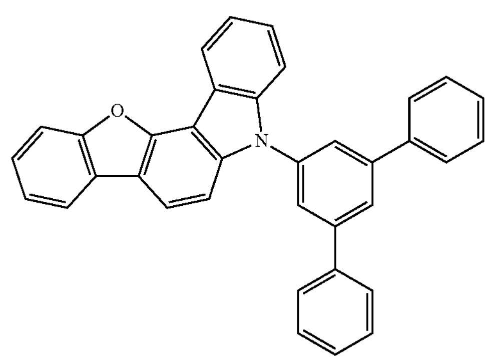

In some embodiments, the host may include an electron transporting host and a hole transporting host, the electron transporting host may include a triphenylene group and a triazine group, and the hole transporting host may include a carbazole group.

A weight ratio of the electron transporting host to the hole transporting host may be in a range of about 1:9 to about 9:1, for example, about 2:8 to about 8:2, or for example, about 4:6 to about 6:4. When a weight ratio of the electron transporting host to the hole transporting host is within any of these ranges, holes and electrons transport balance into the emission layer may be achieved.

When the organic light-emitting device 10 is a full-color organic light-emitting device, the emission layer may be patterned into a red emission layer, a green emission layer, and/or a blue emission layer. In some embodiments, the emission layer may have a structure in which the red emission layer, the green emission layer, and/or the blue emission layer are layered to emit white light. In some embodiments, the structure of the emission layer may vary.

When the emission layer includes the host and the dopant, an amount of the dopant may be selected from a range of about 0.01 parts to about 15 parts by weight based on about 100 parts by weight of the host.

The thickness of the emission layer may be in a range of about 100 Å to about 1,000 Å, and in some embodiments, about 200 Å to about 600 Å. When the thickness of the emission layer is within any of these ranges, improved luminescence characteristics may be obtained without a substantial increase in driving voltage.

Electron Transport Region in Emission Layer

Next, an electron transport region may be formed on the emission layer.

The electron transport region may include a hole blocking layer, an electron transport layer, an electron injection layer, or a combination thereof.

In some embodiments, the electron transport region may have a hole blocking layer/an electron transport layer/an electron injection layer structure or an electron transport layer/an electron injection layer structure. The electron transport layer may have a single-layered structure or a multi-layered structure including two or more different materials.

The conditions for forming a hole blocking layer, an electron transport layer, and an electron injection layer may be inferred based on the conditions for forming the hole injection layer.

When the electron transport region includes a hole blocking layer, the hole blocking layer may include, for example, at least one of BCP, Bphen, BAlq, or any combination thereof:

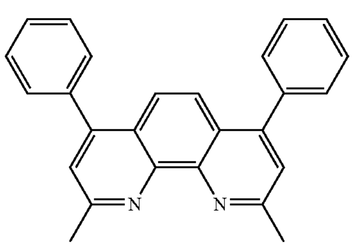
BCP

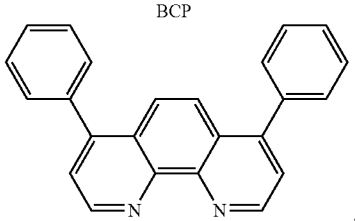
Bphen

In some embodiments, the hole blocking layer may include the host, the material for forming an electron transport layer described herein, the material for forming an electron injection layer described herein, or any combination thereof.

The thickness of the hole blocking layer may be in a range of about 20 Å to about 1,000 Å, for example, about 30 Å to about 600 Å. When the thickness of the hole blocking layer is within any of these ranges, excellent hole blocking characteristics may be obtained without a substantial increase in driving voltage.

The electron transport layer may include BCP, Bphen, TPBi, $Alq_3$, BAlq, TAZ, NTAZ, or any combination thereof:

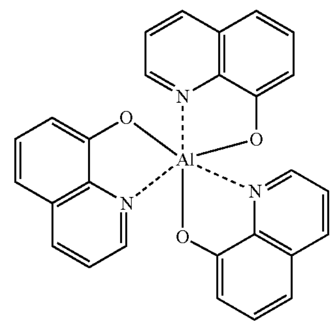
$Alq_3$

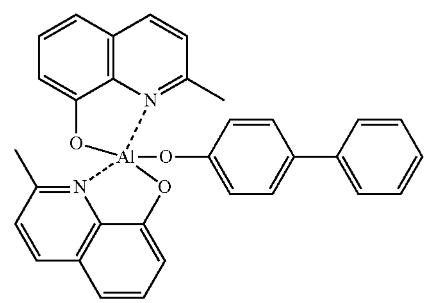
BAlq

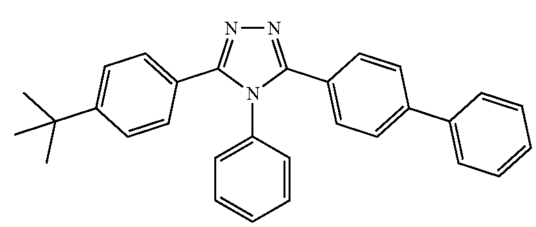
TAZ

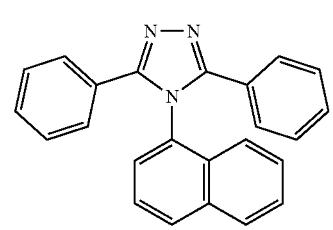
NTAZ

In some embodiments, the electron transport layer may include one of Compounds ET1 to ET25 or any combination thereof:

-continued
ET1
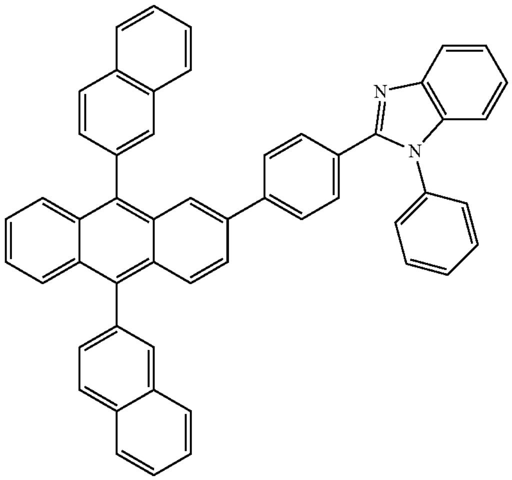
ET2
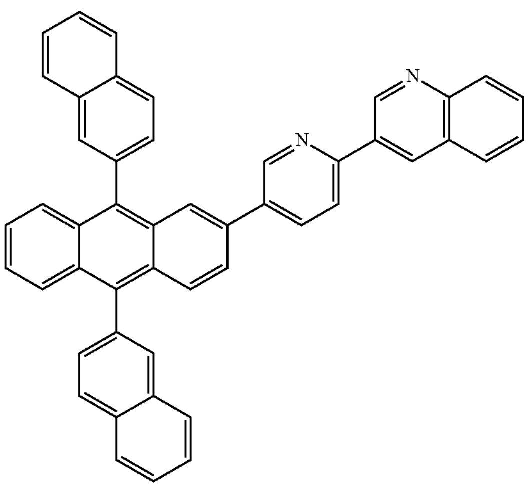
ET3
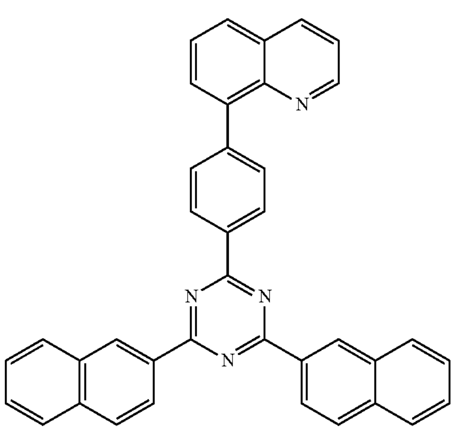
ET4
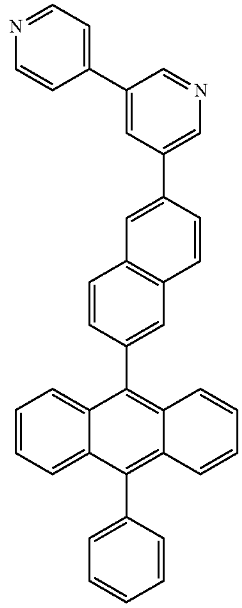
ET5
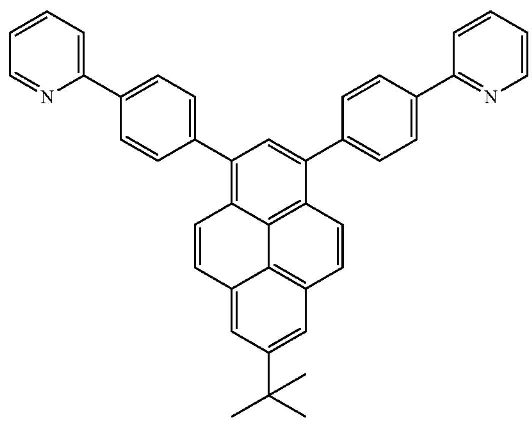
ET6
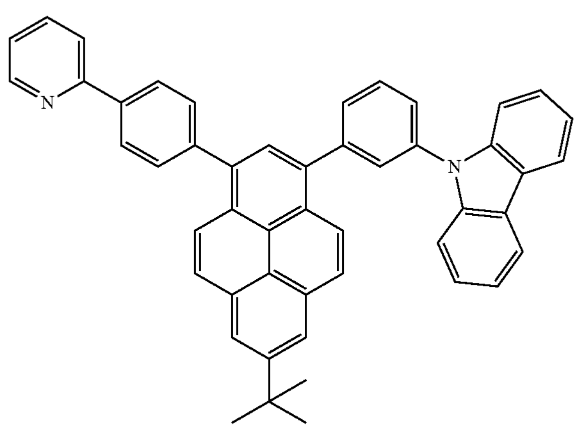

ET7
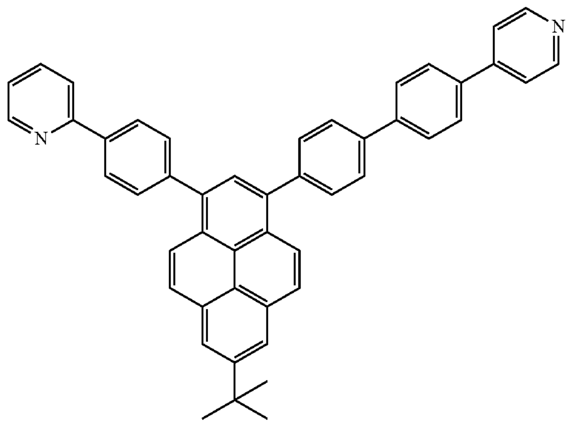
ET8
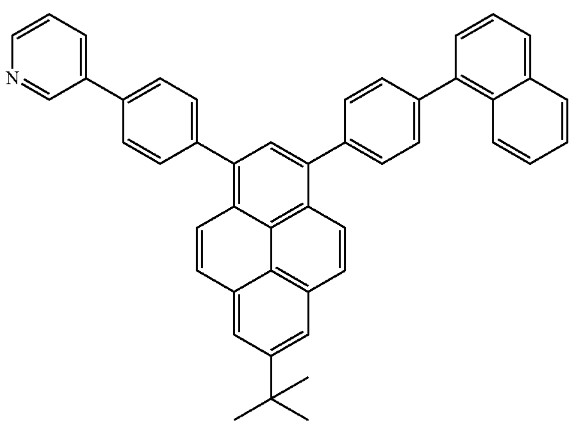
ET9
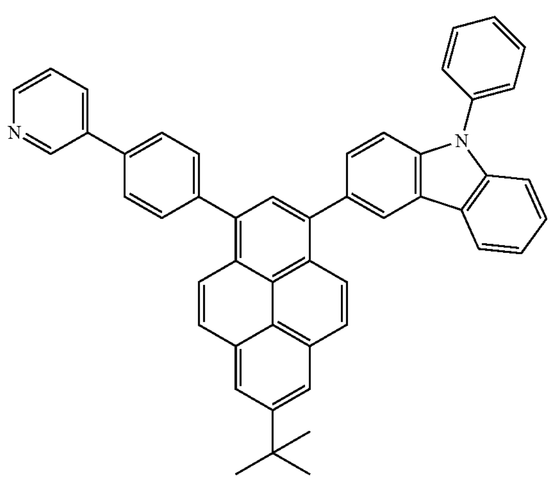
ET10
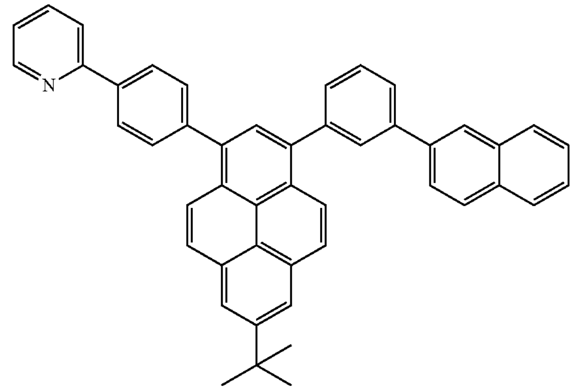
ET11
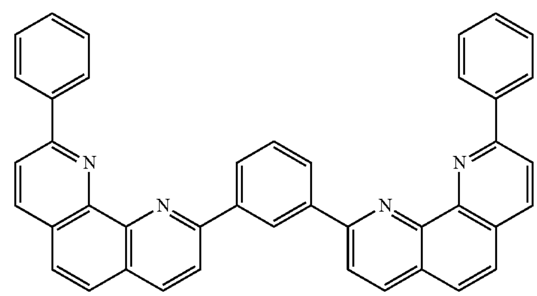
ET12
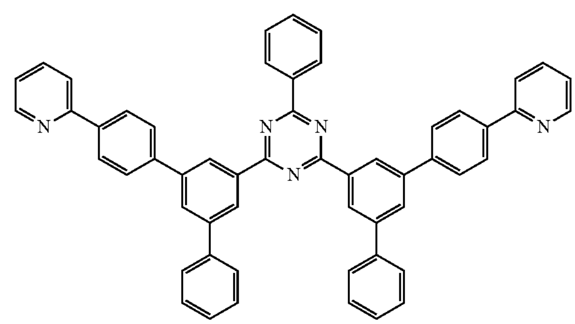
ET13
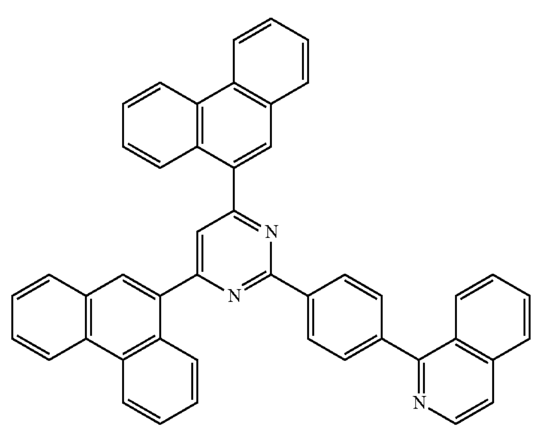

-continued
ET14
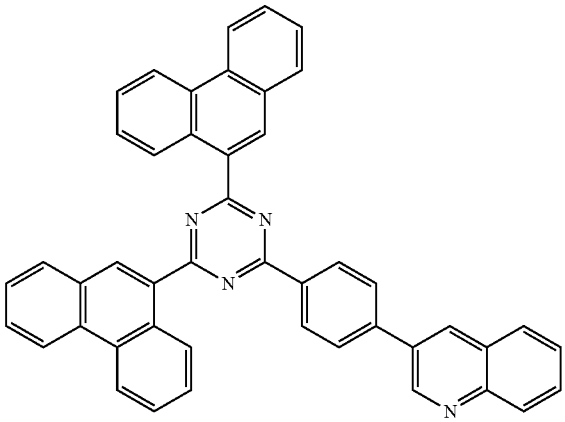
ET15
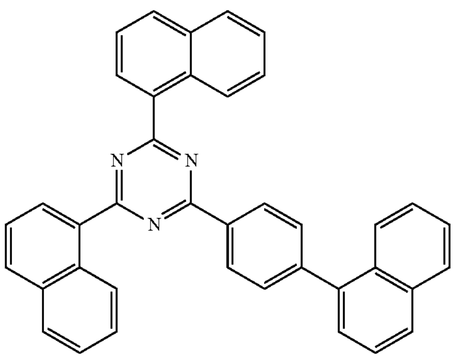
ET16
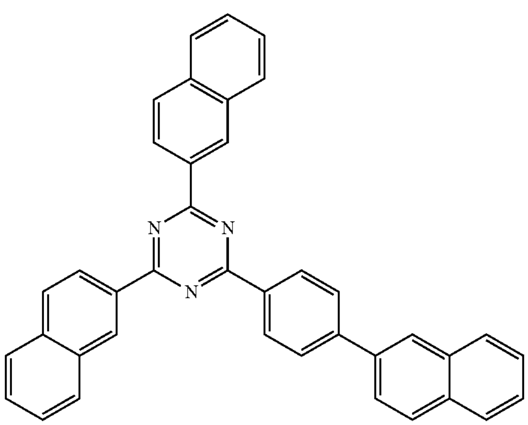
-continued
ET17
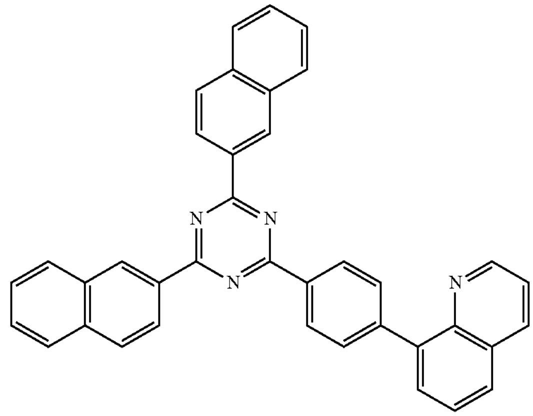
ET18
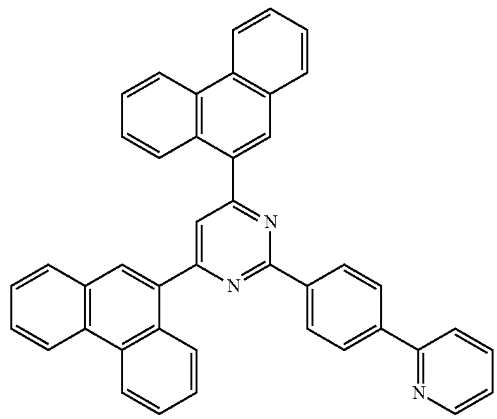
ET19
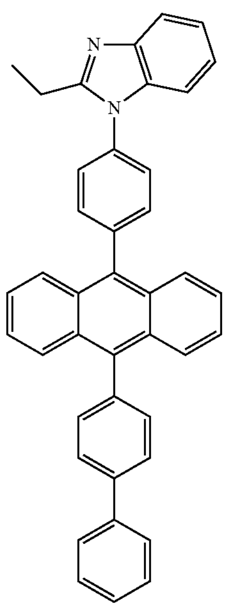

-continued
ET20
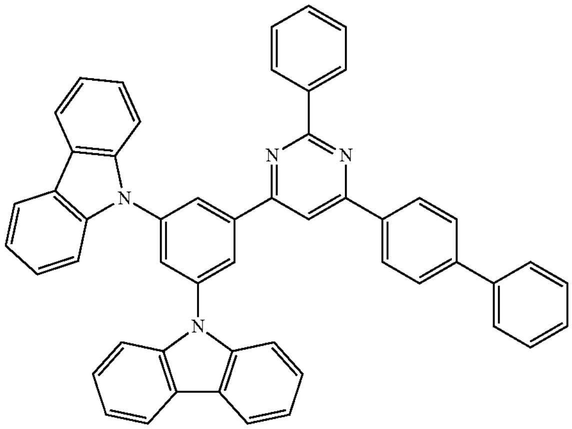
ET21
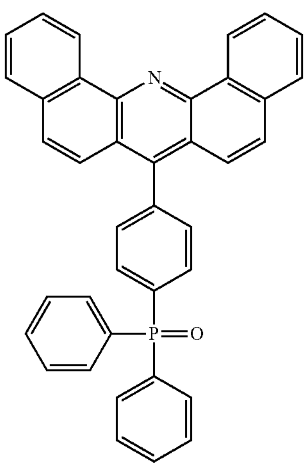
ET22
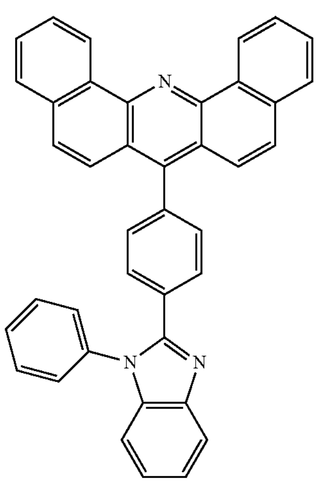
-continued
ET23
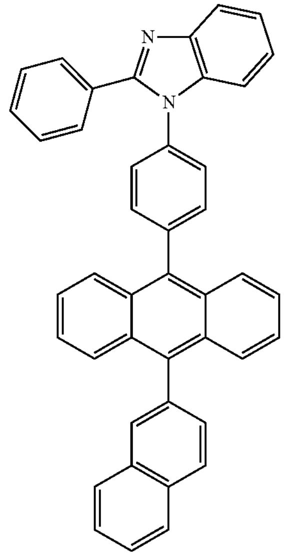
ET24
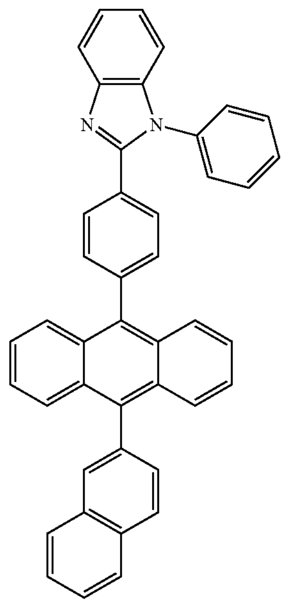
ET25
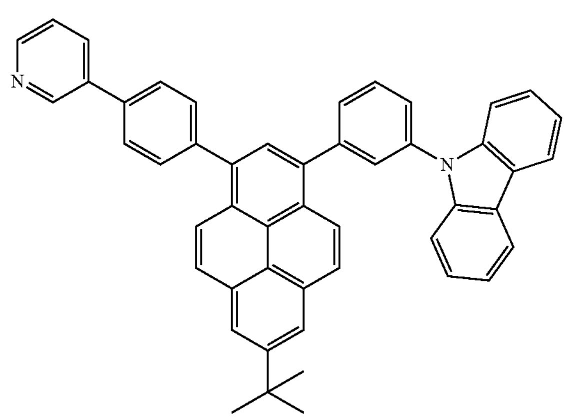
The thickness of the electron transport layer may be in a range of about 100 Å to about 1,000 Å, and in some embodiments, about 150 Å to about 500 Å. When the thickness of the electron transport layer is within any of these ranges, excellent electron transport characteristics may be obtained without a substantial increase in driving voltage.

The electron transport layer may further include a material containing metal, in addition to the materials described above.

The material containing metal may include a Li complex. The Li complex may include, e.g., Compound ET-D1 or Compound ET-D2:

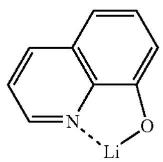

ET-D1

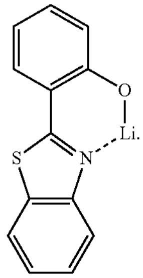

ET-D2

The electron transport region may include an electron injection layer that facilitates electron injection from the second electrode 19.

The electron injection layer may include LiF, NaCl, CsF, $Li_2O$, BaO, or any combination thereof.

The thickness of the electron injection layer may be in a range of about 1 Å to about 100 Å, and in some embodiments, about 3 Å to about 90 Å. When the thickness of the electron injection layer is within any of these ranges, excellent electron injection characteristics may be obtained without a substantial increase in driving voltage.

The second electrode 19 may be on the organic layer 15. The second electrode 19 may be a cathode. A material for forming the second electrode 19 may be a material with a relatively low work function, such as a metal, an alloy, an electrically conductive compound, or any combination thereof. Examples of the material for forming the second electrode 19 may include lithium (Li), magnesium (Mg), aluminum (Al), aluminum-lithium (Al—Li), calcium (Ca), magnesium-indium (Mg—In), and magnesium-silver (Mg—Ag). In some embodiments, ITO or IZO may be used to form a transmissive second electrode 19 to manufacture a top emission light-emitting device. In some embodiments, the material for forming the second electrode 19 may vary.

Hereinbefore the organic light-emitting device 10 has been described with reference to the FIGURE, but embodiments are not limited thereto.

According to an aspect of another embodiment, an electronic apparatus may include the organic light-emitting device. Thus, an electronic apparatus including the organic light-emitting device may be provided. The electronic apparatus may include, for example, a display, lighting, a sensor, or the like.

According to an aspect of still another embodiment, a diagnostic composition may include at least one organometallic compound represented by Formula 1-1.

Since the organometallic compound represented by Formula 1-1 provides high luminescence efficiency, the diagnostic efficiency of the diagnostic composition that includes the organometallic compound represented by Formula 1-1 may be excellent.

The diagnostic composition may be applied in various ways, such as in a diagnostic kit, a diagnostic reagent, a biosensor, or a biomarker.

The term "$C_1$-$C_{60}$ alkyl group" as used herein refers to a linear or branched saturated aliphatic hydrocarbon monovalent group having 1 to 60 carbon atoms, and the term "$C_1$-$C_{60}$ alkylene group" as used herein refers to a divalent group having the same structure as the $C_1$-$C_{60}$ alkyl group.

Examples of the $C_1$-$C_{60}$ alkyl group, the $C_1$-$C_{20}$ alkyl group, and/or the $C_1$-$C_{10}$ alkyl group as used herein may include a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group or a tert-decyl group, each unsubstituted or substituted with a methyl group, an ethyl group, an n-propyl group, an iso-propyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an iso-hexyl group, a sec-hexyl group, a tert-hexyl group, an n-heptyl group, an iso-heptyl group, a sec-heptyl group, a tert-heptyl group, an n-octyl group, an iso-octyl group, a sec-octyl group, a tert-octyl group, an n-nonyl group, an iso-nonyl group, a sec-nonyl group, a tert-nonyl group, an n-decyl group, an iso-decyl group, a sec-decyl group, a tert-decyl group, or any combination thereof. In some embodiments, Formula 9-33 may be a branched $C_6$ alkyl group. Formula 9-33 may be a tert-butyl group substituted with two methyl groups.

The term "$C_1$-$C_{60}$ alkoxy group" as used herein refers to a monovalent group represented by —$OA_{101}$ (wherein $A_{101}$ is a $C_1$-$C_{60}$ alkyl group).

Examples of the $C_1$-$C_{60}$ alkoxy group, the $C_1$-$C_{20}$ alkoxy group, or the $C_1$-$C_{10}$ alkoxy group as used herein may include a methoxy group, an ethoxy group, a propoxy group, a butoxy group, or a pentoxy group.

The term "$C_2$-$C_{60}$ alkenyl group" as used herein refers to a group formed by placing at least one carbon-carbon double bond in the middle or at the terminus of the $C_2$-$C_{60}$ alkyl group. Examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a group formed by placing at least one carbon-carbon triple bond in the middle or at the terminus of the $C_2$-$C_{60}$ alkyl group. Examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon cyclic group having 3 to 10 carbon atoms. The term "$C_3$-$C_{10}$ cycloalkylene group" as used herein refers to a divalent group having the same structure as the $C_3$-$C_{10}$ cycloalkyl group.

Examples of the $C_3$-$C_{10}$ cycloalkyl group as used herein may include a cyclopropyl group, a cyclobutyl group, a cyclopentyl group, a cyclohexyl group, a cycloheptyl group, a cyclooctyl group, an adamantanyl group, a norbornanyl group (a bicyclo[2.2.1]heptyl group), a bicyclo[1.1.1]pentyl group, a bicyclo[2.1.1]hexyl group, or a bicyclo[2.2.2]octyl group.

The term "$C_1$-$C_{10}$ heterocycloalkyl group" as used herein refers to a monovalent saturated monocyclic group having 1 to 10 carbon atoms and at least one heteroatom of N, O, P, Si, S, Ge, Se and B as a ring-forming atom. The term "$C_1$-$C_{10}$ heterocycloalkylene group" as used herein refers to a divalent group having the same structure as the $C_1$-$C_{10}$ heterocycloalkyl group.

Examples of the $C_1$-$C_{10}$ heterocycloalkyl group as used herein may include a silolanyl group, a silinanyl group, a tetrahydrofuranyl group, a tetrahydro-2H-pyranyl group, or a tetrahydrothiophenyl group.

The term "$C_3$-$C_{10}$ cycloalkenyl group" as used herein refers to a monovalent cyclic group that has 3 to 10 carbon atoms and at least one carbon-carbon double bond in its ring, wherein the molecular structure as a whole is non-aromatic. Examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group including at least one heteroatom of N, O, P, Si, S, Ge, Se and B as a ring-forming atom, 1 to 10 carbon atoms, and at least one double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms. The term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include a plurality of rings, the plurality of rings may be fused to each other.

The term "$C_7$-$C_{60}$ alkyl aryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a heterocyclic aromatic system having at least one heteroatom of N, O, P, Si, S, Ge, Se and B as a ring-forming atom and 1 to 1 carbon atoms. The term "$C_1$-$C_{60}$ heteroarylene group" as used herein refers to a divalent group having a heterocyclic aromatic system having at least one heteroatom of N, O, P, Si, S, Ge, Se and B as a ring-forming atom and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include a plurality of rings, the plurality of rings may be fused to each other.

The term "$C_2$-$C_{60}$ alkyl heteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein is represented by —$OA_{102}$ (wherein $A_{102}$ is the $C_6$-$C_{60}$ aryl group). The term "$C_6$-$C_{60}$ arylthio group" as used herein is represented by —$SA_{103}$ (wherein $A_{103}$ is the $C_6$-$C_{60}$ aryl group). The term "$C_1$-$C_{60}$ alkylthio group" as used herein is represented by —$SA_{104}$ (wherein $A_{104}$ is the $C_1$-$C_6$ alkyl group).

The term "monovalent non-aromatic condensed polycyclic group" as used herein refers to a monovalent group that has two or more condensed rings and only carbon atoms (e.g., the number of carbon atoms may be in a range of 8 to 60) as ring-forming atoms, wherein the molecular structure as a whole is non-aromatic. Examples of the monovalent non-aromatic condensed polycyclic group include a fluorenyl group. The term "divalent non-aromatic condensed polycyclic group" as used herein refers to a divalent group having substantially the same structure as the monovalent non-aromatic condensed polycyclic group.

The term "monovalent non-aromatic condensed heteropolycyclic group" as used herein refers to a monovalent group that has two or more condensed rings and a heteroatom selected from N, O, P, Si, S, Ge, Se and B and carbon atoms (e.g., the number of carbon atoms may be in a range of 1 to 60) as ring-forming atoms, wherein the molecular structure as a whole is non-aromatic. Examples of the monovalent non-aromatic condensed heteropolycyclic group include a carbazolyl group. The term "divalent non-aromatic condensed heteropolycyclic group" as used herein refers to a divalent group having substantially the same structure as the monovalent non-aromatic condensed heteropolycyclic group.

The term "$C_5$-$C_{30}$ carbocyclic group" as used herein refers to a saturated or unsaturated cyclic group including 5 to 30 carbon atoms only as ring-forming atoms. The $C_5$-$C_{30}$ carbocyclic group may be a monocyclic group or a polycyclic group. Examples of the "$C_5$-$C_{30}$ carbocyclic group (unsubstituted or substituted with at least one $R_{10a}$)" may include an adamantane group, a norbornene group, a bicyclo[1.1.1]pentane group, a bicyclo[2.1.1]hexane group, a bicyclo[2.2.1]heptane group (a norbornane group), a bicyclo[2.2.2]octane group, a cyclopentane group, a cyclohexane group, a cyclohexene group, a benzene group, a naphthalene group, an anthracene group, a phenanthrene group, a triphenylene group, a pyrene group, a chrysene group, a 1,2,3,4-tetrahydronaphthalene group, a cyclopentadiene group, or a fluorene group, each unsubstituted or substituted with at least one $R_{10a}$.

The term "$C_1$-$C_{30}$ heterocyclic group" as used herein refers to saturated or unsaturated cyclic group including 1 to 30 carbon atoms and at least one heteroatom selected from N, O, P, Si, Se, Ge, B, and S as ring-forming atoms. The $C_1$-$C_{30}$ heterocyclic group may be a monocyclic group or a polycyclic group. Examples of the "$C_1$-$C_{30}$ heterocyclic group (unsubstituted or substituted with at least one $R_{10a}$)" may include a thiophene group, a furan group, a pyrrole group, a silole group, a borole group, a phosphole group, a selenophene group, a germole group, a benzothiophene group, a benzofuran group, an indole group, a benzosilole group, a benzoborole group, a benzophosphole group, a benzoselenophene group, a benzogermole group, a dibenzothiophene group, a dibenzofuran group, a carbazole group, a dibenzosilole group, a dibenzoborole group, a dibenzophosphole group, a dibenzoselenophene group, a dibenzogermole group, a dibenzothiophene 5-oxide group, a 9H-fluorene-9-one group, a dibenzothiophene 5,5-dioxide group, an azabenzothiophene group, an azabenzofuran group, an azaindole group, an azaindene group, an azabenzosilole group, an azabenzoborole group, an azabenzophosphole group, an azabenzoselenophene group, an azabenzogermole group, an azadibenzothiophene group, an azadibenzofuran group, an azacarbazole group, an azafluorene group, an azadibenzosilole group, an azadibenzoborole group, an azadibenzophosphole group, an azadibenzoselenophene group, an azadibenzogermole group, an azadibenzothiophene 5-oxide group, an aza-9H-fluoren-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrazole group, an imidazole group, a triazole group, an oxazole group, an isooxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, each unsubstituted or substituted with at least one $R_{10a}$.

Examples of the "$C_5$-$C_{30}$ carbocyclic group" and the "$C_1$-$C_{30}$ heterocyclic group" as used herein include i) a first ring, ii) a second ring, iii) a condensed ring in which at least two first rings are condensed, iv) a condensed ring in which at least two second rings are condensed, or v) a condensed ring in which at least one first ring and at least one second ring are condensed,

- the first ring may be a cyclopentane group, a cyclopentene group, a furan group, a thiophene group, a pyrrole group, a silole group, a borole group, a phosphole group, a germole group, a selenophene group, an oxazole group, an isoxazole group, an oxadiazole group, an oxatriazole group, a thiazole group, an isothiazole group, a thiadiazole group, a thiatriazole group, a pyrazole group, an imidazole group, a triazole group, a tetrazole group, an azasilole group, a diazasilole group, or a triazasilole group, and
- the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", and "fluorinated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one fluoro group (—F). Examples of the "fluorinated $C_1$ alkyl group (i.e., a fluorinated methyl group)" may include —$CF_3$, —$CF_2H$, and —$CFH_2$. The "fluorinated $C_1$-$C_{60}$ alkyl group (or fluorinated $C_1$-$C_{20}$ alkyl group or the like)", "fluorinated $C_3$-$C_{10}$ cycloalkyl group", "fluorinated $C_1$-$C_{10}$ heterocycloalkyl group", or "fluorinated phenyl group" may respectively be: i) a fully fluorinated $C_1$-$C_{60}$ alkyl group (or fully fluorinated $C_1$-$C_{20}$ alkyl group or the like), fully fluorinated $C_3$-$C_{10}$ cycloalkyl group, fully fluorinated $C_1$-$C_{10}$ heterocycloalkyl group, or fully fluorinated phenyl group, in which all hydrogen atoms are substituted with fluoro groups; or ii) a partially fluorinated $C_1$-$C_{60}$ alkyl group (or partially fluorinated $C_1$-$C_{20}$ alkyl group or the like), partially fluorinated $C_3$-$C_{10}$ cycloalkyl group, partially fluorinated $C_1$-$C_{10}$ heterocycloalkyl group, or partially fluorinated phenyl group, in which some of hydrogen atoms are substituted with fluoro groups.

The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", and "deuterated phenyl group" as used herein may respectively be a $C_1$-$C_{60}$ alkyl group (or $C_1$-$C_{20}$ alkyl group or the like), $C_3$-$C_{10}$ cycloalkyl group, a $C_1$-$C_{10}$ heterocycloalkyl group, and a phenyl group, each substituted with at least one deuterium. Examples of the "deuterated $C_1$ alkyl group (i.e., a deuterated methyl group)" may include —$CD_3$, —$CD_2H$, and —$CDH_2$. Examples of the "deuterated $C_3$-$C_{10}$ cycloalkyl group" may include Formula 10-501. The "deuterated $C_1$-$C_{60}$ alkyl group (or deuterated $C_1$-$C_{20}$ alkyl group or the like)", "deuterated $C_3$-$C_{10}$ cycloalkyl group", "deuterated $C_1$-$C_{10}$ heterocycloalkyl group", or deuterated phenyl group may respectively be: i) a fully deuterated $C_1$-$C_{60}$ alkyl group (or fully deuterated $C_1$-$C_{20}$ alkyl group or the like), fully deuterated $C_3$-$C_{10}$ cycloalkyl group, fully deuterated $C_1$-$C_{10}$ heterocycloalkyl group, or fully deuterated phenyl group, in which all hydrogens are substituted with deuterium atoms; or ii) a partially deuterated $C_1$-$C_{60}$ alkyl group (or partially deuterated $C_1$-$C_{20}$ alkyl group or the like), partially deuterated $C_3$-$C_{10}$ cycloalkyl group, partially deuterated $C_1$-$C_{10}$ heterocycloalkyl group, or partially deuterated phenyl group, in which some of hydrogens are substituted with deuterium atoms.

The "($C_1$-$C_{20}$ alkyl)'X' group" refers to a 'X' group substituted with at least one $C_1$-$C_{20}$ alkyl group. For example, The "($C_1$-$C_{20}$ alkyl)$C_3$-$C_{10}$ cycloalkyl group" as used herein refers to a $C_3$-$C_{10}$ cycloalkyl group substituted with at least one $C_1$-$C_{20}$ alkyl group, and the "($C_1$-$C_{20}$ alkyl)phenyl group" as used herein refers to a phenyl group substituted with at least one $C_1$-$C_{20}$ alkyl group. Examples of the ($C_1$ alkyl)phenyl group may include a toluyl group.

In the present specification, "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluoren-9-one group, and an azadibenzothiophene 5,5-dioxide group" each refer to a hetero ring in which at least one ring-forming carbon atom is substituted with nitrogen atom and respectively having an identical backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group".

A substituent of the substituted $C_5$-$C_{30}$ carbocyclic group, the substituted $C_1$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_1$-$C_{60}$alkylthio group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_7$-$C_{60}$ alkyl aryl group, the substituted $C_6$-$C_{60}$ aryloxy group, the substituted $C_6$-$C_{60}$ arylthio group, the substituted $C_1$-$C_{60}$ heteroaryl group, the substituted $C_2$-$C_{60}$ alkyl heteroaryl group, the substituted monovalent non-aromatic condensed polycyclic group, and the substituted monovalent non-aromatic condensed heteropolycyclic group may each independently be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, $—P(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, or a monovalent non-aromatic condensed heteropolycyclic group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_7$-$C_{60}$ alkyl aryl group, a $C_6$-$C_{60}$ aryloxy group, a $C_6$-$C_{60}$ arylthio group, a $C_1$-$C_{60}$ heteroaryl group, a $C_2$-$C_{60}$ alkyl heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, $—P(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, $—P(=O)(Q_{38})(Q_{39})$, or $—P(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

Hereinafter, a compound and an organic light-emitting device according to an embodiment will be described in detail with reference to Synthesis Examples and Examples, however, the present disclosure is not limited thereto. The wording "B was used instead of A" used in describing Synthesis Examples means that an amount of B used was identical to an amount of A used based on molar equivalence.

EXAMPLES

Synthesis Example 1 (Compound 1)

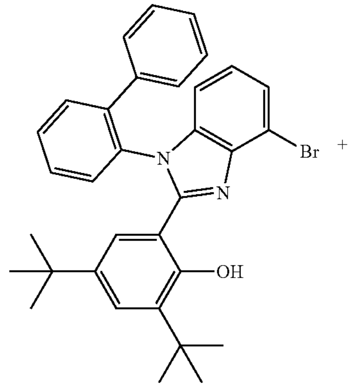

A-1

-continued

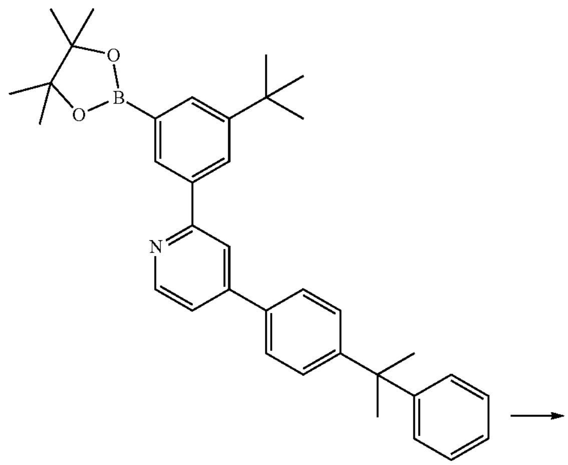

B-1

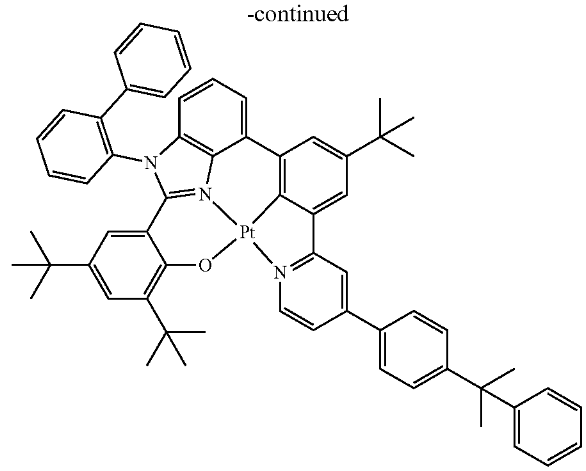

1

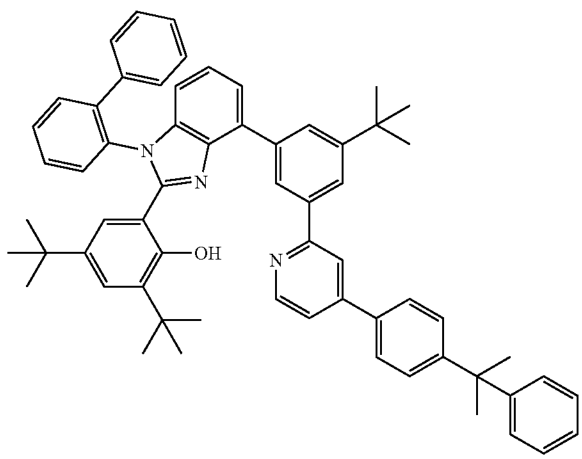

C-1

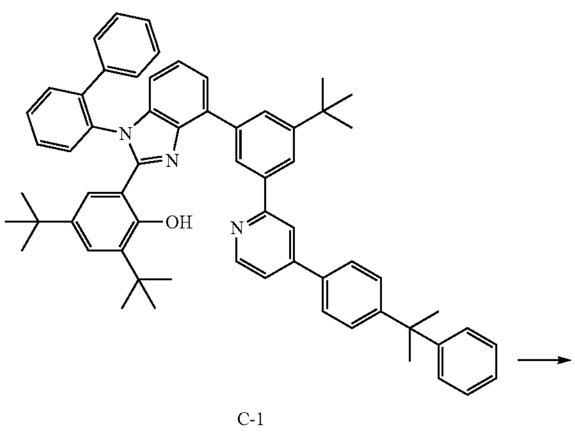

C-1

Synthesis of ligand C-1 (2-(1-([1,1'-biphenyl]-2-yl)-4-(3-(tert-butyl)-5-(4-(4-(2-phenylpropan-2-yl)phenyl)pyridin-2-yl)phenyl)-1H-benzo[d]imidazol-2-yl)-4,6-di-tert-butylphenol)

5.7 grams (g) of Intermediate B-1 (0.011 mol, 0.9 equiv.), 6.6 g of Intermediate A-1 (0.012 mol, 1 equiv.), 0.96 g of tetrakis(triphenylphosphine)palladium(0) (0.001 mmol, 0.07 equiv.), and 4.9 g of potassium carbonate (0.036 mol, 3 equiv.) were dissolved in 80 milliliters (mL) of a solvent in which tetrahydrofuran (THF) and distilled water ($H_2O$) were mixed at a volume ratio of 3:1, followed by reflux for 12 hours. The resulting product was cooled to room temperature, and a precipitate was filtered to obtain a filtrate. The obtained filtrate was washed with EA (ethyl acetate) and $H_2O$, the organic layer was concentrated and purified by column chromatography with gradient elution (while increasing a rate of EA/hexane to between 8% and 15%), and recrystallization was performed using MC (methylene chloride)/MeOH to obtain 4.8 g of Ligand C-1 (having a purity of 99% or higher). The resulting compound was identified by using mass spectroscopy and HPLC analysis.

HRMS(MALDI) calcd for $C_{63}H_{63}N_3O$: m/z 877.4971, Found: 877.4975

Synthesis of Compound 1

4.9 g of ligand C-1 (5.55 mmol) and 2.76 g of $K_2PtCl_4$ (6.65 mmol, 1.2 equiv.) were dissolved in 110 mL of a mixture of 100 mL of AcOH (acetic acid) and 10 mL of $H_2O$, followed by reflux for 16 hours. The resulting product was cooled to room temperature, and a precipitate was filtered to obtain a filtrate. The obtained filtrate was extracted with methylene chloride (MC) and washed with $H_2O$, the organic layer was concentrated, and the obtained residue was purified by column chromatography to obtain 2.2 g of Compound 1 (yield: 37%). The resulting compound was identified by using mass spectroscopy and HPLC analysis.

HRMS(MALDI) calcd for $C_{63}H_{61}N_3OPt$: m/z 1070.4462, Found: 1070.4464

Synthesis Example 2 (Compound 3)
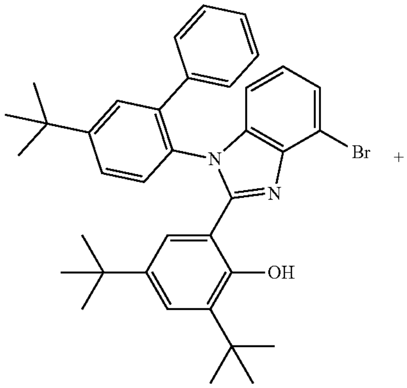
A-3
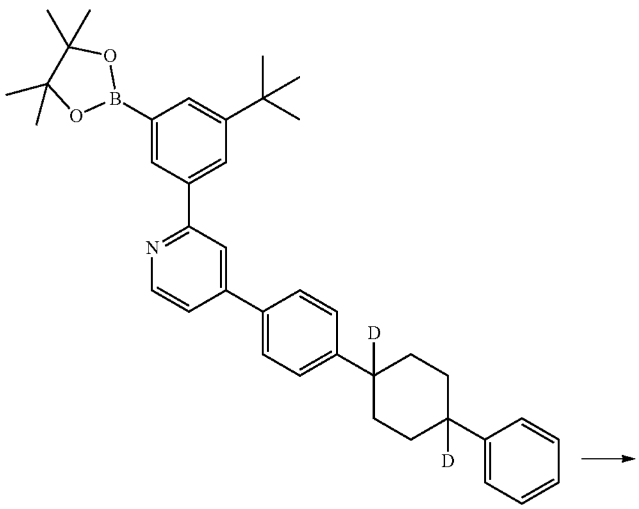
B-3
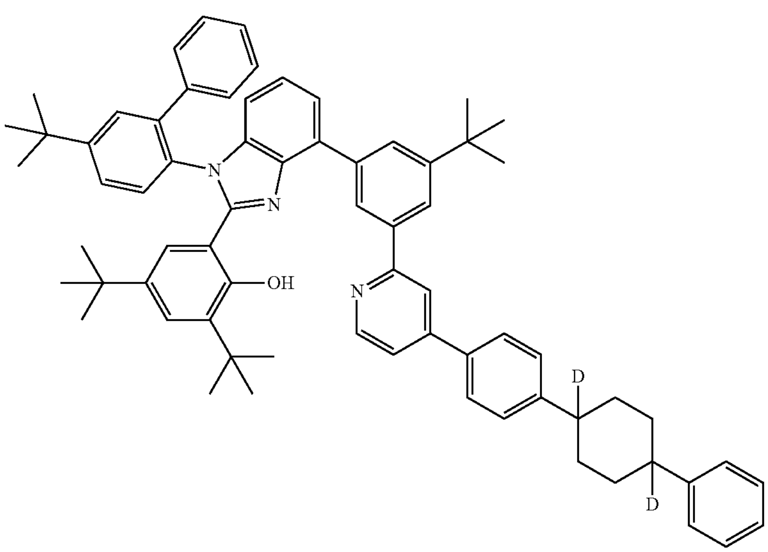
C-3

-continued

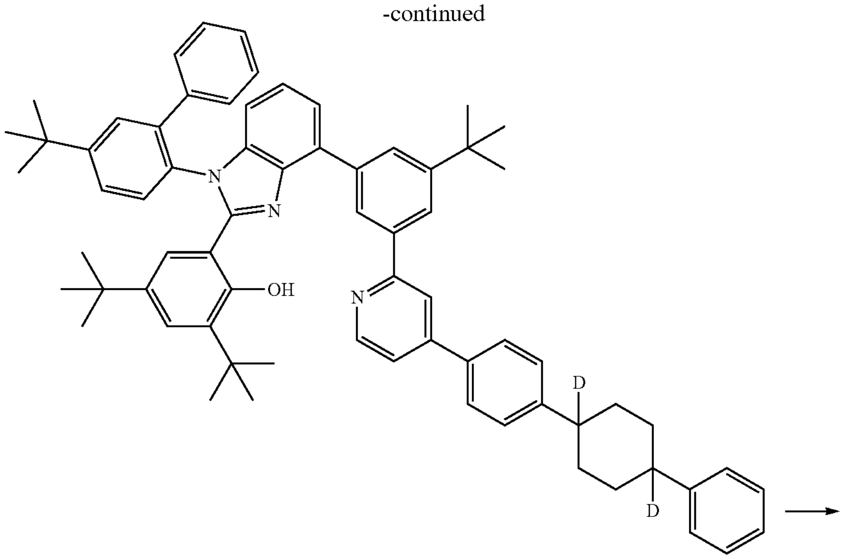

C-3

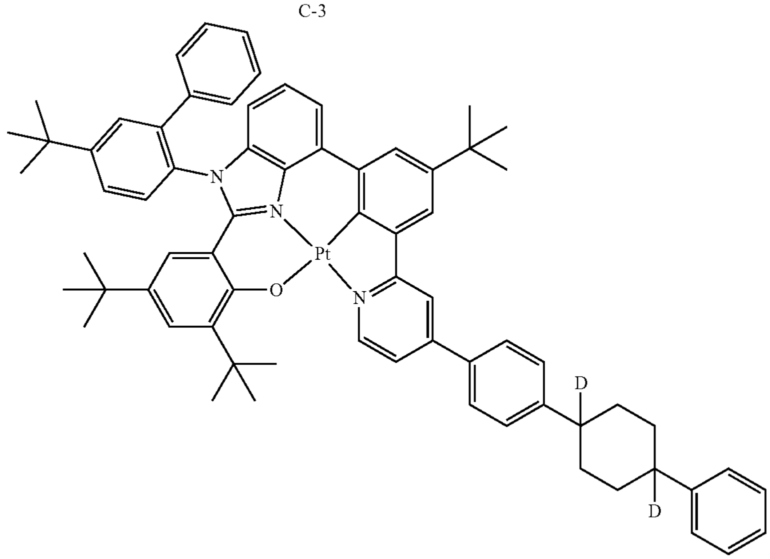

3

Synthesis of ligand C-3 (2,4-di-tert-butyl-6-(4-(3-(tert-butyl)-5-(4-(4-(4-phenylcyclohexyl-1,4-d2) phenyl)pyridin-2-yl)phenyl)-1-(5-(tert-butyl)-[1,1'-biphenyl]-2-yl)-1H-benzo[d]imidazol-2-yl)phenol)

3.4 grams (g) of Intermediate B-3 (0.006 mol, 0.9 equiv.), 4.0 g of Intermediate A-3 (0.006 mol, 1 equiv.), 0.53 g of tetrakis(triphenylphosphine)palladium(0) (0.001 mmol, 0.07 equiv.), and 2.7 g of potassium carbonate (0.020 mol, 3 equiv.) were dissolved in 80 milliliters (mL) of a solvent in which tetrahydrofuran (THF) and distilled water ($H_2O$) were mixed at a volume ratio of 3:1, followed by reflux for 12 hours. The resulting product was cooled to room temperature, and a precipitate was filtered to obtain a filtrate. The obtained filtrate was washed with EA and $H_2O$, the organic layer was concentrated, and the resulting residue was purified by column chromatography with gradient elution (while increasing a rate of EA/hexane to between 8% and 15%), and recrystallization was performed using MC/MeOH to obtain 4.5 g of Ligand C-3 (having a purity of 99% or higher). The resulting compound was identified by using mass spectroscopy and HPLC analysis.

HRMS(MALDI) calcd for $C_{70}H_{73}D_2N_3O$: m/z 975.6036, Found: 975.6039

Synthesis of Compound 3

4.5 g of ligand C-3 (5.25 mmol) and 2.61 g of $K_2PtCl_4$ (6.30 mmol, 1.2 equiv.) were dissolved in 100 mL of a mixture of 100 mL of AcOH and 10 mL of $H_2O$, followed by reflux for 16 hours. The resulting product was cooled to room temperature, and a precipitate was filtered to obtain a filtrate. The obtained filtrate was extracted with MC and washed with $H_2O$, the organic layer was concentrated to obtain a residue, and the obtained residue was purified by column chromatography (MC 40%, Hexane 60%) to obtain 1.84 g of Compound 3 (yield: 30%). The resulting compound was identified by using mass spectroscopy and HPLC analysis.

HRMS(MALDI) calcd for $C_{70}H_{71}D_2N_3OPt$: m/z 1168.5527, Found: 1168.5528

Synthesis Example 3 (Compound 177)
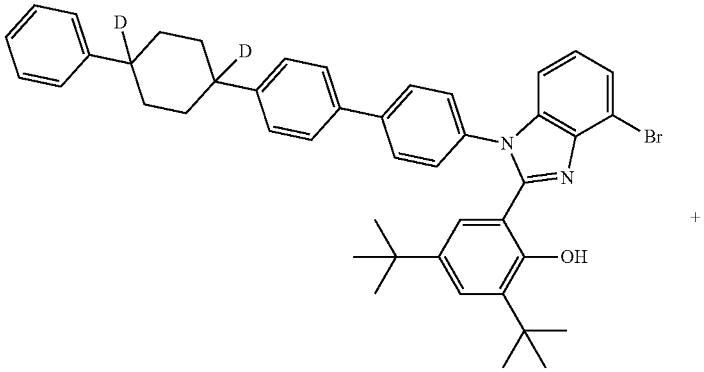
A-177
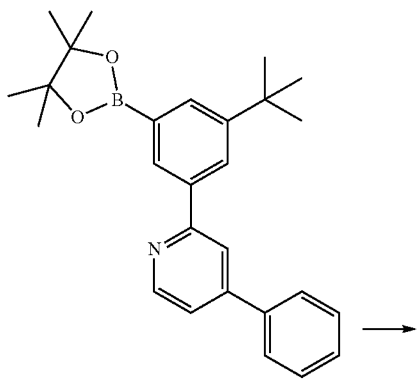
B-177
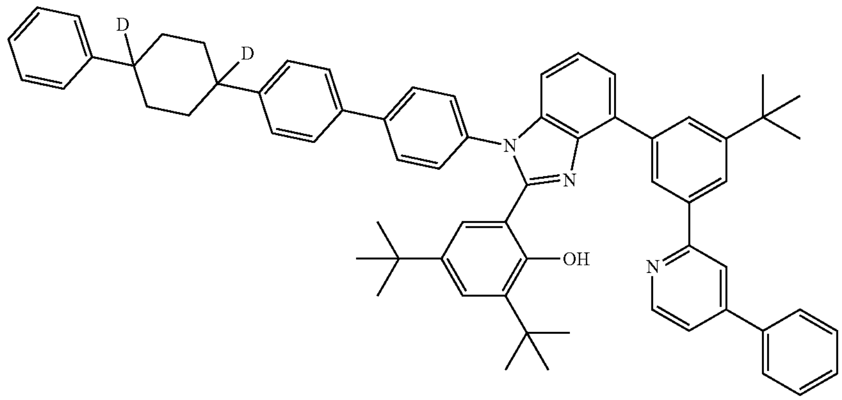
C-177

-continued

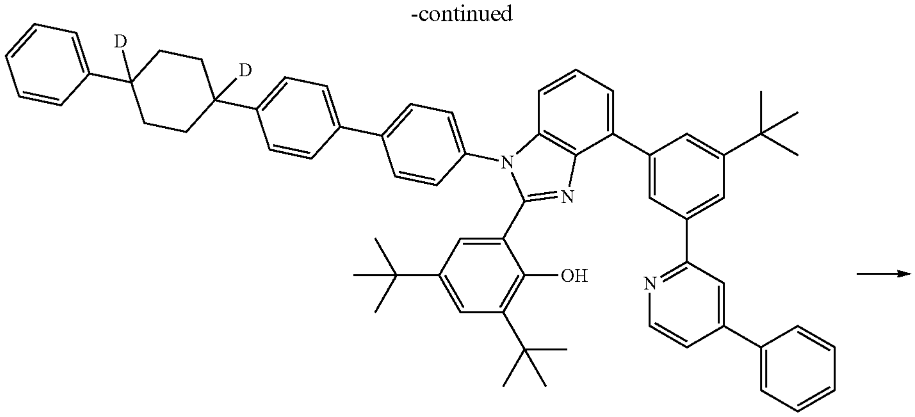

C-177

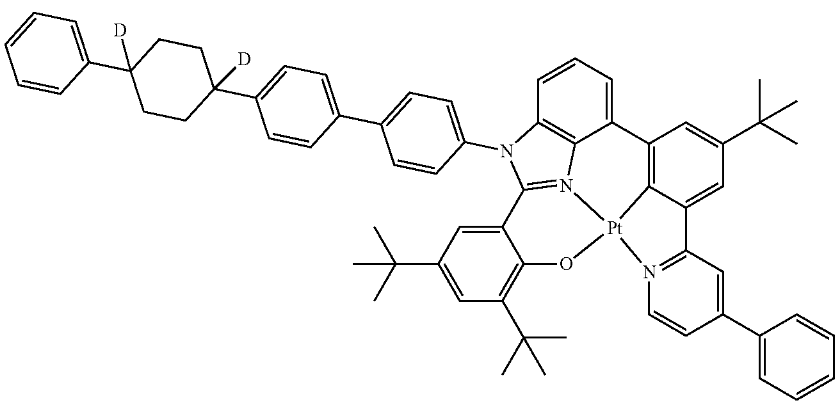

177

Synthesis of Ligand C-177

3.0 g of ligand C-177 (having a purity of 98% or higher) was obtained in substantially the same manner as in Synthesis of ligand C-3 in Synthesis Example 2, except that Intermediate A-177 and Intermediate B-177 were used instead of Intermediate A-3 and Intermediate B-3, respectively. The resulting compound was identified by using mass spectroscopy and HPLC analysis.

HRMS(MALDI) calcd for $C_{66}H_{65}D_2N_{30}$: m/z 919.5410, Found: 919.5412

Synthesis of Compound 177

1.2 g of Compound 177 (yield: 34%) was obtained in substantially the same manner as in Synthesis of Compound 3 in Synthesis Example 2, except that ligand C-177 was used instead of ligand C-3. The resulting compound was identified by using mass spectroscopy and HPLC analysis.

HRMS(MALDI) calcd for $C_{66}H_{63}D_2N_3OPt$: m/z 1112.4901, Found: 1112.4903

Synthesis Example 4 (Compound 187)

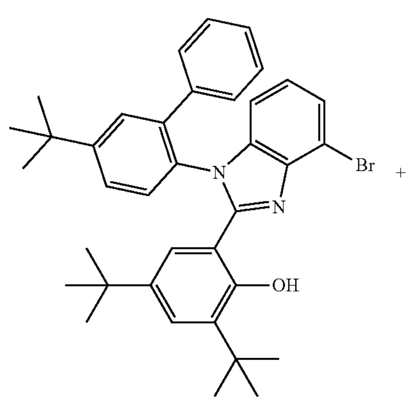

A-3

-continued

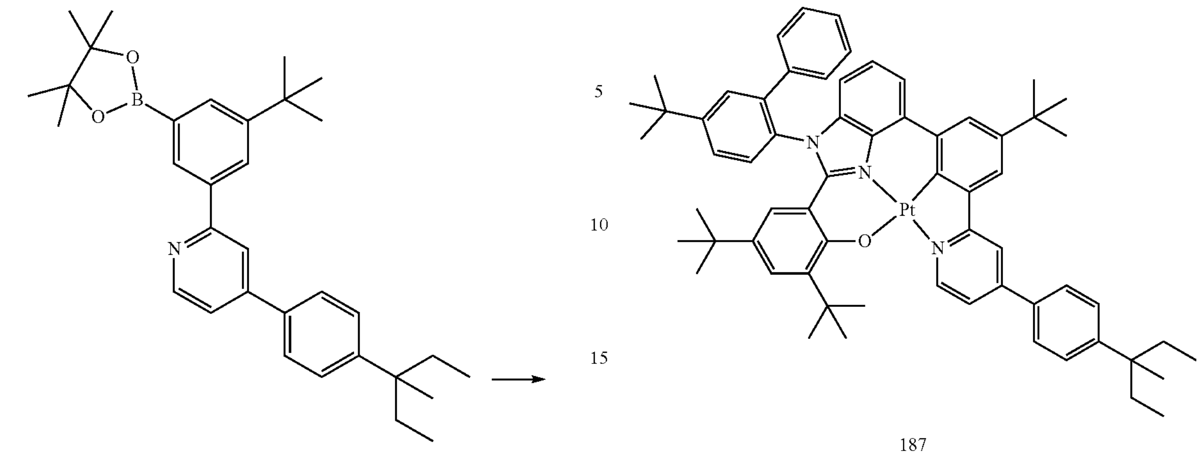

B-187

187

Synthesis of Ligand C-187

3.2 g of ligand C-187 (having a purity of 98% or higher) was obtained in substantially the same manner as in Synthesis of ligand C-3 in Synthesis Example 2, except that Intermediate B-187 was used instead of Intermediate B-3. The resulting compound was identified by using mass spectroscopy and HPLC analysis.

HRMS(MALDI) calcd for $C_{64}H_{73}N_3O$: m/z 899.5754, Found: 899.5757

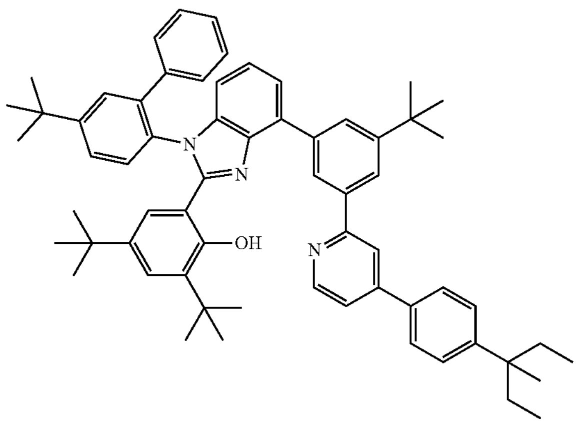

C-187

Synthesis of Compound 187

1.67 g of Compound 187 (yield: 43%) was obtained in substantially the same manner as in Synthesis of Compound 3 in Synthesis Example 2, except that ligand C-187 was used instead of ligand C-3. The resulting compound was identified by using mass spectroscopy and HPLC analysis.

HRMS(MALDI) calcd for $C_{64}H_{71}N_3OPt$: m/z 1092.5245, Found: 1092.5243 Synthesis Example 5 (Compound 218)

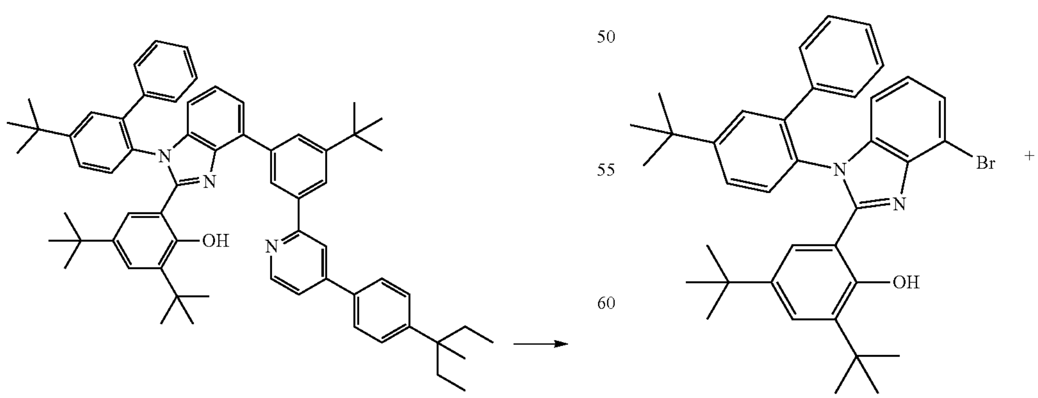

C-187

A-3

-continued

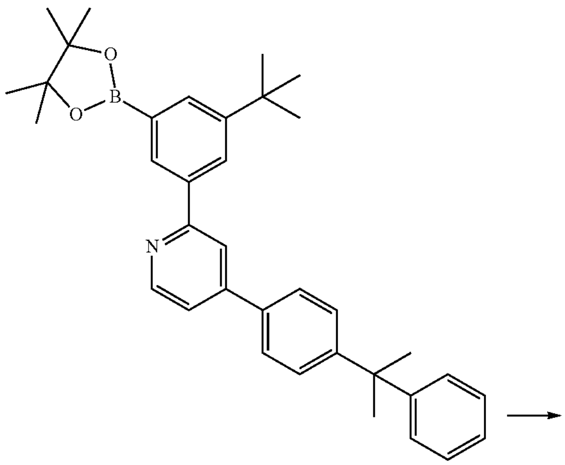

B-1

-continued

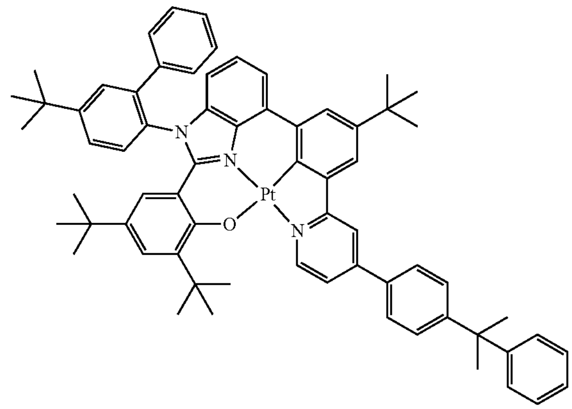

218

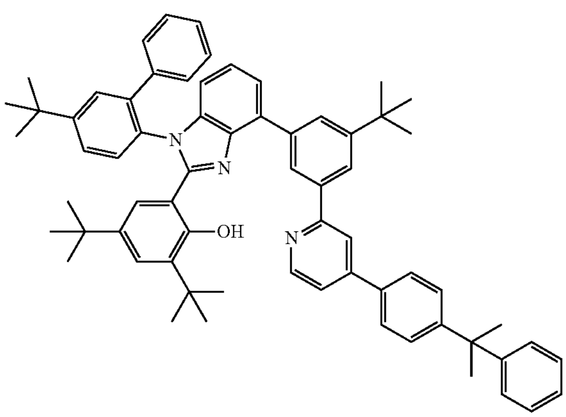

C-218

Synthesis of Ligand C-218

2.8 g of ligand C-218 (having a purity of 97% or higher) was obtained in substantially the same manner as in Synthesis of ligand C-3 in Synthesis Example 2, except that Intermediate B-1 was used instead of Intermediate B-3. The resulting compound was identified by using mass spectroscopy and HPLC analysis.

HRMS(MALDI) calcd for $C_{67}H_{71}N_3O$: m/z 933.5597, Found: 933.5599

Synthesis of Compound 218

1.39 g of Compound 218 (yield: 41%) was obtained in substantially the same manner as in Synthesis of Compound 3 in Synthesis Example 2, except that ligand C-218 was used instead of ligand C-3. The resulting compound was identified by using mass spectroscopy and HPLC analysis.

HRMS(MALDI) calcd for $C_{67}H_{69}N_3OPt$: m/z 1126.5088, Found: 1126.5087

Synthesis Example 6 (Compound 246)

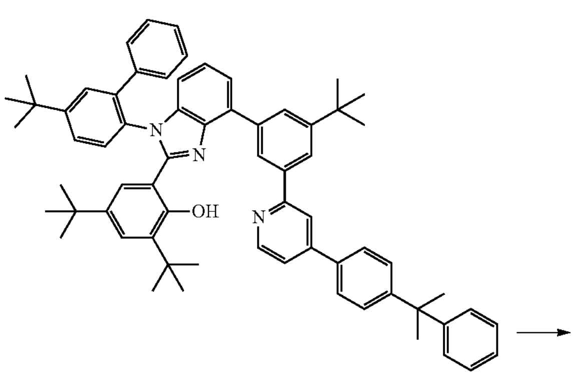

C-218

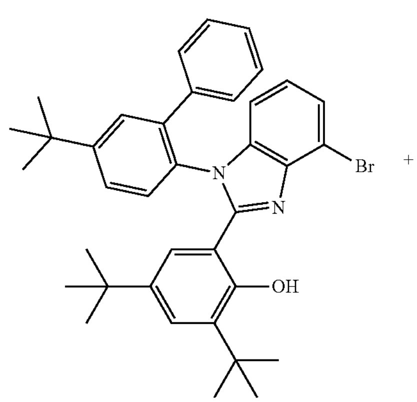

A-3

-continued

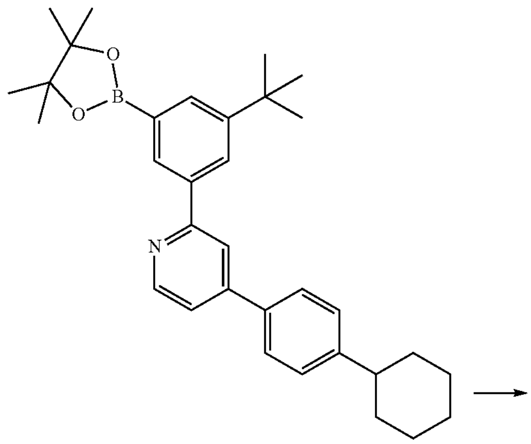

B-246

-continued

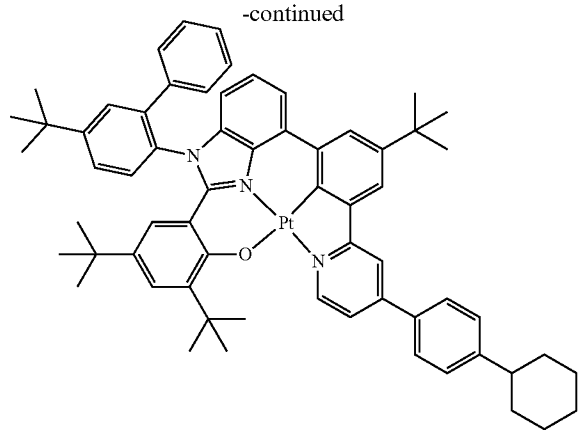

246

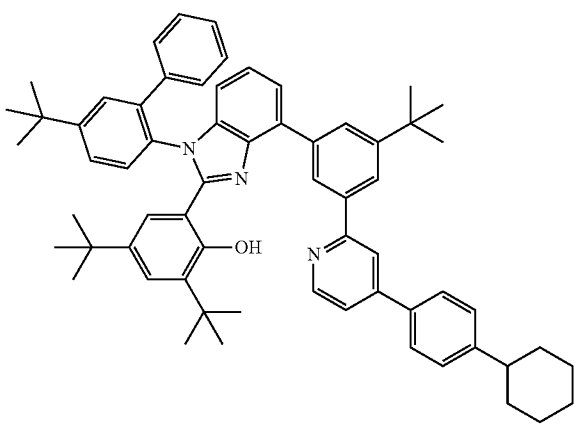

C-246

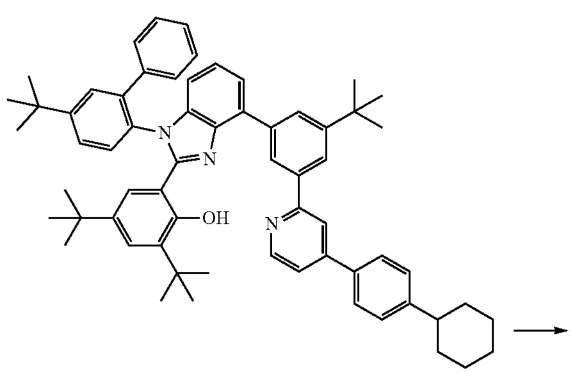

C-246

Synthesis of Ligand C-246

3.0 g of ligand C-246 (having a purity of 97% or higher) was obtained in substantially the same manner as in Synthesis of ligand C-3 in Synthesis Example 2, except that Intermediate B-246 was used instead of Intermediate B-3. The resulting compound was identified by using mass spectroscopy and HPLC analysis.

HRMS(MALDI) calcd for $C_{64}H_{71}N_3O$: m/z 897.5597, Found: 897.5599

Synthesis of Compound 246

1.42 g of Compound 246 (yield: 39%) was obtained in substantially the same manner as in Synthesis of Compound 3 in Synthesis Example 2, except that ligand C-246 was used instead of ligand C-3. The resulting compound was identified by using mass spectroscopy and HPLC analysis.

HRMS(MALDI) calcd for $C_{64}H_{69}N_3OPt$: m/z 1090.5088, Found: 1090.5087

Evaluation Example 1: Evaluation on Singlet (S1) Energy Level and Triplet (T1) Energy Level The singlet ($S_1$) energy level and the triplet ($T_1$) energy level of the organometallic Compounds 1, 3, 177, 187, 218 and 246 and Compounds A, B, and C were evaluated by using a Gaussian program according to a density functional theory (DFT) method (structure optimization was performed at a degree of B3LYP, and 6-31 G(d,p)). The results thereof are shown in Table 1.

TABLE 1

| Compound No. | $S_1$ (eV) | $T_1$ (eV) | ΔST (eV) |
|---|---|---|---|
| 1 | 2.515 | 2.371 | 0.144 |
| 3 | 2.527 | 2.369 | 0.158 |
| 177 | 2.510 | 2.347 | 0.163 |
| 187 | 2.512 | 2.352 | 0.160 |
| 218 | 2.485 | 2.342 | 0.143 |
| 246 | 2.512 | 2.353 | 0.159 |
| A | 2.521 | 2.215 | 0.306 |
| B | 2.741 | 2.244 | 0.497 |
| C | 2.751 | 2.517 | 0.234 |

TABLE 1-continued
| Compound No. | $S_1$ (eV) | $T_1$ (eV) | ΔST (eV) |
|---|---|---|---|
| 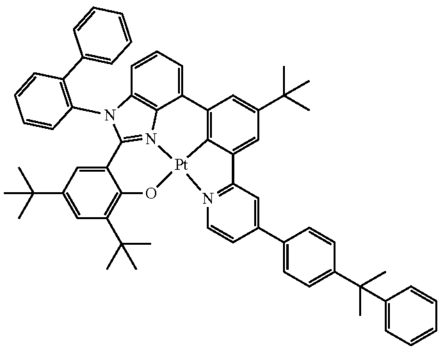 1 | | | |
| 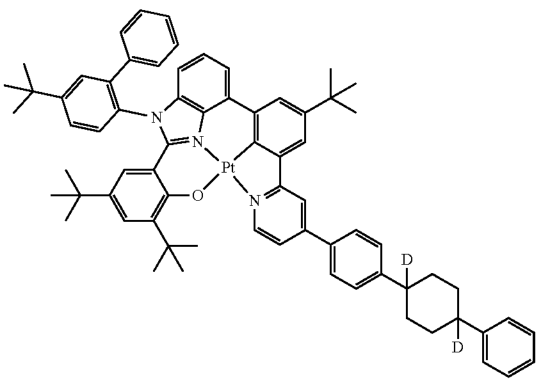 3 | | | |
| 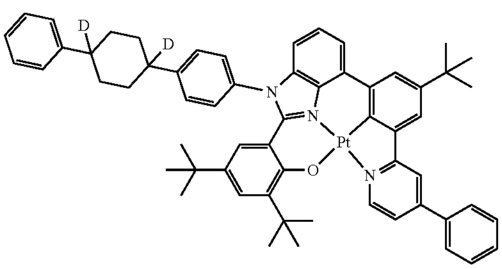 177 | | | |
| 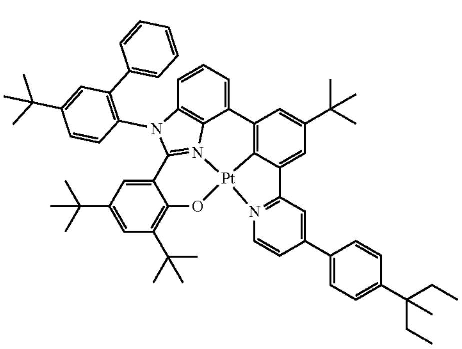 187 | | | |
| 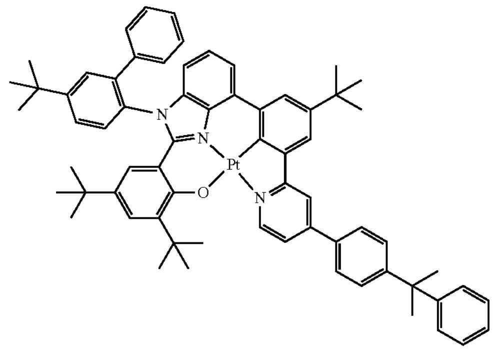 218 | | | |
| 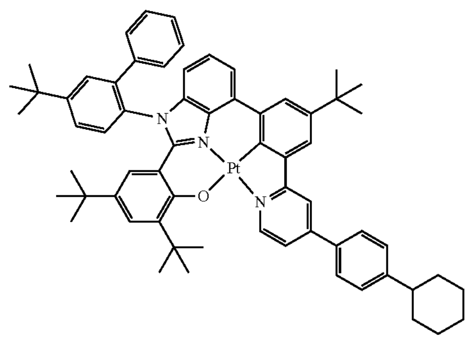 246 | | | |
| 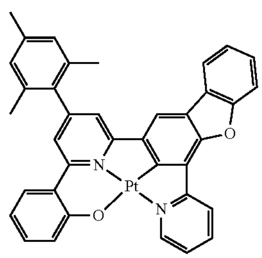 A | | | |
| 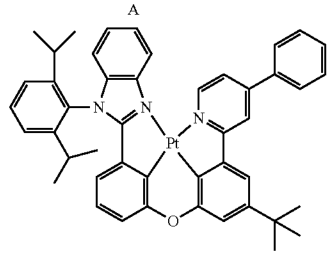 B | | | |
| 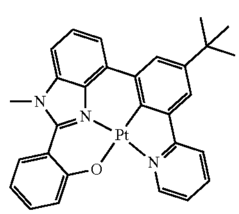 C | | | |
As shown in Table 1, Compounds 1, 3, 177, 187, 218 and 246 were found to have ΔST in a range of 0.1 eV to 0.2 eV.

Evaluation Example 2: Evaluation of Horizontal Orientation Ratio mCP and Compound 1 were co-deposited on a quartz substrate at a weight ratio of 92:8 in a vacuum pressure of $10^{-7}$ torr to form a film having a thickness of 40 nm. Then, a glass substrate for encapsulation was attached on the film to encapsulate the film.

The photoluminescence (PL) intensity according to angle of the film was measured by using a Luxol-OLED/analyzer LOA-100 (available from CoCoLink) from −150° to +150°. Then, the horizontal orientation ratio of Compound 1 was calculated by using a fitting program of the analyzer. The results thereof are shown in Table 2. The same process was performed on the compounds shown in Table 2. The results thereof are also shown in Table 2.

TABLE 2

| Sample No. | Co-deposition material | Horizontal orientation ratio (%) |
|---|---|---|
| 1 | mCP:Compound 1 (8 wt %) | 89 |
| 3 | mCP:Compound 3 (8 wt %) | 94 |
| 177 | mCP:Compound 177 (8 wt %) | 91 |
| 187 | mCP:Compound 187 (8 wt %) | 90 |
| 218 | mCP:Compound 218 (8 wt %) | 92 |
| 246 | mCP:Compound 246 (8 wt %) | 92 |
| A | mCP:Compound A (8 wt %) | 75 |
| B | mCP:Compound B (8 wt %) | 75 |
| C | mCP:Compound C (8 wt %) | 71 |

Referring to the results of Table 2, the horizontal orientation ratios of Compounds 1, 3, 177, 187, 218 and 246 were found to be higher than the horizontal orientation ratios of Compounds A, B, and C.

Evaluation Example 3: Thermal Characteristics Evaluation

Thermal analysis ($N_2$ atmosphere, a temperature range: from room temperature to 800° C. (10° C./min)-TGA, from room temperature to 400° C.-DSC, Pan Type: Pt Pan in disposable Al Pan (TGA) and disposable Al pan (DSC)) was performed on Compounds 1, 3, 177, 187, 218 and 246 by using thermo gravimetric analysis (TGA) and differential scanning calorimetry (DSC). The evaluation results are shown in Table 3.

TABLE 3

| Compound No. | Ts_10% (° C.) |
|---|---|
| 1 | 291 |
| 177 | 325 |
| 187 | 285 |
| 218 | 299 |
| 246 | 300 |

Referring to the results of Table 3, Compounds 1, 177, 187, 218 and 246 were each found to have a relatively low sublimation temperature. Thus, a thin film having excellent performance may be prepared by using above compounds.

Example 1

A glass substrate, on which ITO is patterned as an anode, was cut to a size of 50 millimeters (mm)×50 mm×0.5 mm, sonicated in isopropyl alcohol and water for 5 minutes each, and cleaned by exposure to ultraviolet rays and ozone for 30 minutes. Subsequently, the glass substrate was mounted on a vacuum-deposition device.

HT3 and F6-TCNNQ were vacuum-co-deposited at a weight ratio of 98:2 on the anode to form a hole injection layer having a thickness of 100 Å. HT3 was vacuum-deposited on the hole injection layer to form a hole transport layer having a thickness of 1,350 Å. Then, H-H1 was vacuum-deposited on the hole transport layer to form an electron blocking layer having a thickness of 300 Å.

Subsequently, H-H1 and H-E43 (as hosts) and Compound 1 (as a dopant) were co-deposited on the electron blocking layer at a weight ratio of 47.5:47.5:5 to form an emission layer having a thickness of 400 Å.

ET3 and ET-D1 were co-deposited at a volume ratio of 50:50 on the emission layer to form an electron transport layer having a thickness of 350 Å, ET-D1 was deposited on the electron transport layer to form an electron injection layer having a thickness of 10 Å, and Al was vacuum-deposited on the electron injection layer to form a cathode having a thickness of 1,000 Å, thereby completing the manufacture of an organic light-emitting device.

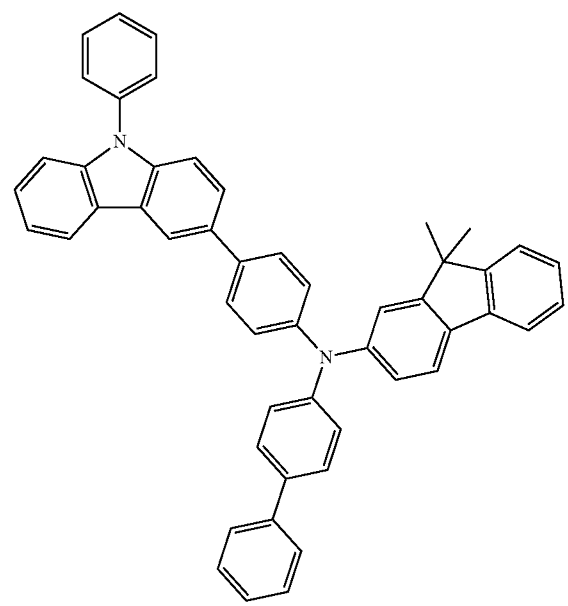

HT3

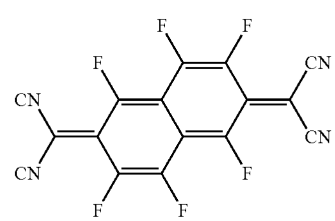

F6-TCNNQ

-continued

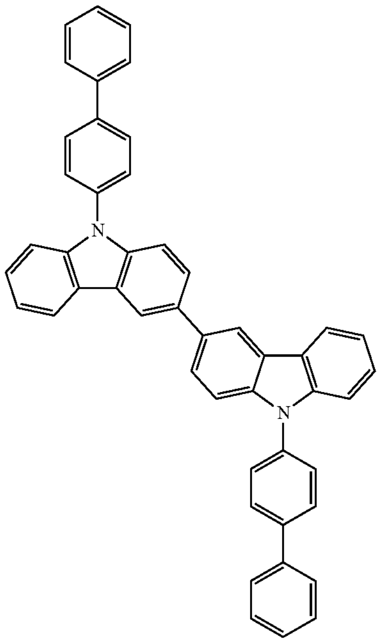

H-H1

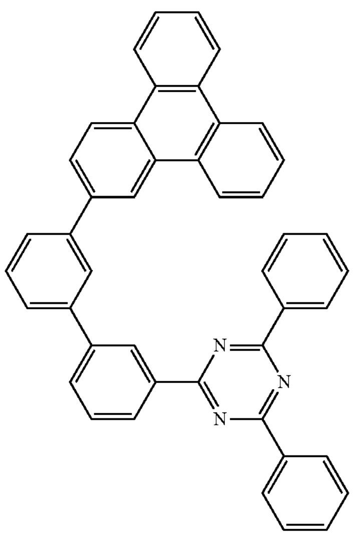

H-E43

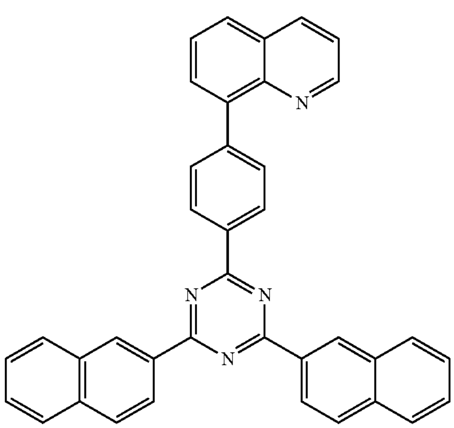

ET3

-continued

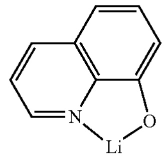

ET-D1

Examples 2 to 6 and Comparative Examples a, B, and C

Organic light-emitting devices were manufactured in substantially the same manner as in Example 1, except that the compounds listed in Table 4 were used instead of Compound 1 as a dopant in the formation of an emission layer.

Evaluation Example 4: Evaluation of Characteristics of Organic Light-Emitting Device A current voltmeter (Keithley 2400) and a luminescence meter (Minolta Cs-1000A) were used on the organic light-emitting devices of Examples 1 to 6 and Comparative Examples A, B, and C to measure the driving voltage, luminescence efficiency (cd/A), and a quantum emission yield (%). The results thereof are shown in Table 4. The luminescence efficiency is shown in a relative value.

TABLE 4

| | Dopant Compound No. | Driving voltage (V) | Luminescence efficiency (relative value, %) | Maximum quantum emmision yield (%) |
|---|---|---|---|---|
| Example 1 | 1 | 4.01 | 104 | 108 |
| Example 2 | 3 | 4.02 | 110 | 112 |
| Example 3 | 177 | 4.05 | 106 | 107 |
| Example 4 | 187 | 4.04 | 109 | 108 |
| Example 5 | 218 | 4.01 | 104 | 104 |
| Example 6 | 246 | 4.02 | 105 | 107 |
| Comparative Example A | A | 4.30 | 87 | 84 |
| Comparative Example B | B | 4.40 | 77 | 75 |
| Comparative Example C | C | 4.57 | 74 | 97 |

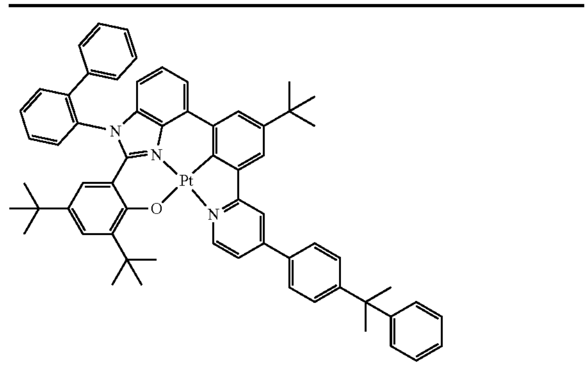

1

TABLE 4-continued

| Dopant Compound No. | Driving voltage (V) | Luminescence efficiency (relative value, %) | Maximum quantum emmision yield (%) |
|---|---|---|---|

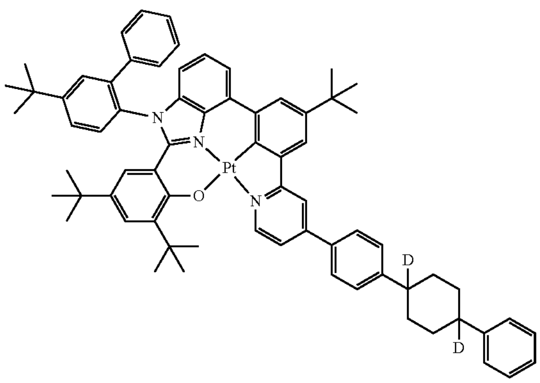

3

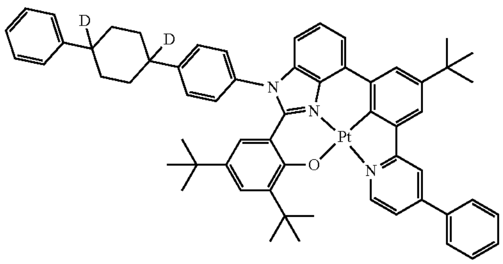

177

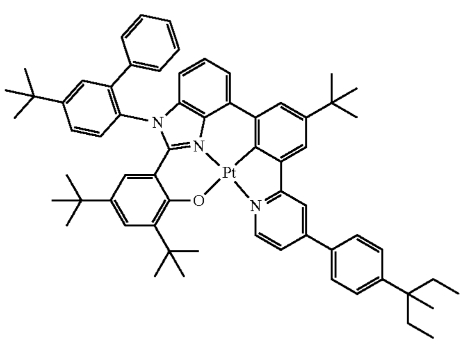

187

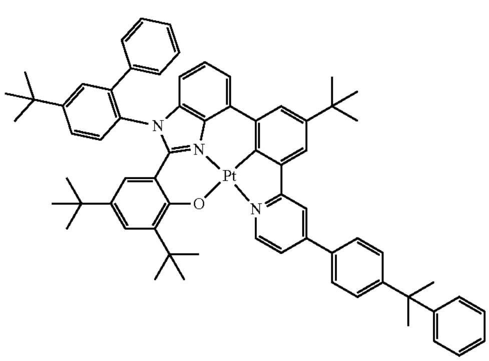

218

TABLE 4-continued

| Dopant Compound No. | Driving voltage (V) | Luminescence efficiency (relative value, %) | Maximum quantum emmision yield (%) |
|---|---|---|---|

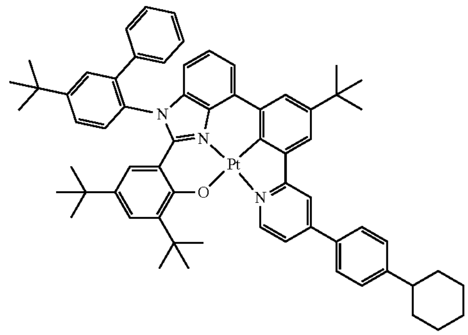

246

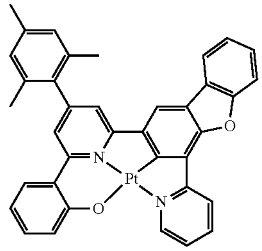

A

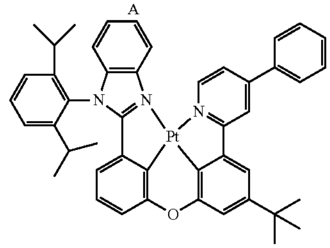

B

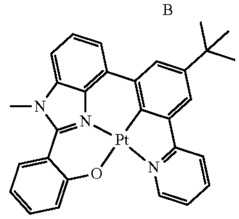

C

Referring to the results of Table 4, the organic light-emitting devices of Examples 1 to 6 were found to have excellent driving voltage, excellent luminescence efficiency, and improved quantum emission yield, as compared with the organic light-emitting devices of Comparative Examples A, B, and C.

As apparent from the foregoing description, the organometallic compound has excellent electrical characteristics and thermal stability. Accordingly, an organic light-emitting device including the organometallic compound may have an improved driving voltage, improved luminescence efficiency, and improved external quantum emission yield. Therefore, a high-quality electronic apparatus may be realized by using the organic light-emitting device.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1-1:

Formula 1-1

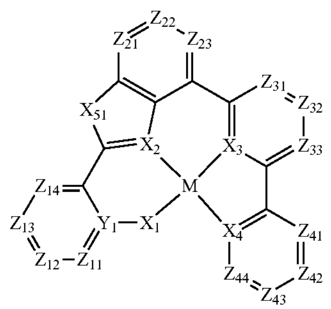

wherein, in Formula 1-1,

M is a transition metal, $X_1$ is O, S, or N(R'''), a bond between $X_1$ and M is a covalent bond, $X_2$ to $X_4$ and $Y_1$ are each independently C or N, one bond of a bond between $X_2$ and M, a bond between $X_3$ and M, and a bond between $X_4$ and M is a covalent bond, while the remaining bonds are each a coordinate bond, $X_{51}$ is O, S, N-[$(L_7)_{b7}$-$(R_7)_{c7}$], C($R_7$)($R_8$), Si($R_7$)($R_8$), Ge($R_7$)($R_8$), or C(═O), $Z_{11}$ is N or C-[$(L_{11})_{b11}$-$(T_{11})_{c11}$], $Z_{12}$ is N or C-[$(L_{12})_{b12}$-$(T_{12})_{c12}$], $Z_{13}$ is N or C-[$(L_{13})_{b13}$-$(T_{13})_{c13}$], and $Z_{14}$ is N or C-[$(L_{14})_{b14}$-$(T_{14})_{c14}$], $Z_{21}$ is N or C-[$(L_{21})_{b21}$-$(T_{21})_{c21}$], $Z_{22}$ is N or C-[$(L_{22})_{b22}$-$(T_{22})_{c22}$], and $Z_{23}$ is N or C-[$(L_{23})_{b23}$-$(T_{23})_{c23}$], $Z_{31}$ is N or C-[$(L_{31})_{b31}$-$(T_{31})_{c31}$], $Z_{32}$ is N or C-[$(L_{32})_{b32}$-$(T_{32})_{c32}$], and $Z_{33}$ is N or C-[$(L_{33})_{b33}$-$(T_{33})_{c33}$], $Z_{41}$ is N or C-[$(L_{41})_{b41}$-$(T_{41})_{c41}$], $Z_{42}$ is N or C-[$(L_{42})_{b42}$-$(T_{42})_{c42}$], $Z_{43}$ is N or C-[$(L_{43})_{b43}$-$(T_{43})_{c43}$], and $Z_{44}$ is N or C-[$(L_{44})_{b44}$-$(T_{44})_{c44}$], $L_7$, $L_{11}$ to $L_{14}$, $L_{21}$ to $L_{23}$, $L_{31}$ to $L_{33}$ and $L_{41}$ to $L_{44}$ are each independently a single bond, a $C_1$-$C_{10}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b7, b11 to b14, b21 to b23, b31 to b33 and b41 to b44 are each independently 1, 2, 3, 4, or 5, R''', $R_7$, $R_8$, $T_{11}$ to $T_{14}$, $T_{21}$ to $T_{23}$, $T_{31}$ to $T_{33}$ and $T_{41}$ to $T_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(═O)($Q_8$)($Q_9$), or —P($Q_8$)($Q_9$), c7, c11 to c14, c21 to c23, c31 to c33 and c41 to c44 are each independently 1, 2, 3, 4, or 5, wherein, the organometallic compound represented by Formula 1-1 satisfies:

1) Condition 11,

2) Condition 12,

3) Condition 13,

4) Condition 11 and Condition 13, or

5) Condition 12 and Condition 13, provided then when the organometallic compound represented by Formula 1-1 satisfies 1), 3) or 4), then i) ΔST of the organometallic compound is in a range of about 0.1 electron volts (eV) to about 0.2 eV, and ΔST indicates an energy gap between a singlet ($S_1$) energy level and a triplet ($T_1$) energy level of the organometallic compound, ii) a horizontal orientation ratio of the organometallic compound is in a range of about 85 percent (%) to about 95%, iii) a sublimation temperature of the organometallic compound is in a range of about 200° C. to about 350° C., or a combination thereof, $Z_{42}$ in Formula 1-1 is C-[$(L_{42})_{b42}$-$(T_{42})_{c42}$], Condition 11

$T_{42}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c42 is 1, $Z_{42}$ in Formula 1-1 is C-[$(L_{42})_{b42}$-$(T_{42})_{c42}$], Condition 12

$T_{42}$ is a group represented by Formula 41, and $c_{42}$ is 1:

*—C($Q_{41}$)($Q_{42}$)($Q_{43}$) Formula 41 wherein in Formula 41, $Q_{41}$ to $Q_{43}$ are each independently deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, at least one of $Q_{41}$ to $Q_{43}$ are each independently a substituted or unsubstituted $C_2$-$C_{60}$ alkyl group, a substituted or unsubstituted $C_3$-$C_{10}$ cycloalkyl group, or a substituted or unsubstituted $C_6$-$C_{60}$ aryl group, and

* indicates a binding site to an adjacent atom, $X_{51}$ in Formula 1-1 is N-[$(L_7)_{b7}$-$(R_7)_{c7}$], Condition 13

$L_7$ is a benzene group, or a naphthalene group, each unsubstituted or substituted with at least one $R_{10a}$, $R_7$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c7 is 1, each of i) at least two of $T_{11}$ to $T_{14}$, ii) at least two of $T_{21}$ to $T_{23}$, iii) at least two of $T_{31}$ to $T_{33}$, iv) at least two of $T_{41}$ to $T_{44}$ and v) at least two of $T_{11}$ to $T_{14}$, $T_{21}$ to $T_{23}$, $T_{31}$ to $T_{33}$, and $T_{41}$ to $T_{44}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ is understood by referring to the description of $T_{11}$ provided herein, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof; a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof; a $C_2$-$C_{60}$ alkenyl group; a $C_2$-$C_{60}$ alkynyl group; a $C_1$-$C_{60}$ alkoxy group; a $C_3$-$C_{10}$ cycloalkyl group; a $C_1$-$C_{10}$ heterocycloalkyl group; a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group.

2. The organometallic compound of claim 1, wherein the organometallic compound represented by Formula 1-1 satisfies 2) or 5) and ΔST of the organometallic compound is in a range of about 0.1 electron volts (eV) to about 0.2 eV, and ΔST indicates an energy gap between a singlet ($S_1$) energy level and a triplet ($T_1$) energy level of the organometallic compound.

3. The organometallic compound of claim 1, wherein ΔST of the organometallic compound is in a range of about 0.13 electron volts (eV) to about 0.2 eV, and ΔST indicates an energy gap between a singlet ($S_1$) energy level and a triplet ($T_1$) energy level of the organometallic compound.

4. The organometallic compound of claim 1, wherein the organometallic compound represented by Formula 1-1 satisfies 2) or 5) and a horizontal orientation ratio of the organometallic compound is in a range of about 85 percent (%) or greater.

5. The organometallic compound of claim 1, wherein the organometallic compound represented by Formula 1-1 satisfies 2) or 5) and a horizontal orientation ratio of the organometallic compound is in a range of about 85 percent (%) to about 95%.

6. The organometallic compound of claim 1, wherein the organometallic compound represented by Formula 1-1 satisfies 2) or 5) and a sublimation temperature of the organometallic compound is in a range of about 200° C. to about 350° C.

7. The organometallic compound of claim 1, wherein the organometallic compound satisfies Condition 11, and $L_{42}$ is a benzene group, or a naphthalene group, each unsubstituted or substituted with at least one $R_{10a}$.

8. The organometallic compound of claim 1, wherein the organometallic compound satisfies Condition 12, and $L_{42}$ is a benzene group, or a naphthalene group, each unsubstituted or substituted with at least one $R_{10a}$.

9. The organometallic compound of claim 1, wherein the organometallic compound satisfies Condition 11 or Condition 13, and $T_{42}$ and $R_7$ are each independently a $C_3$-$C_{10}$ cycloalkyl group unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a phenyl group, a ($C_1$-$C_{20}$ alkyl)phenyl group, a deuterated phenyl group, a fluorinated phenyl group, or any combination thereof.

10. The organometallic compound of claim 1, wherein the organometallic compound satisfies Condition 12, and $Q_{41}$ to $Q_{43}$ in Formula 41 are each independently:

deuterium; or a $C_1$-$C_{20}$ alkyl group, a $C_3$-$C_{10}$ cycloalkyl group, a phenyl group, a biphenyl group or a naphthyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a ($C_1$-$C_{20}$ alkyl) $C_3$-$C_{10}$ cycloalkyl group, a deuterated $C_3$-$C_{10}$ cycloalkyl group, a fluorinated $C_3$-$C_{10}$ cycloalkyl group, or any combination thereof.

11. The organometallic compound of claim 1, wherein the organometallic compound satisfies Condition 12, and at least one of $Q_{41}$ to $Q_{43}$ in Formula 41 is a $C_2$-$C_{20}$ alkyl group, a $C_3$-$C_{10}$ cycloalkyl group, a phenyl group, a biphenyl group or a naphtyl group, each unsubstituted or substituted with deuterium, —F, a cyano group, a $C_1$-$C_{20}$ alkyl group, a deuterated $C_1$-$C_{20}$ alkyl group, a fluorinated $C_1$-$C_{20}$ alkyl group, a $C_3$-$C_{10}$ cycloalkyl group, a ($C_1$-$C_{20}$ alkyl) $C_3$-$C_{10}$ cycloalkyl group, a deuterated $C_3$-$C_{10}$ cycloalkyl group, or a fluorinated $C_3$-$C_{10}$ cycloalkyl group.

12. The organometallic compound of claim 1, wherein $X_{51}$ in Formula 1-1 is N-[$(L_7)_{b7}$-$(R_7)_{c7}$], and a group represented by *-[$(L_7)_{b7}$-$(R_7)_{c7}$] is Formula N51:

Formula N51

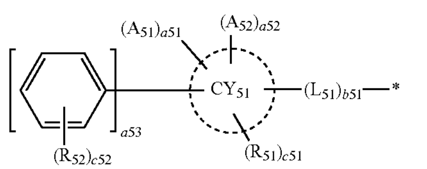

wherein, in Formula N51, ring $CY_{51}$ is a $C_5$-$C_{30}$ carbocyclic group or a $C_1$-$C_{30}$ heterocyclic group, $L_{51}$, b51, $R_{51}$, and c51 are respectively understood by referring to the descriptions of $L_7$, b7, $R_7$, and c7 in claim 1, $R_{52}$ and c52 are respectively understood by referring to the descriptions of $R_7$ and c7 in claim 1, $A_{51}$ is a $C_1$-$C_{60}$ alkyl group unsubstituted or substituted with a $C_3$-$C_{10}$ cycloalkyl group, $A_{52}$ is a deuterated $C_1$-$C_{60}$ alkyl group unsubstituted or substituted with a $C_3$-$C_{10}$ cycloalkyl group, a51 and a52 are each independently an integer from 0 to 10, and a sum of a51 and a52 is 1 or greater, a53 is an integer from 1 to 10, and

* indicates a binding site to an adjacent nitrogen atom.

13. The organometallic compound of claim 1, wherein $Z_{32}$ in Formula 1-1 is C-[$(L_{32})_{b32}$-$(T_{32})_{c32}$], $L_{32}$ is a single bond, and $T_{32}$ is a substituted or unsubstituted $C_1$-$C_{60}$ alkyl group, or a substituted or unsubstituted $C_6$-$C_{60}$ aryl group.

14. An organic light-emitting device comprising:

a first electrode;

a second electrode; and an organic layer between the first electrode and the second electrode and comprising an emission layer and at least one of the organometallic compound of claim 1.

15. The organic light-emitting device of claim 14, wherein the first electrode is an anode, the second electrode is a cathode, and the organic layer further comprises a hole transport region between the first electrode and the emission layer and an electron transport region between the emission layer and the second electrode, wherein the hole transport region comprises a hole injection layer, a hole transport layer, an electron blocking layer, or any combination thereof, and the electron transport region comprises a hole blocking layer, an electron transport layer, an electron injection layer, or any combination thereof.

16. The organic light-emitting device of claim 14, wherein the emission layer comprises the organometallic compound.

17. The organic light-emitting device of claim 16, wherein the emission layer further comprises a host in an amount greater than an amount of the organometallic compound.

18. An organic light-emitting device comprising, a first electrode;

a second electrode; and an organic layer between the first electrode and the second electrode and comprising an emission layer, wherein the emission layer comprises an organometallic compound represented by Formula 1-1:

Formula 1-1

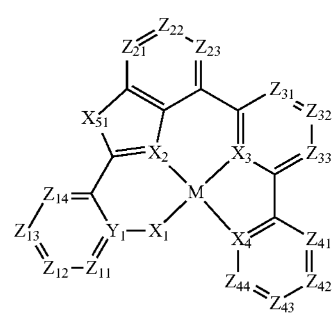

wherein, in Formula 1-1,

M is a transition metal, $X_1$ is O, S, or N(R'''), a bond between $X_1$ and M is a covalent bond, $X_2$ to $X_4$ are $Y_1$ are each independently C or N, one bond of a bond between $X_2$ and M, a bond between $X_3$ and M, and a bond between $X_4$ and M is a covalent bond, while the remaining bonds are each a coordinate bond, $X_{51}$ is O, S, N-[$(L_7)_{b7}$-$(R_7)_{c7}$], C($R_7$)($R_8$), Si($R_7$)($R_8$), Ge($R_7$)($R_8$), or C(=O), $Z_{11}$ is N or C-[$(L_{11})_{b11}$-$(T_{11})_{c11}$], $Z_{12}$ is N or C-[$(L_{12})_{b12}$-$(T_{12})_{c12}$], $Z_{13}$ is N or C-[$(L_{13})_{b13}$-$(T_{13})_{c13}$], and $Z_{14}$ is N or C-[$(L_{14})_{b14}$-$(T_{14})_{c14}$], $Z_{21}$ is N or C-[$(L_{21})_{b21}$-$(T_{21})_{c21}$], $Z_{22}$ is N or C-[$(L_{22})_{b22}$-$(T_{22})_{c22}$], and $Z_{23}$ is N or C-[$(L_{23})_{b23}$-$(T_{23})_{c23}$], $Z_{31}$ is N or C-[$(L_{31})_{b31}$-$(T_{31})_{c31}$], $Z_{32}$ is N or C-[$(L_{32})_{b32}$-$(T_{32})_{c32}$], and $Z_{33}$ is N or C-[$(L_{33})_{b33}$-$(T_{33})_{c33}$], $Z_{41}$ is N or C-[$(L_{41})_{b41}$-$(T_{41})_{c41}$], $Z_{42}$ is N or C-[$(L_{42})_{b42}$-$(T_{42})_{c42}$], $Z_{43}$ is N or C-[$(L_{43})_{b43}$-$(T_{43})_{c43}$], and $Z_{44}$ is N or C-[$(L_{44})_{b44}$-$(T_{44})_{c44}$], $L_7$, $L_{11}$ to $L_{14}$, $L_{21}$ to $L_{23}$, $L_{31}$ to $L_{33}$ and $L_{41}$ to $L_{44}$ are each independently a single bond, a $C_1$-$C_{10}$ alkylene group unsubstituted or substituted with at least one $R_{10a}$, a $C_5$-$C_{30}$ carbocyclic group unsubstituted or substituted with at least one $R_{10a}$, or a $C_1$-$C_{30}$ heterocyclic group unsubstituted or substituted with at least one $R_{10a}$, b7, b11 to b14, b21 to b23, b31 to b33 and b41 to b44 are each independently 1, 2, 3, 4, or 5, R''', $R_7$, $R_8$, $T_{11}$ to $T_{14}$, $T_{21}$ to $T_{23}$, $T_{31}$ to $T_{33}$ and $T_{41}$ to $T_{44}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —Ge($Q_3$)($Q_4$)($Q_5$), —B($Q_6$)($Q_7$), —P(=O)($Q_8$)($Q_9$), or —P($Q_8$)($Q_9$), c7, c11 to c14, c21 to c23, c31 to c33 and c41 to c44 are each independently 1, 2, 3, 4, or 5, wherein, the organometallic compound represented by Formula 1-1 satisfies, 1) one of Condition 11, Condition 12 and Condition 13, 2) Condition 11 and Condition 13, or 3) Condition 12 and Condition 13, $Z_{42}$ in Formula 1-1 is C-[$(L_{42})_{b42}$-$(T_{42})_{c42}$], Condition 11

$T_{42}$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c42 is 1, $Z_{42}$ in Formula 1-1 is C-[$(L_{42})_{b42}$-$(T_{42})_{c42}$], Condition 12

$T_{42}$ is a group represented by Formula 41, and c42 is 1, $$*—C(Q_{41})(Q_{42})(Q_{43}) \quad \text{Formula 41}$$

wherein in Formula 41, $Q_{41}$ to $Q_{43}$ are each independently deuterium, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group, at least one of $Q_{41}$ to $Q_{43}$ are each independently a substituted or unsubstituted $C_2$-$C_{60}$ alkyl group, a substituted or unsubstituted $C_3$-$C_{10}$ cycloalkyl group, or a substituted or unsubstituted $C_6$-$C_{60}$ aryl group, and

* indicates a binding site to an adjacent atom, $X_{51}$ in Formula 1-1 is N-[$(L_7)_{b7}$-$(R_7)_{c7}$], Condition 13

$L_7$ is a benzene group, or a naphthalene group, each unsubstituted or substituted with at least one $R_{10a}$, $R_7$ is a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, or a substituted or unsubstituted $C_1$-$C_{10}$ heterocycloalkenyl group, and c7 is 1, each of i) at least two of $T_{11}$ to $T_{14}$, ii) at least two of $T_{21}$ to $T_{23}$, iii) at least two of $T_{31}$ to $T_{33}$, iv) at least two of $T_{41}$ to $T_{44}$ and v) at least two of $T_{11}$ to $T_{14}$, $T_{21}$ to $T_{23}$, $T_{31}$ to $T_{33}$, and $T_{41}$ to $T_{44}$ are optionally bound to each other to form a $C_5$-$C_{30}$ carbocyclic group unsubstituted or substituted with at least one $R_{10a}$ or a $C_1$-$C_{30}$ heterocyclic group unsubstituted or substituted with at least one $R_{10a}$, $R_{10a}$ may be understood by referring to the description of $T_{11}$ provided herein, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group, a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —Ge($Q_{13}$)($Q_{14}$)($Q_{15}$), —B($Q_{16}$)($Q_{17}$), —P(═O)($Q_{18}$)($Q_{19}$), —P($Q_{18}$)($Q_{19}$), or any combination thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_6$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —Ge($Q_{23}$)($Q_{24}$)($Q_{25}$), —B($Q_{26}$)($Q_{27}$), —P(═O)($Q_{28}$)($Q_{29}$), —P($Q_{28}$)($Q_{29}$), or any combination thereof;

—N($Q_{31}$)($Q_{32}$), —Si($Q_{33}$)($Q_{34}$)($Q_{35}$), —Ge($Q_{33}$)($Q_{34}$)($Q_{35}$), —B($Q_{36}$)($Q_{37}$), —P(═O)($Q_{38}$)($Q_{39}$), or —P($Q_{38}$)($Q_{39}$); or any combination thereof, wherein $Q_1$ to $Q_9$, $Q_{11}$ to $Q_{19}$, $Q_{21}$ to $Q_{29}$, and $Q_{31}$ to $Q_{39}$ are each independently: hydrogen; deuterium; —F; —Cl; —Br; —I; a hydroxyl group; a cyano group; a nitro group; an amidino group; a hydrazine group; a hydrazone group; a carboxylic acid group or a salt thereof, a sulfonic acid group or a salt thereof; a phosphoric acid group or a salt thereof; a $C_1$-$C_{60}$ alkyl group unsubstituted or substituted with deuterium, a $C_1$-$C_{60}$ alkyl group, a $C_6$-$C_{60}$ aryl group, or any combination thereof, a $C_2$-$C_{60}$ alkenyl group; a $C_2$-$C_{60}$ alkynyl group, a $C_1$-$C_{60}$ alkoxy group; a $C_3$-$C_{10}$ cycloalkyl group; a $C_1$-$C_{10}$ heterocycloalkyl group, a $C_3$-$C_{10}$ cycloalkenyl group; a $C_1$-$C_{10}$ heterocycloalkenyl group; a $C_6$-$C_{60}$ aryl group unsubstituted or substituted with deuterium, a $C_1$-$C_{60}$ alkyl group, a $C_6$-$C_{60}$ aryl group, or any combination thereof; a $C_6$-$C_{60}$ aryloxy group; a $C_6$-$C_{60}$ arylthio group; a $C_1$-$C_{60}$ heteroaryl group; a monovalent non-aromatic condensed polycyclic group; or a monovalent non-aromatic condensed heteropolycyclic group, wherein the emission layer comprises a host in an amount greater than an amount of the organometallic compound, and wherein the host comprises an electron transporting host and a hole transporting host, and the electron transporting host is different from the hole transporting host.

19. The organic light-emitting device of claim 18, wherein the electron transporting host comprises a triphenylene group and a triazine group, and the hole transporting host comprises a carbazole group.

20. An electronic apparatus comprising the organic light-emitting device of claim 14.

* * * * *